(12) United States Patent
Ozluturk et al.

(10) Patent No.: US 8,737,363 B2
(45) Date of Patent: May 27, 2014

(54) CODE DIVISION MULTIPLE ACCESS (CDMA) COMMUNICATION SYSTEM

(75) Inventors: Fatih M. Ozluturk, Port Washington, NY (US); Alexander M. Jacques, Kings Park, NY (US); Gary R. Lomp, Centerport, NY (US); John Kowalski, Camas, WA (US)

(73) Assignee: InterDigital Technology Corporation, Wilmington, DE (US)

( * ) Notice: Subject to any disclaimer, the term of this patent is extended or adjusted under 35 U.S.C. 154(b) by 33 days.

(21) Appl. No.: 13/041,745

(22) Filed: Mar. 7, 2011

(65) Prior Publication Data

US 2011/0158202 A1 Jun. 30, 2011

Related U.S. Application Data

(60) Continuation of application No. 10/857,463, filed on May 28, 2004, now Pat. No. 7,903,613, which is a continuation of application No. 09/400,489, filed on Sep. 21, 1999, now Pat. No. 6,885,652, which is a division of application No. 08/815,299, filed on Mar. 11, 1997, now Pat. No. 6,049,535, which is a continuation-in-part of application No. 08/669,775, filed on Jun. 27, 1996, now Pat. No. 5,799,010.

(60) Provisional application No. 60/000,775, filed on Jun. 30, 1995.

(51) Int. Cl.
 *H04B 7/216* (2006.01)

(52) U.S. Cl.
 USPC ............ 370/335; 375/220; 375/222; 455/557

(58) Field of Classification Search
 USPC ................ 375/200, 222, 220; 455/550.1, 557
 See application file for complete search history.

(56) References Cited

U.S. PATENT DOCUMENTS 3,700,820 A 10/1972 Blasbalg et al.
3,761,610 A 9/1973 Krallinger et al.
(Continued)

FOREIGN PATENT DOCUMENTS

DE 3743731 7/1989
DE 3743732 7/1989
(Continued)

OTHER PUBLICATIONS

U.S. Appl. No. 60/069,511, Dec. 2009, Butovitsch, P., et al.
(Continued)

*Primary Examiner* — Sharad Rampuria
(74) *Attorney, Agent, or Firm* — Volpe and Koenig, P.C.

(57) ABSTRACT

A subscriber unit for use in a multiple access spread-spectrum communication system includes a spread spectrum radio interface, responsive to a rate function signal from a base station, and first and second despreaders. The base station assigns the rate function spread-spectrum message channels and the first despreader recovers and modifies an information signal one of the spread spectrum message channels. The information channel mode is then modified for processing by the second despreader, with the second despreader supporting a different information signal rate. The subscriber unit has a capability of communicating with a dynamically changing a transmission rate of an information signal which includes multiple spread spectrum message channels. The system includes a closed loop power control system for maintaining a minimum system transmit power level for a radio carrier station and the subscriber units, and system capacity management for maintaining a maximum number of active subscriber units for improved system performance.

18 Claims, 39 Drawing Sheets

(56) References Cited

U.S. PATENT DOCUMENTS

| | | |
|---|---|---|
| 4,069,392 A | 1/1978 | Goldenberg et al. |
| 4,092,601 A | 5/1978 | Lee et al. |
| 4,156,277 A | 5/1979 | Seitz et al. |
| 4,228,538 A | 10/1980 | Scharla-Nielsen et al. |
| 4,292,623 A | 9/1981 | Eswaran et al. |
| 4,320,513 A | 3/1982 | Lampert |
| 4,384,307 A | 5/1983 | Kuzmik et al. |
| 4,385,206 A | 5/1983 | Bradshaw et al. |
| 4,403,322 A | 9/1983 | Kato et al. |
| 4,425,665 A | 1/1984 | Stauffer |
| 4,458,314 A | 7/1984 | Grimes |
| 4,470,154 A | 9/1984 | Yano |
| 4,480,307 A | 10/1984 | Budde et al. |
| 4,516,272 A | 5/1985 | Yano |
| 4,570,220 A | 2/1986 | Tetrick et al. |
| 4,583,124 A | 4/1986 | Tsuji et al. |
| 4,599,732 A | 7/1986 | Lefever |
| 4,608,700 A | 8/1986 | Kirtley, Jr. et al. |
| 4,625,308 A | 11/1986 | Kim et al. |
| 4,630,126 A | 12/1986 | Kaku et al. |
| 4,630,283 A | 12/1986 | Schiff |
| 4,646,232 A | 2/1987 | Chang et al. |
| 4,667,192 A | 5/1987 | Schmid et al. |
| 4,668,990 A | 5/1987 | Kondo et al. |
| 4,675,863 A | 6/1987 | Paneth et al. |
| 4,675,865 A | 6/1987 | DeVries et al. |
| 4,709,343 A | 11/1987 | Van Chang |
| 4,744,079 A | 5/1988 | Csapo et al. |
| 4,768,145 A | 8/1988 | Wheelwright et al. |
| 4,785,463 A | 11/1988 | Janc et al. |
| 4,794,590 A | 12/1988 | Yano |
| 4,802,189 A | 1/1989 | Wedler |
| 4,807,226 A | 2/1989 | Naka |
| 4,811,262 A | 3/1989 | White |
| 4,811,421 A | 3/1989 | Havel et al. |
| 4,839,887 A | 6/1989 | Yano |
| 4,841,527 A | 6/1989 | Raychaudhuri et al. |
| 4,862,402 A | 8/1989 | Shah et al. |
| 4,876,554 A | 10/1989 | Tubbs |
| 4,885,742 A | 12/1989 | Yano |
| 4,901,265 A | 2/1990 | Kerr et al. |
| 4,901,307 A | 2/1990 | Gilhousen et al. |
| 4,905,177 A | 2/1990 | Weaver, Jr. et al. |
| 4,912,722 A | 3/1990 | Carlin |
| 4,914,574 A | 4/1990 | Terada et al. |
| 4,926,130 A | 5/1990 | Weaver |
| 4,928,274 A | 5/1990 | Gilhousen et al. |
| 4,940,771 A | 7/1990 | Maresca |
| 4,965,533 A | 10/1990 | Gilmore |
| 4,965,792 A | 10/1990 | Yano |
| 4,979,170 A | 12/1990 | Gilhousen et al. |
| 5,017,926 A | 5/1991 | Ames et al. |
| 5,021,891 A | 6/1991 | Lee |
| 5,022,024 A | 6/1991 | Paneth et al. |
| 5,022,046 A | 6/1991 | Morrow |
| 5,022,049 A | 6/1991 | Abrahamson et al. |
| 5,027,306 A | 6/1991 | Dattorro et al. |
| 5,028,887 A | 7/1991 | Gilmore |
| 5,050,004 A | 9/1991 | Morton, Jr. |
| 5,056,109 A | 10/1991 | Gilhousen et al. |
| 5,073,900 A | 12/1991 | Mallinckrodt |
| 5,081,643 A | 1/1992 | Schilling |
| 5,084,900 A | 1/1992 | Taylor |
| 5,093,840 A | 3/1992 | Schilling |
| 5,099,204 A | 3/1992 | Wheatley, III |
| 5,101,416 A | 3/1992 | Fenton et al. |
| 5,101,501 A | 3/1992 | Gilhousen et al. |
| 5,103,459 A | 4/1992 | Gilhousen et al. |
| 5,105,423 A | 4/1992 | Tanaka et al. |
| 5,107,225 A | 4/1992 | Wheatley, III et al. |
| 5,107,345 A | 4/1992 | Lee |
| 5,107,487 A | 4/1992 | Vilmur et al. |
| 5,109,390 A | 4/1992 | Gilhousen et al. |
| 5,113,525 A | 5/1992 | Andoh |
| 5,115,429 A | 5/1992 | Hluchyj et al. |
| 5,117,385 A | 5/1992 | Gee |
| 5,126,748 A | 6/1992 | Ames et al. |
| 5,128,623 A | 7/1992 | Gilmore |
| 5,140,613 A | 8/1992 | Birgenheier et al. |
| 5,142,278 A | 8/1992 | Moallemi et al. |
| 5,151,919 A | 9/1992 | Dent |
| 5,159,283 A | 10/1992 | Jensen |
| 5,159,551 A | 10/1992 | Brunnett et al. |
| 5,159,608 A | 10/1992 | Falconer et al. |
| 5,161,168 A | 11/1992 | Schilling |
| 5,166,929 A | 11/1992 | Lo |
| 5,166,951 A | 11/1992 | Schilling |
| 5,166,952 A | 11/1992 | Omurg et al. |
| 5,179,571 A | 1/1993 | Schilling |
| 5,179,572 A | 1/1993 | Schilling |
| 5,193,094 A | 3/1993 | Viterbi |
| 5,193,102 A | 3/1993 | Meidan et al. |
| 5,199,061 A | 3/1993 | Kim |
| 5,204,874 A | 4/1993 | Falconer et al. |
| 5,204,876 A | 4/1993 | Bruckert et al. |
| 5,210,771 A | 5/1993 | Schaeffer et al. |
| 5,216,692 A | 6/1993 | Ling |
| 5,224,120 A | 6/1993 | Schilling |
| 5,228,053 A | 7/1993 | Miller et al. |
| 5,228,054 A | 7/1993 | Rueth et al. |
| 5,228,056 A | 7/1993 | Schilling |
| 5,233,630 A | 8/1993 | Wolf |
| 5,235,614 A | 8/1993 | Bruckert et al. |
| 5,237,586 A | 8/1993 | Bottomley |
| 5,239,557 A | 8/1993 | Dent |
| 5,239,685 A | 8/1993 | Moe et al. |
| 5,241,690 A | 8/1993 | Larsson et al. |
| 5,245,629 A | 9/1993 | Hall |
| 5,247,702 A | 9/1993 | Su et al. |
| 5,253,268 A | 10/1993 | Omura et al. |
| 5,253,347 A | 10/1993 | Bagnoli et al. |
| 5,257,283 A | 10/1993 | Gilhousen et al. |
| 5,258,940 A | 11/1993 | Coker et al. |
| 5,260,967 A | 11/1993 | Schilling |
| 5,260,998 A | 11/1993 | Takagi |
| 5,262,974 A | 11/1993 | Hausman et al. |
| 5,263,045 A | 11/1993 | Schilling |
| 5,265,119 A | 11/1993 | Gilhousen et al. |
| 5,267,238 A | 11/1993 | Yano et al. |
| 5,267,244 A | 11/1993 | Messerschmitt et al. |
| 5,267,261 A | 11/1993 | Blakeney, III et al. |
| 5,267,262 A | 11/1993 | Wheatley, III |
| 5,268,900 A | 12/1993 | Hluchyj |
| 5,274,474 A | 12/1993 | Medina |
| 5,274,665 A | 12/1993 | Schilling |
| 5,276,261 A | 1/1994 | Mayer et al. |
| 5,276,684 A | 1/1994 | Pearson |
| 5,276,907 A | 1/1994 | Meidan |
| 5,280,472 A | 1/1994 | Gilhousen et al. |
| 5,280,537 A | 1/1994 | Sugiyama et al. |
| 5,283,536 A | 2/1994 | Wheatley, III et al. |
| 5,287,299 A | 2/1994 | Lin |
| 5,287,463 A | 2/1994 | Frame et al. |
| 5,289,527 A | 2/1994 | Tiedemann, Jr. |
| 5,291,515 A | 3/1994 | Uchida et al. |
| 5,293,641 A | 3/1994 | Kallin et al. |
| 5,295,152 A | 3/1994 | Gudmundson et al. |
| 5,295,153 A | 3/1994 | Gudmundson |
| 5,297,161 A | 3/1994 | Ling |
| 5,297,162 A | 3/1994 | Lee et al. |
| 5,299,226 A | 3/1994 | Schilling |
| 5,299,228 A | 3/1994 | Hall |
| 5,305,308 A | 4/1994 | English et al. |
| 5,305,349 A | 4/1994 | Dent |
| 5,305,468 A | 4/1994 | Bruckert et al. |
| 5,307,405 A | 4/1994 | Sih |
| 5,309,474 A | 5/1994 | Gilhousen et al. |
| 5,311,176 A | 5/1994 | Gurney |
| 5,311,459 A | 5/1994 | D'Luna et al. |
| 5,316,422 A | 5/1994 | Coffman |
| 5,319,450 A | 6/1994 | Tamayama et al. |
| 5,321,721 A | 6/1994 | Yamaura et al. |
| 5,327,455 A | 7/1994 | De Gaudenzi et al. |
| 5,327,467 A | 7/1994 | De Gaudenzi et al. |

(56) References Cited

U.S. PATENT DOCUMENTS

| | | |
|---|---|---|
| 5,329,547 A | 7/1994 | Ling |
| 5,333,175 A | 7/1994 | Ariyavisitakul et al. |
| 5,337,338 A | 8/1994 | Sutton et al. |
| 5,339,046 A | 8/1994 | Kornfeld et al. |
| 5,339,174 A | 8/1994 | Harris |
| 5,339,184 A | 8/1994 | Tang |
| 5,339,330 A | 8/1994 | Mallinckrodt |
| 5,341,396 A | 8/1994 | Higgins et al. |
| 5,341,397 A | 8/1994 | Gudmundson |
| 5,341,427 A | 8/1994 | Hardy et al. |
| 5,341,456 A | 8/1994 | DeJaco |
| 5,343,335 A | 8/1994 | Hara |
| 5,345,467 A | 9/1994 | Lomp et al. |
| 5,345,596 A | 9/1994 | Buchenhorner et al. |
| 5,345,598 A | 9/1994 | Dent |
| 5,347,536 A | 9/1994 | Meehan |
| 5,347,569 A | 9/1994 | Yamamoto |
| 5,349,606 A | 9/1994 | Lovell et al. |
| 5,351,134 A | 9/1994 | Yaguchi et al. |
| 5,351,269 A | 9/1994 | Schilling |
| 5,353,302 A | 10/1994 | Bi |
| 5,353,332 A | 10/1994 | Raith et al. |
| 5,353,352 A | 10/1994 | Dent et al. |
| 5,355,453 A | 10/1994 | Row et al. |
| 5,359,624 A | 10/1994 | Lee et al. |
| 5,361,276 A | 11/1994 | Subramanian |
| 5,363,377 A | 11/1994 | Sharpe |
| 5,363,403 A | 11/1994 | Schilling et al. |
| 5,365,544 A | 11/1994 | Schilling |
| 5,365,551 A | 11/1994 | Snodgrass et al. |
| 5,365,585 A | 11/1994 | Puhl et al. |
| 5,367,533 A | 11/1994 | Schilling |
| 5,373,259 A | 12/1994 | Hackman et al. |
| 5,373,502 A | 12/1994 | Turban |
| 5,377,183 A | 12/1994 | Dent |
| 5,377,223 A | 12/1994 | Schilling |
| 5,377,226 A | 12/1994 | Davis |
| 5,379,242 A | 1/1995 | Rose et al. |
| 5,381,443 A | 1/1995 | Borth et al. |
| 5,383,219 A | 1/1995 | Wheatley, III et al. |
| 5,386,589 A | 1/1995 | Kanai |
| 5,390,207 A | 2/1995 | Fenton et al. |
| 5,392,023 A | 2/1995 | D'Avello et al. |
| 5,392,287 A | 2/1995 | Tiedemann, Jr. et al. |
| D356,560 S | 3/1995 | Kornfeld et al. |
| 5,396,516 A | 3/1995 | Padovani et al. |
| 5,396,539 A | 3/1995 | Slekys et al. |
| 5,398,243 A | 3/1995 | Aguilhon et al. |
| 5,404,376 A | 4/1995 | Dent |
| 5,406,559 A | 4/1995 | Edem et al. |
| 5,406,615 A | 4/1995 | Miller, II et al. |
| 5,406,629 A | 4/1995 | Harrison et al. |
| 5,408,697 A | 4/1995 | Price et al. |
| 5,410,568 A | 4/1995 | Schilling |
| 5,412,659 A | 5/1995 | Fujita et al. |
| 5,412,686 A | 5/1995 | Ling |
| 5,414,728 A | 5/1995 | Zehavi |
| 5,414,729 A | 5/1995 | Fenton |
| 5,414,732 A | 5/1995 | Kaufmann |
| 5,414,796 A | 5/1995 | Jacobs et al. |
| 5,416,797 A | 5/1995 | Gilhousen et al. |
| 5,418,624 A | 5/1995 | Ahmed |
| 5,418,813 A | 5/1995 | Schaffner et al. |
| 5,420,850 A | 5/1995 | Umeda et al. |
| 5,420,864 A | 5/1995 | Dahlin et al. |
| 5,420,896 A | 5/1995 | Schilling |
| 5,422,908 A | 6/1995 | Schilling |
| 5,422,909 A | 6/1995 | Love et al. |
| 5,430,724 A | 7/1995 | Fall et al. |
| 5,430,760 A | 7/1995 | Dent |
| 5,432,815 A * | 7/1995 | Kang et al. .................. 375/145 |
| 5,440,597 A | 8/1995 | Chung et al. |
| 5,440,632 A | 8/1995 | Bacon et al. |
| 5,442,625 A | 8/1995 | Gitlin et al. |
| 5,442,662 A | 8/1995 | Fukasawa et al. |
| 5,446,683 A | 8/1995 | Mullen et al. |
| 5,446,756 A | 8/1995 | Mallinckrodt |
| 5,448,600 A | 9/1995 | Lucas |
| 5,452,339 A | 9/1995 | Siu et al. |
| 5,454,026 A | 9/1995 | Tanaka |
| 5,457,813 A | 10/1995 | Poutanen |
| 5,459,758 A | 10/1995 | Moore |
| 5,459,759 A | 10/1995 | Schilling |
| 5,459,760 A | 10/1995 | Watanabe |
| 5,461,639 A | 10/1995 | Wheatley, III et al. |
| 5,465,269 A | 11/1995 | Schaffner et al. |
| 5,465,399 A | 11/1995 | Oberholtzer et al. |
| 5,469,471 A | 11/1995 | Wheatley, III |
| 5,471,497 A | 11/1995 | Zehavi |
| 5,479,397 A | 12/1995 | Lee |
| 5,481,561 A | 1/1996 | Fang |
| 5,483,549 A | 1/1996 | Weinberg et al. |
| 5,485,486 A | 1/1996 | Gilhousen et al. |
| 5,487,089 A | 1/1996 | Misaizu et al. |
| 5,487,174 A | 1/1996 | Persson |
| 5,487,180 A | 1/1996 | Ohtake |
| 5,488,629 A | 1/1996 | Takahashi et al. |
| 5,490,136 A | 2/1996 | Sereno et al. |
| 5,491,837 A | 2/1996 | Haartsen |
| 5,497,395 A | 3/1996 | Jou |
| 5,499,236 A | 3/1996 | Giallorenzi et al. |
| 5,499,395 A | 3/1996 | Doi et al. |
| 5,504,773 A | 4/1996 | Padovani et al. |
| 5,506,864 A | 4/1996 | Schilling |
| 5,506,865 A | 4/1996 | Weaver, Jr. |
| 5,508,708 A | 4/1996 | Ghosh et al. |
| 5,509,002 A | 4/1996 | Baden et al. |
| 5,509,126 A | 4/1996 | Oprescu et al. |
| 5,511,067 A | 4/1996 | Miller |
| 5,519,736 A | 5/1996 | Ishida |
| 5,521,938 A | 5/1996 | Stewart et al. |
| 5,528,593 A | 6/1996 | English et al. |
| 5,528,624 A | 6/1996 | Kaku et al. |
| 5,535,211 A | 7/1996 | Yano |
| 5,535,238 A | 7/1996 | Schilling et al. |
| 5,535,239 A | 7/1996 | Padovani et al. |
| 5,535,278 A | 7/1996 | Cahn et al. |
| 5,537,397 A | 7/1996 | Abramson |
| 5,537,434 A | 7/1996 | Persson et al. |
| 5,541,606 A | 7/1996 | Lennen |
| 5,544,155 A | 8/1996 | Lucas et al. |
| 5,544,156 A | 8/1996 | Teder et al. |
| 5,544,167 A | 8/1996 | Lucas et al. |
| 5,544,196 A | 8/1996 | Tiedemann, Jr. et al. |
| 5,546,424 A | 8/1996 | Miyake |
| 5,548,613 A | 8/1996 | Kaku et al. |
| 5,548,616 A | 8/1996 | Mucke et al. |
| 5,548,812 A | 8/1996 | Padovani et al. |
| 5,550,810 A | 8/1996 | Monogioudis et al. |
| 5,550,811 A | 8/1996 | Kaku et al. |
| 5,551,057 A | 8/1996 | Mitra |
| 5,559,788 A | 9/1996 | Zschelle et al. |
| 5,559,790 A | 9/1996 | Yano et al. |
| 5,561,669 A | 10/1996 | Lenney et al. |
| 5,563,907 A | 10/1996 | Lomp |
| 5,563,912 A | 10/1996 | Yasunaga et al. |
| 5,564,074 A | 10/1996 | Juntti |
| 5,566,165 A | 10/1996 | Sawahashi et al. |
| 5,566,201 A | 10/1996 | Ostman |
| 5,568,472 A | 10/1996 | Umeda et al. |
| 5,568,483 A | 10/1996 | Padovani et al. |
| 5,568,507 A | 10/1996 | Hershey et al. |
| 5,570,349 A | 10/1996 | Bustamante et al. |
| 5,570,353 A | 10/1996 | Keskitalo et al. |
| 5,570,369 A | 10/1996 | Jokinen |
| 5,572,516 A | 11/1996 | Miya et al. |
| 5,574,747 A | 11/1996 | Lomp |
| 5,574,754 A | 11/1996 | Kurihara et al. |
| 5,574,775 A | 11/1996 | Miller, II et al. |
| 5,574,983 A | 11/1996 | Douzono et al. |
| 5,574,984 A | 11/1996 | Reed et al. |
| 5,577,022 A | 11/1996 | Padovani et al. |
| 5,577,087 A | 11/1996 | Furuya |
| 5,579,374 A | 11/1996 | Doi et al. |

(56) References Cited

U.S. PATENT DOCUMENTS

| | | |
|---|---|---|
| 5,581,547 A | 12/1996 | Umeda et al. |
| 5,582,851 A | 12/1996 | Hofstetter et al. |
| 5,583,851 A | 12/1996 | Kato et al. |
| 5,585,850 A | 12/1996 | Schwaller |
| 5,586,113 A | 12/1996 | Adachi et al. |
| 5,590,409 A | 12/1996 | Sawahashi et al. |
| 5,594,718 A | 1/1997 | Weaver, Jr. et al. |
| 5,596,570 A | 1/1997 | Soliman |
| 5,602,832 A | 2/1997 | Hudson |
| 5,602,833 A | 2/1997 | Zehavi |
| 5,603,096 A | 2/1997 | Gilhousen et al. |
| 5,603,113 A | 2/1997 | De Loe, Jr. |
| 5,604,730 A | 2/1997 | Tiedemann, Jr. |
| 5,604,766 A | 2/1997 | Dohi et al. |
| 5,610,940 A | 3/1997 | Durrant et al. |
| 5,613,228 A | 3/1997 | Tuttle et al. |
| 5,614,914 A | 3/1997 | Bolgiano et al. |
| 5,619,524 A | 4/1997 | Ling et al. |
| 5,619,526 A | 4/1997 | Kim et al. |
| 5,621,416 A | 4/1997 | Lennen |
| 5,621,723 A | 4/1997 | Walton, Jr. et al. |
| 5,623,485 A | 4/1997 | Bi |
| 5,623,486 A | 4/1997 | Dohi et al. |
| 5,627,834 A | 5/1997 | Han et al. |
| 5,627,835 A | 5/1997 | Witter |
| 5,627,855 A | 5/1997 | Davidovici |
| 5,629,934 A | 5/1997 | Ghosh et al. |
| 5,629,955 A | 5/1997 | McDonough |
| 5,634,195 A | 5/1997 | Sawyer |
| 5,638,361 A | 6/1997 | Ohlson et al. |
| 5,638,362 A | 6/1997 | Dohi et al. |
| 5,640,414 A | 6/1997 | Blakeney, II et al. |
| 5,644,590 A | 7/1997 | Sugita |
| 5,648,955 A | 7/1997 | Jensen et al. |
| 5,649,292 A | 7/1997 | Doner |
| 5,649,299 A | 7/1997 | Battin et al. |
| 5,652,765 A | 7/1997 | Adachi et al. |
| 5,654,955 A | 8/1997 | Natali |
| 5,654,980 A | 8/1997 | Latva-aho et al. |
| 5,657,343 A | 8/1997 | Schilling |
| 5,659,573 A | 8/1997 | Bruckert et al. |
| 5,666,654 A | 9/1997 | Kanai |
| 5,673,259 A | 9/1997 | Quick, Jr. |
| 5,673,286 A | 9/1997 | Lomp |
| 5,675,581 A | 10/1997 | Soliman |
| 5,678,198 A | 10/1997 | Lemson |
| 5,689,502 A | 11/1997 | Scott |
| 5,689,815 A | 11/1997 | Yamazaki et al. |
| 5,691,974 A | 11/1997 | Zehavi et al. |
| 5,692,008 A | 11/1997 | Van Nee |
| 5,710,758 A | 1/1998 | Soliman et al. |
| 5,710,768 A | 1/1998 | Ziv et al. |
| 5,712,869 A | 1/1998 | Lee et al. |
| 5,715,236 A | 2/1998 | Gilhousen et al. |
| 5,715,521 A | 2/1998 | Fukasawa et al. |
| 5,715,526 A | 2/1998 | Weaver et al. |
| 5,715,536 A | 2/1998 | Banks |
| 5,717,713 A | 2/1998 | Natali |
| 5,719,898 A | 2/1998 | Davidovici et al. |
| 5,721,757 A | 2/1998 | Banh et al. |
| 5,722,051 A | 2/1998 | Agrawal et al. |
| 5,722,063 A | 2/1998 | Peterzell et al. |
| 5,724,236 A | 3/1998 | Oglesbee |
| 5,724,385 A | 3/1998 | Levin et al. |
| 5,732,328 A | 3/1998 | Mitra et al. |
| 5,734,639 A | 3/1998 | Bustamante |
| 5,734,647 A | 3/1998 | Yoshida et al. |
| 5,734,648 A | 3/1998 | Adachi et al. |
| 5,737,326 A | 4/1998 | I et al. |
| 5,737,327 A | 4/1998 | Ling et al. |
| 5,745,484 A | 4/1998 | Scott |
| 5,745,520 A | 4/1998 | Love et al. |
| 5,748,687 A | 5/1998 | Ozluturk |
| 5,751,705 A | 5/1998 | Sato |
| 5,751,739 A | 5/1998 | Seshadri et al. |
| 5,751,761 A | 5/1998 | Gilhousen |
| 5,751,763 A | 5/1998 | Bruckert |
| 5,754,803 A | 5/1998 | Regis |
| 5,757,767 A | 5/1998 | Zehavi |
| 5,758,266 A | 5/1998 | Kornfeld et al. |
| 5,764,687 A | 6/1998 | Easton |
| 5,771,226 A | 6/1998 | Kaku |
| 5,771,451 A | 6/1998 | Takai et al. |
| 5,771,461 A | 6/1998 | Love et al. |
| 5,781,541 A | 7/1998 | Schneider et al. |
| 5,781,542 A | 7/1998 | Tanaka et al. |
| 5,781,584 A | 7/1998 | Zhou et al. |
| 5,784,366 A | 7/1998 | Apelewicz |
| 5,784,406 A | 7/1998 | Dejaco et al. |
| 5,790,591 A | 8/1998 | Gold et al. |
| 5,796,776 A * | 8/1998 | Lomp et al. .................. 375/222 |
| 5,799,010 A | 8/1998 | Lomp et al. |
| 5,802,046 A | 9/1998 | Scott |
| 5,802,110 A | 9/1998 | Watanabe et al. |
| 5,805,994 A | 9/1998 | Perreault et al. |
| 5,806,003 A | 9/1998 | Jolma et al. |
| 5,809,020 A | 9/1998 | Bruckert et al. |
| 5,812,542 A | 9/1998 | Bruckert et al. |
| 5,812,593 A | 9/1998 | Kaku |
| 5,812,938 A | 9/1998 | Gilhousen et al. |
| 5,815,798 A | 9/1998 | Bhagalia et al. |
| 5,822,310 A | 10/1998 | Chennakeshu et al. |
| 5,822,318 A | 10/1998 | Tiedemann et al. |
| 5,822,359 A | 10/1998 | Bruckert et al. |
| 5,828,662 A | 10/1998 | Jalali et al. |
| 5,828,947 A | 10/1998 | Michel et al. |
| 5,841,768 A | 11/1998 | Ozluturk et al. |
| 5,841,806 A | 11/1998 | Gilhousen et al. |
| 5,842,113 A | 11/1998 | Nanda et al. |
| 5,844,935 A | 12/1998 | Shoji |
| 5,856,971 A | 1/1999 | Gitlin et al. |
| 5,862,489 A | 1/1999 | Aalto |
| 5,870,378 A | 2/1999 | Huang et al. |
| 5,870,393 A | 2/1999 | Yano et al. |
| 5,870,414 A | 2/1999 | Chaib et al. |
| 5,870,427 A | 2/1999 | Tiedemann et al. |
| 5,872,810 A * | 2/1999 | Philips et al. .................. 375/222 |
| 5,875,400 A | 2/1999 | Madhavapeddy et al. |
| 5,878,329 A | 3/1999 | Mallinckrodt |
| 5,878,350 A | 3/1999 | Nakamura et al. |
| 5,881,056 A | 3/1999 | Huang et al. |
| 5,881,368 A | 3/1999 | Grob et al. |
| 5,883,889 A | 3/1999 | Faruque |
| 5,883,899 A | 3/1999 | Dahlman et al. |
| 5,884,187 A | 3/1999 | Ziv et al. |
| 5,884,189 A | 3/1999 | Yamazaki |
| 5,884,196 A | 3/1999 | Lekven et al. |
| 5,893,035 A | 4/1999 | Chen |
| 5,896,368 A | 4/1999 | Dahlman et al. |
| 5,898,665 A | 4/1999 | Sawahashi et al. |
| 5,903,552 A | 5/1999 | Raith |
| 5,909,434 A | 6/1999 | Odenwalder et al. |
| 5,909,435 A | 6/1999 | Apelewicz |
| 5,912,919 A | 6/1999 | Lomp et al. |
| 5,918,155 A | 6/1999 | Nakamura et al. |
| 5,920,591 A | 7/1999 | Fukasawa |
| 5,924,015 A | 7/1999 | Garrison et al. |
| 5,926,500 A | 7/1999 | Odenwalder |
| 5,926,501 A | 7/1999 | Souissi et al. |
| 5,930,230 A | 7/1999 | Odenwalder et al. |
| 5,930,684 A | 7/1999 | Keskitalo et al. |
| 5,930,704 A | 7/1999 | Kay |
| 5,930,706 A | 7/1999 | Raith |
| 5,933,781 A | 8/1999 | Willenegger et al. |
| 5,940,382 A | 8/1999 | Haim |
| 5,940,771 A | 8/1999 | Gollnick et al. |
| 5,943,361 A | 8/1999 | Gilhousen et al. |
| 5,953,346 A | 9/1999 | Luddy |
| 5,959,980 A | 9/1999 | Scott |
| 5,966,403 A | 10/1999 | Pon |
| 5,978,412 A | 11/1999 | Takai |
| 5,978,413 A | 11/1999 | Bender |
| 5,987,014 A | 11/1999 | Magill et al. |
| 5,991,329 A | 11/1999 | Lomp et al. |

(56) References Cited

U.S. PATENT DOCUMENTS

| | | | | |
|---|---|---|---|---|
| 5,991,332 | A | 11/1999 | Lomp et al. | |
| 5,991,627 | A | 11/1999 | Honkasalo et al. | |
| 6,005,856 | A | 12/1999 | Jensen et al. | |
| 6,018,528 | A | 1/2000 | Gitlin et al. | |
| 6,021,123 | A | 2/2000 | Mimura | |
| 6,035,197 | A | 3/2000 | Haberman et al. | |
| 6,038,577 | A | 3/2000 | Burshtein | |
| 6,049,535 | A | 4/2000 | Ozukturk et al. | |
| 6,072,787 | A | 6/2000 | Hamalainen et al. | |
| 6,088,324 | A | 7/2000 | Sato | |
| 6,088,335 | A | 7/2000 | I et al. | |
| 6,088,399 | A | 7/2000 | Luz et al. | |
| 6,104,748 | A | 8/2000 | Kaku | |
| 6,108,537 | A | 8/2000 | Comer et al. | |
| 6,122,292 | A | 9/2000 | Watanabe et al. | |
| 6,137,840 | A | 10/2000 | Tiedemann, Jr. et al. | |
| 6,141,374 | A | 10/2000 | Burns | |
| 6,157,619 | A | 12/2000 | Ozluturk et al. | |
| 6,172,994 | B1 | 1/2001 | Schaffner et al. | |
| 6,173,162 | B1 | 1/2001 | Dahlman et al. | |
| 6,181,949 | B1 | 1/2001 | Ozluturk et al. | |
| 6,195,327 | B1 | 2/2001 | Lysejko et al. | |
| 6,212,174 | B1 | 4/2001 | Lomp et al. | |
| 6,212,399 | B1 | 4/2001 | Kumar et al. | |
| 6,212,566 | B1 | 4/2001 | Vanhoof et al. | |
| 6,215,778 | B1 | 4/2001 | Lomp et al. | |
| 6,215,814 | B1 | 4/2001 | Ylitalo et al. | |
| 6,226,316 | B1 | 5/2001 | Schilling et al. | |
| 6,229,843 | B1 | 5/2001 | Lomp et al. | |
| 6,252,866 | B1 | 6/2001 | Haim | |
| 6,269,113 | B1 | 7/2001 | Park | |
| 6,272,168 | B1 | 8/2001 | Lomp et al. | |
| 6,286,040 | B1 | 9/2001 | Durham | |
| 6,289,040 | B1 | 9/2001 | Molev-Shteiman | |
| 6,292,519 | B1 | 9/2001 | Popovic | |
| 6,324,208 | B1 | 11/2001 | Bhagalia et al. | |
| 6,335,923 | B2 | 1/2002 | Kubo et al. | |
| 6,335,924 | B1 | 1/2002 | Yano et al. | |
| 6,341,143 | B1 * | 1/2002 | Nelson et al. | 375/222 |
| 6,347,083 | B1 | 2/2002 | Nishino | |
| 6,356,555 | B1 | 3/2002 | Rakib et al. | |
| 6,381,264 | B1 | 4/2002 | Lomp et al. | |
| 6,393,049 | B1 | 5/2002 | Davidovici et al. | |
| 6,396,867 | B1 | 5/2002 | Tiedemann, Jr. et al. | |
| 6,396,897 | B1 | 5/2002 | Ebrahimifard et al. | |
| 6,397,070 | B1 | 5/2002 | Black | |
| 6,405,272 | B1 | 6/2002 | Regis | |
| 6,434,124 | B1 | 8/2002 | Rege | |
| 6,438,119 | B1 | 8/2002 | Kim et al. | |
| 6,456,608 | B1 | 9/2002 | Lomp | |
| 6,463,089 | B1 | 10/2002 | Chauncey et al. | |
| 6,463,295 | B1 | 10/2002 | Yun | |
| 6,473,447 | B1 | 10/2002 | Strich et al. | |
| 6,487,190 | B1 | 11/2002 | Regis | |
| 6,490,462 | B2 | 12/2002 | Ozluturk et al. | |
| 6,493,563 | B1 | 12/2002 | Ozluturk et al. | |
| 6,507,745 | B2 | 1/2003 | Ozluturk et al. | |
| 6,510,148 | B1 | 1/2003 | Honkasalo | |
| 6,519,277 | B2 | 2/2003 | Eidson | |
| 6,519,461 | B1 | 2/2003 | Andersson et al. | |
| 6,519,474 | B2 | 2/2003 | Ozluturk et al. | |
| 6,539,008 | B1 | 3/2003 | Ahn et al. | |
| 6,546,058 | B1 | 4/2003 | Gilhousen et al. | |
| 6,549,525 | B2 | 4/2003 | Odenwalder | |
| 6,549,565 | B1 | 4/2003 | Buehrer et al. | |
| 6,571,105 | B2 | 5/2003 | Ozluturk et al. | |
| 6,575,368 | B1 | 6/2003 | Tamburrini et al. | |
| 6,577,876 | B2 | 6/2003 | Ozluturk et al. | |
| 6,587,447 | B1 | 7/2003 | Wang et al. | |
| 6,590,883 | B1 | 7/2003 | Kitade et al. | |
| 6,590,889 | B1 | 7/2003 | Preuss et al. | |
| 6,606,503 | B2 | 8/2003 | Ozluturk et al. | |
| 6,608,825 | B1 | 8/2003 | Luddy | |
| 6,633,600 | B2 | 10/2003 | Lomp et al. | |
| 6,654,613 | B1 | 11/2003 | Maeng et al. | |
| 6,661,835 | B1 * | 12/2003 | Sugimoto et al. | 375/148 |
| 6,671,266 | B1 | 12/2003 | Moon et al. | |
| 6,674,788 | B2 | 1/2004 | Lomp et al. | |
| 6,674,791 | B2 | 1/2004 | Lomp et al. | |
| 6,697,350 | B2 | 2/2004 | Lomp | |
| 6,707,805 | B2 | 3/2004 | Ozluturk et al. | |
| 6,708,041 | B1 | 3/2004 | Butovitsch et al. | |
| 6,721,301 | B2 | 4/2004 | Ozluturk et al. | |
| 6,724,740 | B1 | 4/2004 | Choi et al. | |
| RE38,523 | E | 6/2004 | Ozluturk | |
| 6,744,809 | B2 | 6/2004 | Lomp et al. | |
| 6,760,321 | B2 | 7/2004 | Shamsunder | |
| 6,763,244 | B2 | 7/2004 | Chen et al. | |
| 6,766,143 | B1 | 7/2004 | Beckwith | |
| 6,778,511 | B1 | 8/2004 | Magnus et al. | |
| 6,778,551 | B1 | 8/2004 | Oh | |
| 6,778,840 | B2 | 8/2004 | Ozluturk et al. | |
| 6,785,251 | B2 * | 8/2004 | Bolgiano et al. | 370/335 |
| 6,788,662 | B2 * | 9/2004 | Ozluturk et al. | 370/335 |
| 6,801,516 | B1 | 10/2004 | Lomp et al. | |
| 6,816,473 | B2 | 11/2004 | Ozluturk et al. | |
| 6,831,905 | B1 | 12/2004 | Lomp et al. | |
| 6,839,567 | B2 | 1/2005 | Ozluturk et al. | |
| 6,847,821 | B1 | 1/2005 | Lewis et al. | |
| 6,850,499 | B2 | 2/2005 | Wheatley et al. | |
| 6,853,675 | B1 | 2/2005 | Oleynik | |
| 6,865,168 | B1 | 3/2005 | Sekine | |
| 6,873,645 | B2 | 3/2005 | Lomp et al. | |
| 6,879,841 | B2 | 4/2005 | Ozluturk et al. | |
| 6,885,652 | B1 | 4/2005 | Ozukturk et al. | |
| 6,904,294 | B2 | 6/2005 | Ozluturk et al. | |
| 6,907,020 | B2 | 6/2005 | Periyalwar | |
| 6,940,840 | B2 * | 9/2005 | Ozluturk et al. | 370/335 |
| 6,956,835 | B2 | 10/2005 | Tong et al. | |
| 6,973,579 | B2 | 12/2005 | Dick et al. | |
| 6,975,672 | B2 | 12/2005 | Bottomley et al. | |
| 6,977,915 | B2 | 12/2005 | Chen et al. | |
| 6,983,009 | B2 | 1/2006 | Lomp | |
| 6,985,467 | B2 | 1/2006 | Lomp et al. | |
| 7,010,320 | B2 | 3/2006 | Komatsu | |
| 7,020,111 | B2 | 3/2006 | Ozluturk et al. | |
| 7,039,029 | B2 | 5/2006 | Lee et al. | |
| 7,050,481 | B1 | 5/2006 | Hulbert | |
| 7,061,888 | B2 | 6/2006 | Sakoda | |
| 7,072,380 | B2 | 7/2006 | Ozluturk et al. | |
| 7,079,522 | B1 | 7/2006 | Kim et al. | |
| 7,085,583 | B2 | 8/2006 | Ozluturk et al. | |
| 7,117,004 | B2 | 10/2006 | Ozluturk et al. | |
| 7,123,600 | B2 | 10/2006 | Ozluturk et al. | |
| 7,123,607 | B2 | 10/2006 | Yokoyama et al. | |
| 7,133,460 | B2 | 11/2006 | Bae et al. | |
| 7,184,426 | B2 | 2/2007 | Padovani et al. | |
| 7,190,966 | B2 | 3/2007 | Ozluturk et al. | |
| 7,212,820 | B2 | 5/2007 | Persson et al. | |
| 7,233,591 | B2 | 6/2007 | Holtzman et al. | |
| 7,286,847 | B2 | 10/2007 | Ozluturk et al. | |
| RE39,980 | E | 1/2008 | Dent | |
| 7,339,894 | B2 | 3/2008 | Corazza | |
| 7,403,508 | B1 | 7/2008 | Miao | |
| 7,420,945 | B2 | 9/2008 | Ponnekanti | |
| 7,430,257 | B1 | 9/2008 | Shattil | |
| 7,437,177 | B2 | 10/2008 | Ozluturk et al. | |
| 7,502,406 | B2 | 3/2009 | Lomp et al. | |
| 7,535,874 | B2 | 5/2009 | Ozluturk et al. | |
| 7,583,225 | B2 | 9/2009 | Cohen et al. | |
| 7,593,453 | B2 | 9/2009 | Lomp et al. | |
| 7,656,931 | B2 | 2/2010 | Smith et al. | |
| 7,706,332 | B2 | 4/2010 | Ozluturk et al. | |
| 7,706,830 | B2 | 4/2010 | Ozluturk et al. | |
| 7,756,190 | B2 | 7/2010 | Lomp et al. | |
| 7,839,960 | B2 | 11/2010 | Gilhousen et al. | |
| 7,873,328 | B2 | 1/2011 | Ozluturk et al. | |
| 7,903,613 | B2 | 3/2011 | Ozluturk et al. | |
| 7,929,498 | B2 | 4/2011 | Ozluturk et al. | |
| 7,986,749 | B2 | 7/2011 | Tiedemann, Jr. et al. | |
| 8,009,636 | B2 | 8/2011 | Ozluturk et al. | |
| 8,208,513 | B2 | 6/2012 | Amde et al. | |
| 8,213,485 | B2 | 7/2012 | Odenwalder | |
| 8,248,912 | B2 | 8/2012 | Chen et al. | |

(56) References Cited

U.S. PATENT DOCUMENTS

| | | | |
|---|---|---|---|
| 8,285,318 | B2 | 10/2012 | Chen et al. |
| 2002/0051434 | A1 | 5/2002 | Ozluturk et al. |
| 2004/0005020 | A1 | 1/2004 | Dent |
| 2005/0243897 | A1 | 11/2005 | Lomp et al. |
| 2007/0002934 | A1 | 1/2007 | Schilling |
| 2008/0304552 | A1 | 12/2008 | Pataguppe et al. |
| 2009/0103508 | A1 | 4/2009 | Lomp et al. |
| 2010/0002752 | A1 | 1/2010 | Lomp et al. |
| 2010/0157950 | A1 | 6/2010 | Ozluturk et al. |
| 2010/0272155 | A1 | 10/2010 | Lomp et al. |
| 2010/0277878 | A1 | 11/2010 | Sekido |
| 2011/0194571 | A1 | 8/2011 | Ozluturk et al. |
| 2012/0008598 | A1 | 1/2012 | Ozluturk et al. |

FOREIGN PATENT DOCUMENTS

| | | |
|---|---|---|
| EP | 0022170 | 1/1981 |
| EP | 0372350 | 6/1990 |
| EP | 0462572 | 12/1991 |
| EP | 0464839 | 1/1992 |
| EP | 0476215 | 3/1992 |
| EP | 0515335 | 5/1992 |
| EP | 0505341 | 9/1992 |
| EP | 0525860 | 2/1993 |
| EP | 0526106 | 2/1993 |
| EP | 0565507 | 10/1993 |
| EP | 0615395 | 9/1994 |
| EP | 0631397 | 12/1994 |
| EP | 0637179 | 2/1995 |
| EP | 0654913 | 5/1995 |
| EP | 0656716 | 6/1995 |
| EP | 0668662 | 8/1995 |
| EP | 0682423 | 11/1995 |
| EP | 0744876 | 11/1996 |
| EP | 1933470 | 6/2008 |
| FR | 2712129 | 5/1995 |
| GB | 2280575 | 2/1995 |
| GB | 2301746 | 12/1996 |
| JP | S62-256516 | 11/1987 |
| JP | S63-198423 | 8/1988 |
| JP | H01-124730 | 8/1989 |
| JP | H02-042500 | 2/1990 |
| JP | H02-84832 | 3/1990 |
| JP | H02-220526 | 9/1990 |
| JP | H02-256331 | 10/1990 |
| JP | H02-287874 | 11/1990 |
| JP | H03-040535 | 2/1991 |
| JP | H04-114521 | 4/1992 |
| JP | H04-222111 | 8/1992 |
| JP | H04-287593 | 10/1992 |
| JP | H05-022285 | 1/1993 |
| JP | H05-083381 | 4/1993 |
| JP | H05-129969 | 5/1993 |
| JP | H05-144128 | 6/1993 |
| JP | H07-030483 | 7/1993 |
| JP | 5-227124 | 9/1993 |
| JP | H05-235906 | 9/1993 |
| JP | H05-244056 | 9/1993 |
| JP | H05-327580 | 10/1993 |
| JP | H05-300077 | 11/1993 |
| JP | H06-006374 | 1/1994 |
| JP | H06-77963 | 3/1994 |
| JP | H06-104694 | 4/1994 |
| JP | H06-104829 | 4/1994 |
| JP | H06-120865 | 4/1994 |
| JP | 06-268574 | 9/1994 |
| JP | H06-276176 | 9/1994 |
| JP | H06-343068 | 12/1994 |
| JP | H07-046180 | 2/1995 |
| JP | H07-050631 | 2/1995 |
| JP | H07-058665 | 3/1995 |
| JP | H07-079477 | 3/1995 |
| JP | H07-087011 | 3/1995 |
| JP | H07-095151 | 4/1995 |
| JP | H07-107007 | 4/1995 |
| JP | H07-107033 | 4/1995 |
| JP | H07-123016 | 5/1995 |
| JP | H07-154297 | 6/1995 |
| JP | H07-38496 | 7/1995 |
| JP | H07-273600 | 10/1995 |
| JP | H07-336323 | 12/1995 |
| JP | H07-336765 | 12/1995 |
| JP | H08-32513 | 2/1996 |
| JP | H08-37515 | 2/1996 |
| JP | H08-307320 | 11/1996 |
| JP | S63-23425 | 1/1998 |
| JP | 2001-166841 | 6/2001 |
| WO | 9013942 | 11/1990 |
| WO | 9200639 | 1/1992 |
| WO | 9222157 | 10/1992 |
| WO | 9221196 | 11/1992 |
| WO | 9307702 | 4/1993 |
| WO | 9309626 | 5/1993 |
| WO | 9314588 | 7/1993 |
| WO | 9315573 | 8/1993 |
| WO | 9416513 | 7/1994 |
| WO | 9428640 | 12/1994 |
| WO | 9503652 | 2/1995 |
| WO | 9507578 | 3/1995 |
| WO | 9508876 | 3/1995 |
| WO | 9512257 | 5/1995 |
| WO | 9515038 | 6/1995 |
| WO | 9702665 | 1/1997 |
| WO | 9702675 | 1/1997 |
| WO | 9707600 | 2/1997 |

OTHER PUBLICATIONS

U.S. Appl. No. 60/090,236, Jun. 1998, Butovitsch, P., et al.
U.S. Appl. No. 60/177,093, Jan. 2000, Wen, Tong.
U.S. Appl. No. 60/290,740, May. 2001, Terry, S., et al.
"Final Initial Determination," In the Matter of Certain 3G Mobile Handsets and Components, Investigation No. 337-TA-613 (Aug. 14, 2009).
"Notice of Commission Determination to Review in Part a Final Determination Finding No Violation of Section 337 and on Review to Affirm the Administrative Law Judge's Determination of no Violation; Termination of Investigation," In the Matter of Certain 3G Mobile Handsets and Components, Investigation No. 337-TA-613 (Oct. 16, 2009).
"Public Version of Respondents Samsung Electronics America, Inc.'s and Samsung Telecommunications America LLC's Response to the Complaint and Notice of Investigation," *In the Matter of Certain 3G Wideband Code Division Multiple Access (WCDMA) Handsets and Components Thereof*, (United States International Trade Commission), (Investigation No. 337-TA-601), (May 31, 2007).
Abeta et al, "A Coherent Detection System with a Suppressed Pilot Channel for DS/CDMA Systems," Technical Report of IEICE, B-II, vol. J77-B-II, No. 11, pp. 641-648, Japan, Nov. 1994.
Alavi, Power Control and Interference Management in a Spread-Spectrum Cellular Mobile Radio System, (1984) (unpublished Ph.D. thesis—Michigan State University Department of Electrical Engineering and Systems Science) (on file with the Michigan State University Libraries).
Andermo et al., "A CDMA-Based Radio Access Design for UMTS," *IEEE Personal Communications*, pp. 48-53, (Feb. 1995).
Andermo et al., "Code Division Testbed, CODIT," *Record*, ICUPC'93 Conference, pp. 397-401, (IEEE 1993).
Andermo et al., "CODIT, a Testbed Project Evaluating DS-CDMA for UMTS/FPLMTS," pp. 21-25, IEEE (1994).
Andermo, "CODIT Final Review Report," R2020/ERA/PM/DS/P/050b1, Issue 2.0, *UMTS Code Division Testbed(CODIT)* (Nov. 21, 1995).
Andersson et al., "PCS Support in IS-54C," Third Annual International Conference on Universal Personal Communications, pp. 114-118 (Sep. 1994).
Association of Radio Industries and Businesses (ARIB), *Specifications of Air-Interface for 3G Mobile System*, vol. 3, ver. 1.0 (Jan. 14, 1999).

(56) References Cited

OTHER PUBLICATIONS

Azad et al., "Multirate Spread Spectrum Direct Sequence CDMA Techniques", *IEEE Colloquium on Spread Spectrum Techniques for Radio Communication Systems*, Digest No. 1994/098, pp. 4/1-4/5, (IEEE, 1994).

Baier et al., "Design Study for a CDMA Based Third Generation Mobile Radio System," *IEEE Journal on Selected Areas in Communications*, vol. 12, No. 4, pp. 733-743, (May 1994).

Bernasoni, "Receiver Architectures for the Down-Link in a DS-CDMA Mobile System," pp. 51-55 (IEEE, Sep. 1994).

Blahut, *Theory and Practice of Error Control Codes*, (Addison-Wesley Publishing Company, 1983).

Blasbalg, "A Comparison of Pseudo-Noise and Conventional Modulation for Multiple-Access Satellite Communications," *IBM Journal*, pp. 241-255, (Jul. 1965).

Braun et al., "An All-Digital Receiver for Satellite Audio Broadcasting Signals Using Trellis Coded Quasi-Orthogonal Code-Division Multiplexing," *European Transactions on Telecommunications and Related Technologies*, vol. 4, No. 1, pp. 23-32, (Feb. 1993).

Brismark et al., "A Coherent Detection Scheme for the Uplink Channel in a CDMA System, " 1994 IEEE 44th Vehicular Technology Conference, Stockholm, Sweden, vol. 2, pp. 729-732 (Jun. 1994).

Cameron et al., "An Analysis of CDMA With Imperfect Power Control," *1993 43$^{rd}$IEEE Vehicular Technology Conference*, (Seacaucus, NJ, May 18-20, 1993), pp. 977-979, (IEEE 1992).

Chuang et al., "Uplink Power Control for TDMA Portable Radio Channels," *IEEE Transactions on Vehicular Technology*, vol. 43, No. 1, pp. 33-39, (Feb. 1994).

Cosmas et al., "Overview of the Mobile Communication Programme of RACE II," *Electronics and Engineering Journal*, pp. 155-167, (Aug. 1995).

D'Avella et al., "Power Control in CDMA Systems: Performance Evaluation and System Design Implications," Universal Personal Communications, 1994, Record, 1994 Third Annual International Conference On, pp. 73-77 (Sep. 27-Oct. 1, 1994).

Dixon, *Spread Spectrum Systems With Commerical Applications*, Third Edition, pp. 412-415 (John Wiley & Sons, Inc. 1994).

Esmailzadeh et al., "Power Control in Packet Switched Time Division Duplex Direct Sequence Spread Spectrum Communications," *Vehicular Technology Conference, 1992 IEEE 42nd*, vol. 2, pp. 989-992 (May 10-13, 1992).

ETSI TC-RES, European Telecommunication Standard ETS 300 444, "Radio Equipment and Systems (RES); Digital European Cordless Telecommunications (DECT) Generic Access Profile (GAP)," (European Telecommuncation Standards Institute, Dec. 1995).

ETSI TC-RES, European Telecommunication Standard prETS 300 444, "Radio Equipment and Systems (RES); Digital European Cordless Telecommunications (DECT) Generic Access Profile (GAP), " (European Telecommunication Standards Institute, Feb. 1995).

ETSI TC-RES, Interim European Telecommunication Standard (I-ETS) 300 131, "Radio Equipment and Systems (RES); Common Air Interface Specification to be used for the interworking between cordless telephone apparatus in the frequency band 864, 1 MHz to 868, 1 MHz, including public services," (European Telecommunication Standards Institute, Apr. 1992).

ETSI TC-SMG, European Telecommunication Standard ETS 300 557, "Digital Cellular Telecommunications System (Phase 2); Mobile Radio Interface Layer 3 Specification (GSM 04.08)", Fourth Edition (European Telecommunications Standards Institute, May 1996).

ETSI TC-SMG, European Telecommunication Standard ETS 300 578, "Digital Cellular Telecommunications System (Phase 2); Radio Subsystem Link Control (GSM 05.08)", Fifth Edition (European Telecommunications Standards Institute, May 1996).

Expert Report of Mark Lanning Regarding of U.S. Patent Numbers: 6,674,791; 7,117,004; 7,190,966; and 7,286,847, In the Matter of Certain 3G Mobile Handsets and Components, Investigation No. 337-TA-613, Feb. 1, 2008.

Expert Report of Mark Lanning Regarding Invalidity of U.S. Patent Numbers: 6,674,791 and 7,190,966, In the Matter of Certain 3G Mobile Handsets and Components Thereof, Investigation No.337-TA-601, Oct. 17, 2007.

Fluhr et al, "Advanced Mobile Phone Service: Control Architecture, " *The Bell System Technical Journal*, vol. 58, No. 1, pp. 43-69, (American Telephone and Telegraph Company Jan. 1979).

Giannetti et al., "Design of an All-Digital Receiver for Narrowband Continuous-Phase Asynchronous CDMA Systems," vol. 3, pp. 468-472 (IEEE, May 1993).

Hagmanns et al., "Code Division Multiple Access (CDMA): das natürliche Zugriffesverfahren für den zellularen Mobilfunk (Code Division Multiple Access (CDMA): The Natural Access Procedure for Cellular Mobile Radio Systems)," 8273 ANT Nachrichtentechnische Berichte, No. 10, pp. 64-71, (Aug. 1993, Backnang, DE). Translation of paper provided, pp. 1-17.

Hinderling et al., "CDMA Mobile Station Modem ASIC," *IEEE Journal Of Solid State Circuits*, vol. 28, No. 3, pp. 253-260, (Mar. 1993).

Hinderling et al., "Digital automobile/mobile telephone type CDMA modulation demodulation circuits integrated into a chip," NIKKEI ELECTRONICS, Apr. 26 issue, No. 579, pp. 163-175, Nikkei Business Publications, Inc. (Apr. 26, 1993) (Not available in English).

Holtzman, "A Simple, Accurate Method To Calculate Spread-Spectrum Multiple-Access Error Probabilities," *IEEE Transactions On Communications*, vol. 40, No. 3, pp. 461-464, (IEEE, Mar. 1992).

I et al., "Multi-Code CDMA Wireless Personal Communications Networks," pp. 1060-1064, (IEEE, 1995).

I et al., "Performance of Multi-Code CDMA Wireless Personal Communications Networks", pp. 907-911, (IEEE, 1995).

I et al., "Variable Spreading Gain CDMA with Adaptive Control for True Packet Switching Wireless Network", pp. 725-730, (IEEE, 1995).

Interdigital/Siemens, "Functional Interface Specification (FIS) for Radio in the Local Loop based on B-CDMA, CDMA*link* version 1," Issue 1.0 (Siemens AG Jun. 23, 1995).

International Dictionary of Physics and Electronics, Second Edition, pp. 612 and 952, (D. Van Nostrand Company, Inc. 1956, 1961).

Kato et al., An improvement on channel quality for personal communications systems, Proceedings of General Conference 1995 of the Institute of Electronics, Information and Communication Engineers, Communication 1, p. 513, B513, (Mar. 10, 1995).

Kohno et al., "Spread Spectrum Access Methods for Wireless Communications," *IEEE Communications*, vol. 33, No. 1, pp. 58-67, (IEEE, Jan. 1995).

Komo et al., "Implementation Consideration Of Code Division Access Sequences, " *23$^{RD}$ Southeastern Symposium On System Theory*, pp. 11-15, (Mar. 12, 1991).

Krzymien et al., "Rapid Acquisition Algorithms for Synchronization of Bursty Transmissions in CDMA Microcellular and Personal Wireless Systems", *IEEE Journal on Selected Areas in Communications*, vol. 14, No. 3, pp. 570-579, (Apr. 1996).

Lee. "Overview of Cellular CDMA," *IEEE Transactions on Vehicular Technology*, vol. 40, No. 2, pp. 291-302, (May 1991).

Liu et al., "SIR-Based Call Admission Control for DS-CDMA Cellular Systems, " *IEEE Jounral on Selected Areas in Communications*, vol. 12, No. 14, pp. 638-644 (May 1994).

McDonald, *Fundamentals of Digital Switching*, (Plenum Press, 1983).

McEliece, R. J., "Correlation Properties of Sets of Sequences Derived from Irreducible Cyclic Codes," *Information and Control 45*, pp. 18-25 (1980).

McFarlane et al., "Validation of Advanced CDMA Concepts for UMTS and FPLMTS, " pp. 36-40, (IEEE 1994).

McFarlane, "UMTS Revisited," (IEE, London, UK 1994).

MPT 1375, Common Air Interface Specification to be Used for the Interworking between Cordless Telephone Appartus (May 1989).

Nettleton, Spectral Efficiency in Cellular Land-Mobile Communications: A Spread Spectrum Approach, (1978) (unpublished Ph.D. thesis, Purdue University) (on file with UMI Dissertation Information Service).

Nokia Corporation and Nokia Inc.'s Response to the Amended Complaint and Amended Notice of Investigation, In the Matter of Certain

(56) References Cited

OTHER PUBLICATIONS

Wireless Devices with 3G Capabilities and Components Thereof, Investigation No. 337-TA-800, Jan. 27, 2012.
Nokia Corporation and Nokia Inc.'s Response to the Complaint and Notice of Investigation, In the Matter of Certain Wireless Devices with 3G Capabilities and Components Thereof, Investigation No. 337-TA-800, Sep. 27, 2011.
Okazaki et al., "Transmission Power Control Method for Wide-band DS/CDMA Transmission," Proceedings of the 1995 IEICE General Conference, [Communications 1] , B-425, p. 425 (Mar. 10, 1995) (Not available in English).
Ormondroyd, "Power Control for Spread-Spectrum Systems," *Conference on Communications Equipment and Systems*, pp. 109-115, (Apr. 20-22, 1982).
Pahlavan et al., "Performance of Adaptive Matched Filter Receivers Over Fading Multipath Channels," *IEEE Transactions on Communications*, vol. 38, No. 12, pp. 2106-2113, (Dec. 1990).
Public Version of Respondents Nokia Corporation and Nokia Inc.'s Response to the Complaint and Notice of Investigation, In the Matter of Certain 3G Mobile Handsets and Components Thereof, Investigation No. 337-TA-613, Oct. 5, 2007.
Public Version of Respondents Nokia Corporation and Nokia Inc.'s Response to the Second Amended Complaint and Notice of Investigation, In the Matter of Certain 3G Mobile Handsets and Components Thereof, Investigation No. 337-TA-613, Dec. 31, 2007.
Pursley, "Performance Evaluation for Phase-Coded Spread-Spectrum Multiple-Access Communication—Part 1: System Analyiss," *IEEE Transactions on Communications*, vol. COM-25, No. 8, pp.795-799, (Aug. 1977).
Qualcomm, "Proposed EIA/TIA Interim Standard: Wideband Spread Spectrum Digital Cellular System Dual-Mode Mobile Station—Base Station Compatibility Standard," TR45.5, (Apr. 21, 1992).
Response of Respondent Futurewei to Complaint Under Section 337 of the Tariff Act of 1930, as Amended, and Notice of Investigation, In the Matter of Certain Wireless Devices with 3G Capabilities and Components Thereof, Investigation No. 337-TA-800, Sep. 27, 2011.
Response of Respondent Huawei to Amended Complaint Under Section 337 of the Tariff Act of 1930, as Amended, and Amended Notice of Investigation, In the Matter of Certain Wireless Devices with 3G Capabilities and Components Thereof, Investigation No, 337-TA-800, Jan. 27, 2012. ††
Response of Respondent Huawei to Complaint Under Section 337 of the Tariff Act of 1930, as Amended, and Notice of Investigation, In the Matter of Certain Wireless Devices with 3G Capabilities and Components Thereof, Investigation No. 337-TA-800, Sep. 27, 2011.
Response of ZTE Corporation and ZTE (USA) to the Amended Complaint of Interdigital Communications, LLC, Interdigital Technology Corp., and IPR Licensing, Inc. under Section 337 of the Tariff Act of 1930, as Amended, and Notice of Investigation, In the Matter of Certain Wireless Devices with 3G Capabilities and Components Thereof, Investigation No. 337-TA-800, Jan. 27, 2012.
Rick et al., "Noncoherent Parallel Acquisition in CDMA Spread Spectrum Systems," IEEE, pp. 1422-1426, (May 1994).
Salmasi et al., "On the System Design Aspects of Code Division Multiple Access (CDMA) Applied to Digital Cellular and Personal Communications Networks," *Vehicular Technology Conference, 1991, 'Gateway to the Future Technology in Motion', 41st IEEE*,pp. 57-62, (May 19-22, 1991).
Sarwate et al, "Crosscorrelation Properties of Pseudorandom and Related Sequences," Proceedings of the IEEE, IEEE, New York, US, vol, 68, No. 5, pp. 593-619, XF002939579 (May 1, 1980).
Sasaki et al., "Voice Activity Detection and Transmission Error Control for Digital Cordless Telephone System," IEICE Transactions on Communications, vol. E77-B, No. 7, pp. 948-954 (Jul. 1994).
Schilling, "Broadband-CDMA: *ONEPHONE* for A Wireless Twenty First Century," ICPWC'94, pp. 1-5, (IEEE 1994).
Schnell, "Hadamard Codewords as Orthogonal Spreading Sequences in Synchronous DS CDMA Systems for Mobile Radio Channels," IEEE Third International Symposium on Spread Spectrum Techniques and Applications, vol. 2, pp. 505-509, (Jul. 4-6, 1994).

Scholtz, "The Origins of Spread Spectrum Communications," *IEEE Transactions on Communications*, vol. COM-30, No. 5, pp. 822-854, (May 1982).
Siemens AG, "CDMA/link System Description," ver. 3.00 (Mar. 10, 1995).
Simon et al., *Spread Spectrum Communications Handbook*, Revised Edition pp. 262-396, (McGraw Hill New York, 1994).
Simpson et al., "CDMA Power Control, Interleaving, and Coding," *41st IEEE Vehicular Technology Conference*, (St. Louis, MO , May 19-22, 1991) pp. 362-367, (IEEE 1991).
Simpson et al., "Direct Sequence CDMA Power Control, Interleaving and Coding," *IEEE Journal on Selected Areas in Communications*, vol. 11, No. 7, pp. 1085-1095, (Sep. 1993).
Soliman et al., "CDMA Reverse Link Open Loop Power Control," *Globecom '92 IEEE Global Telecommunications Conference* (Orlando, FL, Dec. 6-9, 1992) pp. 69-73, (IEEE 1992).
Southcott et al., "Voice Control of the Pan-European Digital Mobile Radio System," Proceedings of the Global Telecommunications Conference and Exhibition, IEEE Global Telecommunications Conference and Exhibition, Communications Technology for the 1990s and Beyond, vol. 2, pp. 1070-1074 (Nov. 1989).
Supplemental Response of Respondent Futurewei to Complaint Under Section 337 of the Tariff Act of 1930, as Amended, and Notice of Investigation, In the Matter of Certain Wireless Devices with 3G Capabilities and Components Thereof, Investigation No. 337-TA-800, Jan. 12, 2012.
Tachikawa et al., "Nonlinear Code Sequence for Rapid Acquisition—Ref. 3", Study Report of the Spread Spectrum Communication System Study Group, The Institute of Electrical, Information, Electronics and Communications Engineers of Japan (IEIEC), (March 25, 1987). Translation provided.
Telecommunications Industry Association, TIA/EIA/IS-95-A (Revision of TIA/EIA/IS-95), "TIA/EIA Interim Standard: Mobile Station—Base Station Compatibility Standard For Dual-Mode Wideband Spread Spectrum Cellular System," (May 1995).
TIA/EIA/IS-95, "Mobile Station-Base Station Compatibility Standard for Dual-Mode Wideband Spread Spectrum Cellular System", TIA/EIA Interim Standard, pp. 7-12, 7.14, and 7.15, (Telecommunications Industry Association, Jul. 1993).
TIA/EIA/IS-95-A, "Mobile Station-Base Station Compatibility Standard for Dual-Mode Wideband Spread Spectrum Cellular System", TIA/EIA Interim Standard, (Telecommunications Industry Association, May 1995).
Tiedemann et al., "The Design and Development of A Code Division Multiple Access (CDMA) System for Cellular And Personal Communications, " *IEEE International Symposium on Personal, Indoor and Mobile Radio Communications*, (London, UK, Sep. 23-25, 1991) pp. 131-136, (IEEE 1991).
Van Nielen, "UMTS: A Third Generation Mobile System," *PIMRC '92*, (Boston, MA, Oct. 19-21, 1992) pp. 17-21, (1992).
Wu et al, "A Study on Wireless Multi-media CDMA Systems that Maximize Throughput," Technical Report of IEICE, It94-114, SST94-97, pp. 25-30, Japan, Mar. 1995.
Zagami et al., "Providing Universal Location Services Using A Wireless E911 Location Network," *IEEE Communications Magazine*, pp. 66-71, (Apr. 1998).
Ziemer et al., *Digital Communications and Spread Spectrum Systems*, pp. 492-494 (Collier Macmillan 1985).
Zimmerman et al., "CDMA und ATM-zwei Technologien, ein Zeil, (CDMA and ATM—Ideal Partners)" *2323 Telecom Report Siemens*, vol. 18, No. 2, pp. 60-63, (1995 Maerz/Apr., München, DE), from http://www.siemens.de/telcom/artikel/0295/295zimm.htm Translation provided in: *Siemens Telcom Report International* from http://www.siemens.de/telcom/articles/e0395/395zimm.htm.
Baier et al., "Multi-Rate DS-CDMA radio interface for third-generation cellular system," Mobile and Personal Communications, pp. 255-260, Seventh IEE European Conference, Dec. 15, 1993.
Errata to Response of Respondents Samsung Electronics Co., Ltd., Samsung Electronics America, Inc., and Samsung Telecommunications America, LLC to the Complaint and Notice of Investigation, In the Matter of Certain Wireless Devices with 3G and/or 4G Capabilities and Components Thereof, Investigation No. 337-TA-868, Feb. 28, 2013.

(56) References Cited

OTHER PUBLICATIONS

Errata to Response of Huawei Respondents Complaints Under Section 337 of the Tariff Act of 1930, As Amended, and Notice of Investigation, In the Matter of Certain Wireless Devices with 3G and/or 4G Capabilities and Components Thereof, Investigation No. 337-TA-868, Mar. 1, 2013.

Huawei Respondents Response to Complaint Under Section 337 of the Tariff Act of 1930, As Amended, and Notice of Investigation, In the Matter of Certain Wireless Devices with 3G and/or 4G Capabilities and Components Thereof, Investigation No. 337-TA-868, Feb. 21, 2013.

Nokia Corporation and Nokia Inc.'s Response to the Complaint of InterDigital Communications, Inc., InterDigital Technology Corportion, IPR Licensing, Inc. and InterDigital Holdings, Inc. Under Section 337 of the Tariff Act of 1930. As Amended, and Notice of Investigation, In the Matter of Certain Wireless Devices with 3G and/or 4G Capabilities and Components Thereof, Investigation No. 337-TA-868, Mar. 1, 2013.

Response of Respondents Samsung Electronics Co., Ltd., Samsung Electronics America, Inc., and Samsung Telecommunications America, LLC to the Complaint and Notice of Investigation, In the Matter of Certain Wireless Devices with 3G and/or 4G Capabilities and Components Thereof, Investigation No. 337-TA-868, Feb. 21, 2013.

Response of ZTE Corporation and ZTE (USA) to the Complaint of InterDigital Communications, LLC Under Section 337 of the Tariff Act of 1930. As Amended, and Notice of Investigation, In the Matter of Certain Wireless Devices with 3G and/or 4G Capabilities and Components Thereof, Investigation No. 337-TA-868, Feb. 22, 2013.

Abeta, S., et al., "Fast Coding and Processing Gain Control for DS/CDMA Systems," Proceedings of the 1996 IEICE General Conference, B-1 Antennas, propagation, (Mar. 1995). (English Title Only).

Abeta, et al., "Performance Analysis of Coding Rate and Processing Gain Control with Soft Power Control for Cellular DS/CDMA Systems," The Institute of Electronics, Information and Communication Engineers, Technical Report, vol. 95, No. 62, (May 1995). (English Abstract Only).

Adachi, F., et al., "Coherent Multicode DS-CDMA Mobile Radio Access for Next Generation System," (NTT Mobile Communications), The Institute of Electronics, Information and Communication Engineers, Technical Report, vol. 95, No. 310, Oct. 1995. (English Abstract Only).

Alavi, "Power Control and Interference Management in a Spread-Spectrum Cellular Mobile Radio System," (unpublished Ph.D. thesis—Michigan State University Department of Electrical Engineering and Systems Science) (on file with the Michigan State University Libraries), (1984).

Andermo, PG, et al., "CODIT and Third Generation Systems," 1995 4.sup.th IEEE International Conference on Universal Personal Communications Record, pp. 843-847 (Nov. 6-10, 1995).

Baier, "An Open Multi-Rate Radio Interface based on DSCDMA," RACE Mobile Telecommunications Workshop at 123 (Jun. 16-18, 1993).

Cameron, R. et al., "An Analysis of CDMA with Imperfect Power Control," IEEE 42nd Vehicular Technology Conference, vol. 2, pp. 977-980 (May 1993).

Cideciyan, R., et al., "Performance of the CODIT Radio Interface," IBM Research Division, Zurich Research Laboratory, 1995.

Dohi, T., et al., "Effects of SINR based transmit power control in the presence of non-uniform traffic distribution," (NTT Mobile Communications), Proceedings of the 1996 IEICE General Conference, B-1 Antennas, propagation, (Mar. 1995). (English Title Only).

Doi, N., et al., DS/CDMA prototype system transmitting low bit-rate voice and high bit-rate ISDN signals (IEEE, 1994).

Esmailzedah, R, "A Comparison on the Performance of the FDD and TDD Modes of B-CDMA Communications" (IEEE, 1995), pp. 339-343 (Apr. 1995).

Higashi et al., "Performance of Coherent Detection and RAKE for DSCDMA Uplink Channels," IEEE at 436 (Jan. 1995).

Jalali et al., "Effects of Diversity, Power Control, and Bandwidth on the Capacity of Microcellular CDMA Systems," , IEEE, pp. 952-961 (1994).

Jalali, A., "On the Bandwidth Efficiency of CDMA System," IEEE, pp. 515-519 (1994).

Krzymien, "Performance of a Reference Symbol Assisted Multistage Successive Interference Cancelling Receiver in a Multi-Cell CDMA Wireless System," IEEE at 152 (May 1995).

Lee, C. et al., "Closed-loop power control in CDMA systems," Steele, R., IEEE Proc.-Commun., vol. 143, No. 4, (Aug. 1996).

Ohkawa, et al., Improvement of Data Error Rate for Orthogonal Multi-Carrier FH-CDMA Schemes Used Power Control, The Institute of Electronics, Information and Communication Engineers, Technical Report, vol. 93, No. 539, (Mar. 1994). (English Abstract Only).

Ojanpera, et al., "Design of a 3rd Generation Multirate CDMA System with Multiuser Detection," MUD-CDMA, IEEE, pp. 335-338, (1996).

Okawa, et al., "Performance of multicode transmission with transmit power control on DS-CDMA," Proceedings of the 1996 IEICE General Conference, B-1 Antennas, propagation, (Mar. 1996). (English Title Only).

Okumura, et al., "A transmission experiment on coherent multicode DSCDMA mobile radio access," (NTT Mobile Communications), The Institute of Electronics, Information and Communication Engineers, Technical Report, vol. 95, No. 310, (Oct. 1995). (English Abstract Only).

Olle, G., et al., "CODIT System Management Packet Services Functionality," Ericsson Radio Systems AB.

Otsuka, et al., "Digital Cellular Base Station System," NEC Technical Report vol. 47 No. 9, Sep. 1994. (English Abstract Only).

RACE Mobile Telecommunications Summit, agenda and schedule, Cascais, Portugal, Nov. 22-24, 1995.

RACE Mobile Telecommunications Workshop, Amsterdam, The Netherlands, May 17-19, 1994.

Saluvere et al., "Direct Sequence Spread Spectrum Digital Radio DSP Prototyping Using Xilinx FPGAs," Proceedings of the 4th International Workshop (Sep. 1994). (English Abstract Only).

Sawahashi, M., et al., "Pilot symbol-assisted coherent multistage interference canceller using recursive channel estimation for OSCOMA mobile radio," Electronics Letters vol. 32 No. 4 at 301 (Feb. 15, 1996).

Stefansson, T., et al., "Real-time Testbed for Assessing a CDMA-based System," IEEE Personal Communications, Oct. 1995, pp. 75-80.

Swales, et al., "A Comparison of CDMA Techniques for Third Generation Mobile Radio Systems" (IEEE, 1993).

Urie, et al., "An Advanced TDMA Mobile Access System for UMTS," IEEE 1995, pp. 38-47, (Feb. 1995).

Viterbi, et al., "Performance of Power-Controlled Wideband Terrestrial Digital Communication," IEEE Transactions on Communications, vol. 41, No. 4, (Apr. 1993).

Walter, P, "CODIT Macro Diversity and Handover Performance in an Outdoor Environment," Telia Research AB.

Wu, J., et al., "A Study of Multi-Media CDMA System Using Channel Measurement Information," The Institute of Electronics, Information and Communication Engineers, Technical Report, vol. 94, No. 281, (Oct. 1994). (English Abstract Only).

* cited by examiner

CODE DIVISION MULTIPLE ACCESS (CDMA) COMMUNICATION SYSTEM

CROSS REFERENCE TO RELATED APPLICATION(S)

This application is a continuation of U.S. patent application Ser. No. 10/857,463 filed May 28, 2004 which is a continuation of U.S. patent application Ser. No. 09/400,489 filed on Sep. 21, 1999 which issued on Apr. 26, 2005 as U.S. Pat. No. 6,885,652; which is a divisional of U.S. patent application Ser. No. 08/815,299 filed on Mar. 11, 1997 which issued on Apr. 11, 2000 as U.S. Pat. No. 6,049,535; which is a continuation-in-part of U.S. patent application Ser. No. 08/669,775, filed Jun. 27, 1996 which issued on Aug. 25, 1998 as U.S. Pat. No. 5,799,010 which claims the benefit of U.S. Provisional Patent Application No. 60/000,775 filed on Jun. 30, 1995 which are incorporated by reference as if fully set forth.

BACKGROUND OF THE INVENTION

The present invention generally pertains to Code Division Multiple Access (CDMA) communications, also known as spread-spectrum communications. More particularly, the present invention pertains to a system and method for providing a high capacity, CDMA communications system which provides for one or more simultaneous user bearer channel rate while rejecting multipath interference.

DESCRIPTION OF THE RELEVANT ART

Providing quality telecommunication services to user groups which are classified as remote, such as rural telephone systems and telephone systems in underdeveloped countries, has proved to be a challenge in recent years. These needs have been partially satisfied by wireless radio services, such as fixed or mobile frequency division multiplex (FDM), frequency division multiple access (FDMA), time division multiplex (TDM), time division multiple access (TDMA) systems, combination frequency and time division systems (FD/TDMA), and other land mobile radio systems. Usually, these remote services are faced with more potential users than can be supported simultaneously by their frequency or spectral bandwidth capacity.

Recognizing these limitations, recent advances in wireless communications have used spread spectrum modulation techniques to provide simultaneous communication by multiple users. Spread spectrum modulation refers to modulating an information signal with a spreading code signal; the spreading code signal being generated by a code generator where the period Tc of the spreading code is substantially less than the period of the information data bit or symbol signal. The code may modulate the carrier frequency upon which the information has been sent, called frequency-hopped spreading, or may directly modulate the signal by multiplying the spreading code with the information data signal, called direct-sequence spreading (DS). Spread-spectrum modulation produces a signal with bandwidth substantially greater than that required to transmit the information signal. Synchronous reception and despreading of the signal at the receiver recovers the original information. A synchronous demodulator in the receiver uses a reference signal to synchronize the despreading circuits to the input spread-spectrum modulated signal to recover the carrier and information signals. The reference signal can be a spreading code which is not modulated by an information signal. Such use of a synchronous spread-spectrum modulation and demodulation for wireless communication is described in U.S. Pat. No. 5,228,056 entitled SYNCHRONOUS SPREAD-SPECTRUM COMMUNICATIONS SYSTEM AND METHOD by Donald L. Schilling, which techniques are incorporated herein by reference.

Spread-spectrum modulation in wireless networks offers many advantages because multiple users may use the same frequency band with minimal interference to each user's receiver. Spread-spectrum modulation also reduces effects from other sources of interference. In addition, synchronous spread-spectrum modulation and demodulation techniques may be expanded by providing multiple message channels for a single user, each spread with a different spreading code, while still transmitting only a single reference signal to the user. Such use of multiple message channels modulated by a family of spreading codes synchronized to a pilot spreading code for wireless communication is described in U.S. Pat. No. 5,166,951 entitled HIGH CAPACITY SPREAD-SPECTRUM CHANNEL by Donald L. Schilling, which is incorporated herein by reference.

One area in which spread-spectrum techniques are used is in the field of mobile cellular communications to provide personal communication services (PCS). Such systems desirably support large numbers of users, control Doppler shift and fade, and provide high speed digital data signals with low bit error rates. These systems employ a family of orthogonal or quasi-orthogonal spreading codes, with a pilot spreading code sequence synchronized to the family of codes. Each user is assigned one of the spreading codes as a spreading function. Related problems of such a system are: supporting a large number of users with the orthogonal codes, handling reduced power available to remote units, and handling multipath fading effects. Solutions to such problems including using phased-array antennas to generate multiple steerable beams, using very long orthogonal or quasi-orthogonal code sequences. These sequences may be reused by cyclic shifting of the code synchronized to a central reference, and diversity combining of multipath signals. Such problems associated with spread spectrum communications, and methods to increase capacity of a multiple access, spread-spectrum system are described in U.S. Pat. No. 4,901,307 entitled SPREAD SPECTRUM MULTIPLE ACCESS COMMUNICATION SYSTEM USING SATELLITE OR TERRESTRIAL REPEATERS by Gilhousen et al. which is incorporated herein by reference.

The problems associated with the prior art systems focus around reliable reception and synchronization of the receiver despreading circuits to the received signal. The presence of the multipath fading introduces a particular problem with spread spectrum receivers in that a receiver must somehow track the multipath components to maintain code-phase lock of the receiver's despreading means with the input signal. Prior art receivers generally track only one or two of the multipath signals, but this method is not satisfactory because the combined group of low power multipath signal components may actually contain far more power than the one or two strongest multipath components. The prior art receivers track and combine the strongest components to maintain a predetermined Bit Error Rate (BER) of the receiver. Such a receiver is described, for example, in U.S. Pat. No. 5,109,390 entitled DIVERSITY RECEIVER IN A CDMA CELLULAR TELEPHONE SYSTEM by Gilhousen et al. A receiver that combines all multipath components, however, is able to maintain the desired BER with a signal power that is lower than that of prior art systems because more signal power is available to the receiver. Consequently, there is a need for a spread spectrum communication system employing a receiver that tracks substantially all of the multipath signal components, so that substantially all multipath signals may be combined in the receiver, and hence the required transmit power of the signal for a given BER may be reduced.

Another problem associated with multiple access, spread-spectrum communication systems is the need to reduce the total transmitted power of users in the system, since users may have limited available power. An associated problem requiring power control in spread-spectrum systems is related to the inherent characteristic of spread-spectrum systems that one user's spread-spectrum signal is received by another user's receiver as noise with a certain power level. Consequently, users transmitting with high levels of signal power may interfere with other users' reception. Also, if a user moves relative to another user's geographic location, signal fading and distortion require that the users adjust their transmit power level to maintain a particular signal quality. At the same time, the system should keep the power that the base station receives from all users relatively constant. Finally, because it is possible for the spread-spectrum system to have more remote users than can be supported simultaneously, the power control system should also employ a capacity management which rejects additional users when the maximum system power level is reached.

Prior spread-spectrum systems have employed a base station that measures a received signal and sends an adaptive power control (APC) signal to the remote users. Remote users include a transmitter with an automatic power control (APC) signal to the remote users. Remote users include a transmitter with an automatic gain control (AGC) circuit which responds to the APC signal. In such systems the base station monitors the overall system power or the power received from each user, and sets the APC signal accordingly. Such a spread-spectrum power control system and method is described in U.S. Pat. No. 5,299,226 entitled ADAPTIVE POWER CONTROL FOR A SPREAD SPECTRUM COMMUNICATION SYSTEM AND METHOD, and U.S. Pat. No. 5,093,840 entitled ADAPTIVE POWER CONTROL FOR A SPREAD SPECTRUM TRANSMITTER, both by Donald L. Schilling and incorporated herein by reference. This open loop system performance may be improved by including a measurement of the signal power received by the remote user from the base station, and transmitting an APC signal back to the base station to effectuate a closed loop power control method. Such closed loop power control is described, for example, in U.S. Pat. No. 5,107,225 entitled HIGH DYNAMIC RANGE CLOSED LOOP AUTOMATIC GAIN CONTROL CIRCUIT to Charles E. Wheatley, III et al. and incorporated herein by reference.

These power control systems, however, exhibit several disadvantages. First, the base station must perform complex power control algorithms, increasing the amount of processing in the base station. Second, the system actually experiences several types of power variations: variation in the noise power caused by the variation in the number of users and variations in the received signal power of a particular bearer channel. These variations occur with different frequency, so simple power control algorithms can be optimized to compensate for only one of the two types of variation. Finally, these power algorithms tend to drive the overall system power to a relatively high level. Consequently, there is a need for a spreading-spectrum power control method that rapidly responds to changes in bearer channel power levels, while simultaneously making adjustments to all users' transmit power in response to changes in the number of users. Also, there is a need for an improved spread-spectrum communication system employing a closed loop power control system which minimizes the system's overall power requirements while maintaining a sufficient BER at the individual remote receivers. In addition, such a system should control the initial transmit power level of a remote user and manage total system capacity.

Spread-spectrum communication systems desirably should support large numbers of users, each of which has at least one communication channel. In addition, such a system should provide multiple generic information channels to broadcast information to all users and to enable users to gain access to the system. Using prior art spread-spectrum systems this could only be accomplished by generating large numbers of spreading code sequences.

Further, spread-spectrum systems should use sequences that are orthogonal or nearly orthogonal to reduce the probability that a receiver locks to the wrong spreading code sequences or phase. The use of such orthogonal codes and the benefits arising therefrom are outlined in U.S. Pat. No. 5,103,459 entitled SYSTEM AND METHOD FOR GENERATING SIGNAL WAVEFORMS IN A CDMA CELLULAR TELEPHONE SYSTEM, Gilhousen et al. and U.S. Pat. No. 5,193,094 entitled METHOD AND APPARATUS FOR GENERATING SUPER-ORTHOGONAL CONVOLUTIONAL CODES AND THE DECODING THEREOF, by Andrew J. Viterbi, both of which are incorporated herein by reference. However, generating such large families of code sequences with such properties is difficult. Also, generating large code families requires generating sequences which have a long period before repetition. Consequently, the time a receiver takes to achieve synchronization with such a long sequence is increased. Prior art spreading code generators often combine shorter sequences to make longer sequences, but such sequences may no longer be sufficiently orthogonal. Therefore, there is a need for an improved method for reliably generating large families of code sequences that exhibit nearly orthogonal characteristics and have a long period before repetition, but also include the benefit of a short code sequence that reduces the time to acquire and lock the receiver to the correct code phase. In addition, the code generation method should allow generation of codes with any period, since the spreading code period is often determined by parameters used such as data rate or frame size.

Another desirable characteristic of spreading code sequences is that the transition of the user data value occur at a transition of the code sequence values. Since data typically has a period which is divisible by $2^N$, such a characteristic usually requires the code-sequence to be an even length of $2^N$. However, code generators, as is well known in the art, generally use linear feedback shift registers which generate codes of length $2^N-1$. Some generators include a method to augment the generated code sequence by inserting an additional code value, as described, for example, in U.S. Pat. No. 5,228,054 entitled POWER-OF-TWO LENGTH PSEUDONOISE SEQUENCE GENERATOR WITH FAST OFFSET ADJUSTMENT by Timothy Rueth et al and incorporated herein by reference. Consequently, the spread-spectrum communication system should also generate spreading code sequences of even length.

Finally, the spread-spectrum communication system should be able to handle many different types of data, such as FAX, voiceband data, and ISDN, in addition to traditional voice traffic. To increase the number of users supported, many systems employ encoding techniques such as ADPCM to achieve "compression" of the digital telephone signal. FAX, ISDN and other data, however, require the channel to be a clear channel. Consequently, there is a need for a spread spectrum communication system that supports compression techniques that also dynamically modify the spread spectrum bearer channel between an encoded channel and a clear channel in response to the type of information contained in the user's signal.

SUMMARY OF THE INVENTION

The present invention is embodied in a multiple access, spread-spectrum communication system which processes a plurality of information signals received simultaneously over telecommunication lines for simultaneous transmission over a radio frequency (RF) channel as a code-division-multiplexed (CDM) signal. The system includes a radio carrier station (RCS) which receives a call request signal that corresponds to a telecommunication line information signal, and a user identification signal that indentifies a user to which the call request and information signal are addressed. The receiving apparatus is coupled to a plurality of code division multiple access (CDMA) modems, one of which provides a global pilot code signal and a plurality of message code signals, and each of the CDMA modems combines one of the plurality of information signals with its respective message code signal to provide a spread-spectrum processed signal. The plurality of message code signals of the plurality of CDMA modems are synchronized to the global pilot code signal The system also includes assignment apparatus that is responsive to a channel assignment signal for coupling the respective information signals received on the telecommunication lines to indicated ones of the plurality of modems; the assignment apparatus is coupled to a time-slot exchange means. The system further includes a system channel controller coupled to a remote call-processor and to the time-slot exchange means. The system channel controller is responsive to the user identification signal, to provide the channel assignment signal. In the system, an RF transmitter is connected to all of the modems to combine the plurality of spread-spectrum processed message signals with the global pilot code signal to generate a CDM signal. The RF transmitter also modulates a carrier signal with the CDM signal and transmits the modulated carrier signal through an RF communication channel.

The transmitted CDM signal is received from the RF communication channel by a subscriber unit (SU) which processes and reconstructs the transmitted information signal assigned to the subscriber. The SU includes a receiving means for receiving and demodulating the CDM signal from the carrier. In addition, the SU comprises a subscriber unit controller and a CDMA modem which includes a processing means for acquiring the global pilot code and despreading the spread-spectrum processed signal to reconstruct the transmitted information signal.

The RCS and the SUs each contain CDMA modems for transmission and reception of telecommunication signals including information signals and connection control signals. The CDMA modem comprises a modem transmitter having: a code generator for providing an associated pilot code signal and for generating a plurality of message code signals; a spreading code means for combining each of the information signals, with a respective one of the message code signals to generate spread-spectrum processed message signals; and a global pilot code generator which provides a global pilot code signal to which the message code signals are synchronized.

The CDMA modem also comprises a modem receiver having associated pilot code acquisition and tracking logic. The associated pilot code acquisition logic includes an associated pilot code generator; a group of associated pilot code correlators for correlating code-phase delayed versions of the associated pilot signal with a receive CDM signal for producing a despread associated pilot signal. The code phase of the associated pilot signal is changed responsive to an acquisition signal value until a detector indicates the presence of the despread associated pilot code signal by changing the acquisition signal value. The associated pilot code signal is synchronized to the global pilot signal. The associated pilot code tracking logic adjusts the associated pilot code signal in phase responsive to the acquisition signal so that the signal power level of the despread associated pilot code signal is maximized. Finally, the CDMA modem receiver includes a group of message signal acquisition circuits. Each message signal acquisition circuit includes a plurality of receive message signal correlators for correlating one of the local receive message code signals with the CDM signal to produce a respective despread receive message signal.

To generate large families of nearly mutually orthogonal codes used by the CDMA modems, the present invention includes a code sequence generator. The code sequences are assigned to a respective logical channel of the spread-spectrum communication system, which includes In-phase (I) and Quadrature (Q) transmission over RF communication channels. One set of sequences is used as pilot sequences which are code sequences transmitted without modulation by a data signal. The code sequence generator circuit includes a long code sequence generator including a linear feedback shift register, a memory which provides a short, even code sequence, and a plurality of cyclic shift, feedforward sections which provide other members of the code family which exhibit minimal correlation with the code sequence applied to the feedforward circuit. The code sequence generator further includes a group of code sequence combiners for combining each phase shifted version of the long code sequence with the short, even code sequence to produce a group, or family, or nearly mutually orthogonal codes.

Further, the present invention includes several methods for efficient utilization of the spread-spectrum channels. First, the system includes a bearer channel modification system which comprises a group of message channels between a first transceiver and second transceiver. Each of the group message channels supports a different information signal to determine the type of information signal that is received, and produces a coding signal relating to the coding signal. If a certain type of information signal is present, the first transceiver switches transmission from a first message channel to a second message channel to support the different transmission rate. The coding signal is transmitted by the first transceiver to the second transceiver, and the second transceiver switches to the second message channel to receive the information signal at a different transmission rate.

Another method to increase efficient utilization of the bearer message channel is the method of idle-code suppression used by the present invention. The spread-spectrum transceiver receives a digital data information signal including a predetermined flag pattern corresponding to an idle period. The method includes the steps of: 1) delayed and monitoring the digital data signal; 2) detecting the predetermined flag pattern; 3) suspending transmission of the digital data signal when the flag patter is detected; and 4) transmitting the data signal as a spread-spectrum signal when the flag pattern is not detected.

The present invention includes a system and method for closed loop automatic power control (APC) for the RCS and SUs of the spread-spectrum communication system. The SUs transmit spread-spectrum signals, the RCS acquires the spread-spectrum signals, and the RCS detects the received power level of the spread-spectrum signals plus any interfering signal including noise. The APC system includes the RCS and a plurality of SUs, wherein the RCS transmits a plurality of forward channel information signals to the SUs as a plurality of forward channel spread-spectrum signals having a respective forward transmit power level, and each SU transmit to the base station at least one reverse spread-spectrum signal having a respective reverse transmit power level and at least one reverse channel spread-spectrum signal which includes a reverse channel information signal.

The APC includes an automatic forward power control (AFPC) system, and an automatic reverse power control (ARPC) system. The AFPC system operates by measuring, at the SU, a forward signal-to-noise ratio of the respective forward channel information signal, generating a respective forward channel error signal corresponding to a forward error between the respective forward signal-to-noise ratio and a pre-determined signal-to-noise value, and transmitting the respective forward channel error signal as part of a respective reverse channel information signal from the SU to the RCS. The RCS includes a plural number of AFPC receivers for receiving the reverse channel information signals and extracting the forward channel error signals from the respective forward spread-spectrum signals responsive to the respective forward error signal.

The ARPC system operates by measuring, in the RCS, a reverse signal-to-noise ratio of each of the respective reverse channel information signals, generating a respective reverse channel error signal representing an error between the respective reverse channel signal-to-noise ration and a respective pre-determined signal-to-noise value, and transmitting the respective reverse channel error signal as a part of a respective forward channel information signal to the SU. Each SU includes an ARPC receiver for receiving the forward channel information signal and extracting the respective reverse error signal from the forward channel information signal. The SU adjusts the reverse transmit power level of the respective reverse spread-spectrum signal responsive to the respective reverse error signal.

BRIEF DESCRIPTION OF THE DRAWING(S)

GLOSSARY OF ACRONYMS

Figure 1:
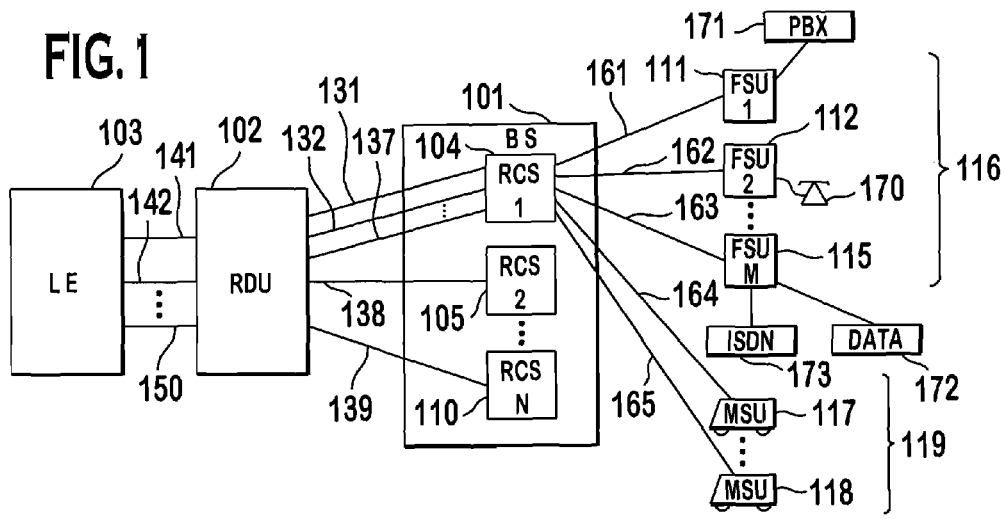
FIG. 1 is a block diagram of a code division multiple access communication system according to the present invention.

| Acronym | Definition |
|---|---|
| AC | Assigned Channels |
| A/D | Analog-to-Digital |
| ADPCM | Adaptive Differential Pulse Code Modulation |
| AFPC | Automatic Forward Power Control |
| AGC | Automatic Gain Control |
| AMF | Adaptive Matched Filter |
| APC | Automatic Power Control |
| ARPC | Automatic Reverse Power Control |
| ASPT | Assigned Pilot |
| AVC | Adaptive Vector Correlator |
| AXCH | Access Channel |
| B-CDMA | Broadband Code Division Multiple Access |
| BCM | Bearer Channel Modification |
| BER | Bit Error Rate |
| BS | Base Station |
| CC | Call Control |
| CDM | Code Division Multiplex |
| CDMA | Code Division Multiple Access |
| CLK | Clock Signal Generator |
| CO | Central Office |
| CTCH | Control Channel |
| CUCH | Check-Up Channel |
| dB | Decibels |
| DCC | Data Combiner Circuitry |
| DI | Distribution Interface |
| DLL | Delay Locked Loop |
| DM | Delta Modulator |
| DS | Direct Sequence |
| EPIC | Extended PCM Interface Controller |
| FBCH | Fast Broadcast Channel |
| FDM | Frequency Division Multiplex |
| FD/TDMA | Frequency & Time Division Systems |
| FDMA | Frequency Division Multiple Access |
| FEC | Forward Error Correction |
| FSK | Frequency Shift Keying |
| FSU | Fixed Subscriber Unit |
| GC | Global Channel |
| GLPT | Global Pilot |
| GPC | Global Pilot Code |
| GPSK | Gaussian Phase Shift Keying |
| GPS | Global Positioning System |
| HPPC | High Power Passive Components |
| HSB | High Speed Bus |
| I | In-Phase |
| IC | Interface Controller |
| ISDN | Integrated Services Digital Network |
| ISST | Initial System Signal Threshold |
| LAXPT | Long Access Pilot |
| LAPD | Link Access Protocol |
| LCT | Local Craft Terminal |
| LE | Local Exchange |
| LFSR | Linear Feedback Shift Register |
| LI | Line Interface |
| LMS | Least Mean Square |
| LOL | Loss of Code Lock |
| LPF | Low Pass Filter |
| LSR | Linear Shift Register |
| MISR | Modem Input Signal Receiver |

-continued

| Acronym | Definition |
|---|---|
| MIU | Modem Interface Unit |
| MM | Mobility Management |
| MOI | Modem Output Interface |
| MPC | Maintenance Power Control |
| MPSK | M-ary Phase Shift Keying |
| MSK | Minimum Shift Keying |
| MSU | Mobile Subscriber Unit |
| NE | Network Element |
| OMS | Operation and Maintenance System |
| OS | Operations System |
| OQPSK | Offset Quadrature Phase Shift Keying |
| OW | Order Wire |
| PARK | Portable Access Rights Key |
| PBX | Private Branch Exchange |
| PCM | Pulse Coded Modulation |
| PCS | Personal Communication Services |
| PG | Pilot Generator |
| PLL | Phase Locked Loop |
| PLT | Pilot |
| PN | Pseudonoise |
| POTS | Plain Old Telephone Service |
| PSTN | Public Switched Telephone Network |
| Q | Quadrature |
| QPSK | Quadrature Phase Shift Keying |
| RAM | Random Access Memory |
| RCS | Radio Carrier Station |
| RDI | Receiver Data Input Circuit |
| RDU | Radio Distribution Unit |
| RF | Radio Frequency |
| RLL | Radio Local Loop |
| SAXPT | Short Access Channel Pilots |
| SBCH | Slow Broadcast Channel |
| SHF | Super High Frequency |
| SIR | Signal Power to Interface Noise Power Ratio |
| SLIC | Subscriber Line Interface Circuit |
| SNR | Signal-to-Noise Ratio |
| SPC | Service PC |
| SPRT | Sequential Probability Ratio Test |
| STCH | Status Channel |
| SU | Subscriber Unit |
| TDM | Time Division Multiplexing |
| TMN | Telecommunication Management Network |
| TRCH | Traffic Channels |
| TSI | Time-Slot Interchanger |
| TX | Transmit |
| TXIDAT | I-Modem Transmit Data Signal |
| TXQDAT | Q-Modem Transmit Data Signal |
| UHF | Ultra High Frequency |
| VCO | Voltage Controlled Oscillator |
| VDC | Video Distribution Circuit |
| VGA | Variable Gain Amplifier |
| VHF | Very High Frequency |
| WAC | Wireless Access Controller |

DETAILED DESCRIPTION OF THE PREFERRED EMBODIMENT(S)

General System Description

The system of the present invention provides local-loop telephone service using radio links between one or more base stations and multiple remote subscriber units. In the exemplary embodiment, a radio link is described for a base station communicating with a fixed subscriber unit (FSU), but the system is equally applicable to systems including multiple base stations with radio links to both FSUs and Mobile Subscriber Units (MSUs). Consequently, the remote subscriber units are referred to herein as Subscriber Units (SUs).

Referring to FIG. 1, Base Station (BS) 101 provides call connection to a local exchange (LE) 103 or any other telephone network switching interface, such as a private branch exchange (PBX) and includes a Radio Carrier Station (RCS) 104. One or more RCSs 104, 105, 110 connect to a Radio Distribution Unit (RDU) 102 through links 131, 132, 137, 138, 139, and RDU 102 interfaces with LE 103 by transmitting and receiving call set-up, control, and information signals through telco links 141, 142, 150. SUs 116, 119 communicate with the RCS 104 through radio links 161, 162, 163, 164, 165. Alternatively, another embodiment of the invention includes several SUs and a "master" SU with functionality similar to the RCS. Such an embodiment may or may not have connection to a local telephone network.

The radio links 161 to 165 operate within the frequency bands of the DCS1800 standard (1.71-1.785 Ghz and 1.805-1.880 GHz); the US-PCS standard (1.85-1.99 Ghz); and the CEPT standard (2.0-2.7 GHz). Although these bands are used in described embodiment, the invention is equally applicable to the entire UHF to SHF bands, including bands from 2.7 GHz to 5 GHz. The transmit and receive bandwidths of 7, 10, 10.5, 14 and 15 MHz. In the exemplary embodiment of the invention, the minimum guard band between the Uplink and Downlink is 20 MHz, and is desirably at least three times the signal bandwidth. The duplex separation is between 50 to 175 MHz, with the described invention using 50, 75, 80, 95, and 175 MHz. Other frequencies may also be used.

Although the described embodiment uses different spread-spectrum bandwidths centered around a carrier for the transmit and receive spread-spectrum channels, the present method is readily extended to systems using multiple spread-spectrum bandwidths for the transmit channels and multiple spread-spectrum bandwidths for the receive channels. Alternatively, because spread-spectrum communication systems have the inherent feature that one user's transmission appears as noise to another user's despreading receiver, an embodiment may employ the same spread-spectrum channel for both the transmit and receive path channels. In other words, Uplink and Downlink transmissions can occupy the same frequency band. Furthermore, the present method may be readily extended to multiple CDMA frequency bands, each conveying a respectively different set of messages, uplink, downlink or uplink or downlink.

The spread binary symbol information is transmitted over the radio links 161 to 165 using Quadrature Phase Shift Keying (QPSK) modulation with Nyquist Pusle Shaping in the present embodiment, although other modulation techniques may be used, including, but not limited to, Offset (QPSK (OQPSK) and Minimum Shift Keying (MSK). Gaussian Phase Shift Keying (GPSK) and M-ary Phase Shift Keying (MPSK). The radio links 161 to 165 incorporate Broadband Code Division Multiple Access (B-CDMA™) as the mode of transmission in both the Uplink and Downlink directions. CDMA (also known as Spread Spectrum) communication techniques used in multiple access systems are well-known, and are described in U.S. Pat. No. 5,228,056 entitled SYNCHRONOUS SPREAD-SPECTRUM COMMUNICATION SYSTEM AND METHOD by Donald T. Schilling. The system described utilizes the Direct Sequence (DS) spreading technique. The CDMA modulator performs the spread-spectrum spreading code sequence generation, which can be pseudonoise (PN) sequence; and complex DS modulation of the QPSK signals with spreading code sequences for the In-phase (I) and Quadrature (Q) channels. Pilot signals are generated and transmitted with the modulated signals, and pilot signals of the present embodiment are spreading codes not modulated by data. The pilot signals are used for synchronization, carrier phase recovery, and for estimating the impulse response of the radio channel. Each SU includes a single pilot generator and at least one CDMA modulator and demodulator, together known as a CDMA modem. Each RCS 104, 105, 110 has a single pilot generator plus sufficient CDMA modulator sand demodulators for all of the logical channels in use by all SUs.

The CDMA demodulator despreads the signal with appropriate processing to combat or exploit multipath propagation effects. Parameters concerning the received power level are used to generate the Automatic Power Control (APC) information which, in turn, is transmitted to the other end of the communication link. The APC information is used to control transmit power of the automatic forward power control (AFPC) and automatic reverse power control (ARPC) links. In addition, each RCS 104, 105 and 110 can perform Maintenance Power Control (MPC), in a manner similar to APC, to adjust the initial transmit power of each SU 111, 112, 115, 117 and 118. Demodulation is coherent where the pilot signal provides the phase reference.

The described radio links support multiple traffic channels with data rates of 8, 16, 32, 64, 128, and 144 kb/s. The physical channel to which a traffic channel is connected operates with a 64 k symbol/sec rate. Other data rates may be supported, and Forward Error Correction (FEC) coding can be employed. For the described embodiment, FEC with coding rate of ½ and constraint length 7 is used. Other rates and constraint lengths can be used consistent with the code generation techniques employed.

Diversity combining at the radio antennas of RCS 104, 105 and 110 is not necessary because CDMA has inherent frequency diversity due to the spread bandwidth. Receivers include Adaptive Matched Filters (AMFs) (not shown in FIG. 1) which combine the multipath signals. In the present embodiment, the exemplary AMFs perform Maximal Ratio Combining.

Referring to FIG. 1, RCS 104 interfaces to RDU 102 through links 131, 132, 137 with, for example, 1.544 Mb/s DS1, 2.048 Mb/s E1; or HDSL Formats to receive and send digital data signals. While these are typical telephone company standardized interfaces, the present invention is not limited to these digital data formats only. The exemplary RCS line interface (not shown in FIG. 1) translates the line coding (such as HBD3, B8ZS, AMI) and extracts or produces framing information, performs Alarms and Facility signaling functions, as well as channel specific loop-back and parity check functions. The interfaces for this description provide 64 Kb/s PCM encoded or 32 kb/s ADPCM encoded telephone traffic channels or ISDN channels to the RCS for processing. Other ADPCM encoding techniques can be used consistent with the sequence generation techniques.

The system of the present invention also supports bearer rate modification between the RCS 104 and each SU 111, 112, 115, 117 and 118 communicating with RCS 104 in which a CDMA message channel supporting 64 kb/s may be assigned to voiceband data or FAX when rates above 4.8 kb/s are present. Such 64 kb/s bearer channel is considered an unencoded channel. For ISDN, bearer rate modification may be done dynamically, based upon the D channel messages.

In FIG. 1, each SU 111, 112, 115, 117 and 118 either includes or interfaces with a telephone unit 170, or interfaces with a local switch (PBX) 171. The input from the telephone unit may include voice, voiceband data and signaling. The SU translates the analog signals into digital sequences, and may also include a Data terminal 172 or an ISDN interface 173. The SU can differentiate voice input, voiceband data or FAX and digital data. The SU encodes voice data with techniques such as ADPCM at 32 kb/s or lower rates, and detects voiceband data or FAX with rates above 4.8 kb/s to modify the traffic channel (bearer rate modification) for unencoded transmission. Also, A-law, u-law, or no companding of the signal may be performed before transmission. For digital data, data compression techniques, such as idle flag removal, may also be used to conserve capacity and minimize interference.

The transmit power levels of the radio interface between RCS 104 and SUs 111, 112, 115, 117 and 118 are controlled using two different closed loop power control methods. The Automatic Forward Power Control (AFPC) method determines the Downlink transmit power level, and the Automatic Reverse Power Control (ARPC) method determines the Uplink transmit power level. The logical control channel by which SU 111 and RCS 104, for example, transfer power control information operates at least a 16 kHz update rate. Other embodiments may use a faster or slower update rate, for example at 64 kHz or 8 kHz. These algorithms ensure that the transmit power of a user maintains an acceptable Bit-Error Rate (BER), maintains the system power at a minimum to conserve power, and maintains the power level of all SUs 111, 112, 115, 117 and 118 received by RCS 104 at a nearly equal level.

In addition, the system uses an optional maintenance power control method during the inactive mode of a SU. When SU 111 is inactive or powered-down to conserve power, the unit occasionally activates to adjust its initial transmit power level setting in response to a maintenance power control signal from RCS 104. The maintenance power signal is determined by the RCS 104 by measuring the received power level of SU 111 and the present system power level and, from this, calculates the necessary initial transmit power. The method shortens the channel acquisition time of SU 111 to begin a communication. The method also prevents the transmit power level of SU 111 from becoming too high and interfering with other channels during the initial transmission before the closed loop power control reduces the transmit power.

RCS 104 obtains a synchronization of its clock from an interface line such as, but not limited to, E1, T1, or HDSL interfaces. RCS 104 can also generate its own internal clock signal from an oscillator which may be regulated by a Global Positioning System (GPS) receiver. RCS 104 generates a Global Pilot Code, a channel with a spreading code but no data modulation, which can be acquired by remote SUs 111 through 118. All transmission channels of the RCS are synchronized to the Pilot channel, and spreading code phases of code generators (not shown) used for Logical communication channels within RCS 104 are also synchronized to the Pilot channel's spreading code phase. Similarly, SUs 111 through 118 which receive the Global Pilot Code of RCS 104 synchronize the spreading and de-spreading code phases of the code generators (not shown) of the SUs to the Global Pilot Code.

RCS 104, Su 111, and RDU 102 may incorporate system redundancy of system elements and automatic switching between internal functional system elements upon failure event to prevent loss or drop-out of a radio link, power supply, traffic channel, or group of traffic channels.

Logical Communication Channels

A 'channel' of the prior art is usually regarded as a communications path which is part of an interface and which can be distinguished from other paths of that interface without regard to its content. However, in the case of CDMA, separate communications paths are distinguished only by their content. The term 'logical channel' is used to distinguish the separate data streams, which are logically equivalent to channels in the conventional sense. All logical channels and sub-channels of the present invention are mapped to a common 64 kilo-symbols per second (ksym/s) QPSK stream. Some channels are synchronized to associated pilot codes which are generated from, and perform a similar function to the system Global Pilot Code (GPC). The system pilot signals are not, however, considered logical channels.

Several logical communication channels are used over the RF communication link between the RCS and SU. Each logical communication channel either has a fixed, pre-determined spreading code or a dynamically assigned spreading code. For both pre-determined and assigned codes, the code phase is synchronized with the Pilot Code. Logical communication channels are divided into two groups: the Global Channel (GC) group includes channels which are either transmitted from the base station RCS to all remote SUs or from any SU to the RCS of the base station regardless of the SU's identity. The channels in the GC group may contain information of a given type for all users including those channels used by SUs to gain system access. Channels in the Assigned Channels (AC) group are those channels dedicated to communication between the RCS and a particular SU.

The Global Channels (GC) group provides for 1) Broadcast Control logical channels, which provide point to multipoint services for broadcasting messages to all SUs and paging messages to SUs; and 2) Access Control logical channels which provide point-to-point services on global channels for SUs to access the system and obtain assigned channels.

The RCS of the present invention has multiple Access Control logical channels, and one Broadcast Control group. An SU of the present invention has at least one Access Control channel and at least one Broadcast Control logical channel.

The Global logical channels controlled by the RCS are the Fast Broadcast Channel (FBCH) which broadcasts fast changing information concerning which services and which access channels are currently available, and the Slow Broadcast Channel (SBCH) which broadcasts slow changing system information and paging messages. The Access Channel (AXCH) is used by the SUs to access an RCS and gain access to assigned channels. Each AXCH is paired with a Control Channel (CTCH). The CTCH is used by the RCS to acknowledge and reply to access attempts by SUs. The Long Access Pilot (LAXPT) is transmitted synchronously with AXCH to provide the RCS with a time and phase reference.

An Assigned Channel (AC) group contains the logical channels that control a single telecommunication connection between the RCS and an SU. The functions developed when an AC group is formed include a pair of power control logical message channels for each of the Uplink and Downlink connections, and depending on the type of connection, one or more pairs of traffic channels. The Bearer Control function performs the required forward error control, bearer rate modification and encryption functions.

Each SU 111, 112, 115, 117 and 118 has at least one AC group formed when a telecommunication connection exists, and each RCS 104, 105 and 110 has multiple AC group formed, one for each connection in progress. An AC group logical channels is created for a connection upon successful establishment of the connection. The AC group includes encryption, FEC coding, and multiplexing on transmission, and FEC decoding, decryption and demultiplexing on reception.

Each AC group provides a set of connection oriented point-to-point services and operates in both directions between a specific RCS, for example, RCS 104 and a specific SU, for example, SU 111. An AC group formed for a connection can control more than one bearer over the RF communication channel associated with a single connection. Multiple bearers are used to carry distributed data such as, but not limited to, ISDN. An AC group can provide for the duplication of traffic channels to facilitate switch over to 64 kb/s PCM for high speed facsimile and modem services for the bearer rate modification function.

The assigned logical channels formed upon a successful call connection and included in the AC group are a dedicated signaling channel [order wire (OW], and APC channel, and one or more Traffic channels (TRCH) which are bearers of 8, 16, 32, pr 64 kb/s depending on the service supported. For voice traffic, moderate rate coded speech, ADPCM, r PCM can be supported on the Traffic channels. For ISDN service types, two 64 kb/s TRCHs form the B channels and a 16 kb/s TRCH forms the D channel. Alternatively, the APC subchannel may either be separately modulated on its own CDMA channel, or may be time division multiplexed with a traffic channel or OW channel.

Each SU 111, 112, 115, 117 and 118 of the present invention supports up to three simultaneous traffic channels. The mapping of the three logical channels for TRCHs to the user data is shown below in Table 1:

TABLE 1

Mapping of service types to the three available TRCH channels

| Service | TRCH(0) | TRCH(1) | TRCH(2) |
|---|---|---|---|
| 16 kb/s POTS | TRCH/16 | not used | not used |
| 32 + 64 kb/s POTS (during BCM) | TRCH/32 | TRCH/64 | not used |
| 32 kb/s POTS | TRCH/32 | not used | not used |
| 64 kb/s POTS | not used | TRCH/64 | not used |
| ISDN | not used | not used | TRCH/16 |
| ISDN B = D | TRCH/64 | not used | TRCH/16 |
| ISDN 2B + D | TRCH/64 | TRCH/64 | TRCH/16 |
| Digital LL @ 64 kb/s | TRCH/64 | not used | not used |
| Digital LL @ 2 × 64 kb/s | TRCH/64 | TRCH/64 | not used |
| Analog LL @ 64 kb/s | TRCH/64 | not used | not used |

The APC data rate is sent at 64 kb/s. The APC logical channel is not FEC coded to avoid delay and is transmitted at a relatively low power level to minimize capacity used for APC. Alternatively, the APC and OW may be separately modulated using complex spreading code sequences, or they may be time division multiplexed.

The OW logical channel is FEC coded with a rate ½ convolutional code. This logical channel is transmitted in bursts when signaling data is present to reduce interference. After an idle period, the OW signal begins with at least 35 symbols prior to the start of the data frame. For silent maintenance call data, the OW is transmitted continuously between frames of data. Table 2 summarizes the logical channels used in the exemplary embodiment:

TABLE 2

Logical Channels and sub-channels of the B-CDMA Air Interface

| Channel name | Abbr. | Brief Description | Direction (forward or reverse) | Bit rate | Max BER | Power level | Pilot |
|---|---|---|---|---|---|---|---|
| Global Channels ||||||||
| Fast Broadcast Channel | FBCH | Broadcasts fast-changing system information | F | 16 kb/s | 1e−4 | Fixed | GLPT |
| Slow Broadcast Channel | SBCH | Broadcasts paging messages to FSUs and slow-changing system information | F | 16 kb/s | 1e−7 | Fixed | GLPT |
| Access Channels | AXCH(i) | For initial access attempts by FSUs | R | 32 kb/s | 1e−7 | Controlled by APC | LAXPT(i) |
| Control Channels | CTCH(i) | For granting access | F | 32 kb/s | 1e−7 | Fixed | GLPT |
| Assigned Channels ||||||||
| 16 kb/s POTS | TRCH/16 | General POTS use | F/R | 16 kb/s | 1e−4 | Controlled by APC | F-GLPT R-ASPT |
| 32 kb/s POTS | TRCH/32 | General POTS use | F/R | 32 kb/s | 1e−4 | Controlled by APC | F-GLPT R-ASPT |
| 64 kb/s POTS | TRCH/64 | POTS use for in-band modems/fax | F/R | 64 kb/s | 1e−4 | Controlled by APC | F-GLPT R-ASPT |
| D channel | TRCH/16 | ISDN D channel | F/R | 16 kb/s | 1e−7 | Controlled by APC | F-GLPT R-ASPT |
| Order wire channel | OW | assigned signaling channel | F/R | 32 kb/s | 1e−7 | Controlled by APC | F-GLPT R-ASPT |
| APC channel | APC | carries APC commands | F/R | 64 kb/s | 2e−1 | Controlled by APC | F-GLPT R-ASPT |

The Spreading Codes

The CDMA code generators used to encode the logical channels of the present invention employ Linear Shift Registers (LSRs) with feedback logic which is a method well known in the art. The code generators of the present embodiment of the invention generate 64 synchronous unique sequences. Each RC communication channel uses a pair of these sequences for complex spreading (in-phase and quadrature) of the logical channels, so the generator gives 32 complex spreading sequences. The sequences are generated by a single seed which is initially loaded into a shift register circuit.

The Generation of Spreading Code Sequences and Seed Selection

The spreading code period of the present invention is defined as an integer multiple of the symbol duration, and the beginning of the code period is also the beginning of the symbol. The relation between bandwidths and the symbol lengths chosen for the exemplary embodiment of the present invention is:

| BW (MHZ) | L (chips/symbol) |
|---|---|
| 7 | 91 |
| 10 | 130 |
| 10.5 | 133 |
| 14 | 182 |
| 15 | 195 |

The spreading code length is also a multiple of 64 and 96 for ISDN frame support. The spreading code is a sequence of symbols, called chips or chip values. The general methods of generating pseudorandom sequences using Galois Field mathematics is known to those skilled in the art; however, a unique set, or family, of code sequences has been derived for the present invention. First, the length of the linear feedback shift register to generate a code sequence is chosen, and the initial value of the register is called a "seed". Second, the constraint is imposed that no code sequence generated by a code seed may be a cyclic shift of another code sequence generated by the same code seed. Finally, no code sequence generated from one seed may be a cyclic code seed. Finally, no code sequence generated from one seed may be a cyclic shift of a code sequence generated by another seed.

It has been determined that the spreading code length of chip values of the present invention is:

$$128 \times 233415 = 29877120 \qquad \text{Equation 1}$$

The spreading codes are generated by combining a linear sequence of period 233415 and a nonlinear sequence of period 128.

The FBCH channel of the exemplary embodiment is an exception because it is not coded with the 128 length sequence, so the FBCH channel spreading code has period 233415.

Producing a nonlinear sequence of length 128 may be implemented in several different ways. First, the nonlinear sequence may be generated using a linear feedback shift register: a fixed sequence loaded into a shift register with a feed-back connection. The fixed sequence can be generated by an m-sequence of length 127 padded with an extra logic 0, 1, or random value using clock suppression and a logic circuit, as is well known in the art. However, generation of a sequence in real time in this manner may present timing and delay issues, as well as increasing complexity required to provide a desired phase of the sequence.

Consequently, in the exemplary embodiment of the present invention, the values of the nonlinear sequence of length 128 are generated first and then stored in memory within the system. The nonlinear sequence then may be provided, for example, by playing the sequence values from the memory. Another embodiment of the present invention includes loading the stored nonlinear sequence into a shift register with feedback from the last to the first stage. The nonlinear sequence then is repetitively cycled through the shift register and any desired phase of the nonlinear sequence may be provided from the corresponding shift register stage.

The linear sequence of length L=233415 is generated using a linear feedback shift register (LFSR) circuit with 36 stages. The feedback connections correspond to a irreducible polynomial h(n) of degree 36. The polynomial h(x) chosen for the exemplary embodiment of the present invention is $$h(x) = x^{36} + x^{35} + x^{30} + x^{28} + x^{26} + x^{25} + x^{22} + x^{20} + x^{19} + x^{17} + x^{16} + x^{15} + x^{14} + x^{12} + x^{11} + x^9 + x^8 + x^4 + x^3 + x^2 + 1$$

or, in binary notation $$h(x) = (1100001010110010110111101101100011101) \qquad \text{Equation 2}$$

A group of "seed" values for a LFSR representing the polynomial h(x) of equation (2) which generates code sequences that are nearly orthogonal with each other is determined. The first requirement of the seed values is that the seed values do not generate two code sequences which are simply cyclic shifts of each other.

The seeds are represented as elements of $GF(2^{36})$ which is the field of residue classes modulo h(x). This field has a primitive element $\delta = x^2 + x + 1$. The binary representation of $\delta$ is $$\delta = 000000000000000000000000000000000111 \qquad \text{Equation 3}$$

Every element of $GF(2^{36})$ can also be written as a power of $\delta$ reduced modulo h(x). Consequently, the seeds are represented as powers of $\delta$, the primitive element.

The solution for the order of an element does not require a search of all values; the order of an element divides the order of the field ($GF(2^{36})$). When $\delta$ is any element of $GF(2^{36})$ with $$x^e = 1 \qquad \text{Equation 4}$$

for some e, then $e | 2^{36} - 1$. Therefore, the order of any element in $GF(2^{36})$). When $\delta$ is any element in $GF(2^{36})$ divides $2^{36} - 1$.

Using these constraints, it has been determined that a numerical search generates a group of seed values, n, which are powers of $\delta$, the primitive element of h(x).

The present invention includes a method to increase the number of available seeds for use in a CDMA communication system by recognizing that certain cyclic shifts of the previously determined code sequences may be used simultaneously. The round trip delay for the cell sizes and bandwidths of the present invention are less than 3000 chips. In one embodiment of the present invention, sufficiently separated cyclic shifts of a sequence can be used within the same cell without causing ambiguity for a receiver attempting to determine the code sequence. This method enlarges the set of sequences available for use.

By implementing the tests previously described, a total of 3879 primary seeds were determined through numerical computation. These seeds are given mathematically as $$\delta^n \text{ modulo } h(x) \qquad \text{Equation 5}$$

where 3879 values of a n are listed in the Appendix A, with $\delta = (00, \ldots 00111)$ as before in (3).

When all primary seeds are known, all secondary seeds of the present invention are derived from the primary seeds by shifting them multiples of 4095 chips modulo h(x). Once a family of seed values is determined, these values are stored in memory and assigned to logical channels as necessary. Once assigned, the initial seed value is simply loaded into LFSR to produce the required spreading code sequence associated with the seed value.

Rapid Acquisition Feature of Long and Short codes

Rapid acquisition of the correct code phase by a spread-spectrum receiver is improved by designing spreading codes which are faster to detect. The present embodiment of the invention includes a new method of generating code sequences that have rapid acquisition properties by using one or more of the following methods. First, a long code may be constructed from two or more short codes. The new implementation uses many code sequences, one or more of which are rapid acquisition sequences of length L that have average acquisition phase searches r=log 2L. Sequences with such properties are well known to those practiced in the art. The average number of acquisition test phases of the resulting long sequence is a multiple of r=log 2L rather than half of the number of phases of the long sequence.

Second, a method of transmitting complex valued spreading code sequences (In-phase (I) and Quadrature (Q) sequences) in a pilot spreading code signal may be used rather than transmitting real valued sequences. Two or more separate code sequence may be transmitted over the complex channels. If the sequences have different phases, an acquisition may be done by acquisition circuits in parallel over the different code sequences when the relative phase shift between the two or more code channels is known. For example, for two sequences, one can be sent on an In phase (I) channel and one on the Quadrature (Q) channel. To search the code sequences, the acquisition detection means searches the two channels, but begins the (Q) channel with an offset equal to one-half of the spreading code sequence length. With code sequence length N, the acquisition means starts the search at N/2 on the (Q) channel. The average number of tests to find acquisition is N/2 for a single code search, but searching the (I) and phase delayed (Q) channel in parallel reduces the average number of tests to N/4. The codes sent on each channel could be the same code, the same code with one channel's code phase delayed, or different code sequences.

Epoch and Sub-epoch Structures

The long complex spreading codes used for the exemplary system of the present invention have a number of chips after which the code repeats. The repetition period of the spreading sequence is called an epoch. To map the logical channels to CDMA spreading codes, the present invention uses an Epoch and Sub-epoch structure. The code period for the CDMA spreading code to modulate logical channels is 29877120 chips/code period which is the same number of chips for all bandwidths. The code period is the epoch of the present invention, and Table 3 below defines the epoch duration for the supported chip rates. In addition, two sub-epochs are defined over the spreading code epoch and are 233415 chips and 128 chips long.

The 233415 chip sub-epoch is referred to as a long sub-epoch, and is used for synchronizing events on the RF communication interface such as encryption key switching and changing from global to assigned codes. The 128 chip short epoch is defined for use as an additional timing reference. The highest symbol rate used with a single CDMA code is 64 ksym/s. There is always an integer number of chips in a symbol duration for the supported symbol rates 64, 32, 16, and 8 ksym/s.

TABLE 3

Bandwidths, Chip Rates, and Epochs

| Bandwidth (MHz) | Chip Rate, Complex (Mchip/sec) | number of chips in a 64 kbit/sec symbol | 128 chip sub-epoch duration* (μs) | 233415 chip sub-epoch duration* (ms) | Epoch duration (sec) |
|---|---|---|---|---|---|
| 7 | 5.824 | 91 | 21.978 | 40.078 | 5.130 |
| 10 | 8.320 | 130 | 15.385 | 28.055 | 3.591 |
| 10.5 | 8.512 | 133 | 15.038 | 27.422 | 3.510 |
| 14 | 11.648 | 182 | 10.989 | 20.039 | 2.565 |
| 15 | 12.480 | 195 | 10.256 | 18.703 | 2.394 |

*numbers in these columns are rounded to 5 digits.

Mapping of the Logical Channels to Epochs and Sub-epochs

The complex spreading codes are designed such that the beginning of the sequence epoch coincides with the beginning of a symbol for all of the bandwidths supported. The present invention supports bandwidths of 7, 10, 10.5, 14, and 15 MHz. Assuming nominal 20% roll-off, these bandwidths correspond to the following chip rates in Table 4.

TABLE 4

Supported Bandwidths and Chip Rates for CDMA

| BW (MHz) | $R_c$ (Complex Mchips/sec) | Excess BW, % | L: ($R_c$/L) = 64k | Factorization of L |
|---|---|---|---|---|
| 7 | 5.824 | 20.19 | 91 | 7 × 13 |
| 10 | 8.320 | 20.19 | 130 | 2 × 5 × 13 |
| 10.5 | 8.512 | 23.36 | 133 | 7 × 19 |
| 14 | 11.648 | 20.19 | 182 | 2 × 7 × 13 |
| 15 | 12.480 | 20.19 | 195 | 3 × 5 × 13 |

The number of chips in an epoch is:

$$N=29877120=2^7 \times 3^3 \times 5 \times 7 \times 13 \times 19 \quad \text{Equation 6}$$

If interleaving is used, the beginning of an interleaver period coincides with the beginning of the sequence epoch. The spreading sequences generated using the method of the present invention can support interleaver periods that are multiples of 1.5 ms for various bandwidths.

Figure 2A:
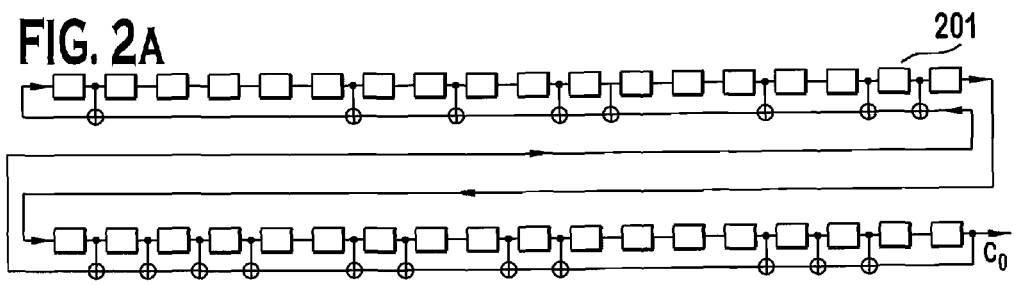
FIG. 2a is a block diagram of a 36 stage linear shift register suitable for use with long spreading code of the generator of the present invention.
Figure 2B:
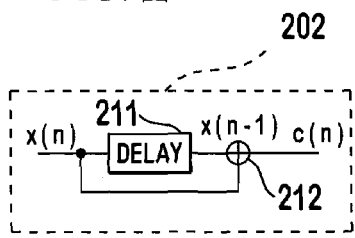
FIG. 2b is a block diagram of circuitry which illustrates the feed-forward operation of the code generator.
Figure 2C:
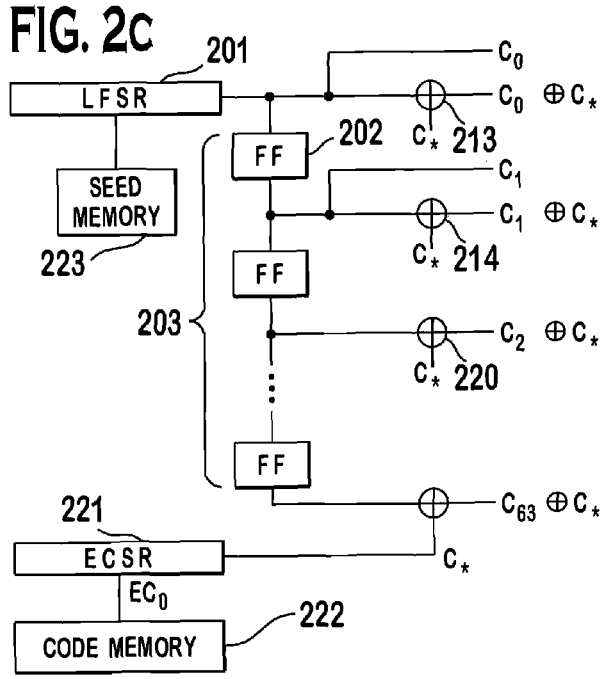
FIG. 2c is a block diagram of an exemplary code generator of the present invention including circuitry for generating spreading code sequences from the long spreading codes and the short spreading codes.

Cyclic sequences of the prior art are generated using linear feedback shift register (LFSR) circuits. However, this method does not generate sequences of even length. One embodiment of the spreading code sequence generator using the code seeds generated previously is shown in FIG. 2a, FIG. 2b, and FIG. 2c. The present invention uses a 36 stage LFSR 201 to generate a sequence of period $N'=233415=3^3 \times 5 \times 7 \times 13 \times 19$, which is $C_o$ in FIG. 2a. In FIGS. 2a, 2b, and 2c, the symbol ⊕ represents a binary addition (EXCLUSIVE-OR). A sequence generator designed as above generates the in-phase and quadrature parts of a set of complex sequences. The tap connections and initial state of the 36 state LFSR determine the sequence generated by this circuit. The tap coefficients of the 36 stage LFRS are determined such that the resulting sequences have the period 233415. Note that the tap connections shown in FIG. 2a correspond to the polynomial given in equation (2). Each resulting sequence is then overlaid by binary addition with the 128 length sequence C* to obtain the epoch period 29877120.

FIG. 2b shows a Feed Forward (FF) circuit 202 which is used in the code generator. The signal X[n−1] is output of the chip delay 211, and the input of the chip delay 211 is X[n]. The code chip C[n] is formed by the logical adder 212 from the input X[n] and X[n−1]. FIG. 2c shows the complete spreading code generator. From the LFSR 201, output signals go through a chain of up to 63 single stage FFs 203 cascaded as shown. The output of each FF is overlaid with the short, even code sequence C* period $128=2^7$ which is stored in code memory 222 and which exhibits spectral characteristics of a pseudorandom sequence to obtain the epoch N=29877120. This sequence of 128 is determined by using an m-sequence (PN sequence) of length $127=2^7-1$ and adding a bit-value, such as logic 0, to the sequence to increase the length to 128 chips. The even code sequence C* is input to the even code shift register 221, which is a cyclic register, that continually outputs the sequence. The short sequence is then combined with the long sequence using an EXCLUSIVE-OR operation 213, 214, 220.

Figure 2D:
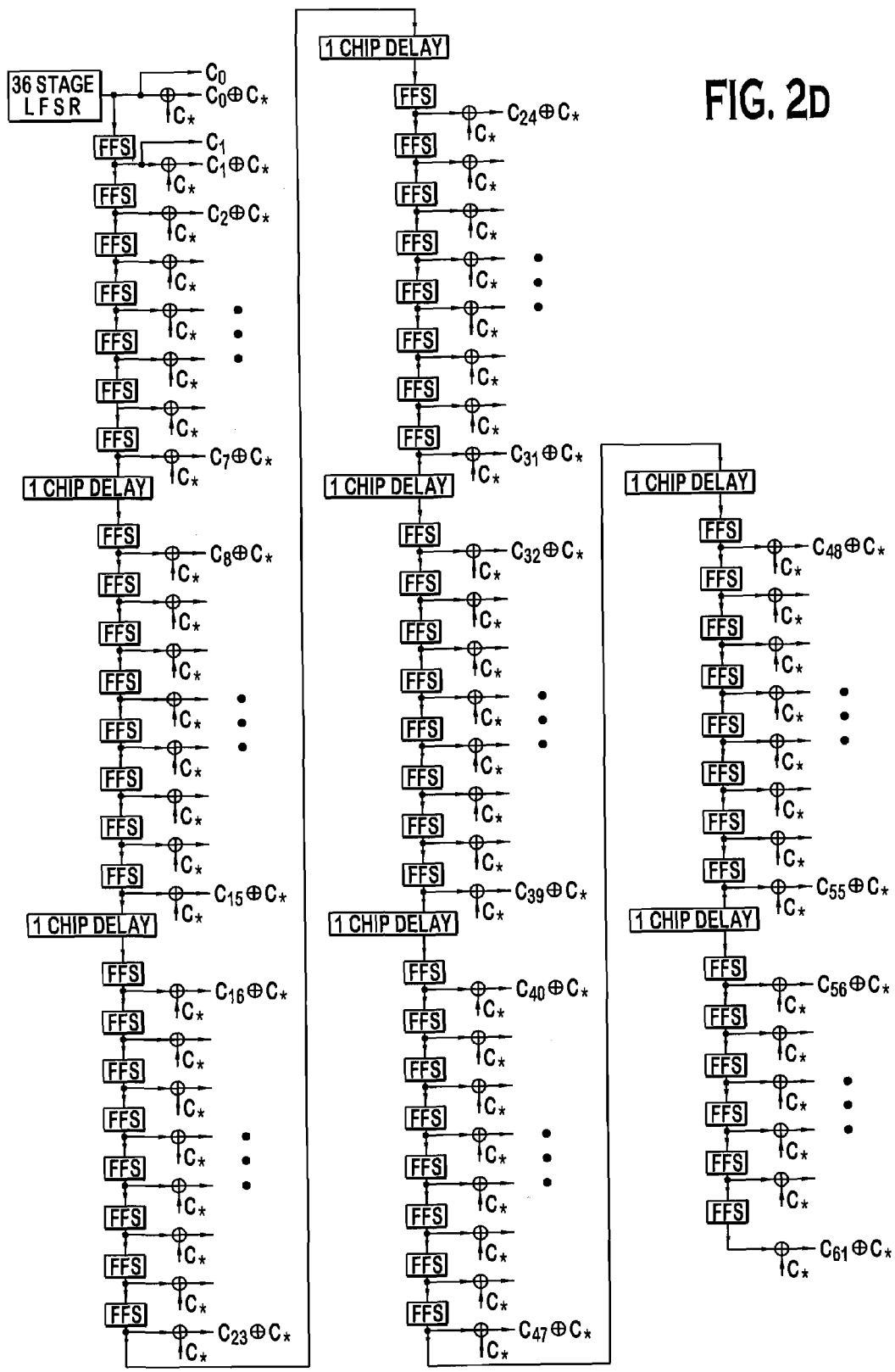
FIG. 2d is an alternate embodiment of the code generator circuit including delay elements to compensate for electrical circuit delays.

As shown in FIG. 2c, up to 63 spreading code sequences $C_o$ through $C_{63}$ are generated by tapping the output signals FFs 203 and logically adding the short sequence C* in binary adders 213, 214, and 220, for example. One skilled in the art would realize that the implementation of FF 203 will create a cumulative delay effect for the code sequences produced at each FF stage in the chain. This delay is due to the nonzero electrical delay in the electronic components of the implementation. The timing problems associated with the delay can be mitigated by inserting additional delay elements into the FF chain in one version of the embodiment of the invention. The FF chain of FIG. 2c with additional delay elements is shown in FIG. 2d.

The code-generators in the exemplary embodiment of the present invention are configured to generate either global codes, or assigned codes. Global codes are CDMA codes that can be received or transmitted by all users of the system. Assigned codes are CDMA codes that are allocated for a particular connection. When a set of sequences are generated from the same generator as described, only the seed of the 36 stage LFRS is specified to generate a family of sequences. Sequences for all the global codes, are generated using the same LFSR circuit. Therefore, once an SU has synchronized to the Global pilot signal from an RCS and knows the seed for the LFSR circuit for the Global Channel codes, it can generate not only the pilot sequence but also all other global codes used by the RCS.

The signal that is upconverted to RF is generated as follows. The output signals of the above shift register circuits are converted to an antipodal sequence (0 maps into +1, 1 maps into −1). The Logical channels are initially converted to QPSK signals, which are mapped as constellation points as is well known in the art. The IN-phase and Quadrature channels of each QPSK signal form the real and imaginary parts of the complex data value. Similarly, two spreading codes are used to form complex spreading chip values. The complex data are spread by being multiplied by the complex spreading code. Similarly, the received complex data is correlated with the conjugate of the complex spreading code to recover despread data.

Short Codes

Short codes are used for the initial ramp-up process when an SU accesses an RCS. The period of the short codes is equal to the symbol duration and the start of each period is aligned with a symbol boundary. Both SU and RCS derive the real and imaginary parts of the short codes from the last eight feed-forward sections of the sequence generator producing the global codes for that cell.

The short codes that are in use in the exemplary embodiment of the invention are updated every 3 ms. Other update times that are consistent with symbol rate may be used. Therefore, a change-over occurs every 3 ms starting from the epoch boundary. At a change-over, the next symbol length portion of the corresponding feed-forward output becomes the short code. When the SU needs to use a particular short code, it waits until the first 3 ms boundary of the next epoch and stores the next symbol length portion output from the corresponding FF section. This shall be used as the short code until the next change-over, which occurs 3 ms later.

The signals represented by these short codes are known as Short Access Channel pilots (SAXPTs).

Mapping of Logical Channels to Spreading Codes

The exact relationship between the spreading code sequences and the CDMA logical channels and pilot signals is documented in Table 5a and Table 5b. Those signal names ending in '–CH' correspond to logical channels. Those signal names ending in '–PT' correspond to pilot signals, which are described in detail below.

TABLE 5A

Spreading code sequences and global CDMA codes

| Sequence | Quadrature | Logical Channel or Pilot Signal | Direction |
|---|---|---|---|
| $C_0$ | I | FBCH | Forward (F) |
| $C_1$ | Q | FBCH | F |
| $C_2 \oplus C^*$ | I | GLPT | F |
| $C_3 \oplus C^*$ | Q | GLPT | F |
| $C_4 \oplus C^*$ | I | SBCH | F |
| $C_5 \oplus C^*$ | Q | SBCH | F |
| $C_6 \oplus C^*$ | I | CTCH(0) | F |
| $C_7 \oplus C^*$ | Q | CTCH(0) | F |
| $C_8 \oplus C^*$ | I | APCH(1) | F |
| $C_9 \oplus C^*$ | Q | APCH(1) | F |
| $C_{10} \oplus C^*$ | I | CTCH(1) | F |
| $C_{11} \oplus C^*$ | Q | CTCH(1) | F |
| $C_{12} \oplus C^*$ | I | APCH(1) | F |
| $C_{13} \oplus C^*$ | Q | APCH(1) | F |
| $C_{14} \oplus C^*$ | I | CTCH(2) | F |
| $C_{15} \oplus C^*$ | Q | CTCH(2) | F |
| $C_{16} \oplus C^*$ | I | APCH(2) | F |
| $C_{17} \oplus C^*$ | Q | APCH(2) | F |
| $C_{18} \oplus C^*$ | I | CTCH(3) | F |
| $C_{19} \oplus C^*$ | Q | CTCH(3) | F |
| $C_{20} \oplus C^*$ | I | APCH(3) | F |
| $C_{21} \oplus C^*$ | Q | APCH(3) | F |
| $C_{22} \oplus C^*$ | I | reserved | — |
| $C_{23} \oplus C^*$ | Q | reserved | — |
| … | … | … | … |
| $C_{40} \oplus C^*$ | I | reserved | — |
| $C_{41} \oplus C^*$ | Q | reserved | — |
| $C_{42} \oplus C^*$ | I | AXCH(3) | Reverse (R) |
| $C_{43} \oplus C^*$ | Q | AXCH(3) | R |
| $C_{44} \oplus C^*$ | I | LAXPT(3) SAXPT(3) seed | R |
| $C_{45} \oplus C^*$ | Q | LAXPT(3) SAXPT(3) seed | R |
| $C_{46} \oplus C^*$ | I | AXCH(2) | R |
| $C_{47} \oplus C^*$ | Q | AXCH(2) | R |
| $C_{48} \oplus C^*$ | I | LAXPT(2) SAXPT(2) seed | R |
| $C_{49} \oplus C^*$ | Q | LAXPT(2) SAXPT(2) seed | R |
| $C_{50} \oplus C^*$ | I | AXCH(1) | R |
| $C_{51} \oplus C^*$ | Q | AXCH(1) | R |
| $C_{52} \oplus C^*$ | I | LAXPT(1) SAXPT(1) seed | R |
| $C_{53} \oplus C^*$ | Q | LAXPT(1) SAXPT(1) seed | R |
| $C_{54} \oplus C^*$ | I | AXCH(0) | R |
| $C_{55} \oplus C^*$ | Q | AXCH(0) | R |
| $C_{56} \oplus C^*$ | I | LAXPT(0) SAXPT(0) seed | R |
| $C_{57} \oplus C^*$ | Q | LAXPT(0) SAXPT(0) seed | R |
| $C58 \oplus C^*$ | I | IDLE | — |
| $C59 \oplus C^*$ | Q | IDLE | — |
| $C60 \oplus C^*$ | I | AUX | R |

TABLE 5A-continued

Spreading code sequences and global CDMA codes

| Sequence | Quadrature | Logical Channel or Pilot Signal | Direction |
|---|---|---|---|
| $C_{61} \oplus C^*$ | Q | AUX | R |
| $C_{62} \oplus C^*$ | I | reserved | — |
| $C_{63} \oplus C^*$ | Q | reserved | — |

TABLE 5B

Spreading code sequences and assigned CDMA codes

| Sequence | Quadrature | Logical Channel or Pilot Signal | Direction |
|---|---|---|---|
| $C_0 \oplus C^*$ | I | ASPT | Reverse (R) |
| $C_1 \oplus C^*$ | Q | ASPT | R |
| $C_2 \oplus C^*$ | I | APCH | R |
| $C_3 \oplus C^*$ | Q | APCH | R |
| $C_4 \oplus C^*$ | I | OWCH | R |
| $C_5 \oplus C^*$ | Q | OWCH | R |
| $C_6 \oplus C^*$ | I | TRCH(0) | R |
| $C_7 \oplus C^*$ | Q | TRCH(0) | R |
| $C_8 \oplus C^*$ | I | TRCH(1) | R |
| $C_9 \oplus C$ | Q | TRCH(1) | R |
| $C_{10} \oplus C^*$ | I | TRCH(2) | R |
| $C_{11} \oplus C^*$ | Q | TRCH(2) | R |
| $C_{12} \oplus C^*$ | I | TRCH(3) | R |
| $C_{13} \oplus C^*$ | Q | TRCH(3) | R |
| $C_{14} \oplus C^*$ | I | reserved | — |
| $C_{15} \oplus C^*$ | Q | reserved | — |
| ... | ... | ... | ... |
| ... | ... | ... | ... |
| $C_{44} \oplus C^*$ | I | reserved | — |
| $C_{45} \oplus C^*$ | Q | reserved | — |
| $C_{46} \oplus C^*$ | I | TRCH(3) | Forward (F) |
| $C_{47} \oplus C^*$ | Q | TRCH(3) | F |
| $C_{48} \oplus C^*$ | I | TRCH(2) | F |
| $C_{49} \oplus C^*$ | Q | TRCH(2) | F |
| $C_{50} \oplus C^*$ | I | TRCH(1) | F |
| $C_{51} \oplus C^*$ | Q | TRCH(1) | F |
| $C_{52} \oplus C^*$ | I | TRCH(0) | F |
| $C_{53} \oplus C^*$ | Q | TRCH(0) | F |
| $C_{54} \oplus C^*$ | I | OWCH | F |
| $C_{55} \oplus C^*$ | Q | OWCH | F |
| $C_{56} \oplus C^*$ | I | APCH | F |
| $C_{57} \oplus C^*$ | Q | APCH | F |
| $C_{58} \oplus C^*$ | I | IDLE | — |
| $C_{59} \oplus C^*$ | Q | IDLE | — |
| $C_{60} \oplus C^*$ | I | reserved | — |
| $C_{61} \oplus C^*$ | Q | reserved | — |
| $C_{62} \oplus C^*$ | I | reserved | — |
| $C_{63} \oplus C^*$ | Q | reserved | — |

For global codes, the seed values for the 36 bit shift register are chosen to avoid using the same code, or any cyclic shift of the same code, within the same geographical area to prevent ambiguity or harmful interference. No assigned code is equal to, or a cyclic shift of a global code.

Pilot Signals

The pilot signals are used for synchronization, carrier phase recovery, and for estimating the impulse response of the radio channel.

The RCS 104 transmits a forward link pilot carrier reference as a complex pilot code sequence to provide time and phase reference for all SUs 111, 112, 115, 117 and 118 in its service area. The power level of the Global Pilot (GLPT) signal is set to provide adequate coverage over the whole RCS service area, which area depends on the cell size. With only one pilot signal in the forward link, the reduction in system capacity due to the pilot energy is negligible.

The SUs 111, 112, 115, 117 and 118 each transmits a pilot carrier reference as a quadrature modulated (complex-valued) pilot spreading code sequence to provide a time and phase reference to the RCS for the reverse link. The pilot signal transmitted by the SU of one embodiment of the invention is 6 dB lower than the power of the 32 kb/s POTS traffic channel. The reverse pilot channel is subject to APC. The reverse link pilot associated with a particular connection is called the Assigned Pilot (ASPT). In addition, there are pilot signals associated with access channels. These are called the Long Access Channel Pilots (LAXPTs). Short access channel pilots (SAXPTs) are also associated with the access channels and used for spreading code acquisition and initial power ramp-up.

All pilot signals are formed from complex codes, as defined below:

$$GLPT(\text{forward}) = \{C_2 \oplus C^*) + j.(C_3 \oplus C^*)\} \cdot \{(1) + j.(0)\}\{\text{ComplexCode}\} \cdot \{\text{Carrier}\}$$

The complex pilot signals are de-spread by multiplication with conjugate spreading codes: $\{C_2 \oplus C^*) + j.(C_3 \oplus C^*)\}$. By contrast, traffic channels are of the form:

$$TRCH_n(\text{forward/reverse}) = \{(C_k \oplus C^*) + j.(C_l \oplus C^*)\} \cdot \{(\pm 1) + j.(\pm 1)\}\{\text{ComplexCode}\} \cdot \{\text{DataSymbol}\}$$

which thus form a constellation set at $$\frac{\pi}{4}$$

radians with respect to the pilot signal constellations.

Figure 3A:
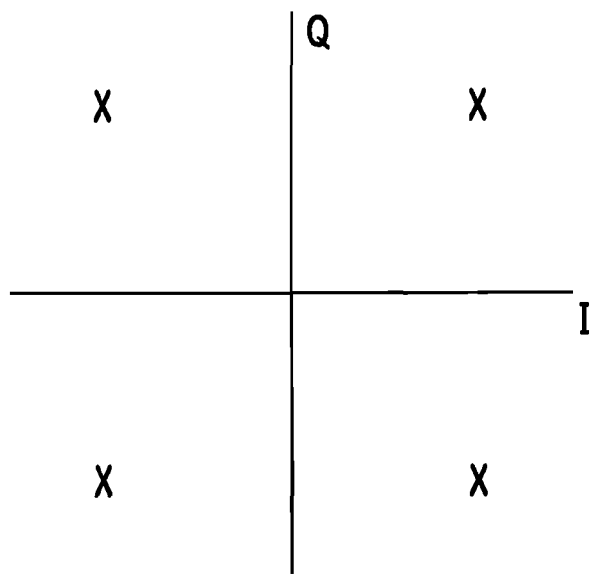
FIG. 3a is a graph of the constellation points of the pilot spreading code QPSK signal.
Figure 3B:
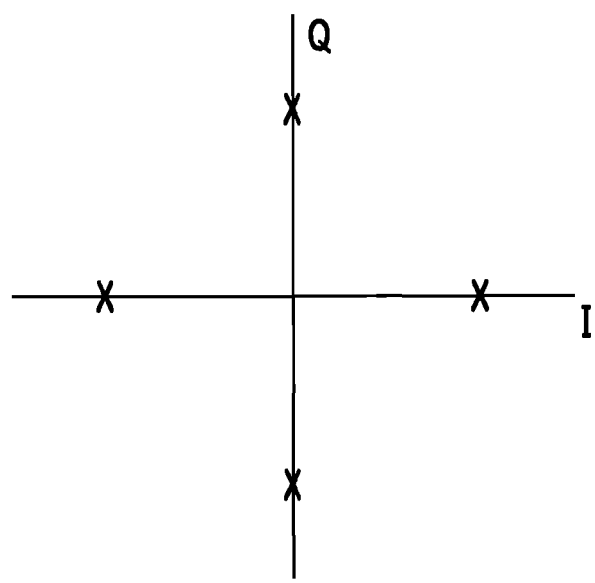
FIG. 3b is a graph of the constellation points of the message channel QPSK signal.

The GLPT constellation is shown in FIG. 3a, and the TRCH n traffic channel constellation is shown in FIG. 3b.

Logical Channel Assignment of the FBCH, SBCH, and Traffic Channels

The FBCH is a global forward link channel used to broadcast dynamic information about the availability of services and AXCHs. Messages are sent continuously over this channel, and each message lasts approximately 1 ms. The FBCH message is 16 bits long, repeated continuously, and is epoch aligned. The FBCH is formatted as defined in Table 6.

TABLE 6

FBCH format

| Bit | Definition |
|---|---|
| 0 | Traffic Light 0 |
| 1 | Traffic Light 1 |
| 2 | Traffic Light 2 |
| 3 | Traffic Light 3 |
| 4-7 | service indicator bits |
| 8 | Traffic Light 0 |
| 9 | Traffic Light 1 |
| 10 | Traffic Light 2 |
| 11 | Traffic Light 3 |
| 12-15 | service indicator bits |

For the FBCH, bit 0 is transmitted first. As used in Table 6, a traffic light corresponds to an Access Channel (AXCH) and indicates whether the particular access channel is currently in use (a red) or not in use (a green). A logic '1' indicates that the traffic light is green, and a logic '0' indicates the traffic light is red. The values of the traffic light bits may change from octet to octet, and each 16 bit message contains distinct service indicator bits which describe the types of services that are available for the AXCHs.

One embodiment of the present invention uses service indicator bits as follows to indicate the availability of services or AXCHs. The service indicator bits {4, 5, 6, 7, 12, 13, 14, 15} taken together may be an unsigned binary number, with bit 4 as the MSB and bit 15 as the LSB. Each service type increment has an associated nominal measure of the capacity required, and the FBCH continuously broadcasts the available capacity. This is scaled to have a maximum value equivalent to the largest single service increment possible. When an SU requires a new service or an increase in the number of bearers, it compares the capacity required to that indicated by the FBCH, and then considers itself blocked if the capacity is not available. The FBCH and the traffic channels are aligned to the epoch.

Slow Broadcast Information frames contain system or other general information that is available to all SUs and Paging Information frames contain information about all call requests for particular SUs. Slow Broadcast Information frames and Paging Information frames are multiplexed together on a single logical channel which forms the Slow Broadcast Channel (SBCH). As previously defined, the code epoch is a sequence of 29 877 20 chips having an epoch duration which is a function of the chip rate defined in Table 7 below. In order to facilitate power saving, the channel is divided into N "Sleep" Cycles, and each Cycle is subdivided into M slots, which are 19 ms long, except for 10.5 Mhz bandwidth which has slots of 18 ms.

TABLE 7

SBCH Channel Format Outline

| Bandwidth (MHz) | Spreading Code Rate (MHz) | Epoch Length (ms) | Cycles/ Epoch N | Cycle Length (ms) | Slots/ Cycle M | Slot Length (ms) |
| --- | --- | --- | --- | --- | --- | --- |
| 7.0 | 5.824 | 5130 | 5 | 1026 | 54 | 19 |
| 10.0 | 8.320 | 3591 | 3 | 1197 | 63 | 19 |
| 10.5 | 8.512 | 3510 | 3 | 1170 | 65 | 18 |
| 14.0 | 11.648 | 2565 | 3 | 855 | 45 | 19 |
| 15.0 | 12.480 | 2394 | 2 | 1197 | 63 | 19 |

Sleep Cycle Slot #1 is always used for slow broadcast information. Slots #2 to #M−1 are used for paging groups unless extended slow broadcast information is inserted. The pattern of cycles and slots in one embodiment of the present invention run continuously at 16 kb/s.

Within each Sleep Cycle the SU powers-up the receiver and re-acquires the pilot code. It then achieves carrier lock to a sufficient precision for satisfactory demodulation and Viterbi decoding. The settling time to achieve carrier lock may be up to 3 Slots in duration. For example, an SU assigned to Slot #7 powers up the Receiver at the start of Slot #4. Having monitored its Slot the SU will have either recognized its Paging Address and initiated an access request, or failed to recognize its Paging Address in which case it reverts to the Sleep mode. Table 8 shows duty cycles for the different bandwidths, assuming a wake-up duration of 3 Slots.

TABLE 8

Sleep-Cycle Power Saving

| Bandwidth (MHz) | Slots/Cycle | Duty Cycle |
| --- | --- | --- |
| 7.0 | 54 | 7.4% |
| 10.0 | 63 | 6.3% |
| 10.5 | 65 | 6.2% |
| 14.0 | 45 | 8.9% |
| 15.0 | 63 | 6.3% |

Spreading Code Tracking and AMF Detection in Multipath Channels

Spreading Code Tracking

Three CDMA spreading code tracking methods in multipath fading environments are described which track the code phase of a received multipath spread-spectrum signal. The first is the prior art tracking circuit which simply tracks the spreading code phase with the highest detector output signal value, the second is a tracking circuit that tracks the median value of the code phase of the group of multipath signals, and the third is the centroid tracking circuit which tracks the code-phase of an optimized, least mean squared weighted average of the multipath signal components. The following describes the algorithms by which the spreading code phase of the received CDMA signal is tracked.

Figure 3C:
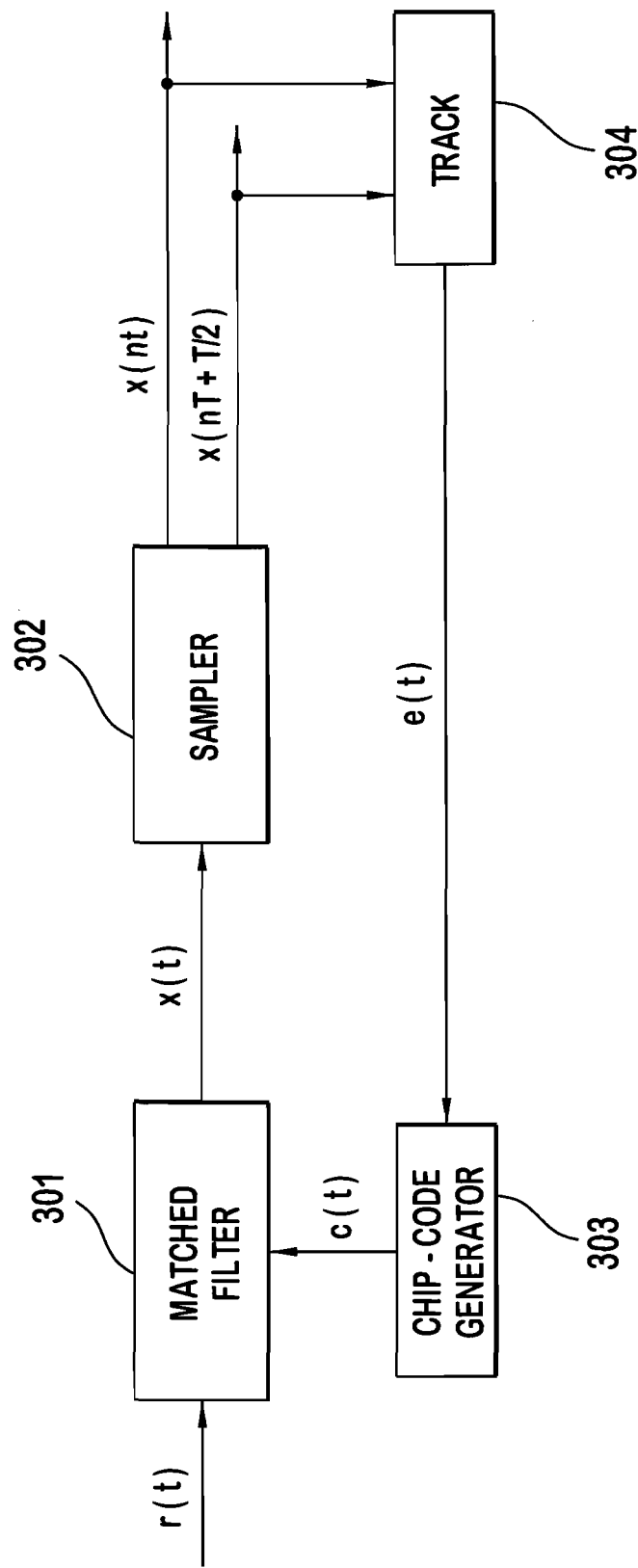
FIG. 3c is a block diagram of exemplary circuitry which implements the method of tracking the received spreading code phase of the present invention.
Figure 3D:
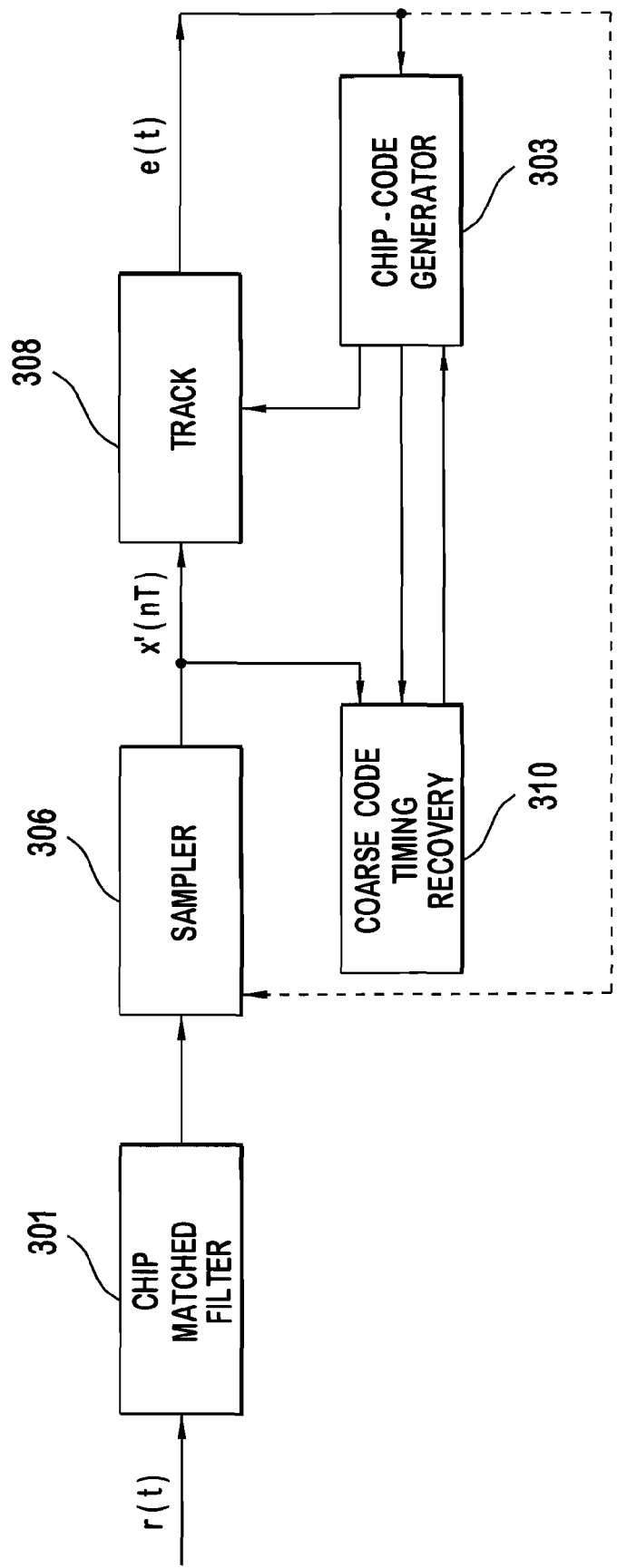
FIG. 3d is a block diagram of an alternative exemplary circuitry which implements the method of tracking the received spreading code phase of the present invention.

A tracking circuit has operating characteristics that reveal the relationship between the time error and the control voltage that drives a Voltage Controlled Oscillator (VCO) of a spreading code phase tracking circuit. When there is a positive timing error, the tracking circuit generates a negative control voltage to offset the timing error. When there is a negative timing error, the tracking circuit generates a positive control voltage to offset the timing error. When the tracking circuit generates a zero value, this value corresponds to the perfect time alignment called the 'lock-point'. FIGS. 3c and 3d show the basic tracking circuit. Received signal r(t) is applied to the chip Matched Filter 301, which maximizes the chip signal to noise ratio.

In FIG. 3c, the output signal of the chip matched filter x(t) is sampled by the sampler 302 at a sampling rate of twice the chip rate to produce samples x[nT] and x[nT+T/2]. The samples of x[nT] and x[nT+T/2] are used by a tracking circuit 304 to determine if the phase of the spreading code c(t) of the code generator 303 is correct. The tracking circuit 304 produces an error signal e(t) as an input to the code generator 303. The code generator 303 uses this signal e(t) as an input signal to adjust the code-phase it generates.

FIG. 3d shows a spreading code phase tracking system similar to that shown in FIG. 3c, but the output signal of the chip matched filter x(t) is sampled by the sampler 306 at a sampling rate equivalent to the chip rate to produce samples x'[nT] only. The tracking circuit 308 uses the samples x'[nT] in a manner similar to that of the tracking circuit 304 of FIG. 3c. The configuration of FIG. 3d may be used to track the code phase once an initial acquisition of the spreading code phase has occurred. In such a situation, the approximate chip timing can be recovered by a coarse timing recovery circuit 310 from an acquisition code generator clock CLK, for example, and the timing signal can be used by the Code Generator 303 and Sampler 306 to sample the signal x(t) at the approximate desired sampling time during a chip period. Consequently, to relate the operation of Track circuit 308 of the configuration of FIG. 3d to the following description of tracking methods assuming a configuration as described in 3c, the early samples x[nT] when sampling at the chip rate, and the late samples x[nT+T/2] become the odd samples of x'[nT].

In a CDMA system, the signal transmitted by the reference user is written in the low-pass representation as $$s(t) = \sum_{k=-\infty}^{\infty} c_k P_{Tc}(t - kT_c) \qquad \text{Equation 7}$$

where $c_k$ represents the spreading code coefficients, $P_{Tc}(t)$ represents spreading code chip waveform, and $T_c$ is the chip duration. Assuming that the reference user is not transmitting data so that only the spreading code modulates the carrier. Referring to FIG. 3c, the received signal is $$r(t) = \sum_{u=1}^{N} a_i s(t - \tau_i) \qquad \text{Equation 8}$$

Here, $a_i$ is due to fading effect of the multipath channel on the i-th path and $\tau_i$ is the random time delay associated with the same path. The receiver passes the received signal through a matched filter, which is implemented as a correlation receiver and is described below. This operation is done in two steps: first the signal is passed through a chip matched filter and sampled to recover the spreading code chip values, then this chip sequence is correlated with the locally generated code sequence.

FIG. 3c shows the chip matched filter 301, matched to the chip waveform $P_{Tc}(t)$, and the sampler 302. Ideally, the signal x(t) at the output terminal of the chip matched filter is $$x(t) = \sum_{i=k}^{M} \sum_{k+=-\infty}^{\infty} a_i c_k g(t - \tau_i k T_c) \qquad \text{Equation 9}$$

where $$g(t) = P_{Tc}(t) * h_R(t) \qquad \text{Equation 10}$$

Here, $h_r(t)$ is the impulse response of the chip matched filter and '*' denotes convolution. The order of the summations can be rewritten as $$x(t) = \sum_{i=k}^{M} c_k f(t - kT_c) \qquad \text{Equation 11}$$

where $$f(t) = \sum_{i=k}^{M} a_i g(t - \tau_i) \qquad \text{Equation 12}$$

In the multipath channel described above, the sampler samples the output signal of the matched filter to produce x(nT) at the maximum power level points of g(t). In practice, however, the waveform g(t) is severely distorted because of the effect of the multipath signal reception, and a perfect time alignment of the signals is not available.

When the multipath distortion in the channel is negligible and a perfect estimate of the timing is available, i.e., $a_i=1$, $\tau_1=0$, and $a_i=0$, i=2, . . . , M, the received signal is r(t)=s(t). Then, with this ideal channel model, the output of the chip matched filter becomes $$x(t) = \sum_{k=-\infty}^{\infty} c_k g(t - kT_c) \qquad \text{Equation 13}$$

When there is multipath fading, however, the received spreading code chip value waveform is distorted, and has a number of local maxima that can change from one sampling interval to another depending on the channel characteristics. For multipath fading channels with quickly changing channel characteristics, it is not practical to try to locate the maximum of the waveform f(t) in every chip period interval. Instead, a time reference may be obtained from the characteristics of f(t) that may not change as quickly. Three tracking methods are described based on different characteristics of f(t).

Prior Art Spreading Code Tracking Method:

Prior art tracking methods include a code tracking circuit in which the receiver attempts to determine the timing of the maximum matched filter output value of the chip waveform occurs and sample the signal accordingly. However, in the multipath fading channels, the receiver despread code waveform can have a number of local maxima, especially in a mobile environment. In the following, f(t) represents the received signal waveform of the spreading code chip convolved with the channel impulse response. The frequency response characteristic of f(t) and the maximum of this characteristic can change rather quickly making it impractical to track the maximum of f(t).

Define $\tau$ to be the time estimate that the tracking circuit calculates during a particular sampling interval. Also, define the following error function $$\varepsilon = \begin{cases} \int_{\{t: |\tau-t|>\delta\}} f(t)dt, & |\tau - t| > \delta \\ \varepsilon = 0 & |\tau - t| < \delta \end{cases} \qquad \text{Equation 14}$$

The tracking circuits of the prior art calculate a value of the input signal that minimizes the error $\epsilon$. One can write $$\min \varepsilon = 1 - \max_{\tau} \int_{\tau-\delta}^{\tau+\delta} f(t)dt \qquad \text{Equation 15}$$

Assuming $f(\tau)$ has a smooth shape in the value given, the value of $\tau$ for which $f(\tau)$ is maximum minimizes the error $\epsilon$, so the tracking circuit tracks the maximum point of $f(\tau)$.

Median Weighted Value Tracking Method

The Median Weighted Tracking Method of one embodiment of the present invention, minimizes the absolute weighted error, defined as $$\epsilon = \int_{-\infty}^{\infty} |t-\tau| f(t) dt \qquad \text{Equation 16}$$

This tracking method calculates the 'median' signal value of $f(\tau)$ by collecting information from all paths, where $f(\tau)$ is as in equation 12. In a multipath fading environment, the waveform f(t) can have multiple local maxima, by only one median.

To minimize $\epsilon$, take the derivative of equation (16) is taken with respect to $\tau$ and the result is equated to zero, which gives $$\int_{-\infty}^{\tau} f(t)dt = \int_{\tau}^{\infty} f(t)dt \qquad \text{Equation 17}$$

Figure 4:
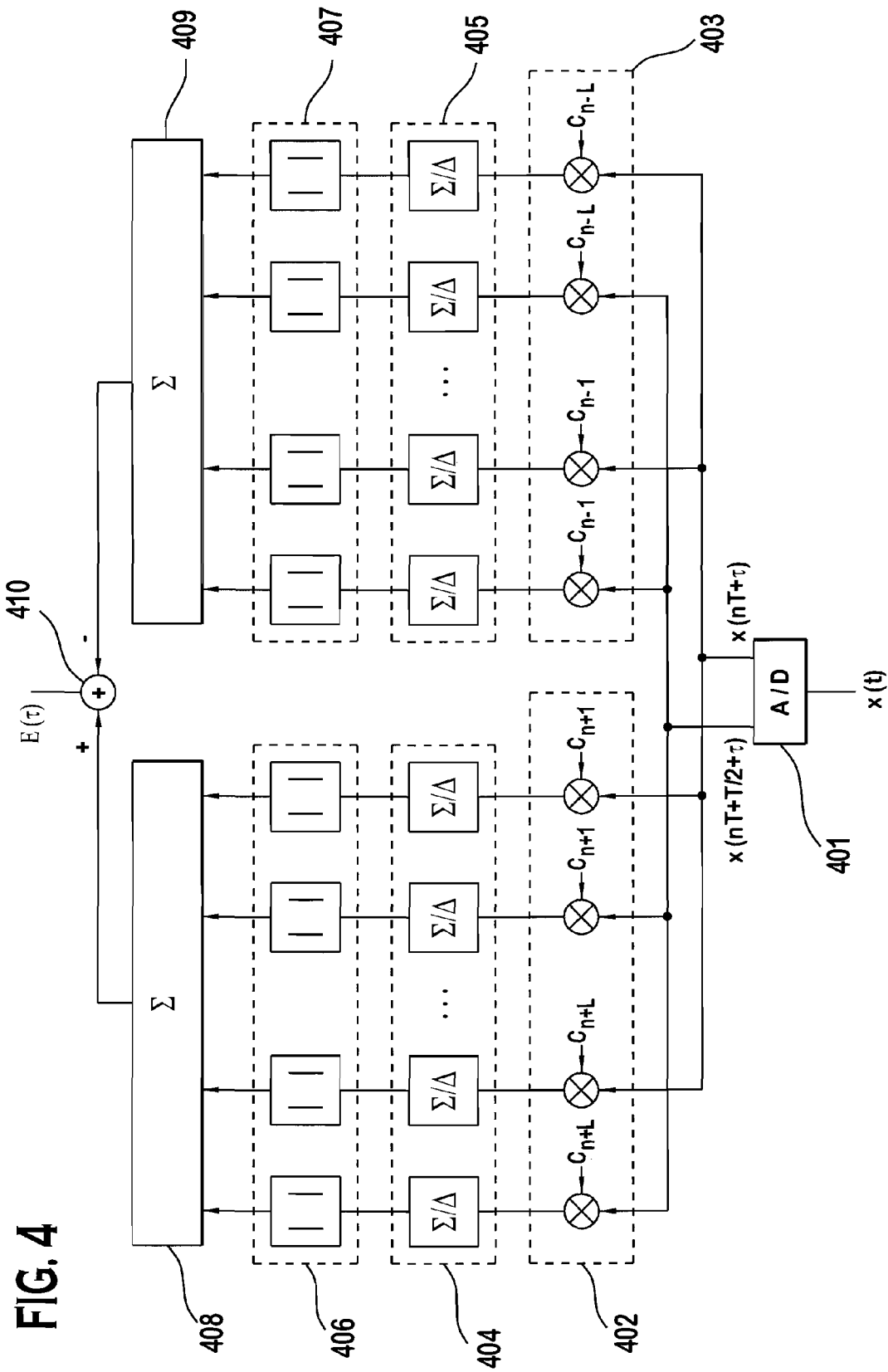
FIG. 4 is a block diagram of the tracking circuit that tracks the median of the received multipath signal components.

The value of $\tau$ that satisfies (17) is called the 'median' of f(t). Therefore, the Median Tracking Method of the present embodiment tracks the median of $f(\tau)$. FIG. 4 shows an implementation of the tracking circuit based on minimizing the absolute weighted error defined above. The signal x(t) and its one-half chip offset version x(t+T/2) are sampled by the A/D 401 at a rate 1/T. The following equation determines the operating characteristic of the circuit in FIG. 4:

$$\varepsilon(\tau) = \sum_{n=1}^{2L} |f(\tau - nT/2)| - |f(\tau + nT/2)| \qquad \text{Equation 18}$$

Tracking the median of a group of multipath signals keeps the received energy of the multipath signal components substantially equal on the early and late sides of the median point of the correct locally generated spreading code phase $c_n$. The tracking circuit consists of an A/D 401 which samples an input signal x(t) to form the half-chip offset samples. The half chip offset samples are alternatively grouped into even samples called an early set of samples x(nT+x) and odd samples called a late set of samples x(nT+(T/2)+τ). The first correlation bank adaptive matched filter 402 multiplies each early sample by the spreading code phases c(n−1), c(n−2), . . . , c(n−L), where L is small compared to the code length and approximately equal to number of chips of delay between the earliest and latest multipath signal. The output of each correlator is applied to a respective first sum-and-dump bank 404. The magnitudes of the output values of the L sum-and-dumps are calculated in the calculator 406 and then summed in summer 408 to give an output value proportional to the signal energy in the early multipath signals. Similarly, a second correlation bank adaptive matched filter 403 operates on the late samples, using code phases c(n−1), c(n−2), . . . , c(n−L), and each output signal is applied to a respective sum-and-dump circuit in an integrator 405. The magnitudes of the L sum-and-dump output signals are calculated in calculator 407 and then summed in summer 409 to give a value for the late multipath signal energy. Finally, the subtractor 410 calculates the difference and produces error signal ϵ(t) of the early and late signals energy values.

The tracking circuit adjusts by means of error signal ϵ(τ) the locally generated code phases c(t) to cause the difference between the early and late values to tend toward 0.

Centroid Tracking Method

The optimal spreading code tracking circuit of one embodiment of the present invention is called the squared weighted tracking (or centroid) circuit. Defining τ to denote the time estimate that the tracking circuit calculates, based on some characteristic of f(t), the centroid tracking circuit minimizes the squared weighted error defined as $$\epsilon = \int_{-\infty}^{\infty} |t-\tau|^2 f(t) dt \qquad \text{Equation 19}$$

This function inside the integral has a quadratic form, which has a unique minimum. The value of τ that minimizes ϵ can be found by taking the derivative of the above equation with respect to τ and equating to zero, which gives $$\int_{-\infty}^{\infty} (-2t+2\tau) f(t) dt = 0 \qquad \text{Equation 20}$$

Therefore, the value of τ that satisfies equation (21)

$$\tau - \frac{1}{\beta} \int_{-\infty}^{\infty} t f(t) dt = 0 \qquad \text{Equation 21}$$

is the timing estimate that the tracking circuit calculates, where β is a constant value.

Figure 5A:
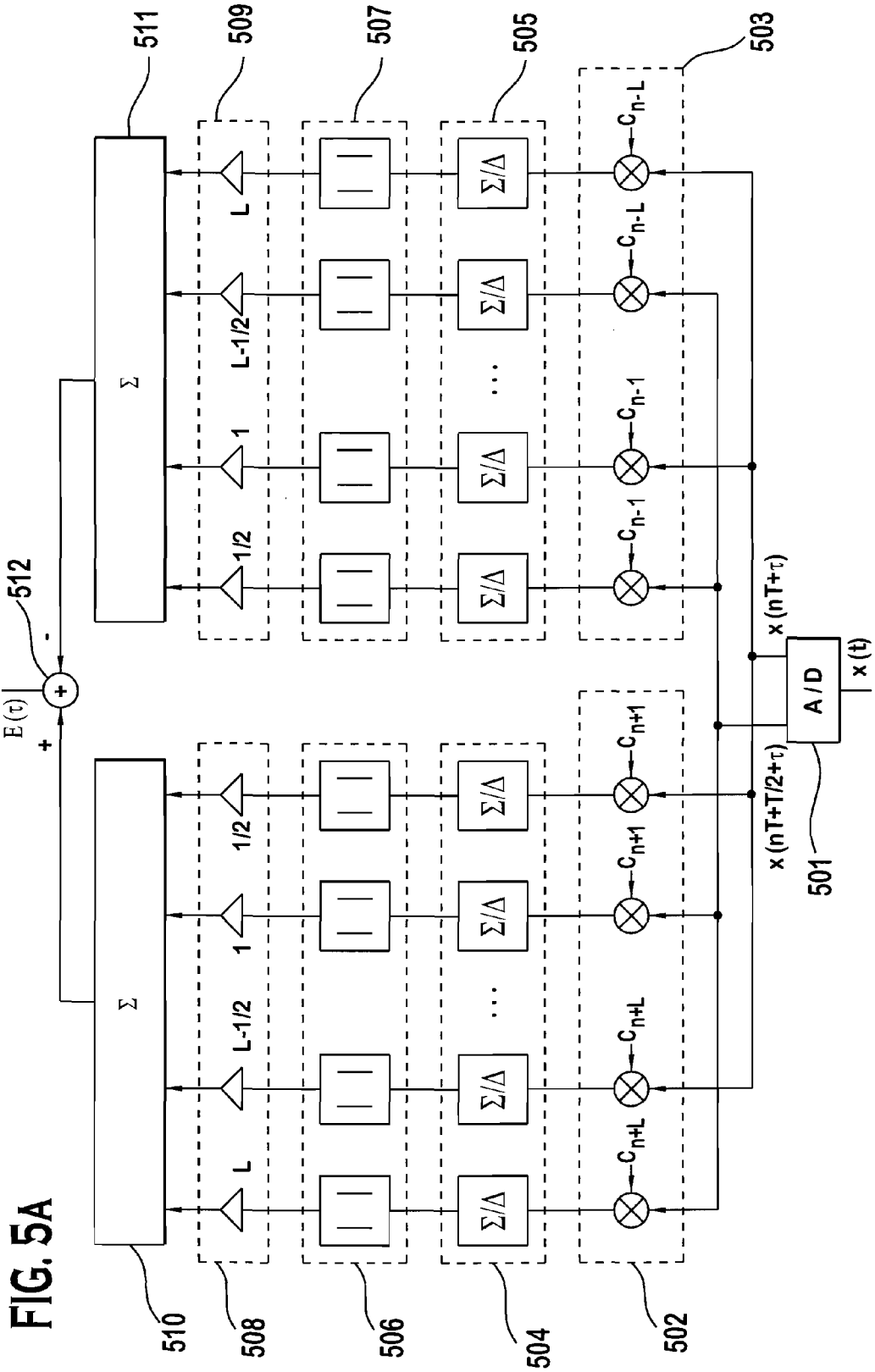
FIG. 5a is a block diagram of the tracking circuit that tracks the centroid of the received multipath signal components.

Based on these observations, a realization of an exemplary tracking circuit which minimizes the squared weighted error is shown in FIG. 5a. The following equation determines the error signal ϵ(τ) of the centroid tracking circuit:

$$\varepsilon(\tau) = \sum_{n=1}^{2L} n[|f(\tau - nT/2)| - |f(\tau + nT/2)|] = 0 \qquad \text{Equation 22}$$

The value that satisfies ϵ(τ)=0 is the perfect estimate of the timing.

The early and late multipath signal energy on each side of the centroid point are equal. The centroid tracking circuit shown in FIG. 5a consists of an A/D converter 501 which samples an input signal x(t) to form the half-chip offset samples. The half chip offset samples are alternatively grouped as an early set of samples x(nT+τ) and a late set of samples x(nT+(T/2)+τ). The first correlation bank adaptive matched filter 502 multiplies each early sample and each late sample by the positive spreading code phases c(n+1), c(n+2), . . . , c(n+L), where L is small compared to the code length and approximately equal to number of chips of delay between the earliest and latest multipath signal. The output signal of each correlator is applied to a respective one of L sum-and-dump circuits of the first sum and dump bank 504. The magnitude value of each sum-and-dump circuit of the sum and dump bank 504 is calculated by the respective calculator in the calculator bank 506 and applied to a corresponding weighting amplifier of the first weighting bank 508. The output signal of each weighting amplifier represents the weighted signal energy in a multipath component signal.

The weighted early multipath signal energy values are summed in sample adder 510 to give an output value proportional to the signal energy in the group of multipath signals corresponding to positive code phases which are the early multipath signals. Similarly, a second correlation bank adaptive matched filter 503 operates on the early and late samples, using the negative spreading code phases c(n−1), c(n−2), . . . , c(n−L); each output signal is provided to a respective sum-and-dump circuit of discrete integrator 505. The magnitude value of the L sum-and-dump output signals are calculated by the respective calculator of calculator bank 507 and then weighted in weighting bank 509. The weighted late multipath signal energy values are summed in sample adder 511 to give an energy value for the group of multipath signals corresponding to the negative code phases which are the late multipath signals. Finally, the adder 512 calculates the difference of the early and late signal energy values to produce error sample value ϵ τ).

The tracking circuit of FIG. 5a produces error signal ϵ(τ) which is used to adjust the locally generated code phase c(nT) to keep the weighted average energy in the early and late multipath signal groups equal. The embodiment shown uses weighting values that increase as the distance from the centroid increases. The signal energy in the earliest and latest multipath signals is probably less than the multipath signal values near the centroid. Consequently, the difference calculated by the adder 510 is more sensitive to variations in delay of the earliest and latest multipath signals.

Quadratic Detector for Tracking

In the new embodiment of the tracking method, the tracking circuit adjusts sampling phase to be "optimal" and robust to multipath. Let f(t) represent the received signal waveform as in equation 12 above. The particular method of optimizing starts with a delay locked loop with an error signal ϵ(τ) that drives the loop. The function ϵ(τ) must have only one zero at τ=$τ_0$ where $τ_0$ is optimal. The optimal form for ϵ(τ) has the canonical form:

$$\varepsilon(\tau) = \int_{-\infty}^{\infty} w(t, \tau)|f(t)|^2 dt \qquad \text{Equation 23}$$

where w(t, τ) is a weighting function relating f(t) to the error ε(τ), and the relationship indicated by equation (24) also holds $$\varepsilon(\tau + \tau_0) = \int_{-\infty}^{\infty} w(t, \tau + \tau_0)|f(t)|^2 dt \qquad \text{Equation 24}$$

It follows from equation (24) that w(t, τ) is equivalent to w(t−τ). Considering the slope M of the error signal in the neighborhood of a lock point $\tau_0$:

$$M = \frac{d\varepsilon(\tau)}{d\tau}\bigg|_{\tau 0} = -\int_{-\infty}^{\infty} w'(t - \tau_0) g(t) dt \qquad \text{Equation 25}$$

where w'(t, τ) is the derivative of w(t, τ) with respect to τ, and g(t) is the average of $|f(t)|^2$.

The error ε(τ) has a deterministic part and a noise part. Let z denote the noise component in ε(τ), then $|z|^2$ is the average noise power in the error function ε(τ). Consequently, the optimal tracking circuit maximizes the ratio $$F = \frac{M^2}{|z|^2} \qquad (26) \qquad \text{Equation 26}$$

Figure 5B:
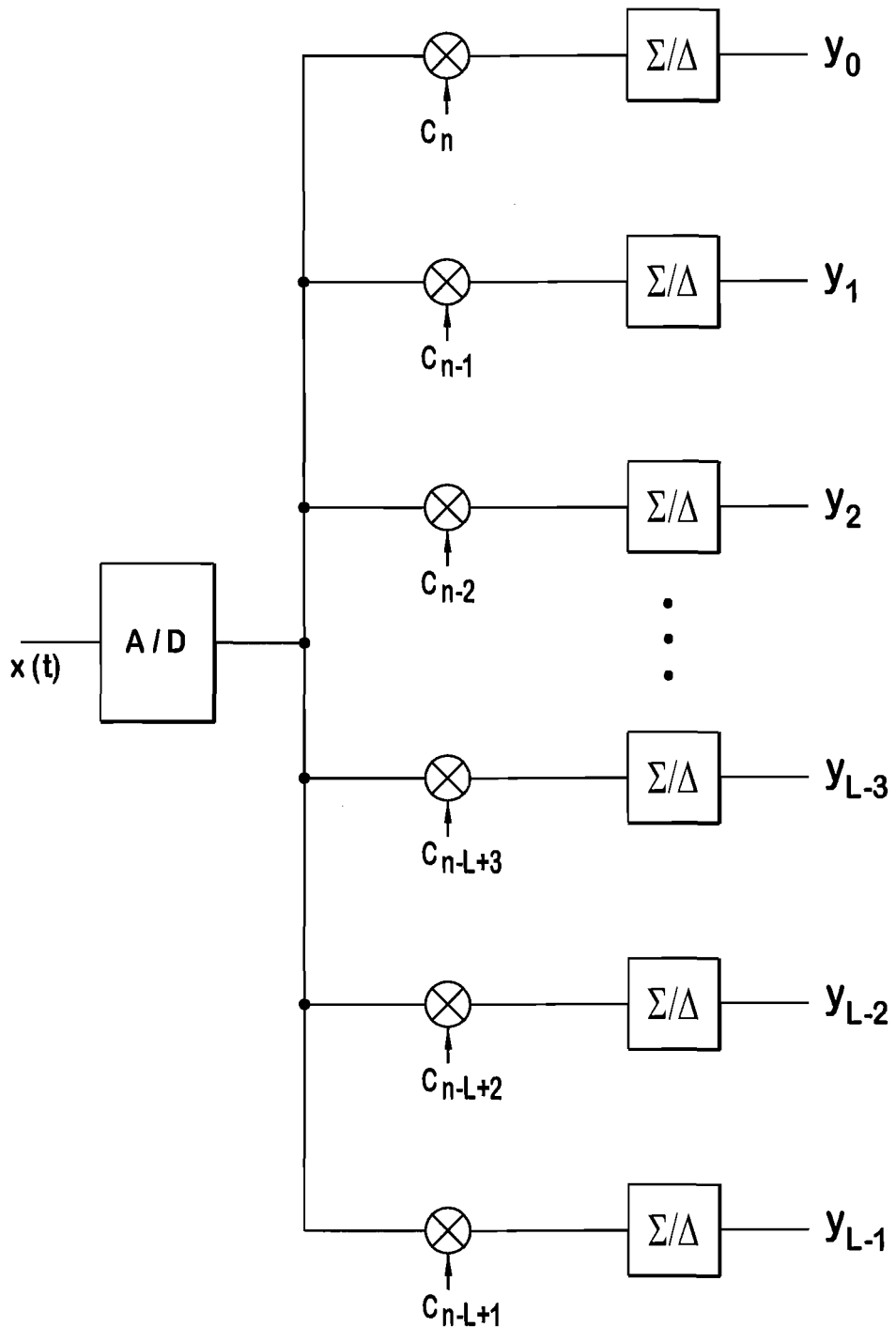
FIG. 5b is a block diagram of the Adaptive Vector Correlator.

The implementation of the Quadratic Detector is now described. The discrete error value e of an error signal ε(τ) is generated by performing the operation $$e = y^T B y \qquad \text{Equation 27}$$

where the vector y represents the received signal components yi, i=0, 1, . . . L−1, as shown in FIG. 5b. The matrix B is an L by L matrix and the elements are determined by calculating values such that the ratio F of equation (26) is maximized.

The Quadratic Detector described above may be used to implement the centroid tracking system described above with reference to FIG. 5a. For this implementation, the vector y is the output signal of the sum and dump circuits 504: y={f(τ−LT), f(τ−LT+T/2), f(τ−(L−1)T), ···f(τ), f(τ+T/2), f(τ+T), ···f(τ+LT)} and the matrix B is set forth in Table 9.

TABLE 9

| B matrix for quadratic form of Centroid Tracking System | | | | | | | | | | |
|---|---|---|---|---|---|---|---|---|---|---|
| L | 0 | 0 | 0 | 0 | 0 | 0 | 0 | 0 | 0 | 0 |
| 0 | L − ½ | 0 | 0 | 0 | 0 | 0 | 0 | 0 | 0 | 0 |
| 0 | 0 | L − 1 | 0 | 0 | 0 | 0 | 0 | 0 | 0 | 0 |
| . | . | . | . | . | . | . | . | . | . | . |
| . | . | . | . | . | . | . | . | . | . | . |
| . | . | . | . | . | . | . | . | . | . | . |
| 0 | 0 | 0 | 0 | ½ | 0 | 0 | 0 | 0 | 0 | 0 |
| 0 | 0 | 0 | 0 | 0 | 0 | 0 | 0 | 0 | 0 | 0 |
| 0 | 0 | 0 | 0 | 0 | 0 | −½ | 0 | 0 | 0 | 0 |
| . | . | . | . | . | . | . | . | . | . | . |
| . | . | . | . | . | . | . | . | . | . | . |
| 0 | 0 | 0 | 0 | 0 | 0 | 0 | 0 | −L + 1 | 0 | 0 |
| 0 | 0 | 0 | 0 | 0 | 0 | 0 | 0 | 0 | −L + ½ | 0 |
| 0 | 0 | 0 | 0 | 0 | 0 | 0 | 0 | 0 | 0 | −L |

Determining the Minimum Value of L Needed:

The value of L in the previous section determines the minimum number of correlators and sum-and-dump elements. L is chosen as small as possible without compromising the functionality of the tracking circuit.

The multipath characteristic of the channel is such that the received chip waveform f(t) is spread over $QT_c$ seconds, or the multipath components occupy a time period of Q chips duration. The value of L chosen is L=Q. Q is found by measuring the particular RF channel transmission characteristics to determine the earliest and latest multipath component signal propagation delay. $QT_c$ is the difference between the earliest and latest multipath component arrival time at a receiver.

Adaptive Vector Correlator

An embodiment of the present invention uses an adaptive vector correlator (AVC) to estimate the channel impulse response and to obtain a reference value for coherent combining of received multipath signal components. The described embodiment employs an array of correlators to estimate the complex channel response affecting each multipath component. The receiver compensates for the channel response and coherently combines the received multipath signal components. This approach is referred to as maximal ratio combining.

Figure 6:
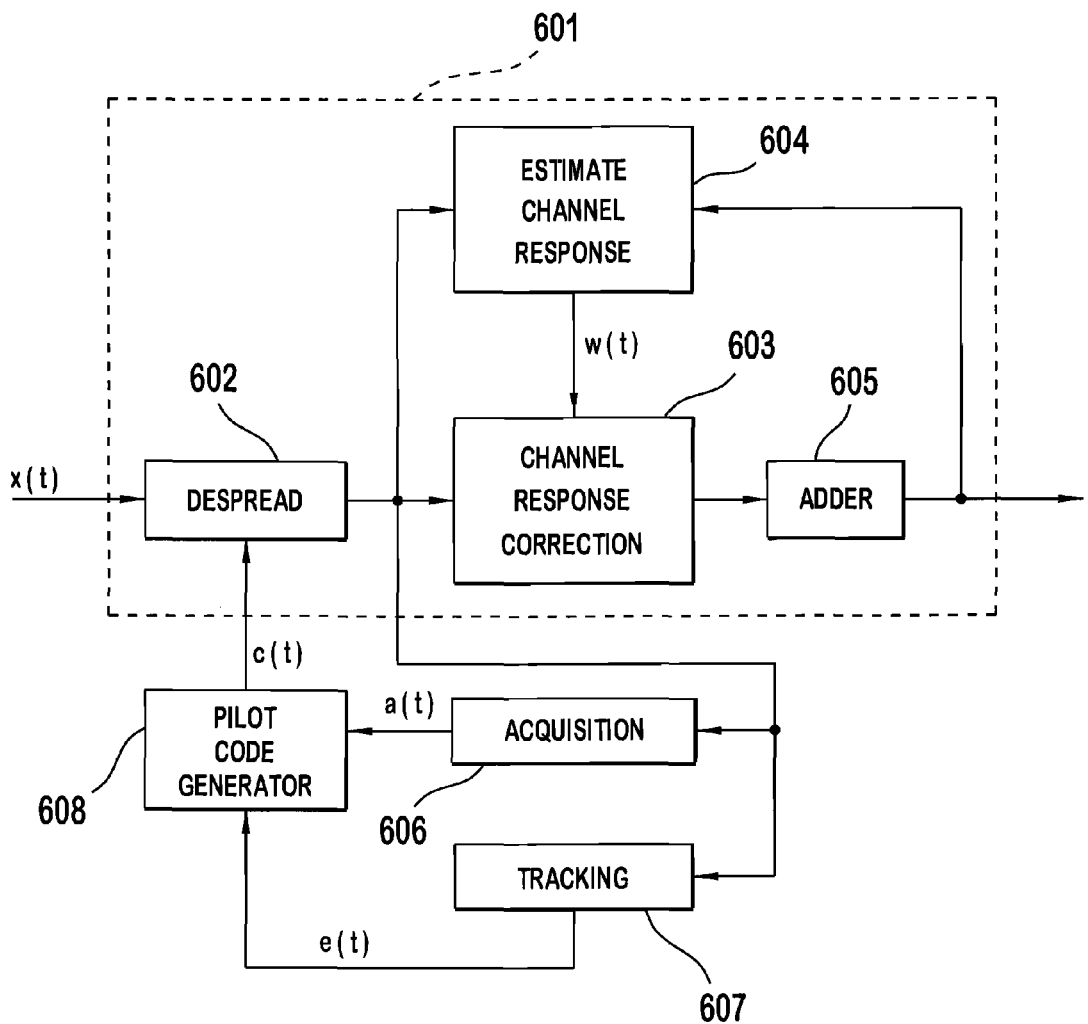
FIG. 6 is a block diagram of exemplary circuitry which implements the acquisition decision method of the correct spreading code phase of the received pilot code of the present invention.

Referring to FIG. 6, the input signal x(t) to the system includes interference noise of other message channels, multipath signals of the message channels, thermal noise, and multipath signals of the pilot signal. The signal is provided to AVC 601 which, in the exemplary embodiment, includes a despreading means 602, channel estimation means for estimating the channel response 604, correction means for correcting a signal for effects of the channel response 603, and adder 605. The AVC despreading means 602 is composed of multiple code correlators, with each correlator using a different phase of the pilot code c(t) provided by the pilot code generator 608. The output signal of this despreading means corresponds to a noise power level if the local pilot code of the despreading means is not in phase with the input code signal. Alternatively, it corresponds to a received pilot signal power level plus noise power level if the phases of the input pilot code and locally generated pilot code are the same. In one embodiment, as shown in FIG. 6, the output signals of the correlators of the despreading means are corrected for the channel response by the correction means 603 and are applied to the adder 605 which collects all multipath pilot signal power. In another embodiment, not shown, the signal x(t) and not the despread signal is provided directly to the correction means 603, and is then despread by a despreading circuit similar to despreading means 602.

The channel response estimation means 604 receives the combined pilot signal and the output signals of the despreading means 602, and provides a channel response estimate signal, w(t), to the correction means 603 of the AVC, and the estimate signal w(t) is also available to the adaptive matched filter (AMF) described below. The output signal of the despreading means 602 is also provided to the acquisition decision means 606 which decides, based on a particular algorithm such as a sequential probability ratio test (SPRT), if the present output levels of the despreading circuits correspond to synchronization of the locally generated code to the desired input code phase. If the detector finds no synchronization, then the acquisition decision means sends a control signal a(t) to the local pilot code generator 608 to offset its phase by one or more chip period. When synchronization is found, the acquisition decision means informs tracking circuit 607, which achieves and maintains a close synchronization between the received and locally generated code sequences.

Figure 7:
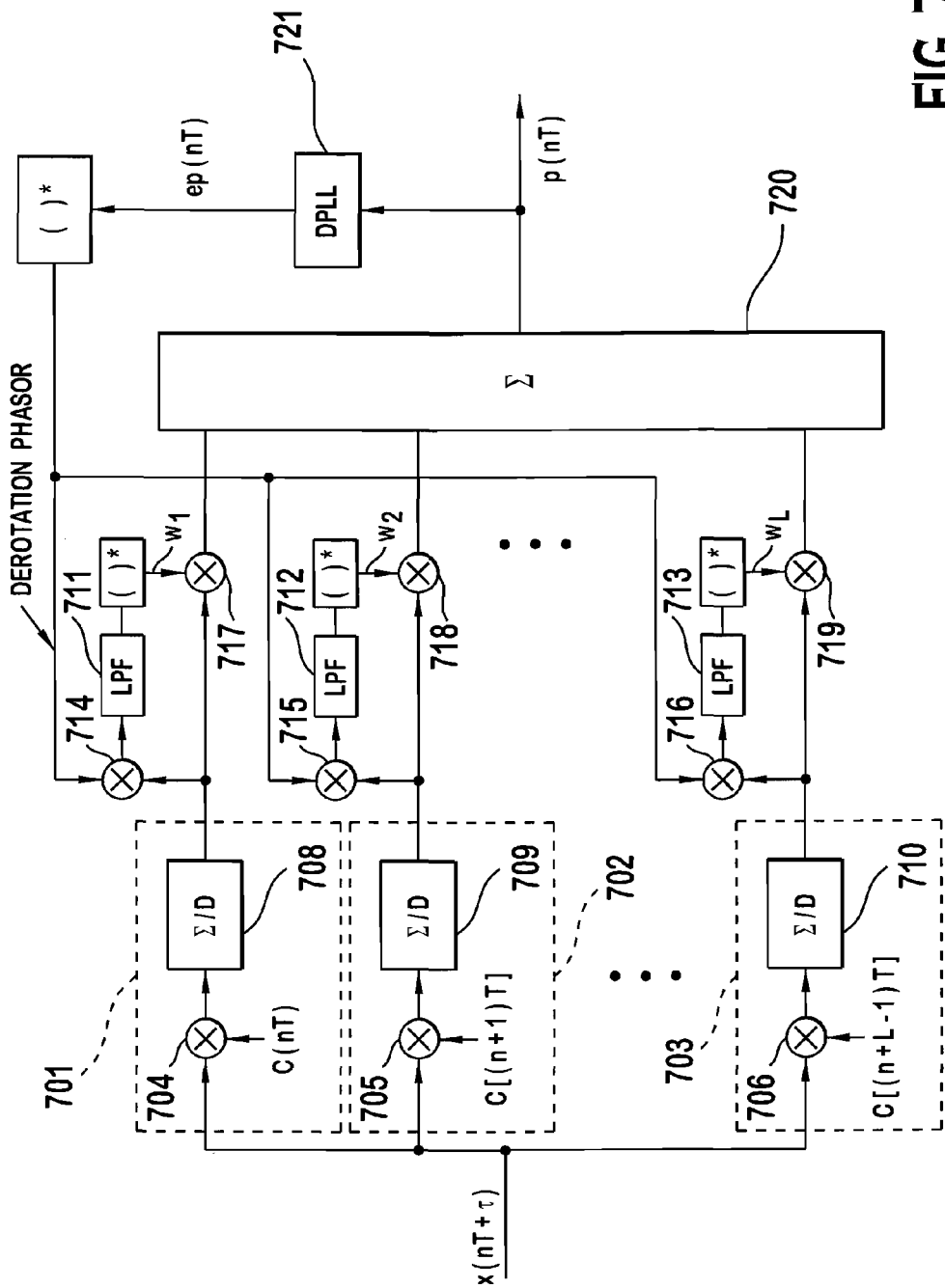
FIG. 7 is a block diagram of an exemplary pilot rake filter which includes the tracking circuit and digital phase locked loop for despreading the pilot spreading code, and generator of the weighting factors of the present invention.

An exemplary implementation of the Pilot AVC used to despread the pilot spreading code is shown in FIG. 7. The described embodiment assumes that the input signal x(t) has been sampled with sampling period T to form samples x(nT+τ), and is composed of interference noise of other message channels, multipath signals of message channels, thermal noise, and multipath signals of the pilot code. The signal x(nT+τ) is applied to L correlators, where L is the number of code phases over which the uncertainty within the multipath signals exists. Each correlator 701, 702, 703 comprises a multiplier 704, 705, 706, which multiples the input signal with a particular phase of the Pilot spreading code signal c((n+i)T), and sum-and-dump circuits 708, 709, 710. The output signal of each multiplier 704, 705, 706 is applied to a respective sum- and dump circuit 708, 709, 710 to perform discrete integration. Before summing the signal energy contained in the outputs of the correlators, the AVC compensates for the channel response and the carrier phase rotation of the different multipath signals. Each output of each sum-and-dump 708, 709, 710 is multiplied with a derotation phaser [complex conjugate of ep(nT)] from digital phase lock loop (DPLL) 721 by the respective multiplier 714, 715, 716 to account for the phase and frequency offset of the carrier signal. The Pilot Rake AMF calculates the weighting factors wk, k=1, . . . , L, for each multipath signal by passing the output of each multiplier 714, 715, 716 through a low pass filter (LPF) 711, 712, 713. Each despread multipath signal is multiplied by its corresponding weighting factor in a respective multiplier 717, 718, 719. The output signals of the multipliers 717, 718, 719 are summed in a master adder 720, and the output signal p(nT) of the accumulator 720 consists of the combined despread multipath pilot signals in noise. The output signal p(nT) is also input to the DPLL 721 to produce the error signal ep(nT) for tracking of the carrier phase.

Figure 8A:
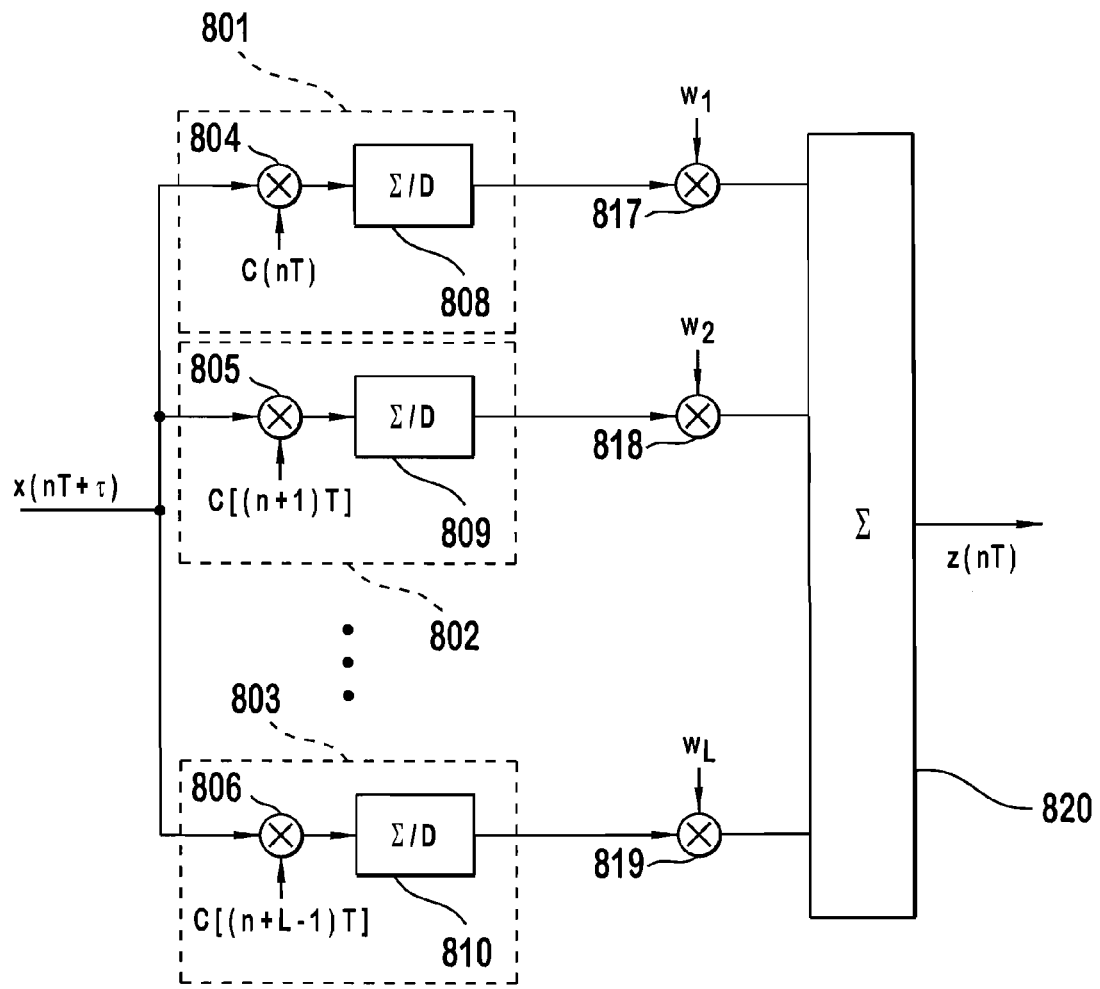
FIG. 8a is a block diagram of an exemplary adaptive vector correlator and matched filter for despreading and combining the multipath components of the present invention.
Figure 8B:
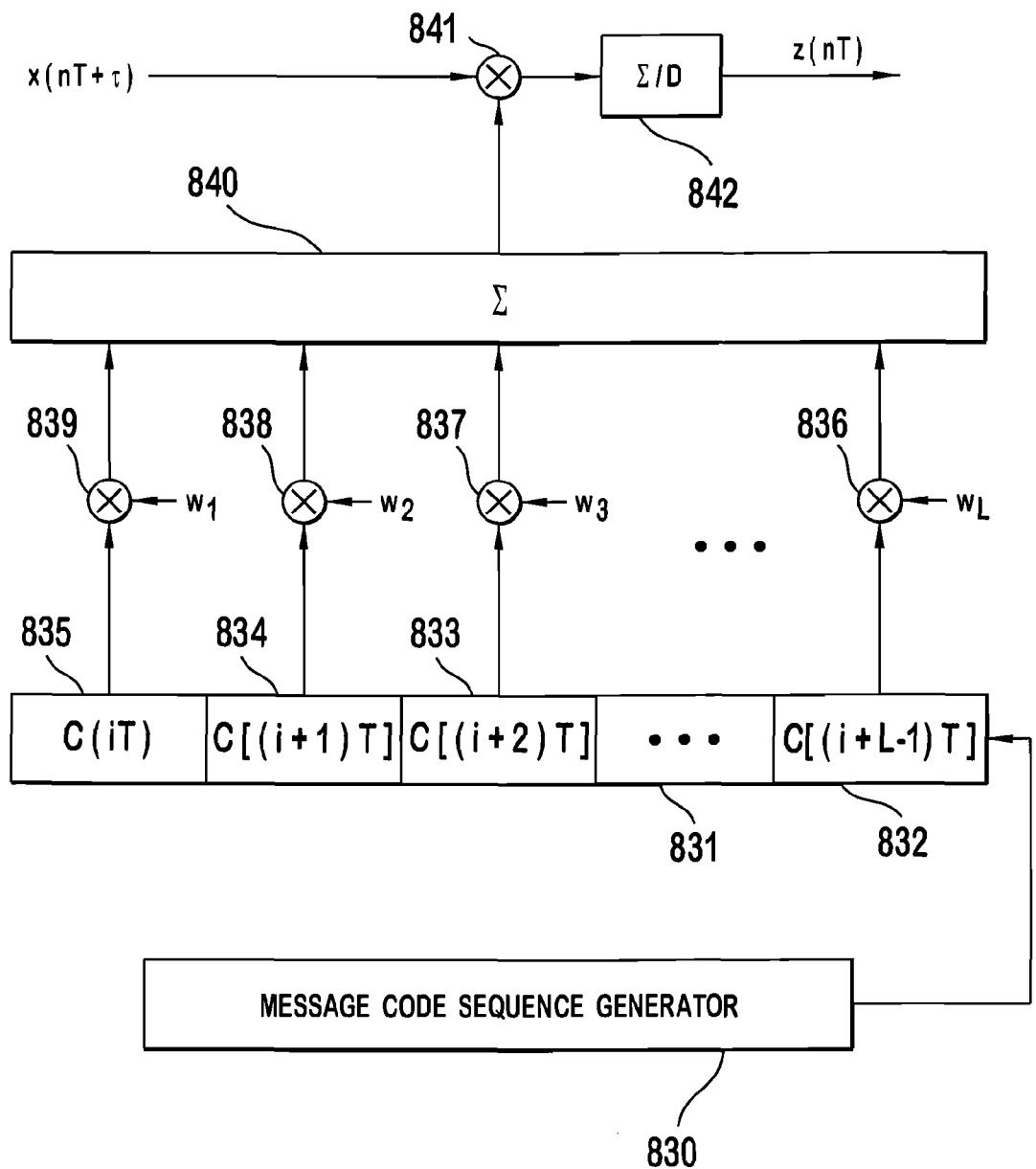
FIG. 8b is a block diagram of an alternative implementation of the adaptive vector correlator and adaptive matched filter for despreading and combining the multipath components of the present invention.

FIGS. 8a and 8b show alternate embodiments of the AVC which can be used for detection and multipath signal component combining. The message signal AVCs of FIGS. 8a and 8b use the weighting factors produced by the Pilot AVC to correct the message data multipath signals. The spreading code signal, c(nT) is the spreading code spreading sequence used by a particular message channel and is synchronous with the pilot spreading code signal. The value L is the number of correlators in the AVC circuit.

The circuit of FIG. 8a calculates the decision variable Z which is given by $$Z = w_1 \sum_{i=1}^{N} x(iT+\tau)c(iT) + w_2 \sum_{i=1}^{N} x(iT+\tau)c((i+1)T) + \ldots + w_L \sum_{i=1}^{L} x(iT+\tau) + c((i+L)T)$$

Equation 28 where N is the number of chips in the correlation window. Equivalently, the decision statistic is given by $$Z = x(T+\tau)\sum_{i=1}^{L} w_1 c(iT) +$$

$$x(2T+\tau)\sum_{i=1}^{L} w_1 c((i+1)T) + \ldots +$$

$$x(NT+\tau)\sum_{i=1}^{L} w_N c((i+N)T)$$

$$= \sum_{k=1}^{N} x(kT-\tau)\sum_{i=1}^{L} w_k c((i+k-1)T)$$

Equation 29

The alternative implementation that results from equation (29) is shown in FIG. 8b.

Referring to FIG. 8a, the input signal x(t) is sampled to form x(nT+τ), and is composed of interference noise of other message channels, multipath signals of message channels, thermal noise, and multipath signals of the pilot code. The signal x(nT+τ) is applied to L correlators, where L is the number of code phases over which the uncertainty within the multipath signals exists. Each correlator 801, 802, 803 comprises a multiplier 804, 805, 806, which multiples the input signal by a particular phase of the message channel spreading code signal, and a respective sum-and-dump circuit 808, 809, 810. The output signal of each multiplier 804, 805, 806 is applied to a respective sum- and dump circuit 808, 809, 810 which performs discrete integration. Before summing the signal energy contained in the output signals of the correlators, the AVC compensates for the different multipath signals. Each despread multipath signal and its corresponding weighting factor, which is obtained from the corresponding multipath weighting factor of the pilot AVC, are multiplied in a respective multiplier 817, 818, 819. The output signals of multipliers 817, 818, 819 are summed in a master adder 820, and the output signal z(nT) of the accumulator 820 consists of sampled levels of a despread message signal in noise.

The alternative embodiment of the invention includes a new implementation of the AVC despreading circuit for the message channels which performs the sum-and-dump for each multipath signal component simultaneously. The advantage of this circuit is that only one sum- and dump circuit and one adder is necessary. Referring to FIG. 8b, the message code sequence generator 830 provides a message code sequence to shift register 831 of length L. The output signal of each register 832, 833, 834, 835 of the shift register 831 corresponds to the message code sequence shifted in phase by one chip. The output value of each register 832, 833, 834, 835 is multiplied in multipliers 836, 837, 838, 839 with the corresponding weighting factor $w_k$, k=1, . . . , L obtained from the Pilot AVC. The output signals of the L multipliers 836, 837, 838, 839 are summed by the adding circuit 840. The adding circuit output signal and the receiver input signal x(nT+τ) are then multiplied in the multiplier 841 and integrated by the sum-and-dump circuit 842 to produce message signal z(nT).

Figure 8C:
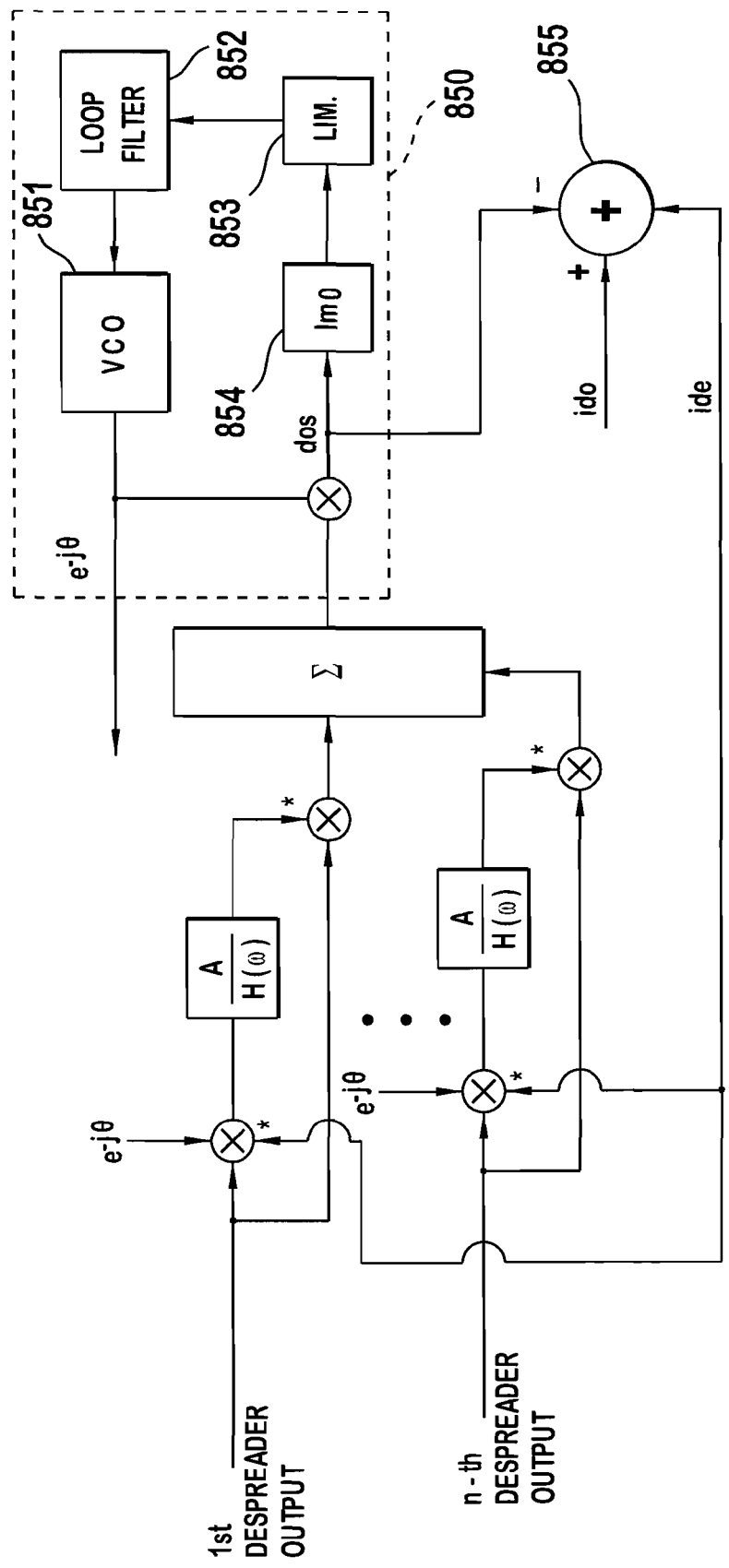
FIG. 8c is a block diagram of an alternative embodiment of the adaptive vector correlator and adaptive matched filter for despreading and combining the multipath components of the present invention.

A third embodiment of the adaptive vector correlator is shown in FIG. 8c. The embodiment shown uses the least mean square (LMS) statistic to implement the vector correlator and determines the derotation factors for each multipath component from the received multipath signal. The AVC of FIG. 8c is similar to the exemplary implementation of the Pilot AVC used to despread the pilot spreading code shown in FIG. 7. The digital phase locked loop 721 is replaced by the phase locked loop 850 having voltage controlled oscillator 851, loop filter 852, limiter 853, and imaginary component separator 854. The difference between the corrected despread output signal dos and an ideal despread output signal is provided by adder 855, and the difference signal is a despread error value ide which is further used by the derotation circuits to compensate for errors in the derotation factors.

In a multipath signal environment, the signal energy of a transmitted symbol is spread out over the multipath signal components. The advantage of multipath signal addition is that a substantial portion of signal energy is recovered in an output signal from the AVC. Consequently, a detection circuit has an input signal from the AVC with a higher signal-to-noise ratio (SNR), and so can detect the presence of a symbol with a lower bit-error ratio (BER). In addition, measuring the output of the AVC is a good indication of the transmit power of the transmitter, and a good measure of the system's interference noise.

Adaptive Matched Filter

One embodiment of the current invention includes an Adaptive Matched Filter (AMF) to optimally combine the multipath signal components in a received spread spectrum message signal. The AMF is a tapped delay line which holds shifted values of the sampled message signal and combines these after correcting for the channel response. The correction for the channel response is done using the channel response estimate calculated in the AVC which operates on the Pilot sequence signal. The output signal of the AMF is the combination of the multipath components which are summed to give a maximum value. This combination corrects for the distortion of multipath signal reception. The various message despreading circuits operate on this combined multipath component signal from the AMF.

Figure 8D:
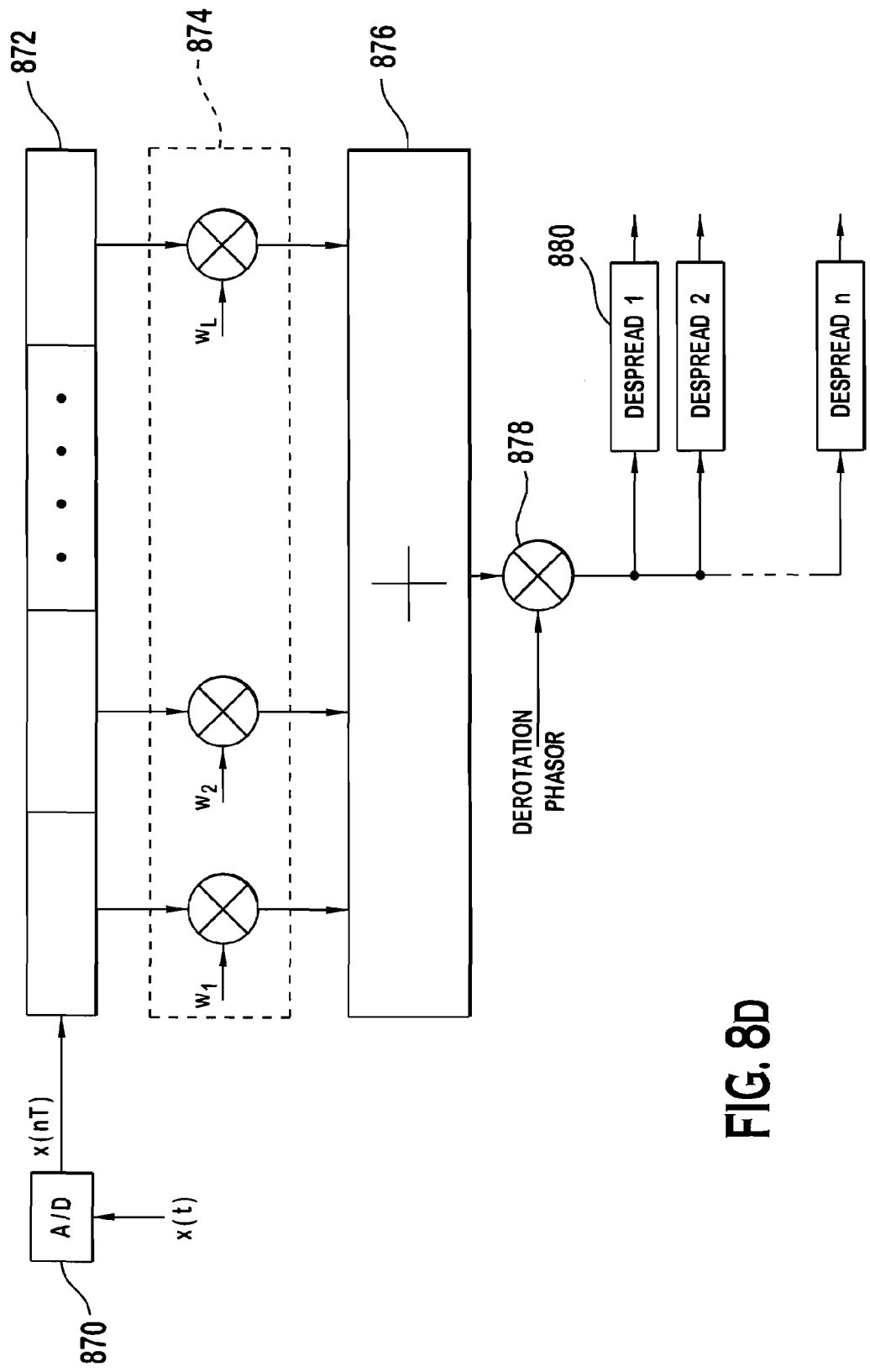
FIG. 8d is a block diagram of the Adaptive Matched Filter of one embodiment of the present invention.

FIG. 8*d* shows an exemplary embodiment of the AMF. The sampled signal from the A/D converter 870 is applied to the L-stage delay line 872. Each stage of this delay line 872 holds the signal corresponding to a different multipath signal component. Correction for the channel response is applied to each delayed signal component by multiplying the component in the respective multiplier of multiplier bank 874 with the respective weighting factor $w_1, w_2, \ldots, w_L$ from the AVC corresponding to the delayed signal component. All weighted signal components are summed in the adder 876 to give the combined multipath component signal y(t).

The combined multipath component signal y(t) does not include the correction due to phase and frequency offset of the carrier signal. The correction for the phase and frequency offset of the carrier signal is made to y(t) by multiplying y(t) with carrier phase and frequency correction (derotation phasor) in multiplier 878. The phase and frequency correction is produced by the AVC as described previously. FIG. 8*d* shows the correction as being applied before the despreading circuits 880, but alternate embodiments of the invention can apply the correction after the despreading circuits.

Method To Reduce Re-Acquisition Time with Virtual Location

One consequence of determining the difference in code phase between the locally generated pilot code sequence and a received spreading code sequence is that an approximate value for the distance between the base station and a subscriber unit can be calculated. If the SU has a relatively fixed position with respect to the RCS of the base station, the uncertainty of received spreading code phase is reduced for subsequent attempts at re-acquisition by the SU or RCS. The time required for the base station to acquire the access signal of a SU that has gone "off-hook" contributes to the delay between the SU going off-hook and the receipt of a dial tone from the PSTN. For systems that require a short delay, such as 150 msec for dial tone after off-hook is detected, a method which reduces the acquisition and bearer channel establishment time is desirable. One embodiment of the present invention uses such a method of reducing re-acquisition by use of virtual locating. Additional details of this technique are described in U.S. patent application entitled "VIRTUAL LOCATING OF A FIXED SUBSCRIBER UNIT TO REDUCE RE-ACQUISITION TIME" filed on even date herewith and incorporated herein by reference.

The RCS acquires the SU CDMA signal by searching only those received code phases corresponding to the largest propagation delay of the particular system. In other words, the RCS assumes that all SUs are at a predetermined, fixed distance from the RCS. The first time the SU establishes a channel with the RCS, the normal search pattern is performed by the RCS to acquire the access channel. The normal method starts by searching the code phases corresponding to the longest possible delay, and gradually adjusts the search to the code phases with the shortest possible delay. However, after the initial acquisition, the SU can calculate the delay between the RCS and the SU by measuring the time difference between sending a short access message to the RCS and receiving an acknowledgment message, and using the received Global Pilot channel as a timing reference. The SU can also receive the delay value by having the RCS calculate the round trip delay difference from the code phase difference between the Global Pilot code generated at the RCS and the received assigned pilot sequence from the SU, and then sending the SU the value on a predetermined control channel. Once the round trip delay is known to the SU, the SU may adjust the code phase of the locally generated assigned pilot and spreading code sequences by adding the delay required to make the SU appear to the RCS to be at the predetermined fixed distance from the RCS. Although the method is explained for the largest delay, a delay corresponding to any predetermined location in the system can be used.

A second advantage of the method of reducing re-acquisition by virtual locating is that a conservation in SU power use can be achieved. Note that a SU that is "powered down" or in a sleep mode needs to start the bearer channel acquisition process with a low transmit power level and ramp-up power until the RCS can receive its signal in order to minimize interference with other users. Since the subsequent re-acquisition time is shorter, and because the SU's location is relatively fixed in relation to the RCS, the SU can ramp-up transmit power more quickly because the SU will wait a shorter period of time before increasing transmit power. The SU waits a shorter period because it knows, within a small error range, when it should receive a response from the RCS if the RCS has acquired the SU signal.

The Spread Spectrum Communication System

The Radio Carrier Station (RCS)

The Radio Carrier Station (RCS) of the present invention acts as a central interface between the SU and the remote processing control network element, such as a Radio Distribution Unit (RDU). The interface to the RDU of the present embodiment follows the G.704 standard and an interface according to a modified version of DECT V5.1, but the present invention can support any interface that can exchange call control and traffic channels. The RCS receives information channels from the RDU including call control data, and traffic channel data such as, but not limited to, 32 kb/s ADPCM, 64 kb/s PCM, and ISDN, as well as system configuration and maintenance data. The RCS also terminates the CDMA radio interface bearer channels with SUs, which channels include both control data, and traffic channel data. In response to the call control data from either the RDU or a SU, the RCS allocates traffic channels to bearer channels on the RF communication link and establishes a communication connection between the SU and the telephone network through an RDU.

Figure 9:
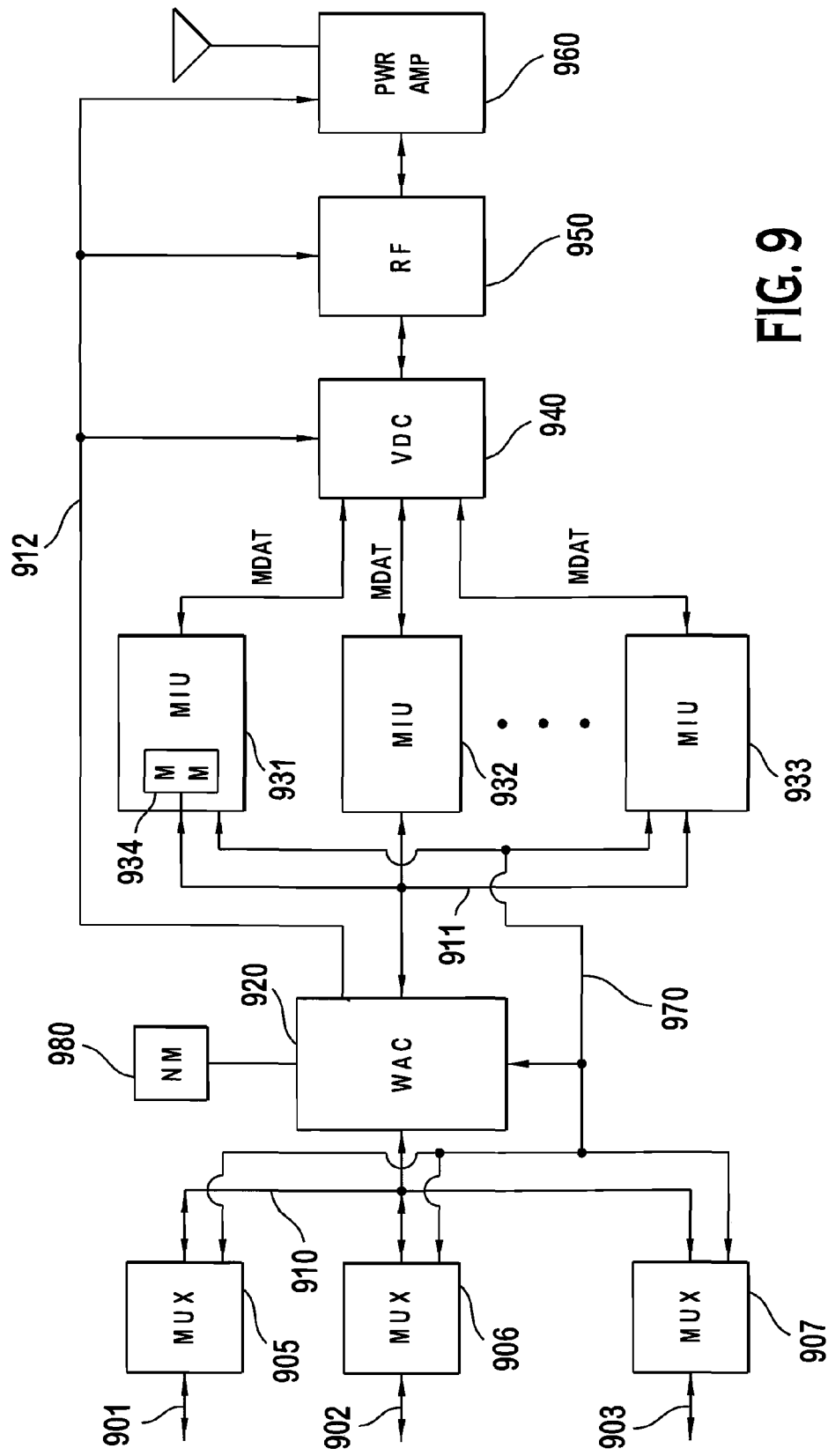
FIG. 9 is a block diagram of the elements of an exemplary radio carrier station (RCS) of the present invention.

As shown in FIG. 9, the RCS receives call control and message information data into the MUXs 905, 906 and 907 through interface lines 901, 902 and 903. Although E1 format is shown, other similar telecommunication formats can be supported in the same manner as described below. The MUXs shown in FIG. 9 may be implemented using circuits similar to that shown in FIG. 10. The MUX shown in FIG. 10 includes system clock signal generator 1001 consisting of phase locked oscillators (not shown) which generate clock signals for the Line PCM highway 1002 (which is part of PCM Highway 910), and high speed bus (HSB) 970; and the MUX Controller 1010 which synchronizes the system clock 1001 to interface line 1004. It is contemplated that the phase lock oscillators can provide timing signals for the RCS in the absence of synchronization to a line. The MUX Line Interface 1011 separates the call control data from the message information data. Referring to FIG. 9, each MUX provides a connection to the Wireless Access Controller (WAC) 920 through the PCM highway 910. The MUX controller 1010 also monitors the presence of different tones present in the information signal by means of tone detector 1030.

Additionally, the MUX Controller 1010 provides the ISDN D channel network signaling locally to the RDU. The MUX line interface 1011, such as a FALC 54, includes an E1 interface 1012 which consists of a transmit connection pair (not shown) and a receive connection pair (not shown) of the MUX connected to the RDU or Central Office (CO) ISDN Switch at the data rate of 2.048 Mbps. The transmit and receive connection pairs are connected to the E1 interface 1012 which translates differential tri-level transmit/receive encoded pairs into levels for use by the Framer 1015. The line interface 1011 uses internal phase-locked-loops (not shown) to produce E1-derived 2.048 MHz, and 4.096 MHz clocks as well as an 8 KHz frame-sync pulse. The line interface can operate in clock-master or clock-slave mode. While the exemplary embodiment is shown as using an E1 Interface, it is contemplated that other types of telephone lines which convey multiple calls may be used, for example, T1 lines or lines which interface to a Private Branch Exchange (PBX).

The line interface framer 1015 frames the data streams by recognizing the framing patterns on channel-1 (time-slot 0) of the incoming line, and inserts and extracts service bits, generates/checks line service quality information.

As long as a valid E1 signal appears at the E1 Interface 1012, the FALC 54, recovers a 2.048 MHz PCM clock signal from the E1 line. This clock, via System Clock 1001, is used system wide as a PCM Highway Clock signal. If the E1 Line fails, the FALC 54 continues to deliver a PCM Clock derived from an oscillator signal o(t) connected to the sync input (not shown) of the FALC 54. This PCM Clock serves the RCS system until another MUX with an operational E1 line assumes responsibility for generating the system clock signals.

The framer 1015 generates a Received Frame Sync Pulse, which in turn can be used to trigger the PCM Interface 1016 to transfer data onto the line PCM Highway 1002 and into the RCS System for use by other elements. Since all E1 lines are frame synchronized, all Line PCM Highways are also frame synchronized. From this 8 kHz PCM Sync pulse, the system clock signal generator 1001 of the MUX uses a Phase Locked Loop (not shown) to synthesize the PNx2 clock [e.g., 15.96 MHz)($W_0(t)$)]. The frequency of this clock signal is different for different transmission bandwidths, as described in Table 7.

The MUX includes a MUX Controller 1010, such as a 25 MHz Quad Integrated Communications Controller, containing a microprocessor 1020, program memory 1021, and Time Division Multiplexer (TDM) 1022. The TDM 1022 is coupled to receive the signal provided by the Framer 1015, and extracts information placed in time slots 0 and 16. The extracted information governs how the MUX controller 1010 processes the Link Access Protocol-D (LAPD) data link. The call control and bearer modification messages, such as those defined as V5.1 Network layer messages, are either passed to the WAC, or used locally by the MUX controller 1010.

The RCS Line PCM Highway 1002 is connected to and originates with the Framer 1015 through PCM Interface 1016, and comprises of a 2.048 MHz stream of data in both the transmit and receive direction. The RCS also contains a High Speed Bus (HSB) 970 which is the communication link between the MUX, WAC, and MIUs. The HSB 970 supports a data rate of, for example, 100 Mbit/sec. Each of the MUX, WAC, and MIU access the HSB using arbitration. The RCS of the present invention also can include several MUXs requiring one board to be a "master" and the rest "slaves". Details on the implementation of the HSB may be found in a U.S. patent application entitled PARALLEL PACKETIZED INTERMODULE ARBITRATED HIGH SPEED CONTROL AND DATA BUS, filed on even date herewith, which is hereby incorporated by reference.

Figure 11:
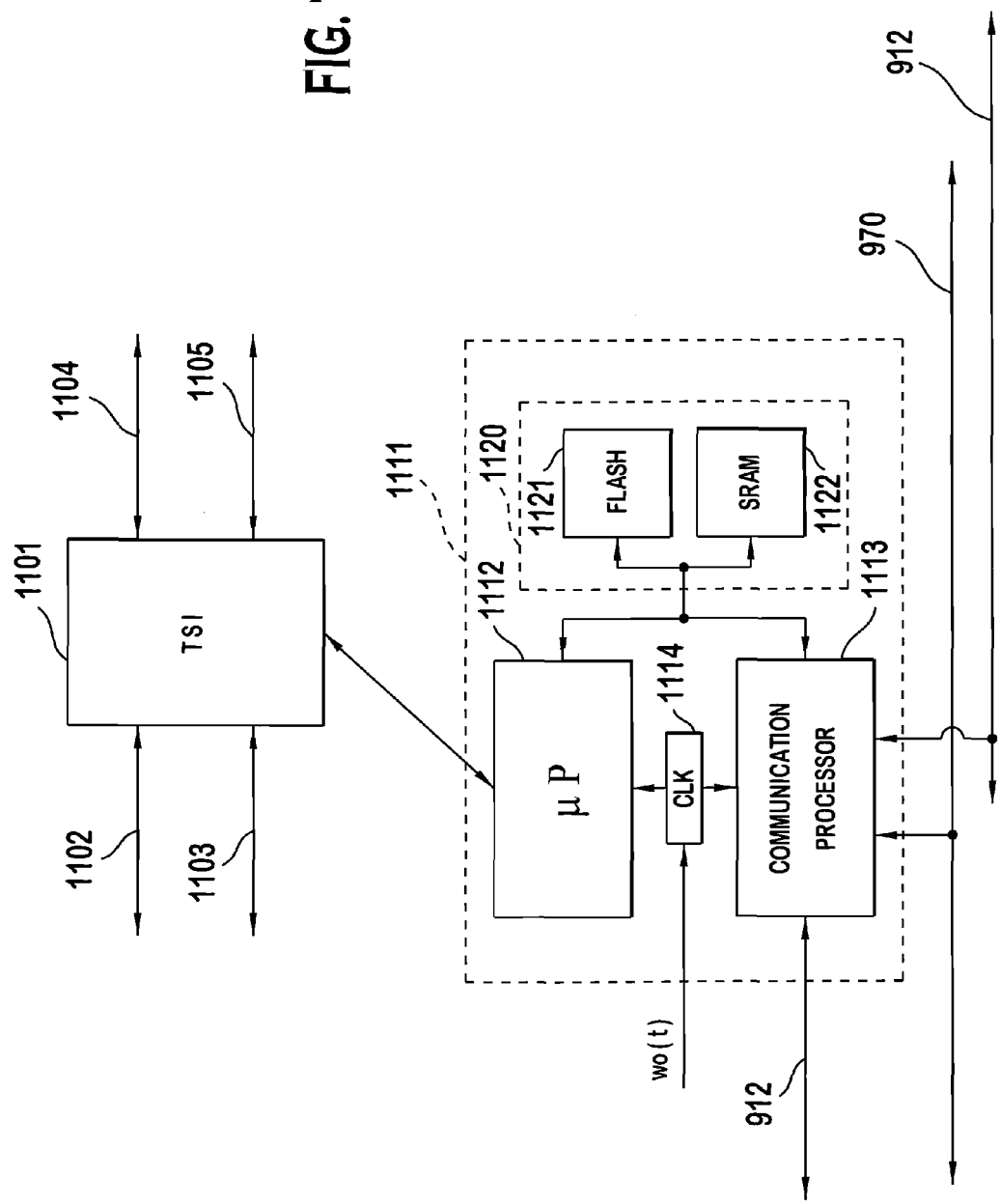
FIG. 11 is a block diagram of the elements of an exemplary wireless access controller (WAC) of the RCS shown in FIG. 9.

Referring to FIG. 9, the Wireless Access Controller (WAC) 920 is the RCS system controller which manages call control functions and interconnection of data streams between the MUXs 905, 906, 907, Modem Interface Units (MIUs) 931, 932, 933. The WAC 920 also controls and monitors other RCS elements such as the VDC 940, RF 950, and Power Amplifiers 960. The WAC 920 as shown in FIG. 11, allocates bearer channels to the modems on each MIU 931, 932, 933 and allocates the message data on line PCM Highway 910 from the MUXs 905, 906, 907 to the modems on the MIUs 931, 932, 933. This allocation is made through the System PCM Highway 911 by means of a time slot interchange on the WAC 920. If more than one WAC is present for redundancy purposes, the WACs determines the Master-Slave relationship with a second WAC. The WAC 920 also generates messages and paging information responsive to call control signals from the MUXs 905, 906, 907 received from a remote processor, such as an RDU; generates Broadcast Data which is transmitted to the MIU master modem 934; and controls the generation by the MIU MM 934 of the Global system Pilot spreading code sequence. The WAC 920 also is connected to an external Network Manager (NM) 980 for craftperson or user access.

Referring to FIG. 11, the WAC includes a time-slot interchanger (TSI) 1101 which transfers information from one time slot in a Line PCM Highway or System PCM Highway to another time slot in either the same or different Line PCM Highway or System PCM Highway. The TSI 1101 is connected to the WAC controller 1111 of FIG. 11 which controls the assignment or transfer of information from one time slot to another time slot and stores this information in memory 1120. The exemplary embodiment of the invention has four PCM Highways 1102, 1103, 1104, 1105 connected to the TSI. The WAC also is connected to the HSB 970, through which WAC communicates to a second WAC (not shown), to the MUXs and to the MIUs.

Referring to FIG. 11, the WAC 920 includes a WAC controller 1111 employing, for example, a microprocessor 1112, such as a Motorola MC 68040 and a communications processor 1113, such as the Motorola MC68360 QUICC communications processor, and a clock oscillator 1114 which receives a clock synch signal wo(t) from the system clock generator. The clock generator is located on a MUX (not shown) to provide timing to the WAC controller 1111. The WAC controller 1111 also includes memory 1120 including Flash Prom 1121 and SRAM memory 1122. The Flash Prom 1121 contains the program code for the WAC controller 1111, and is reprogrammable for new software programs downloaded from an external source. The SRAM 1122 is provided to contain the temporary data written to and read from memory 1120 by the WAC controller 1111.

A low speed bus 912 is connected to the WAC 920 for transferring control and status signals between the RF Transmitter/Receiver 950, VDC 940, RF 950 and Power Amplifier 960 as shown in FIG. 9. The control signals are sent from the WAC 920 to enable or disable the RF Transmitters/Receiver 950 or Power amplifier 960, and the status signals are sent from the RF Transmitters/Receiver 950 or Power amplifier 960 to monitor the presence of a fault condition.

Figure 12:
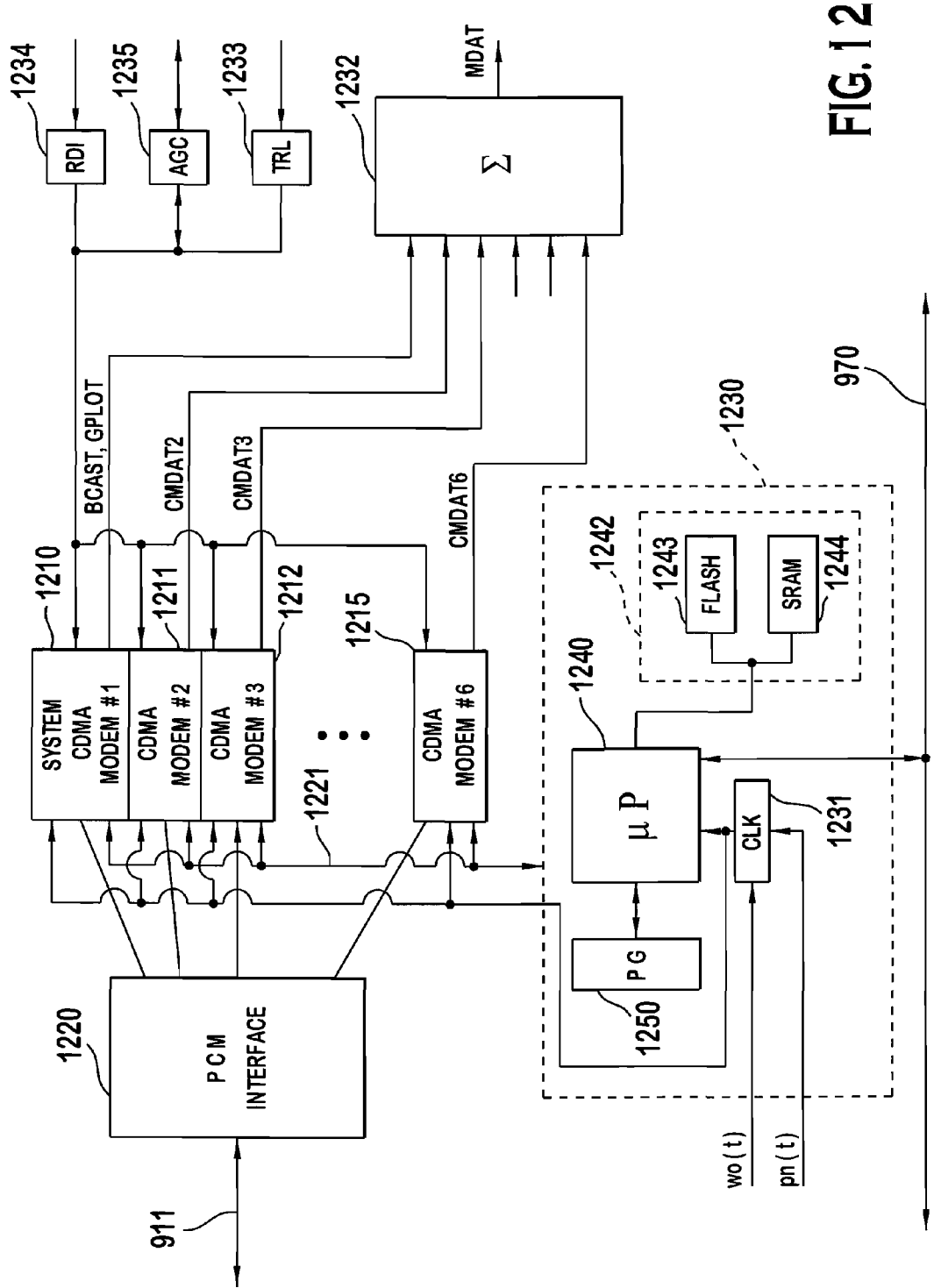
FIG. 12 is a block diagram of the elements of an exemplary modem interface unit (MIU) of the RCS shown in FIG. 9.

Referring to FIG. 9, the exemplary RCS contains at least one MIU 931, which is shown in FIG. 12 and now described in detail. The MIU of the exemplary embodiment includes six CDMA modems, but the invention is not limited to this number of modems. The MIU includes a System PCM Highway 1201 connected to each of the CDMA Modems 1210, 1211, 1212, 1215 through a PCM Interface 1220, a Control Channel Bus 1221 connected to MIU controller 1230 and each of the CDMA Modems 1210, 1211, 1212, 1213, an MIU clock signal generator (CLK) 1231, and a modem output combiner 1232. The MIU provides the RCS with the following functions: the MIU controller receives CDMA Channel Assignment Instructions from the WAC and assigns a modem to a user information signal which is applied to the line interface of the MUX and a modem to receive the CDMA channel from the SU; it also combines the CDMA Transmit Modem Data for each of the MIU CDMA modems; multiplexes I and Q transmit message data from the CDMA modems for transmission to the VDC; receives Analog I and Q receive message data from the VDC; distributes the I and Q data to the CDMA modems; transmits and receives digital AGC Data; distributes the AGC data to the CDMA modems; and sends MIU Board Status and Maintenance Information to the WAC 920.

The MIU controller 1230 of the exemplary embodiment of the present invention contains one communication microprocessor 1240, such as the MC68360 "QUICC" Processor, and includes a memory 1242 having a Flash Prom memory 1243 and a SRAM memory 1244. Flash Prom 1243 is provided to contain the program code for the Microprocessors 1240, and the memory 1243 is downloadable and reprogrammable to support new program versions. SRAM 1244 is provided to contain the temporary data space needed by the MC68360 Microprocessor 1240 when the MIU controller 1230 reads or writes data to memory.

The MIU CLK circuit 1231 provides a timing signal to the MIU controller 1230, and also provides a timing signal to the CDMA modems. The MIU CLK circuit 1231 receives and is synchronized to the system clock signal wo(t). The controller clock signal generator 1213 also receives and synchronizes to the spreading code clock signal pn(t) which is distributed to the CDMA modems 1210, 1211, 1212, 1215 from the MUX.

The RCS of the present embodiment includes a System Modem 1210 contained on one MIU. The System Modem 1210 includes a Broadcast spreader (not shown) and a Pilot Generator (not shown). The Broadcast Modem provides the broadcast information used by the exemplary system, and the broadcast message data is transferred from the MIU controller 1230 to the System Modem 1210. The System Modem also includes four additional modems (not shown) which are used to transmit the signals CT1 through CT4 and AX1 through AX4. The System Modem 1210 provides unweighted I and Q Broadcast message data signals which are applied to the VDC. The VDC adds the Broadcast message data signal to the MIU CDMA Modem Transmit Data of all CDMA modems 1210, 1211, 1212, 1215, and the Global Pilot signal.

The Pilot Generator (PG) 1250 provides the Global Pilot signal which is used by the present invention, and the Global Pilot signal is provided to the CDMA modems 1210, 1211, 1212, 1215 by the MIU controller 1230. However, other embodiments of the present invention do not require the MIU controller to generate the Global Pilot signal, but include a Global Pilot signal generated by any form of CDMA Code Sequence generator. In the described embodiment of the invention, the unweighted I and Q Global Pilot signal is also sent to the VDC where it is assigned a weight, and added to the MIU CDMA Modem transmit data and Broadcast message data signal.

System timing in the RCS is derived from the E1 interface. There are four MUXs in an RCS, three of which (905, 906 and 907) are shown in FIG. 9. Two MUXs are located on each chassis. One of the two MUXs on each chassis is designated as the master, and one of the masters is designated as the system master. The MUX which is the system master derives a 2.048 Mhz PCM clock signal from the E1 interface using a phase locked loop (not shown). In turn, the system master MUX divides the 2.048 Mhz PCM clock signal in frequency by 16 to derive a 128 KHz reference clock signal. The 128 KHz reference clock signal is distributed from the MUX that is the system master to all the other MUXs. In turn, each MUX multiplies the 128 KHz reference clock signal in frequency to synthesize the system clock signal which has a frequency that is twice the frequency of the PN-clock signal. The MUX also divides the 128 KHz clock signal in frequency by 16 to generate the 8 KHz frame synch signal which is distributed to the MIUs. The system clock signal for the exemplary embodiment has a frequency of 11.648 Mhz for a 7 MHz bandwidth CDMA channel Each MUX also divides the system clock signal in frequency by 2 to obtain the PN-clock signal and further divides the PN-clock signal in frequency by 29 877 120 (the PN sequence length) to generate the PN-synch signal which indicates the epoch boundaries. The PN-synch signal from the system master MUX is also distributed to all MUXs to maintain phase alignment of the internally generated clock signals for each MUX. The PN-synch signal and the frame synch signal are aligned. The two MUXs that are designated as the master MUXs for each chasis then distribute both the system clock signal and the PN-clock signal to the MIUs and the VDC.

The PCM Highway Interface 1220 connects the System PCM Highway 911 to each CDMA Modem 1210, 1211, 1212, 1215. The WAC controller transmits Modem Control information, including traffic message control signals for each respective user information signal, to the MIU controller 1230 through the HSB 970. Each CDMA Modem 1210, 1211, 1212, 1215 receives a traffic message control signal, which includes signaling information, from the MIU controller 1111. Traffic message control signals also include call control (CC) information and spreading code and despreading code sequence information.

The MIU also includes the Transmit Data Combiner 1232 which adds weighted CDMA modem transmit data including In-phase (I) and Quadrature (Q) modem transmit data from the CDMA modems 1210, 1211, 1212, 1215 on the MIU. The I modem transmit data is added separately from the Q modem transmit data. The combined I and Q modem transmit data output signal of the Transmit Data Combiner 1232 is applied to the I and Q multiplexer 1233 that creates a single CDMA transmit message channel composed of the I and Q modem transmit data multiplexed into a digital data stream.

The Receiver Data Input Circuit (RDI) 1234 receives the Analog Differential I and Q Data from the Video Distribution Circuit (VDC) 940 shown in FIG. 9 and distributes Analog Differential I and Q Data to each of the CDMA Modems 1210, 1211, 1212, 1215 of the MIU. The Automatic Gain Control Distribution Circuit (AGC) 1235 receives the AGC Data signal from the VDC and distributes the AGC Data to each of the CDMA Modems of the MIU. The TRL circuit 1233 receives the Traffic lights information and similarly distributes the Traffic light data to each of the Modems 1210, 1211, 1212, 1215.

The CDMA Modem

The CDMA modem provides for generation of CDMA spreading code sequences and synchronization between transmitter and receiver. It also provides four full duplex channels (TR0, TR1, TR2, TR3) programmable to 64, 32, 16, and 8 ksym/sec. each, for spreading and transmission at a specific power level. The CDMA modem measures the received signal strength to allow Automatic Power Control, it generates and transmits pilot signals, and encodes and decodes using the signal for forward error correction (FEC). The modem in an SU also performs transmitter spreading code pulse shaping using an FIR filter. The CDMA modem is also used by the Subscriber Unit (SU), and in the following discussion those features which are used only by the SU are distinctly pointed out. The operating frequencies of the CDMA modem are given in Table 10.

TABLE 10

Operating Frequencies

| Bandwidth (MHz) | Chip Rate (MHz) | Symbol Rate (KHz) | Gain (Chips/Symbol) |
| --- | --- | --- | --- |
| 7 | 5.824 | 64 | 91 |
| 10 | 8.320 | 64 | 130 |
| 10.5 | 8.512 | 64 | 133 |
| 14 | 11.648 | 64 | 182 |
| 15 | 12.480 | 64 | 195 |

Figure 13:
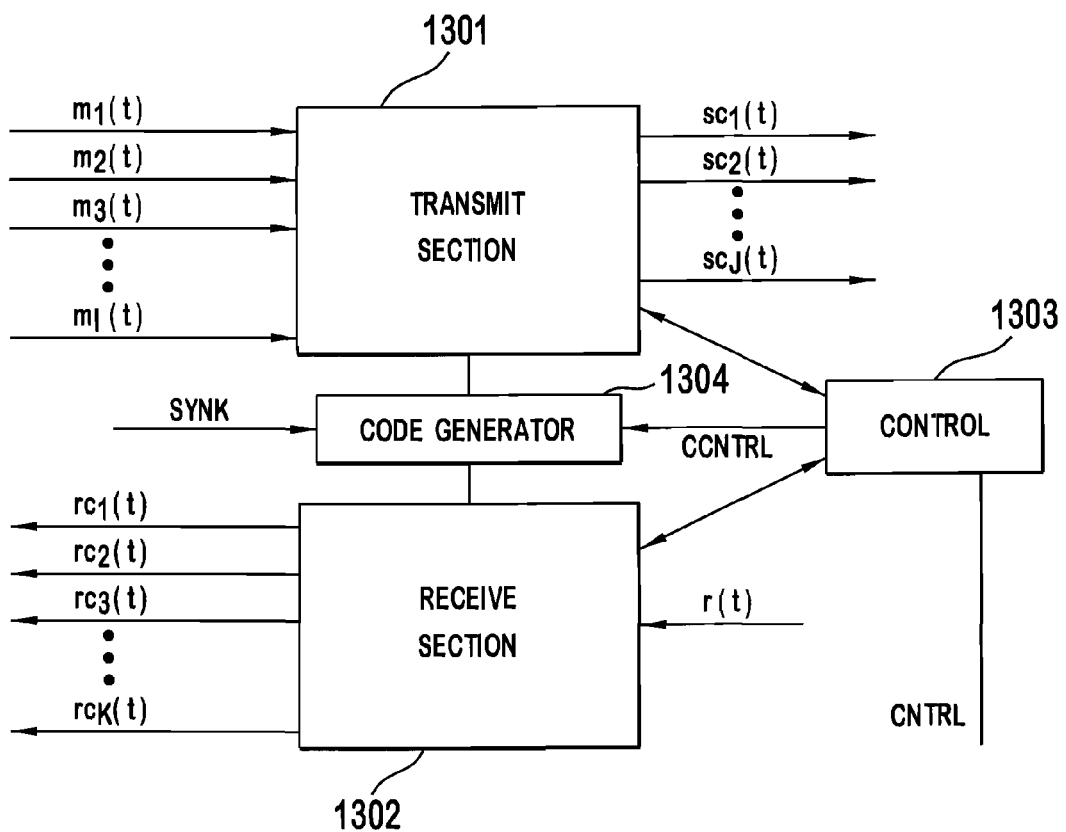
FIG. 13 is a high level block diagram showing the transmit, receive, control, and code generation circuitry of the CDMA modem.

Each CDMA modem 1210, 1211, 1212, 1215 of FIG. 12, and as shown in FIG. 13, is composed of a transmit section 1301 and a receive section 1302. Also included in the CDMA modem is a control center 1303 which receives control messages CNTRL from the external system. These messages are used, for example, to assign particular spreading codes, activate the spreading or despreading, or to assign transmission rates. In addition, the CDMA modem has a code generator means 1304 used to generate the various spreading and despreading codes used by the CDMA modem. The transmit section 1301 is for transmitting the input information and control signals $m_i(t)$, i=1, 2, . . . I as spread-spectrum processed user information signals $sc_j(t)$, j=1, 2, . . . J. The transmit section 1301 receives the global pilot code from the code generator 1304 which is controlled by the control means 1303. The spread spectrum processed user information signals are ultimately added to other similar processed signals and transmitted as CDMA channels over the CDMA RF forward message link, for example to the SUs. The receive section 1302 receives CDMA channels as r(t) and despreads and recovers the user information and control signals $rc_k(t)$, k=1, 2, . . . K transmitted over the CDMA RF reverse message link, for example to the RCS from the SUs.

CDMA Modem Transmitter Section

Figure 14:
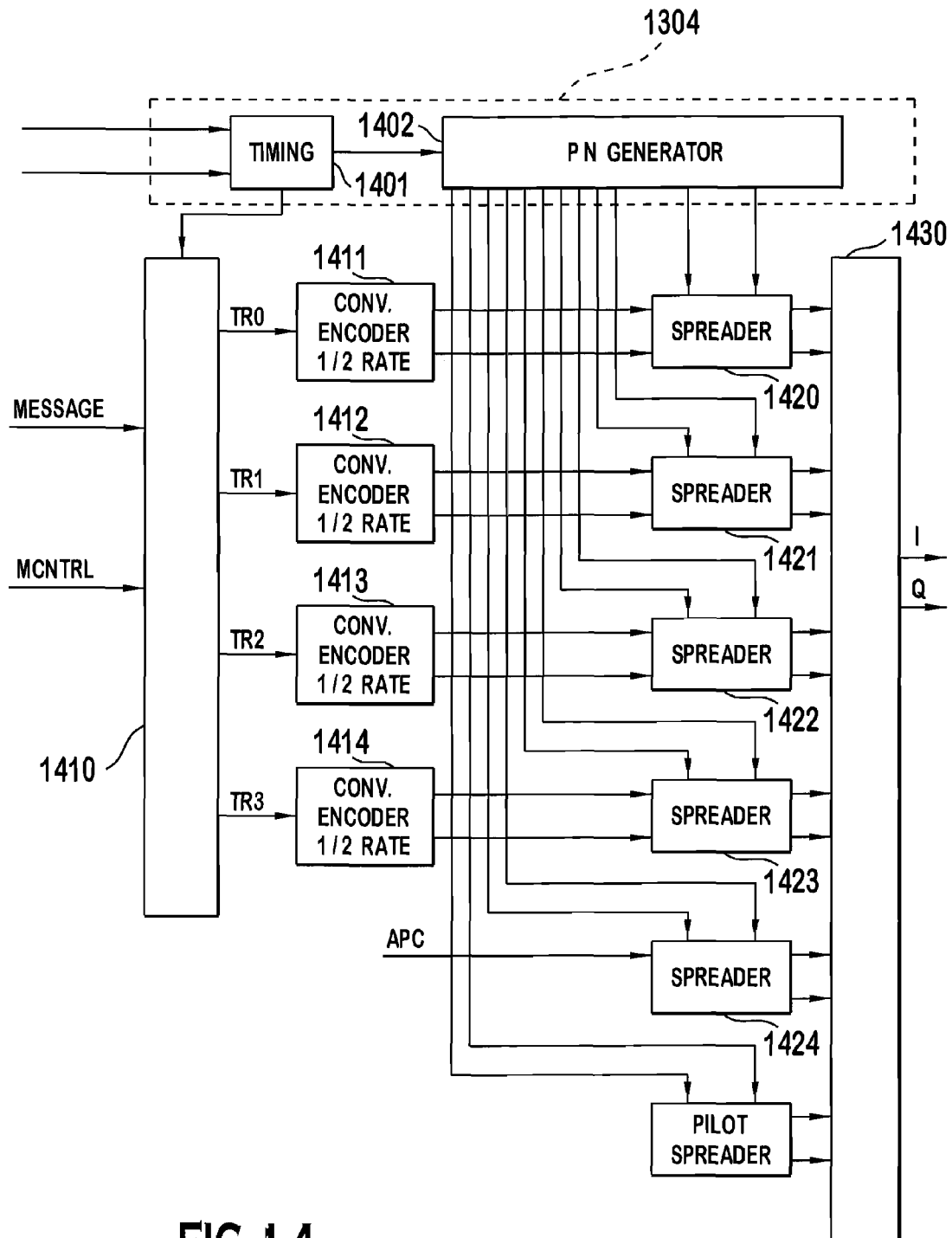
FIG. 14 is a block diagram of the transmit section of the CDMA modem.

Referring to FIG. 14, the code generator means 1304 includes Transmit Timing Control Logic 1401 and spreading code PN-Generator 1402, and the Transmit Section 1301 includes Modem Input Signal Receiver (MISR) 1410, Convolution Encoders 1411, 1412, 1413, 1414, Spreaders 1420, 1421, 1422, 1423, 1424, and Combiner 1430. The Transmit Section 1301 receives the message data channels MESSAGE, convolutionally encodes each message data channel in the respective convolutional encoder 1411, 1412, 1413, 1414, modulates the data with random spreading code sequence in the respective spreader 1420, 1421, 1422, 1423, 1424, and combines modulated data from all channels, including the pilot code received in the described embodiment from the code generator, in the combiner 1430 to generate I and Q components for RF transmission. The Transmitter Section 1301 of the present embodiment supports four (TR0, TR1, TR2, TR3) 64, 32, 16, 8 kb/s programmable channels. The message channel data is a time multiplexed signal received from the PCM highway 1201 through PCM interface 1220 and input to the MISR 1410.

Figure 15:
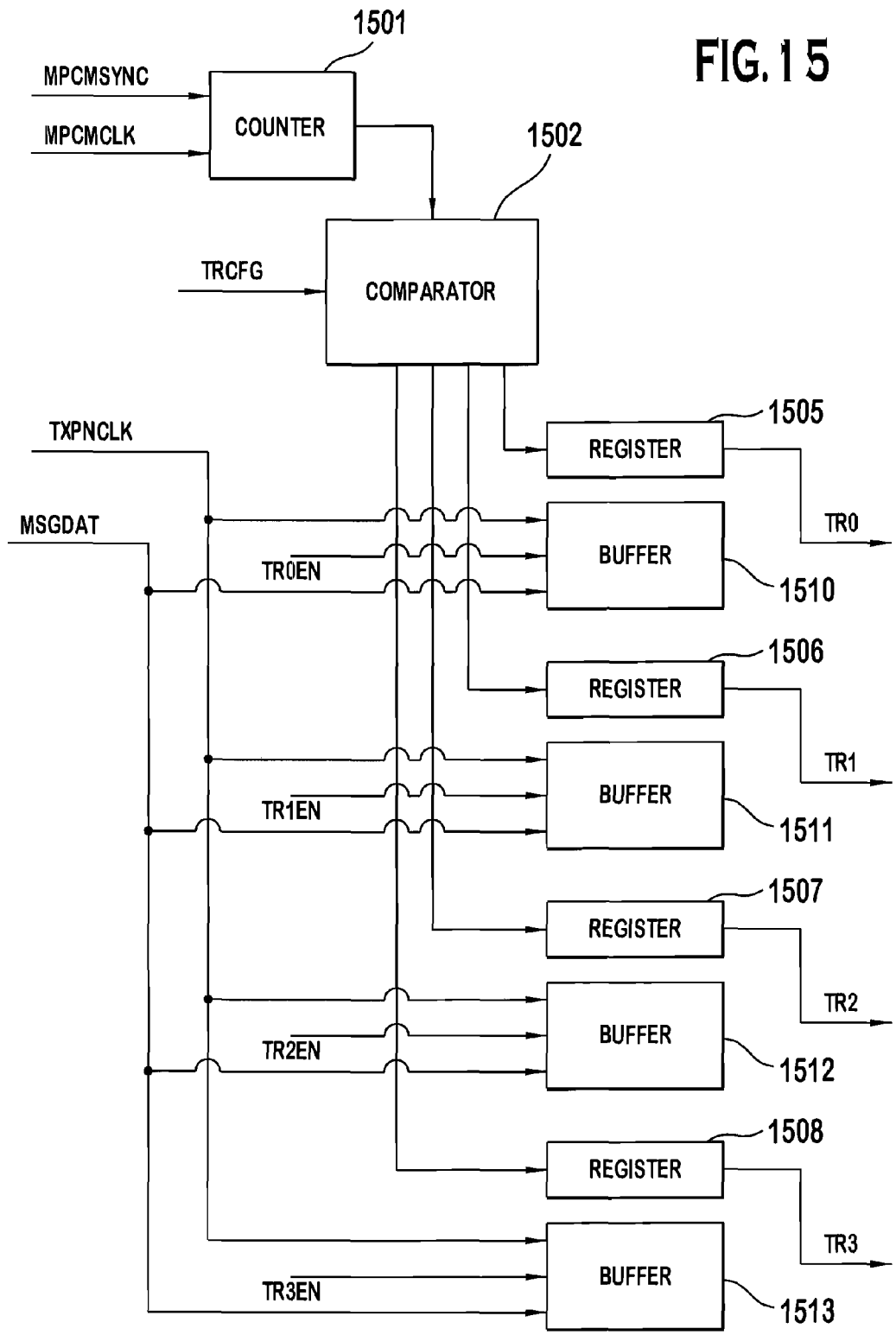
FIG. 15 is a block diagram of an exemplary modem input signal receiver.

FIG. 15 is a block diagram of an exemplary MISR 1410. For the exemplary embodiment of the present invention, a counter is set by the 8 KHz frame synchronization signal MPCMSYNC and is incremented by 2.048 MHz MPCM-CLK from the timing circuit 1401. The counter output is compared by comparator 1502 against TRCFG values corresponding to slot time location for TR0, TR1, TR2, TR3 message channel data; and the TRCFG values are received from the MIU Controller 1230 in MCTRL. The comparator sends count signal to the registers 1505, 1506, 1507 and 1508 which clocks message channel data into buffers 1510, 1511, 1512, 1513 using the TXPCNCLK timing signal derived from the system clock. The message data is provided from the signal MSGDAT from the PCM highway signal MESSAGE when enable signals TR0EN, TR1EN, TR2EN and TR3EN from Timing Control Logic 1401 are active. In further embodiments, MESSAGE may also include signals that enable registers depending upon an encryption rate or data rate. If the counter output is equal to one of the channel location addresses, the specified transmit message data in registers 1510, 1511, 1512, 1513 are input to the convolutional encoders 1411, 1412, 1413, 1414 shown in FIG. 14.

The convolutional encoder enables the use of Forward Error Correction (FEC) techniques, which are well known in the art. FEC techniques depend on introducing redundancy in generation of data in encoded form. Encoded data is transmitted and the redundancy in the data enables the receiver decoder device to detect and correct errors. One embodiment of the present invention employs convolutional encoding. Additional data bits are added to the data in the encoding process and are the coding overhead. The coding rate is expressed as the ratio of data bits transmitted to the total bits (code data+redundant data) transmitted and is called the rate "R" of the code.

Convolution codes are codes where each code bit is generated by the convolution of each new uncoded bit with a number of previously coded bits. The total number of bits used in the encoding process is referred to as the constraint length, "K", of the code. In convolutional coding, data is clocked into a shift register of K bits length so that an incoming bit is clocked into the register, and it and the existing K−1 bits are convolutionally encoded to create a new symbol. The convolution process consists of creating a symbol consisting of a module-2 sum of a certain pattern of available bits, always including the first bit and the last bit in at least one of the symbols.

Figure 16:
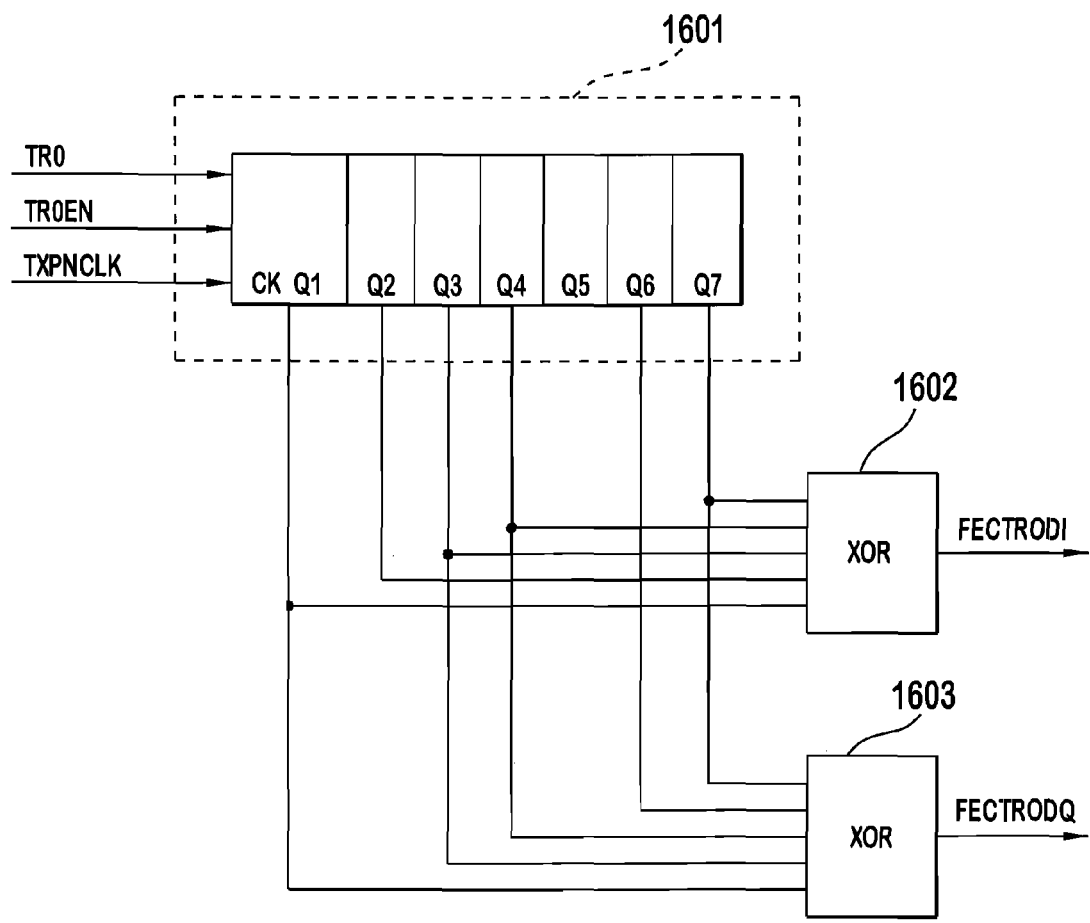
FIG. 16 is a block diagram of an exemplary convolutional encoder as used in the present invention.

FIG. 16 shows the block diagram of a K=7, R=½ convolution encoder suitable for use as the encoder 1411 shown in FIG. 14. This circuit encodes the TR0 Channel as used in one embodiment of the present invention. Seven-Bit Register 1601 with stages Q1 through Q7 uses the signal TXPNCLK to clock in TR0 data when the TR0EN signal is asserted. The output value of stages Q1, Q2, Q3, Q4, Q6, and Q7 are each combined using EXCLUSIVE-OR Logic 1602, 1603 to produce respective I and Q channel FEC data for the TR0 channel FECTR0DI and FECTR0DQ.

Two output symbol streams FECTR0DI and FECTR0DQ are generated. The FECTR0DI symbol stream is generated by EXCLUSIVE OR Logic 1602 of shift register outputs corresponding to bits 6, 5, 4, 3, and 0, (Octal 171) and is designed as In phase component "I" of the transmit message channel data. The symbol stream FECTR0DQ is likewise generated by EXCLUSIVE-OR logic 1603 of shift register outputs from bits 6, 4 3, 1 and 0, (Octal 133) and is designated as Quadrature component "Q" of the transmit message channel data. Two symbols are transmitted to represent a single encoded bit creating the redundancy necessary to enable error correction to take place on the receiving end.

Referring to FIG. 14, the shift enable clock signal for the transmit message channel data is generated by the Control Timing Logic 1401. The convolutionally encoded transmit message channel output data for each channel is applied to the respective spreader 1420, 1421, 1422, 1423, 1424 which multiplies the transmit message channel data by its preassigned spreading code sequence from code generator 1402. This spreading code sequence is generated by control 1303 as previously described, and is called a random pseudonoise signature sequence (PN-code).

The output signal of each spreader 1420, 1421, 1422, 1423, 1424 is a spread transmit data channel. The operation of the spreader is as follows: the spreading of channel output (I+jQ) multiplied by a random sequence (PNI+jPNQ) yields the In-phase component I of the result being composed of (I xor PNI) and (−Q xor PNQ). Quadrature component Q of the result is (Q xor PNI) and (I xor PNQ). Since there is no channel data input to the pilot channel logic (I=1, Q values are prohibited), the spread output signal for pilot channels yields the respective sequences PNI for I component and PNQ for Q component.

The combiner 1430 receives the I and Q spread transmit data channels and combines the channels into an I modem transmit data signal (TXIDAT) and a Q modem transmit data signal (TXQDAT). The I-spread transmit data and the Q spread transmit data are added separately.

For an SU, the CDMA modem Transmit Section 1301 includes the FIR filters to receive the I and Q channels from the combiner to provide pulse shaping, close-in spectral control and x/sin (x) correction for the transmitted signal. Separate but identical FIR filters receive the I and Q spread transmit data streams at the chipping rate, and the output signal of each of the filters is at twice the chipping rate. The exemplary FIR filters are 28 tap even symmetrical filters, which upsample (interpolate) by 2. The upsampling occurs before the filtering, so that 28 taps refers to 28 taps at twice the chipping rate, and the upsampling is accomplished by setting every other sample a zero. Exemplary coefficients are shown in Table 11.

TABLE 11

| | Coefficient Values | | | | | | | | | | | | | |
|---|---|---|---|---|---|---|---|---|---|---|---|---|---|---|
| Coeff. No.: | 0 | 1 | 2 | 3 | 4 | 5 | 6 | 7 | 8 | 9 | 10 | 11 | 12 | 13 |
| Value: | 3 | −11 | −34 | −22 | 19 | 17 | −32 | −19 | 52 | 24 | −94 | −31 | 277 | 468 |
| Coeff. No.: | 14 | 15 | 16 | 17 | 18 | 19 | 20 | 21 | 22 | 24 | 25 | 26 | 27 | |
| Value: | 277 | −31 | −94 | 24 | 52 | −19 | −32 | 17 | 19 | −22 | −34 | −11 | 3 | |

CDMA Modem Receiver Section

Referring to FIGS. 9 and 12, the RF receiver 950 of the present embodiment accepts analog input I and Q CDMA channels, which are transmitted to the CDMA modems 1210, 1211, 1212, 1215 through the MIUs 931, 932, 933 from the VDC 940. These I and Q CMDA channel signals are sampled by the CDMA modem receive section 1302 (shown in FIG. 13) and converted to I and Q digital receive message signal using an Analog to Digital (A/D) converter 1730, shown in FIG. 17. The sampling rate of the A/D converter of the exemplary embodiment of the present invention is equivalent to the despreading code rate. The I and Q digital receive message signals are then despread with correlators using six different complex spreading code sequences corresponding to the despreading code sequences of the four channels (TR0, TR1, TR2, TR3), APC information and the pilot code.

Time synchronization of the receiver to the received signal is separated into two phases; there is an initial acquisition phase and then a tracking phase after the signal timing has been acquired. The initial acquisition is done by shifting the phase of the locally generated pilot code sequence relative to the received signal and comparing the output of the pilot despreader to a threshold. The method used is called sequential search. Two thresholds (match and dismiss) are calculated from the auxiliary despreader. Once the signal is acquired, the search process is stopped and the tracking process begins. The tracking process maintains the code generator 1304 (shown in FIGS. 13 and 17) used by the receiver in synchronization with the incoming signal. The tracking loop used is the Delay-Locked Loop (DLL) and is implemented in the acquisition & track 1701 and the IPM 1702 blocks of FIG. 17.

Figure 17:
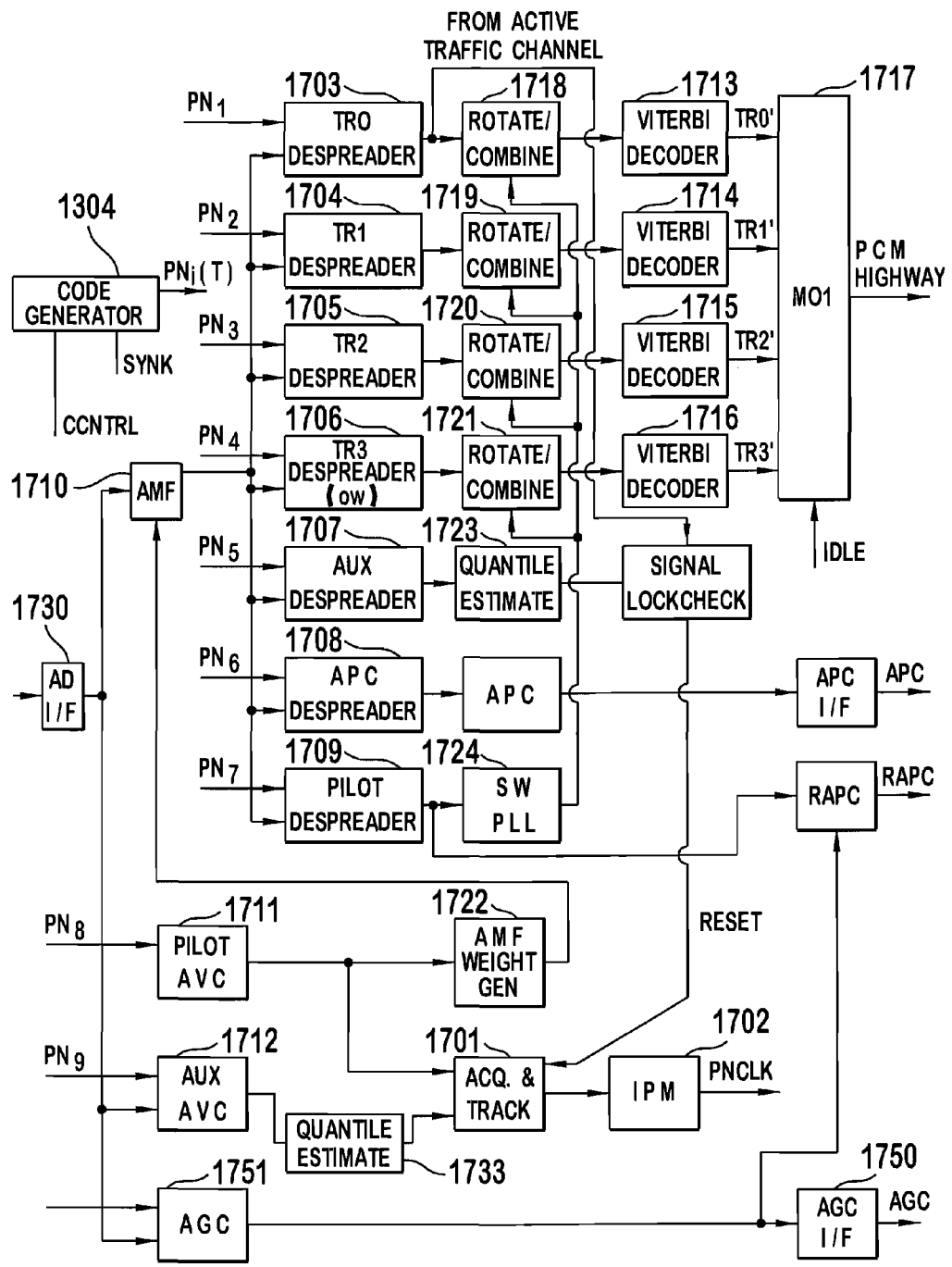
FIG. 17 is a block diagram of the receive section of the CDMA modem.

In FIG. 13, the modem controller 1303 implements the Phase Lock Loop (PLL) as a software algorithm in SW PLL logic 1724 of FIG. 17 that calculates the phase and frequency shift in the received signal relative to the transmitted signal. The calculated phase shifts are used to derotate the phase shifts in rotate and combine blocks 1718, 1719, 1720, 1721 of the multipath data signals for combining to produce output signals corresponding to receive channels TR0', TR1', TR2', TR3'. The data is then Viterbi decoded in Viterbi Decoders 1713, 1714, 1715, 1716 to remove the convolutional encoding in each of the received message channels.

FIG. 17 indicates that the Code Generator 1304 provides the code sequences $Pn_i(t)$, i=1, 2, ... I used by the receive channel despreaders 1703, 1704, 1705, 1706, 1707, 1708,

1709. The code sequences generated are timed in response to the SYNK signal of the system clock signal and are determined by the CCNTRL signal from the modem controller 1303 shown in FIG. 13. Referring to FIG. 17, the CDMA modem receiver section 1302 includes Adaptive Matched Filter (AMF) 1710, Channel despreaders 1703, 1704, 1705, 1706, 1707, 1708, 1709, Pilot AVC 1711, Auxiliary AVC 1712, Viterbi decoders 1713, 1714, 1715, 1716, Modem output interface (MOI) 1717, Rotate and Combine logic 1718, 1719, 1720, 1721, AMF Weight Generator 1722, and Quantile Estimation logic 1723.

In another embodiment of the invention, the CDMA modem receiver also includes a Bit error Integrator to measure the BER of the channel and idle code insertion logic between the Viterbi decoders 1713, 1714, 1715, 1716 and the MOI 1717 to insert idle codes in the event of loss of the message data.

Figure 18:
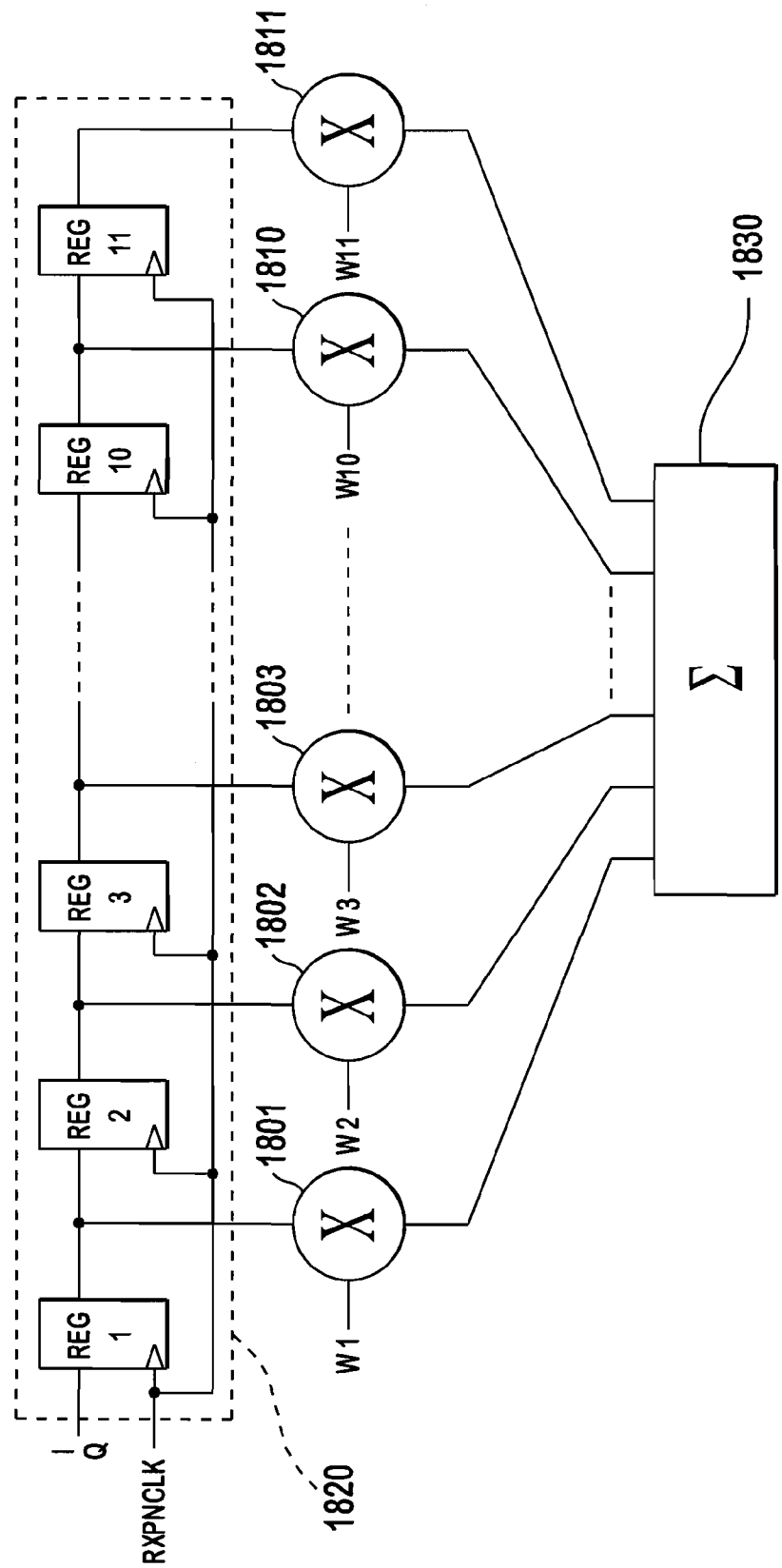
FIG. 18 is a block diagram of an exemplary adaptive matched filter as used in the CDMA modem receive section.

The Adaptive Matched Filter (AMF) 1710 resolves multipath interference introduced by the air channel. The exemplary AMF 1710 uses an 11 stage complex FIR filter as shown in FIG. 18. The received I and Q digital message signals are received at the register 1820 from the A/D 1730 of FIG. 17 and are multiplied in multipliers 1801, 1802, 1803, 1810, 1811 by I and Q channel weights W1 to W11 received from AMF weight generator 1722 of FIG. 17. In the exemplary embodiment, the A/D 1730 provides the I and Q digital receive message signal data as 2's complement values, 6 bits for I and 6 bits for Q which are clocked through an 11 stage shift register 1820 responsive to the receive spreading-code clock signal RXPNCLK. The signal RXPNCLK is generated by the timing section 1401 of code generation logic 1304. Each stage of the shift register is tapped and complex multiplied in the multipliers 1801, 1802, 1803, 1810, 1811 by individual (6-bit I and 6-bit Q) weight values to provide 11 tap-weighted products which are summed in adder 1830, and limited to 7-bit I and 7-bit Q values.

The CDMA modem receive section 1302 (shown in FIG. 13) provides independent channel despreaders 1703, 1704, 1705, 1706, 1707, 1708, 1709 (shown in FIG. 17) for despreading the message channels. The described embodiment despreads 7 message channels, each despreader accepting a 1-bit I b 1-bit Q despreading code signal to perform a complex correlation of this code against a 8-bit I by 8-bit Q data input. The 7 despreaders correspond to the 7 channels: Traffic Channel 0 (TR0'), TR1', TR2', TR3', AUX (a spare channel), Automatic Power Control (APC) and pilot (PLT).

Figure 19:
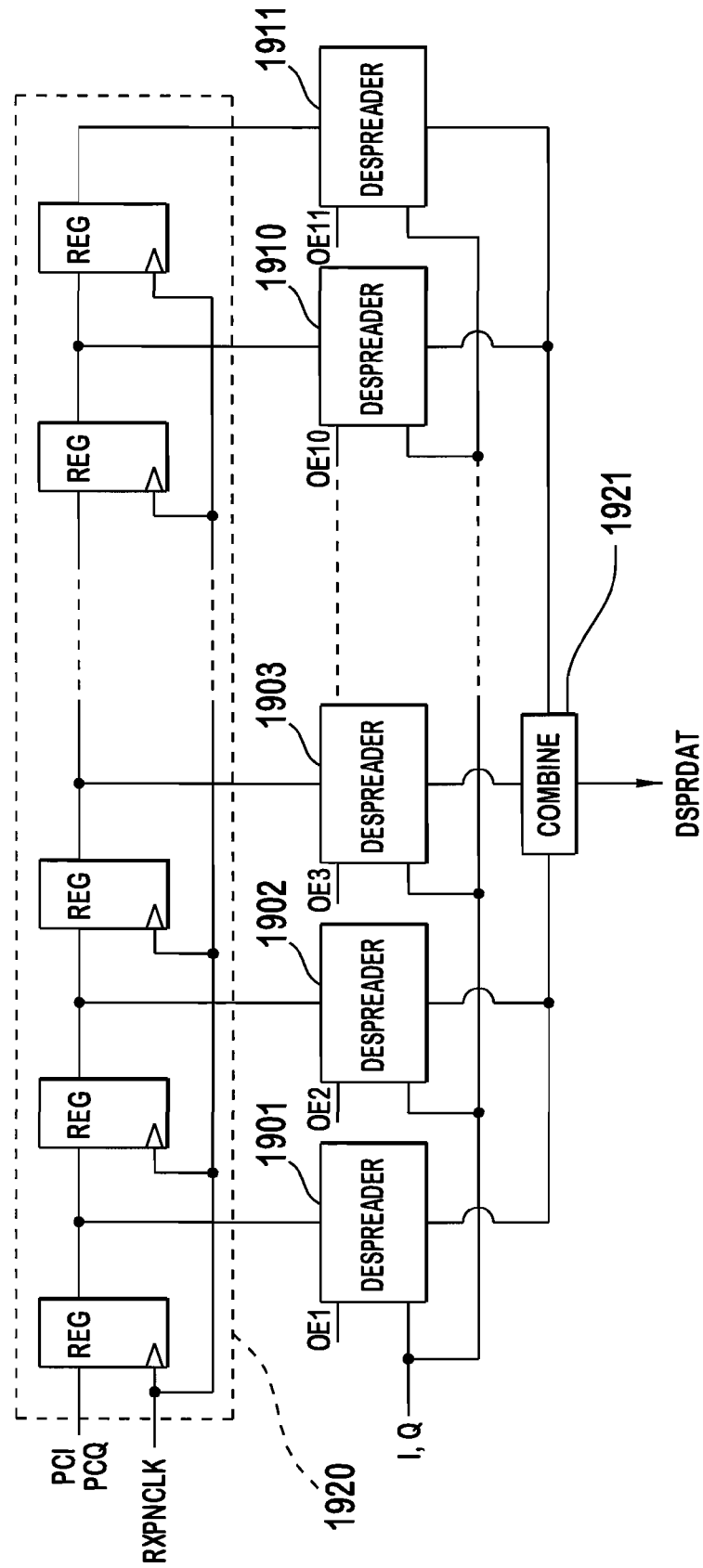
FIG. 19 is a block diagram of an exemplary pilot rake as used in the CDMA modem receive section.

The Pilot AVC 1711 shown in FIG. 19 receives the I and Q Pilot Spreading code sequence values PCI and PCQ into shift register 1920 responsive to the timing signal RXPNCLK, and includes 11 individual despreaders 1901 through 1911 each correlating the I and Q digital receive message signal data with a one chip delayed version of the same pilot code sequence. Signals 0E1, 0E2, . . . 0E11 are used by the modem control 1303 to enable the despreading operation. The output signals of the despreaders are combined in combiner 1920 forming correlation signal DSPRDAT of the Pilot AVC 1711, which is received by the ACQ & Track logic 1701 (shown in FIG. 17), and ultimately by modem controller 1303 (shown in FIG. 13). The ACQ & Track logic 1701 uses the correlation signal value to determine if the local receiver is synchronized with its remote transmitter.

Figure 20:
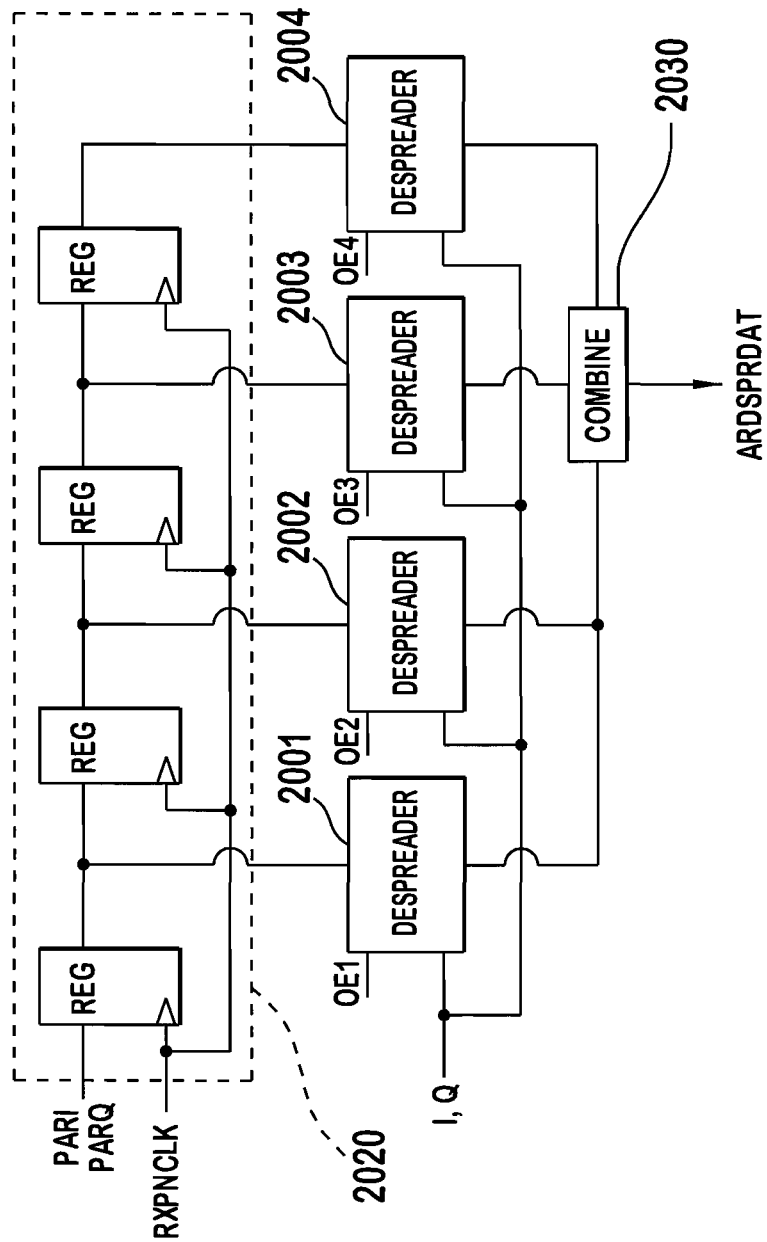
FIG. 20 is a block diagram of an exemplary auxiliary pilot rake as used in the CDMA modem receive section.

The Auxiliary AVC 1712 also receives the I and Q digital receive message signal data and, in the described embodiment, includes four separate despreaders 2001, 2002, 2003, 2004 as shown in FIG. 20. Each despreader receives and correlates the I and Q digital receive message data with delayed versions of the same despreading code sequence PARI and PARQ which are provided by code generator 1304 input to and contained in shift register 2020. The output signals of the despreaders 2001, 2002, 2003, 2004 are combined in combiner 2030 which provides noise correlation signal ARDSPRDAT. The auxiliary AVC spreading code sequence does not correspond to any transmit spreading code sequence of the system. Signals OE1, OE2, . . . OE4 are used by the modem control 1303 to enable the despreading operation. The Auxiliary AVC 1712 provides a noise correlation signal ARDSPRDAT from which quantile estimates are calculated by the Quantile estimator 1733, and provides a noise level measurement to the ACQ & Track logic 1701 (shown in FIG. 17) and modem controller 1303 (shown in FIG. 13).

Each despread channel output signal corresponding to the received message channels TR0', TR1', TR2', and TR3' is input to a corresponding Viterbi decoder 1713, 1714, 1715, 1716 shown in FIG. 17 which performs forward error correction on convolutionally encoded data. The Viterbi decoders of the exemplary embodiment have a constraint length of K=7 and a rate of R=½. The decoded despread message channel signals are transferred from the CDMA modem to the PCM Highway 1201 through the MOI 1717. The operation of the MOI is essentially the same as the operation of the MISR of the transmit section 1301 (shown in FIG. 13) except in reverse.

The CDMA modem receiver section 1302 implements several different algorithms during different phases of the acquisition, tracking and despreading of the receive CDMA message signal.

When the received signal is momentarily lost (or severely degraded) the idle code insertion algorithm inserts idle codes in place of the lost or degraded receive message data to prevent the user from hearing loud noise bursts on a voice call. The idle codes are sent to the MOI 1717 (shown in FIG. 17) in place of the decoded message channel output signal from the Viterbi decoders 1713, 1714, 1715, 1716. The idle code used for each traffic channel is programmed by the Modem Controller 1303 by writing the appropriate pattern IDLE to the MOI, which in the present embodiment is a 8 bit word for a 64 kb/s stream, 4 bit word for a 32 kb/s stream.

Modem Algorithms for Acquisition and Tracking of Received Pilot Signal

The acquisition and tracking algorithms are used by the receiver to determine the approximate code phase of a received signal, synchronize the local modem receiver despreaders to the incoming pilot signal, and track the phase of the locally generated pilot code sequence with the received pilot code sequence. Referring to FIGS. 13 and 17, the algorithms are performed by the Modem controller 1303, which provides clock adjust signals to code generator 1304. These adjust signals cause the code generator for the despreaders to adjust locally generated code sequences in response to measured output values of the Pilot Rake 1711 and Quantile values from quantile estimators 1723B. Quantile values are noise statistics measured from the In-phase and Quadrature channels from the output values of the AUX Vector Correlator 1712 (shown in FIG. 17). Synchronization of the receiver to the received signal is separated into two phases; an initial acquisition phase and a tracking phase. The initial acquisition phase is accomplished by clocking the locally generated pilot spreading code sequence at a higher or lower rate than the received signal's spreading code rate, sliding the locally generated pilot spreading code sequence and performing sequential probability ratio test (SPRT) on the output of the Pilot Vector correlator 1711. The tracking phase maintains the locally generated spreading code pilot sequence in synchronization with the incoming pilot signal. Details of the quantile estimators 1723B may be found in U.S. patent application Ser. No. 08/218,198 entitled "ADAPTIVE POWER CONTROL FOR A SPREAD SPECTRUM COMMUNICATIONS SYSTEM" which is incorporated by reference herein for its teachings on adaptive power control systems.

The SU cold acquisition algorithm is used by the SU CDMA modem when it is first powered up, and therefore has no knowledge of the correct pilot spreading code phase, or when an SU attempts to reacquire synchronization with the incoming pilot signal but has taken an excessive amount of time. The cold acquisition algorithm is divided into two subphases. The first subphase consists of a search over the length 233415 code used by the FBCH. Once this sub-code phase is acquired, the pilot's 233415×128 length code is known to within an ambiguity of 128 possible phases. The second subphase is a search of these remaining 128 possible phases. In order not to lose synch with the FBCH, in the second phase of the search, it is desirable to switch back and forth between tracking of the FBCH code and attempting acquisition of the pilot code.

The RCS acquisition of short access pilot (SAXPT) algorithm is used by an RCS CDMA modem to acquire the SAXPT pilot signal of an SU. Additional details of this technique are described in U.S. patent application entitled "A METHOD OF CONTROLLING INITIAL POWER RAMP-UP IN CDMA SYSTEMS BY USING SHORT CODES" filed on even date herewith and herein incorporated by reference. The algorithm is a fast search algorithm because the SAXPT is a short code sequence of length N, where N=chips/symbol, and ranges from 45 to 195, depending on the system's bandwidth. The search cycles through all possible phases until acquisition is complete.

The RCS acquisition of the long access pilot (LAXPT) algorithm begins immediately after acquisition of SAXPT. The SU's code phase is known within a multiple of a symbol duration, so in the exemplary embodiment of the invention there may be 7 to 66 phases to search within the round trip delay from the RCS. This bound is a result of the SU pilot signal being synchronized to the RCS Global pilot signal.

The re-acquisition algorithm begins when loss of code lock (LOL) occurs. A Z-search algorithm is used to speed the process on the assumption that the code phase has not drifted far from where it was the last time the system was locked. The RCS uses a maximum width of the Z-search windows bounded by the maximum round trip propagation delay.

The Pre-Track period immediately follows the acquisition or re-acquisition algorithms and immediately precedes the tracking algorithm. Pre-track is a fixed duration period during which the receive data provided by the modem is not considered valid. The Pre-Track period allows other modem algorithms, such as those used by the ISW PLL 1724, ACQ & Tracking, AMF Weight GEN 1722, to prepare and adapt to the current channel. The Pre-Track period is two parts. The first part is the delay while the code tracking loop pulls in. The second part is the delay while the AMF tap weight calculations are performed by the AMF Weight Gen 1722 to produce settled weighting coefficients. Also in the second part of the Pre-Track period, the carrier tracking loop is allowed to pull in by the SW PLL 1724, and the scalar quantile estimates are performed in the Quantile estimator 1723A.

The Tracking Process is entered after the Pre-Track period ends. This process is actually a repetitive cycle and is the only process phase during which receive data provided by the modem may be considered valid. The following operations are performed during this phase: AMF Tap Weight Update, Carrier Tracking, Code Tracking, Vector Quantile Update, Scalar Quantile Update, Code Lock Check, Derotation and Symbol Summing, and Power Control (forward and reverse).

If LOL is detected, the modem receiver terminates the Track algorithm and automatically enters the reacquisition algorithm. In the SU, a LOL causes the transmitter to be shut down. In the RCS, LOL causes forward power control to be disabled with the transmit power held constant at the level immediately prior to loss of lock. It also causes the return power control information being transmitted to assume a 010101 . . . pattern, causing the SU to hold its transmit power constant. This can be performed using the signal lock check function which generates the reset signal to the acquisition and tracking circuit 1701.

Two sets of quantile statistics are maintained, one by Quantile estimator 1723B and the other by the scalar Quantile Estimator 1723A. Both are used by the modem controller 1303. The first set is the "vector" quantile information, so named because it is calculated from the vector of four complex values generated by the AUX AVC receiver 1712. The second set is the scalar quantile information, which is calculated from the single complex value AUX signal that is output from the AUX Despreader 1707. The two sets of information represent different sets of noise statistics used to maintain a pre-determined Probability of False Alarm ($P_{fa}$). The vector quantile data is used by the acquisition and reacquisition algorithms implemented by the modem controller 1303 to determine the presence of a received signal in noise, and the scalar quantile information is used by the code lock check algorithm.

For both the vector and scalar cases, quantile information consists of calculated values of lambda0 through lambda2, which are boundary values used to estimate the probability distribution function (p.d.f) of the despread receive signal and determine whether the modem is locked to the PN code. The Aux_Power value used in the following C-subroutine is the magnitude squared of the AUX signal output of the scalar correlator array for the scalar quantiles, and the sum of the magnitudes squared for the vector case. In both cases the quantiles are then calculated using the following C-subroutine:

```
for (n = 0; n < 3; n++) {
    lambda [n] += (lambda [n] < Aux_Power) ? CG[n] : GM[n];
}
``` where CG[n] are positive constants and GM[n] are negative constants (different values are used for scalar and vector quantiles).

During the acquisition phase, the search of the incoming pilot signal with the locally generated pilot code sequence employs a series of sequential tests to determine if the locally generated pilot code has the correct code phase relative to the received signal. The search algorithms use the Sequential Probability Ratio Test (SPRT) to determine whether the received and locally generated code sequences are in phase. The speed of acquisition is increased by parallelism resulting from having a multi-fingered receiver. For example, in the described embodiment of the invention the main Pilot Rake 1711 has a total of 11 fingers representing a total phase period of 11 chip periods. For acquisition 8 separate sequential probability ratio tests (SPRTs) are implemented, with each SPRT observing a 4 chip window. Each window is offset from the previous window by one chip, and in a search sequence any given code phase is covered by 4 windows. If all 8 of the SPRT tests are rejected, then the set of windows is moved by 8 chips.

If any of the SPRT's is accepted, then the code phase of the locally generated pilot code sequence is adjusted to attempt to center the accepted SPRT's phase within the Pilot AVC. It is likely that more than one SPRT reaches the acceptance threshold at the same time. A table lookup is used cover all 256 possible combinations of accept/reject and the modem controller uses the information to estimate the correct center code phase within the Pilot Rake 1711. Each SPRT is implemented as follows (all operations occur at 64 k symbol rate): Denote the fingers' output level values as I_Finger[n] and Q_Finger[n], where n=0 . . . 10 (inclusive, 0 is earliest (most advanced) finger), then the power of each window is:

$$\text{Power Window}[i] = \sum_n (\text{I\_Finger}^2[n] + \text{Q\_Finger}^2[n])$$

To implement the SPRT's the modem controller then performs for each of the windows the following calculations which are expressed as a pseudo-code subroutine:

```
/* find bin for Power */
tmp = SIGMA[0];
for (k = 0; k< 3; k++) {
    if (Power > lambda [k]) tmp = SIGMA[k+1];
}
test_statistic += tmp; /* update statistic */
if(test_statistic > ACCEPTANCE_THRESHOLD)you've got ACQ;
else if (test_statistic < DISMISSAL_THRESHOLD) {
    forget this code phase;
} else keep trying - get more statistics;
``` where lambda[k] are as defined in the above section on quantile estimation, and SIGMA[k], ACCEPTANCE_THRESHOLD and DISMISSAL_THRESHOLD are predetermined constants. Note that SIGMA[k] is negative for values for low values of k, and positive for right values of k, such that the acceptance and dismissal thresholds can be constants rather than a function of how many symbols worth of data have been accumulated in the statistic.

The modem controller determines which bin delimited by the values of lambda[k] the Power level falls into which allows the modem controller to develop an approximate statistic.

For the present algorithm, the control voltage is formed as $\epsilon = y^T B y$, where y is a vector formed from the complex valued output values of the Pilot Vector correlator 1711, and B is a matrix consisting of the constant values pre-determined to maximize the operating characteristics while minimizing the noise as described previously with reference to the Quadratic Detector.

To understand the operation of the Quadratic Detector, it is useful to consider the following. A spread spectrum (CDMA) signal, s(t) is passed through a multipath channel with an impulse response $h_c(t)$. The baseband spread signal is described by equation (30).

$$s(t) = \sum_i C_i p(t - iT_c) \qquad \text{Equation 30}$$

where $C_i$ is a complex spreading code symbol, p(t) is a predefined chip pulse and $T_c$ is the chip time spacing, where $T_c = 1/R_c$ and $R_c$ is the chip rate.

The received baseband signal is represented by equation (31)

$$r(t) = \sum_i C_i q(t - iT_c - \tau) + n(t) \qquad \text{Equation 31}$$

where $q(t) = p(t) * h_c(t)$, $\tau$ is an unknown delay and n(t) is additive noise. The received signal is processed by a filter, $h_R(t)$, so the waveform, x(t), to be processed is given by equation (32).

$$x(t) = \sum_i C_i f(t - iT_c - \tau) + z(t) \qquad \text{Equation 32}$$

where $f(t) = q(t) * h_R(t)$ and $z(t) = n(t) * h_R(t)$.

In the exemplary receiver, samples of the received signal are taken at the chip rate, that is to say, $1/T_c$. These samples, $x(mT_c + \tau')$, are processed by an array of correlators that compute, during the $r^{th}$ correlation period, the quantities given by equation (33).

$$v_k^{(r)} = \sum_{m=rL}^{rL+L-1} x(mT_c + \tau') C_{m+k}^* \qquad \text{Equation 33}$$

These quantities are composed of a noise component $w_k^{(r)}$ and a deterministic component $y_k^{(r)}$ given by equation (34).

$$y_k^{(r)} E[v_k^{(r)}] = Lf(kT_c + \tau' - \tau) \qquad \text{Equation 34}$$

In the sequel, the time index r may be suppressed for ease of writing, although it is to be noted that the function f(t) changes slowly with time.

The samples are processed to adjust the sampling phase, $\tau'$, in an optimum fashion for further processing by the receiver, such as matched filtering. This adjustment is described below. To simplify the representation of the process, it is helpful to describe it in terms of the function $f(t+\tau)$, where the time-shift, $\tau$, is to be adjusted. It is noted that the function $f(t+\tau)$ is measured in the presence of noise. Thus, it may be problematical to adjust the phase $\tau'$ based on measurements of the signal $f(t+\tau)$. To account for the noise, the function v(t): v(t)=f(t)+m(t) is introduced, where the term m(t) represents a noise process. The system processor may be derived based on considerations of the function v(t).

The process is non-coherent and therefore is based on the envelope power function $|v(t+\tau)|^2$. The functional $e(\tau')$ given in equation (35) is helpful for describing the process.

$$e(\tau') = \int_{-\infty}^{0} |v(t+\tau'-\tau)|^2 dt - \int_{0}^{\infty} |v(t+\tau'-\tau)|^2 dt \qquad \text{Equation 35}$$

The shift parameter is adjusted for $e(\tau')=0$, which occurs when the energy on the interval $(-\infty, \tau'-\tau]$ equals that on the interval $[\tau'-\tau, \infty)$. The error characteristic is monotonic and therefore has a single zero crossing point. This is the desirable quality of the functional. A disadvantage of the functional is that it is ill-defined because the integrals are unbounded when noise is present. Nevertheless, the functional $e(\tau')$ may be cast in the form given by equation (36).

$$e(\tau') = \int_{-\infty}^{\infty} w(t) |v(t+\tau'-\tau)|^2 dt \qquad \text{Equation 36}$$

where the characteristic function w(t) is equal to sgn(t), the signum function.

To optimize the characteristic function w(t), it is helpful to define a figure of merit, F, as set forth in equation (37).

$$F = \frac{[e(\tau_0' + T_A) - e(\tau_0' - T_A)]^2}{VAR\{e(\tau_0')\}}$$

Equation 37

The numerator of F is the numerical slope of the mean error characteristic on the interval $[-T_A, T_A]$ surrounding the tracked value, $\tau_0'$. The statistical mean is taken with respect to the noise as well as the random channel, $h_c(t)$. It is desirable to specify a statistical characteristic of the channel in order to perform this statistical average. For example, the channel may be modeled as a Wide Sense Stationary Uncorrelated Scattering (WSSUS) channel with impulse response $h_c(t)$ and a white noise process $U(t)$ that has an intensity function $g(t)$ as shown in equation (38).

$$h_c(t) = \sqrt{g(t)} U(t)$$

Equation 38

The variance of $e(\tau)$ is computed as the mean square value of the fluctuation $$e'(\tau) = e(\tau) - \langle e(\tau) \rangle$$

Equation 39 where $\langle e(\tau) \rangle$ is the average of $e(\tau)$ with respect to the noise.

Optimization of the figure of merit F with respect to the function w(t) may be carried out using well-known Variational methods of optimization.

Once the optimal w(t) is determined, the resulting processor may be approximated accurately by a quadratic sample processor which is derived as follows.

By the sampling theorem, the signal v(t), bandlimited to a bandwidth W may be expressed in terms of its samples as shown in equation (40).

$$v(t) = \Sigma v(k/W) \sin c[(Wt-k)\pi]$$

Equation 40 substituting this expansion into equation (z+6) results in an infinite quadratic form in the samples $v(k/W+\tau'-\tau)$. Making the assumption that the signal bandwidth equals the chip rate allows the use of a sampling scheme that is clocked by the chip clock signal to be used to obtain the samples. These samples, $v_k$ are represented by equation (41).

$$v_k = v(kT_c + \tau' - \tau)$$

Equation 41

This assumption leads to a simplification of the implementation. It is valid if the aliasing error is small.

In practice, the quadratic form that is derived is truncated. An example normalized B matrix is given below in Table 12. For this example, an exponential delay spread profile $g(t) = \exp(-t/\tau)$ is assumed with $\tau$ equal to one chip. An aperture parameter $T_A$ equal to one and one-half chips has also been assumed. The underlying chip pulse has a raised cosine spectrum with a 20% excess bandwidth.

TABLE 12

Example B matrix

| 0 | 0 | 0 | 0 | 0 | 0 | 0 | 0 | 0 | 0 | 0 |
|---|---|---|---|---|---|---|---|---|---|---|
| 0 | 0 | -0.1 | 0 | 0 | 0 | 0 | 0 | 0 | 0 | 0 |
| 0 | -0.1 | 0.22 | 0.19 | -0.19 | 0 | 0 | 0 | 0 | 0 | 0 |
| 0 | 0 | 0.19 | 1 | 0.45 | -0.2 | 0 | 0 | 0 | 0 | 0 |
| 0 | 0 | -0.19 | 0.45 | 0.99 | 0.23 | 0 | 0 | 0 | 0 | 0 |
| 0 | 0 | 0 | -0.2 | 0.23 | 0 | -0.18 | 0.17 | 0 | 0 | 0 |
| 0 | 0 | 0 | 0 | 0 | -0.18 | -0.87 | -0.42 | 0.18 | 0 | 0 |
| 0 | 0 | 0 | 0 | 0 | 0.17 | -0.42 | -0.92 | -0.16 | 0 | 0 |
| 0 | 0 | 0 | 0 | 0 | 0 | 0.18 | -0.16 | -0.31 | 0 | 0 |
| 0 | 0 | 0 | 0 | 0 | 0 | 0 | 0 | 0 | -0.13 | 0 |
| 0 | 0 | 0 | 0 | 0 | 0 | 0 | 0 | 0 | 0 | 0 |

Code tracking is implemented via a loop phase detector that is implemented as follows. The vector y is defined as a column vector which represents the 11 complex output level values of the Pilot AVC 1711, and B denotes an 11×11 symmetric real valued coefficient matrix with pre-determined values to optimize performance with the non-coherent Pilot AVC output values y. The output signal $\epsilon$ of the phase detector is given by equation (42):

$$\epsilon = y^T B y$$

Equation 42

The following calculations are then performed to implement a proportional plus integral loop filter and the VCO:

$$x[n] = x[n-1] + \beta \epsilon$$

$$z[n] = z[n-1] + x[n] + \alpha \epsilon$$

for $\beta$ and $\alpha$ which are constants chosen from modeling the system to optimize system performance for the particular transmission channel and application, and where x[n] is the loop filter's integrator output value and z[n] is the VCO output value. The code phase adjustments are made by the modem controller the following C-subroutine:

```
if (z > zmx) {
    delay phase 1/16 chip;
    z -= zmax;
} else if (z < -zmax) {
    advance phase 1/16 chip;
    z += zmax;
}
```

A different delay phase could be used in the above pseudo-code consistant with the present invention.

The AMF Tap-Weight Update Algorithm of the AMF Weight Gen 1722 occurs periodically to de-rotate and scale the phase of each finger value of the Pilot Rake 1711 by performing a complex multiplication of the Pilot AVC finger value with the complex conjugate of the current output value of the carrier tracking loop and applying the product to a low pass filter and form the complex conjugate of the filter values to produce AMF tap-weight values, which are periodically written into the AMF filters of the CDMA modem.

The lock check algorithm, shown in FIG. 17, is implemented by the modem controller 1303 performing SPRT operations on the output signal of the scalar correlator array. The SPRT technique is the same as that for the acquisition algorithms, except that the acceptance and rejection thresholds are changed to increase the probability of detection of lock.

Carrier tracking is accomplished via a second order loop that operates on the pilot output values of the scalar correlated array. The phase detector output is the hard limited version of the quadrature component of the product of the (complex valued) pilot output signal of the scalar correlated array and the VCO output signal. The loop filter is a proportional plus integral design. The VCO is a pure summation, accumulated phase error $\phi$, which is converted to the complex phasor $\cos \phi + j \sin \phi$ using a look-up table in memory.

The previous description of acquisition and tracking algorithm focuses on a non-coherent method because the acquisition and tracking algorithm described requires non-coherent acquisition following by non-coherent tracking because during acquisition a coherent reference is not available until the AMF, Pilot AVC, Aux AVC, and DPLL are in an equilibrium state. However, it is known in the art that coherent tracking and combining is always optimal because in noncoherent tracking and combining the output phase information of each Pilot AVC finger is lost. Consequently, another embodiment of the invention employs a two step acquisition and tracking system, in which the previously described non-coherent acquisition and tracking algorithm is implemented first, and then the algorithm switches to a coherent tracking method. The coherent combining and tracking method is similar to that described previously, except that the error signal tracked is of the form:

$$\epsilon = y^T A y \qquad \text{Equation 43}$$

where y is defined as a column vector which represents the 11 complex output level values of the Pilot AVC 1711, and A denotes an 11×11 symmetric real valued coefficient matrix with pre-determined values to optimize performance with the coherent Pilot AVC outputs y. An exemplary A matrix is shown below.

$$A = \begin{pmatrix} 1 & 0 & 0 & 0 & 0 & 0 & 0 & 0 & 0 & 0 & 0 \\ 0 & 1 & 0 & 0 & 0 & 0 & 0 & 0 & 0 & 0 & 0 \\ 0 & 0 & 1 & 0 & 0 & 0 & 0 & 0 & 0 & 0 & 0 \\ 0 & 0 & 0 & 1 & 0 & 0 & 0 & 0 & 0 & 0 & 0 \\ 0 & 0 & 0 & 0 & 1 & 0 & 0 & 0 & 0 & 0 & 0 \\ 0 & 0 & 0 & 0 & 0 & 0 & 0 & 0 & 0 & 0 & 0 \\ 0 & 0 & 0 & 0 & 0 & 0 & -1 & 0 & 0 & 0 & 0 \\ 0 & 0 & 0 & 0 & 0 & 0 & 0 & -1 & 0 & 0 & 0 \\ 0 & 0 & 0 & 0 & 0 & 0 & 0 & 0 & -1 & 0 & 0 \\ 0 & 0 & 0 & 0 & 0 & 0 & 0 & 0 & 0 & -1 & 0 \\ 0 & 0 & 0 & 0 & 0 & 0 & 0 & 0 & 0 & 0 & -1 \end{pmatrix}$$

Figure 21:
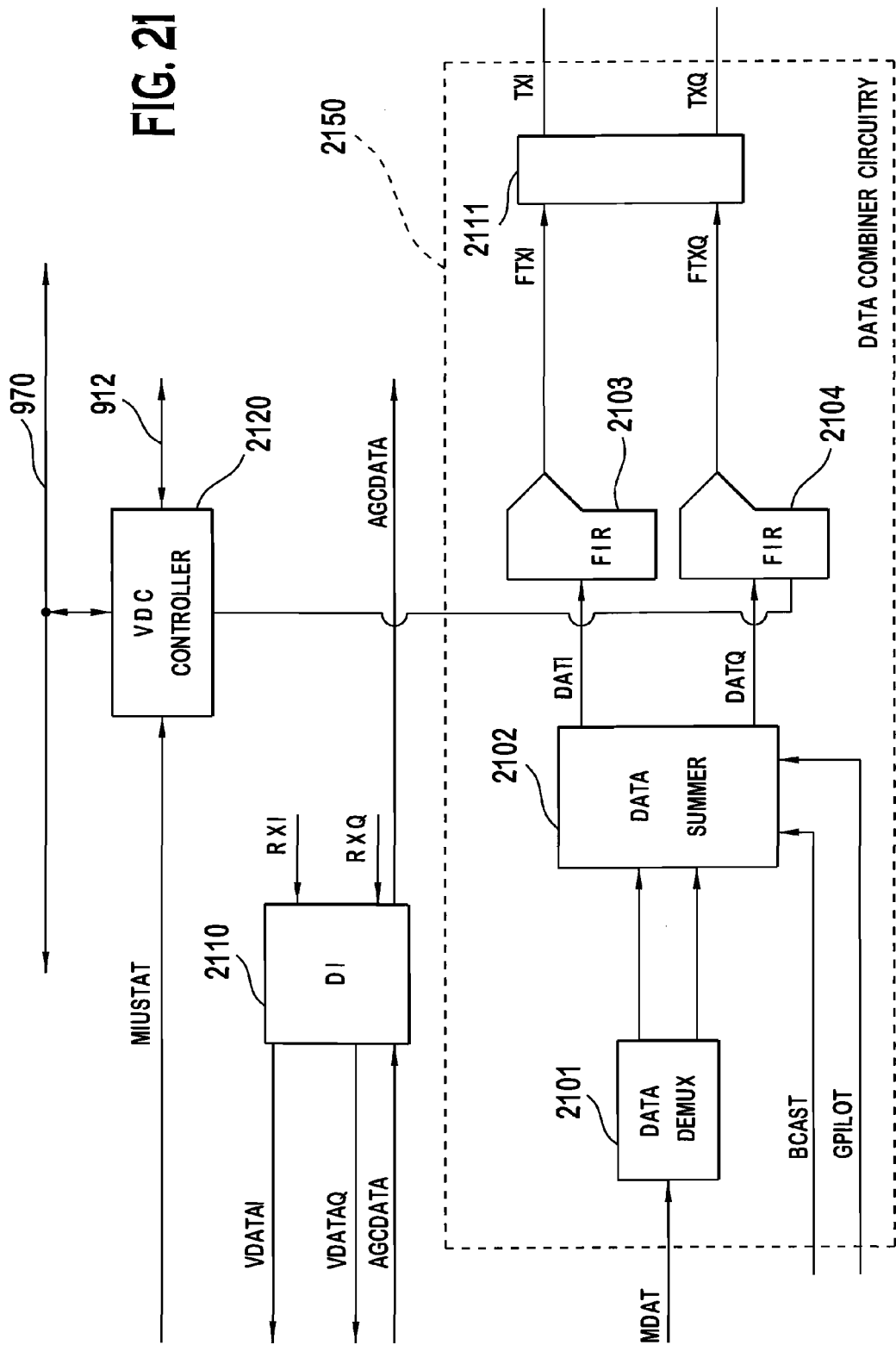
FIG. 21 is a block diagram of an exemplary video distribution circuit (VDC) of the RCS shown in FIG. 9.

Referring to FIG. 9, the Video Distribution Controller Board (VDC) 940 of the RCS is connected to each MIU 931, 932, 933 and the RF Transmitters/Receivers 950. The VDC 940 is shown in FIG. 21. The Data Combiner Circuitry (DCC) 2150 includes a Data Demultiplexer 2101, Data Summer 2102, FIR Filters 2103, 2104, and a Driver 2111. The DCC 2150 1) receives the weighted CDMA modem I and Q data signal MDAT from each of the MIUs, 931, 932, 933, 2) sums the I and Q data with the digital bearer channel data from each MIU 931, 932, 933, 3) and sums the result with the broadcast data message signal BCAST and the Global Pilot spreading code GPILOT provided by the master MIU modem 1210, 4) band shapes the summed signals for transmission, and 5) produces analog data signal for transmission to the RF Transmitter/Receiver.

FIR Filters 2103, 2104 are used to modify the MIU CDMA Transmit I and Q Modem Data before transmission. The WAC transfers FIR Filter Coefficient data through the Serial Port link 912 through the VDC Controller 2120 and to the FIR filters 2103, 2104. Each FIR Filter 2103, 2104 is Configured separately. The FIR Filters 2103, 2104 employ Up-Sampling to operate at twice the chip rate so zero data values are sent after every MIU CDMA Transmit Modem DATI and DATQ value to produce FTXI and FTXQ.

The VDC 940 distributes the AGC signal AGCDATA from the AGC 1750 of the MIUs 931, 932, 933 to the RF Transmitter/Receiver 950 through the Distribution interface (DI) 2110. The VDC DI 2110 receives data RXI and RXQ from the RF Transmitter/Receiver and distributes the signal as VDATAI and VDATAQ to MIUs 931, 932, 933.

Referring to FIG. 21, the VDC 940 also includes a VDC controller 2120 which monitors status and fault information signals MIUSTAT from MIUs and connects to the serial link 912 and HSBS 970 to communicate with WAC 920 shown in FIG. 9. The VDC controller 2120 includes a microprocessor, such as an Intel 8032 Microcontroller, an oscillator (not shown) providing timing signals, and memory (not shown). The VDC controller memory includes a Flash Prom (not shown) to contain the controller program code for the 8032 Microprocessor, and an SRAM (not shown) to contain the temporary data written to and read from memory by the microprocessor.

Figure 22:
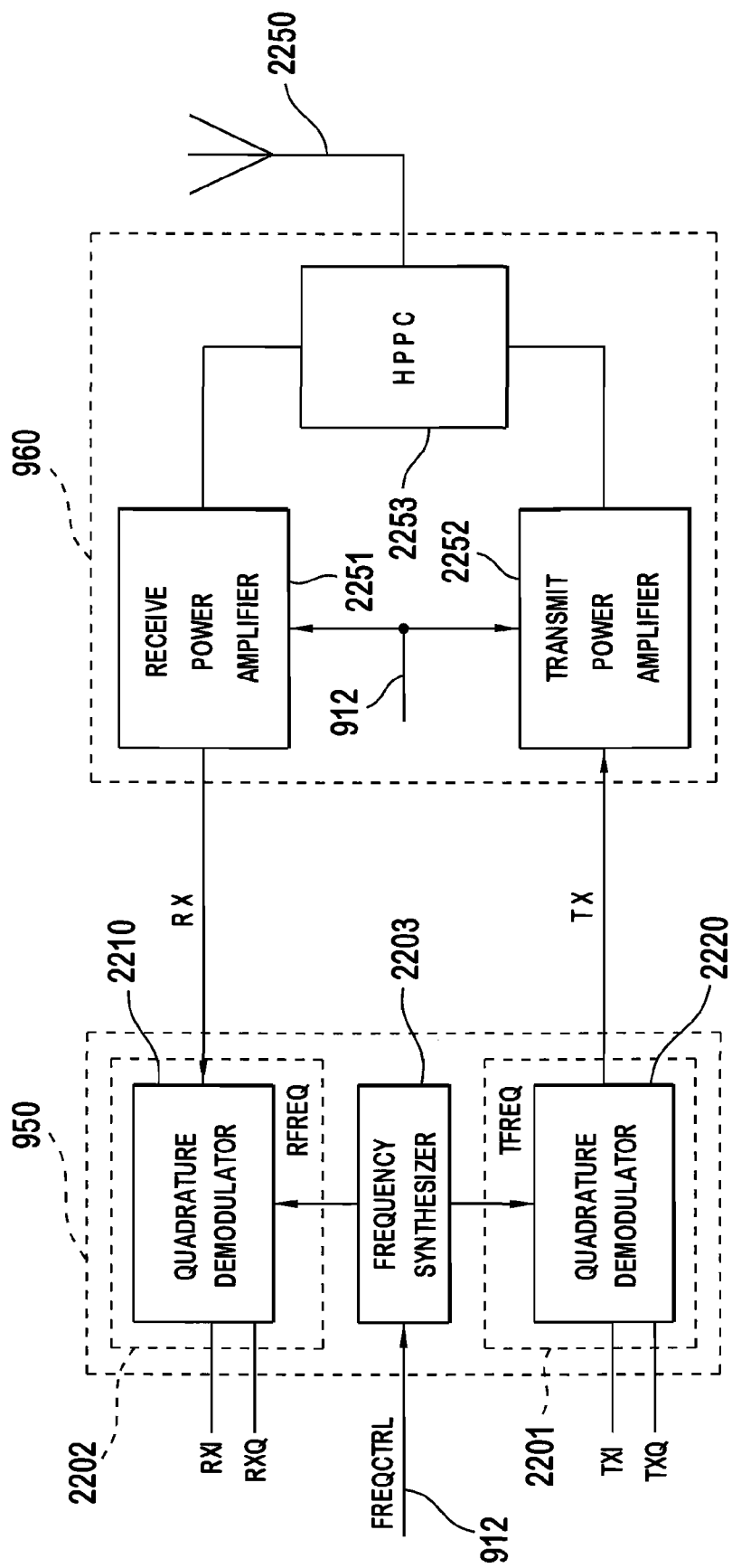
FIG. 22 is a block diagram of an exemplary RF transmitter/receiver and exemplary power amplifiers of the RCS shown in FIG. 9.

Referring to FIG. 9, the present invention includes a RF Transmitter/Receiver 950 and power amplifier section 960. Referring to FIG. 22, the RF Transmitter/Receiver 950 is divided into three sections: the transmitter module 2201, the receiver module 2202, and the Frequency Synthesizer 2203. Frequency Synthesizer 2203 produces a transmit carrier frequency TFREQ and a receive carrier frequency RFREQ in response to a Frequency control signal FREQCTRL received from the WAC 920 on the serial link 912. In the transmitter module 2201, the input analog I and Q data signals TXI and TXQ from the VDC are applied to the Quadrature modulator 2220, which also receives a transmit carrier frequency signal TFREQ from the Frequency Synthesizer 2203 to produce a quadrature modulated transmit carrier signal TX. The analog transmit carrier modulated signal, an upconverted RF signal, TX is then applied to the Transmit Power Amplifier 2252 of the Power Amplifier 960. The amplified transmit carrier signal is then passed through the High Power Passive Components (HPPC) 2253 to the Antenna 2250, which transmits the upconverted RF signal to the communication channel as a CDMA RF signal. In one embodiment of the invention, the Transmit Power Amplifier 2252 comprises eight amplifiers of approximately 60 watts peak-to-peak each.

The HPPC 2253 comprises a lightning protector, an output filter, a 10 dB directional coupler, an isolator, and a high power termination attached to the isolator.

A receive CDMA RF signal is received at the antenna 2250 from the RF channel and passed through the HPPC 2253 to the Receive Power Amplifier 2251. The receive power amplifier 2251 includes, for example, a 30 watt power transistor driven by a 5 watt transistor. The RF receive module 2202 has quadrature modulated receive carrier signal RX from the receive power amplifier. The receive module 2202 includes a Quadrature demodulator 2210 which takes the receive carrier modulated signal RX and the receive carrier frequency signal RFREQ from the Frequency Synthesizer 2203, synchronously demodulates the carrier, and provides analog I and Q channels. These channels are filtered to produce the signals RXI and RXQ, which are transferred to the VDC 940.

The Subscriber Unit

Figure 23:
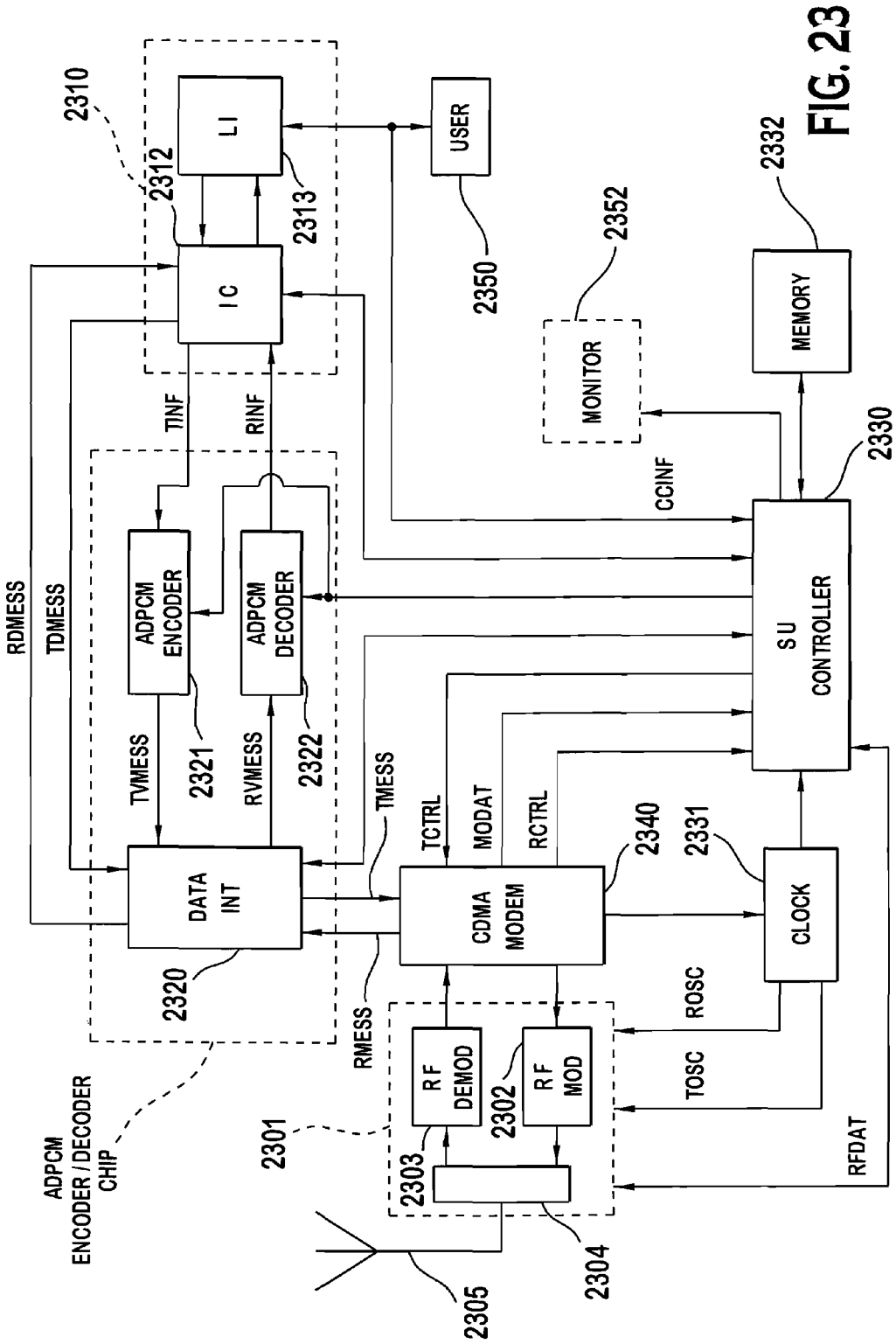
FIG. 23 is a block diagram of an exemplary subscriber unit (SU) of the present invention.

FIG. 23 shows the Subscriber Unit (SU) of one embodiment of the present invention. As shown, the SU includes an RF section 2301 including a RF modulator 2302, RF demodulator 2303, and splitter/isolator 2304 which receive Global and Assigned logical channels including traffic and control messages and Global Pilot signals in the Forward link CDMA RF channel signal, and transmit Assigned Channels and Reverse Pilot signals in the Reverse Link CDMA RF channel. The Forward and Reverse links are received and transmitted respectively through antenna 2305. The RF section employs, in one exemplary embodiment, a conventional dual conversion superheterodyne receiver having a synchronous demodulator responsive to the signal ROSC. Selectivity of such a receiver is provided by a 70 MHz transversal SAW filter (not shown). The RF modulator includes a synchronous modulator (not shown) responsive to the carrier signal TOSC to produce a quadrature modulated carrier signal. This signal is stepped up in frequency by an offset mixing circuit (not shown).

The SU further includes a Subscriber Line Interface 2310, including the functionality of a control (CC) generator, a Data Interface 2320, an ADPCM encoder 2321, an ADPCM decoder 2322, an SU controller 2330, an SU clock signal generator 2331, memory 2332, and a CDMA modem 2340, which is essentially the same as the CDMA modem 1210 described above with reference to FIG. 13. It is noted that data interface 2320, ADPCM Encoder 2321 and ADPCM Decoder 2322 are typically provided as a standard ADPCM Encoder/Decoder chip.

The Forward Link CDMA RF Channel signal is applied to the RF demodulator 2303 to produce the Forward link CDMA signal. The Forward Link CDMA signal is provided to the CDMA modem 2340, which acquires synchronization with the Global pilot signal, produces global pilot synchronization signal to the Clock 2331, to generate the system timing signals, and despreads the plurality of logical channels. The CDMA modem 2340 also acquires the traffic messages RMESS and control messages RCTRL and provides the traffic message signals RMESS to the Data Interface 2320 and receive control message signals RCTRL to the SU Controller 2330.

The receive control message signals RCTRL include a subscriber identification signal, a coding signal, and bearer modification signals. The RCTRL may also include control and other telecommunication signaling information. The receive control message signal RCTRL is applied to the SU controller 2330, which verifies that the call is for the SU from the Subscriber identification value derived from RCTRL. The SU controller 2330 determines the type of user information contained in the traffic message signal from the coding signal and bearer rate modification signal. If the coding signal indicates the traffic message is ADPCM coded, the traffic message RVMESS is sent to the ADPCM decoder 2322 by sending a select message to the Data Interface 2320. The SU controller 2330 outputs an ADPCM coding signal and bearer rate signal derived from the coding signal to the ADPCM decoder 2322. The traffic message signal RVMESS is the input signal to the ADPCM decoder 2322, where the traffic message signal is converted to a digital information signal RINF in response to the values of the input ADPCM coding signal.

If the SU controller 2330 determines the type of user information contained in the traffic message signal from the coding signal is not ADPCM coded, then RDMESS passes through the ADPCM encoder transparently. The traffic message RDMESS is transferred from the Data Interface 2320 directly to the Interface Controller (IC) 2312 of the subscriber line interface 2310.

The digital information signal RINF or RDMESS is applied to the subscriber line interface 2310, including a interface controller (IC) 2312 and Line Interface (LI) 2313. For the exemplary embodiment the IC is an Extended PCM Interface Controller (EPIC) and the LI is a Subscriber Line Interface Circuit (SLIC) for POTS which corresponds to RINF type signals, and a ISDN Interface for ISDN which corresponds to RDMESS type signals. The EPIC and SLIC circuits are well known in the art. The subscriber line interface 2310 converts the digital information signal RINF or RDMESS to the user defined format. The user defined format is provided to the IC 2312 from the SU Controller 2330. The LI 2310 includes circuits for performing such functions as A-law or -law conversion, generating dial tone and, and generating or interpreting signaling bits. The line interface also produces the user information signal to the SU User 2350 as defined by the subscriber line interface, for example POTS voice, voiceband data or ISDN data service.

For a Reverse Link CDMA RF Channel, a user information signal is applied to the LI 2313 of the subscriber line interface 2310, which outputs a service type signal and an information type signal to the SU controller. The IC 2312 of the subscriber line interface 2310 produces a digital information signal TINF which is the input signal to the ADPCM encoder 2321 if the user information signal is to be ADPCM encoded, such as for POTS service. For data or other non-ADPCM encoded user information, the IC 2312 passes the data message TDMESS directly to the Data Interface 2320. The Call control module (CC), including in the subscriber line interface 2310, derives call control information from the User information signal, and passes the call control information CCINF to the SU controller 2330. The ADPCM encoder 2321 also receives coding signal and bearer modification signals from the SU controller 2330 and converts the input digital information signal into the output message traffic signal TVMESS in response to the coding and bearer modification signals. The SU controller 2330 also outputs the reverse control signal which includes the coding signal call control information, and bearer channel modification signal, to the CDMA modem. The output message signal TVMESS is applied to the Data Interface 2320. The Data Interface 2320 sends the user information to the CDMA modem 2340 as transmit message signal TMESS. The CDMA modem 2340 spreads the output message and reverse control channels TCTRL received from the SU controller 2330, and produces the reverse link CDMA Signal. The Reverse Link CDMA signal is provided to the RF transmit section 2301 and modulated by the RF modulator 2302 to produce the output Reverse Link CDMA RF channel signal transmitted from antenna 2305.

SU Controller 2330 receives data RFDAT from the RF Demodulator 2303 and RF Modulator 2302 concerning operating characteristics of the RF section 2301, including, for example, measurements of signal gain, signal power, frequency shift. In response to the data RFDAT, SU Controller 2330 may adjust programmable operating parameters in RF section 2301.

In another embodiment of the present invention, the memory 2332 is composed of two memory components: a first memory for containing a program for loading and use by the SU Controller 2330, and a second memory for writing and storing information during operation. The first memory may be a programmable memory, such as a FLASH memory. SU Controller 2330 may receive a new program transmitted to the SU from the CDMA modem 2340 or from an external device (not shown). Upon receiving the new program, the SU Controller may store the new program in the second memory, determine that the program has been correctly received, store the program in the first memory by reprogramming the first memory, and then reboot and load the new software.

Also, an optional interface to an optional monitoring device 2352 may be provided by the SU Controller 2330. SU Controller 2330 may receive data MODAT from the CDMA Modem 2340 which may indicate current values of system parameters, such as, for example, system noise interference levels, number of established calls, forward and reverse power control parameters, time to access a channel, time to establish a channel, and number of dropped calls. SU Controller 2330 may collect and store this information in memory 2332 and provide the information to the optional monitor 2352 if prompted by a user or automatically.

Call Connection and Establishment Procedure

The process of bearer channel establishment consists of two procedures: the call connection process for a call connection incoming from a remote call processing unit such as an RDU (Incoming Call Connection), and the call connection process for a call outgoing from the SU (Outgoing Call Connection). Before any bearer channel can be established between an RCS and a SU, the SU must register its presence in the network with the remote call processor such as the RDU. When the off-hook signal is detected by the SU, the SU not only begins to establish a bearer channel; but also initiates the procedure for an RCS to obtain a terrestrial link between the RCS and the remote processor. As incorporated herein by reference, the process of establishing the RCS and RDU connection is detailed in the DECT V5.1 standard.

Figure 24:
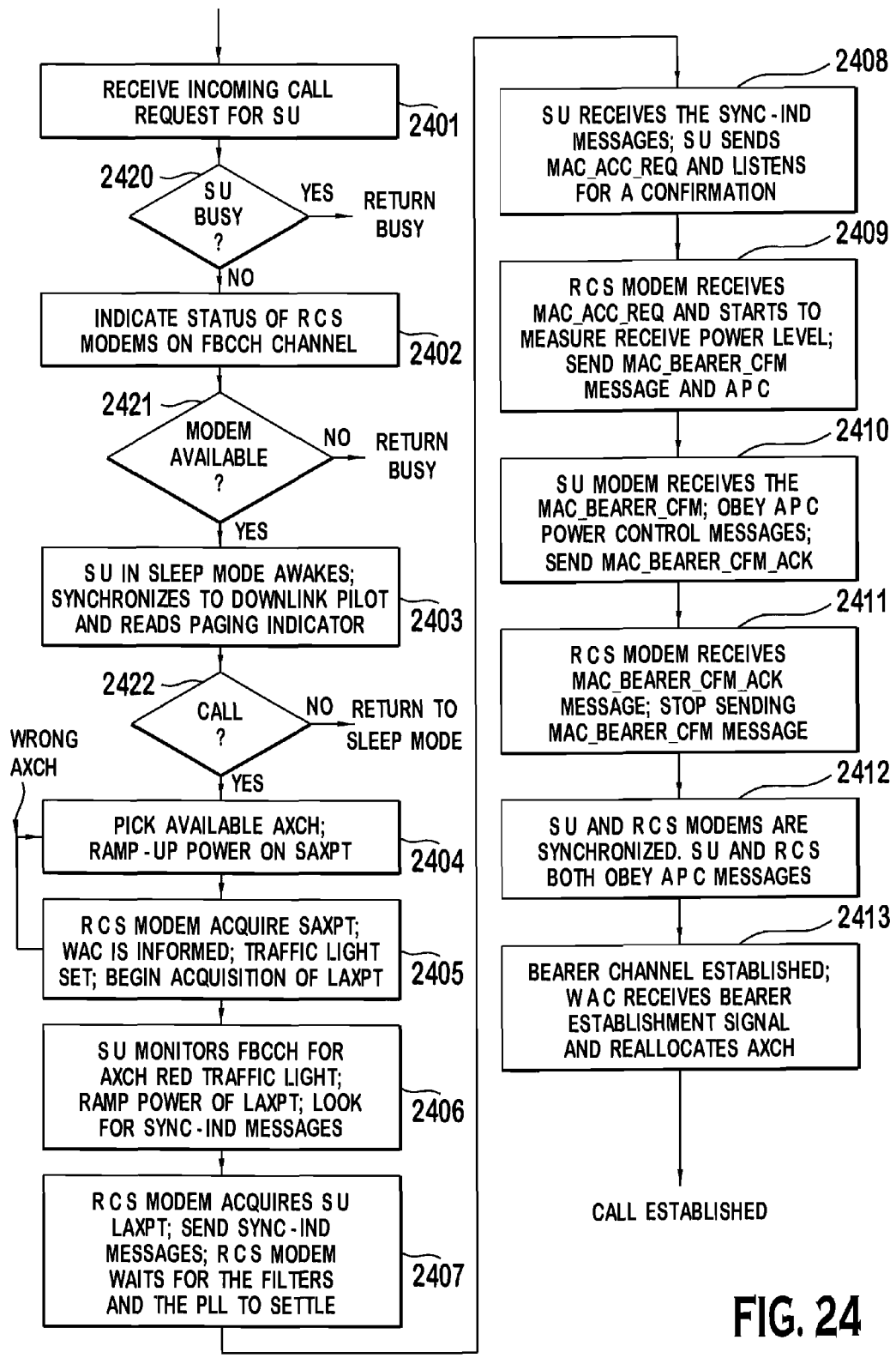
FIG. 24 is a flow-chart diagram of an exemplary call establishment algorithm for an incoming call request used by the present invention for establishing a bearer channel between an RCS and an SU.

For the Incoming Call Connection procedure shown in FIG. 24, first 2401, the WAC 920 (shown in FIG. 9) receives, via one of the MUXs 905, 906 and 907, an incoming call request from a remote call processing unit. This request identifies the target SU and that a call connection to the SU is desired. The WAC periodically outputs the SBCH channel with paging indicators for each SU and periodically outputs the FBCH traffic lights for each access channel. In response to the incoming call request, the WAC, at step 2420, first checks to see if the identified SU is already active with another call. If so, the WAC returns a busy signal for the SU to the remote processing unit through the MUX, otherwise the paging indicator for the channel is set.

Next, at step 2402, the WAC checks the status of the RCS modems and, at step 2421, determines whether there is an available modem for the call. If a modem is available, the traffic lights on the FBCH indicate that one or more AXCH channels are available. If no channel is available after a certain period of time, then the WAC returns a busy signal for the SU to the remote processing unit through the MUX. If an RCS modem is available and the SU is not active (in Sleep mode), the WAC sets the paging indicator for the identified SU on the SBCH to indicate an incoming call request. Meanwhile, the access channel modems continuously search for the Short Access Pilot signal (SAXPT) of the SU.

At step 2403, an SU in Sleep mode periodically enters awake mode. In awake mode, the SU modem synchronizes to the Downlink Pilot signal, waits for the SU modem AMF filters and phase locked loop to settle, and reads the paging indicator in the slot assigned to it on the SBCH to determine if there is a call for the SU 2422. If no paging indicator is set, the SU halts the SU modem and returns to sleep mode. If a paging indicator is set for an incoming call connection, the SU modem checks the service type and traffic lights on FBCH for an available AXCH.

Next, at step 2404, the SU modem selects an available AXCH and starts a fast transmit power ramp-up on the corresponding SAXPT. For a period the SU modem continues fast power ramp-up on SAXPT and the access modems continue to search for the SAXPT.

At step 2405, the RCS modem acquires the SAXPT of the SU and begins to search for the SU LAXPT. When the SAXPT is acquired, the modem informs the WAC controller, and the WAC controller sets the traffic lights corresponding to the modem to "red" to indicate the modem is now busy. The traffic lights are periodically output while continuing to attempt acquisition of the LAXPT.

The SU modem monitors, at step 2406, the FBCH AXCH traffic light. When the AXCH traffic light is set to red, the SU assumes the RCS modem has acquired the SAXPT and begins transmitting LAXPT. The SU modem continues to ramp-up power of the LAXPT at a slower rate until Sync-Ind messages are received on the corresponding CTCH. If the SU is mistaken because the traffic light was actually set in response to another SU acquiring the AXCH, the SU modem times out because no Sync-Ind messages are received. The SU randomly waits a period of time, picks a new AXCH channel, and steps 2404 and 2405 are repeated until the SU modem receives Sync-Ind messages. Details of the power ramp up method used in the exemplary embodiment of this invention may be found in the U.S. patent application entitled METHOD OF CONTROLLING INITIAL POWER RAMP-UP IN CDMA SYSTEMS BY USING SHORT CODES filed on even date herewith, which is hereby incorporated by reference.

Next, at step 2407, the RCS modem acquires the LAXPT of the SU and begins sending Sync-Ind messages on the corresponding CTCH. The modem waits 10 msec for the Pilot and AUX Vector correlator filters and Phase locked loop to settle, but continues to send Synch-Ind messages on the CTCH. The modem then begins looking for a request message for access to a bearer channel (MAC_ACC_REQ), from the SU modem.

The SU modem, at step 2408, receives the Sync-Ind message and freezes the LAXPT transmit power level. The SU modem then begins sending repeated request messages for access to a bearer traffic channel (MAC_ACC_REQ) at fixed power levels, and listens for a request confirmation message (MAC_BEARER_CFM) from the RCS modem.

Next, at step 2409, the RCS modem receives a MAC_ACC_REQ message; the modem then starts measuring the AXCH power level, and starts the APC channel. The RCS modem then sends the MAC_BEARER_CFM message to the SU and begins listening for the acknowledgment MAC_BEARER_CFM_ACK of the MAC_BEARER_CFM message.

At step 2410, the SU modem receives the MAC_BEARER_CFM message and begins obeying the APC power control messages. The SU stops sending the MAC_ACC_REQ message and sends the RCS modem the MAC_BEARER_CFM_ACK message. The SU begins sending the null data on the AXCH. The SU waits 10 msec for the uplink transmit power level to settle.

The RCS modem, at step 2411, receives the MAC_BEARER_CFM_ACK message and stops sending the MAC_BEARER_CFM messages. APC power measurements continue.

Next, at step 2412, both the SU and the RCS modems have synchronized the sub-epochs, obey APC messages, measure receive power levels, and compute and send APC messages. The SU waits 10 msec for downlink power level to settle.

Finally, at step 2413, Bearer channel is established and initialized between the SU and RCS modems. The WAC receives the bearer establishment signal from the RCS modem, re-allocates the AXCH channel and sets the corresponding traffic light to green.

Figure 25:
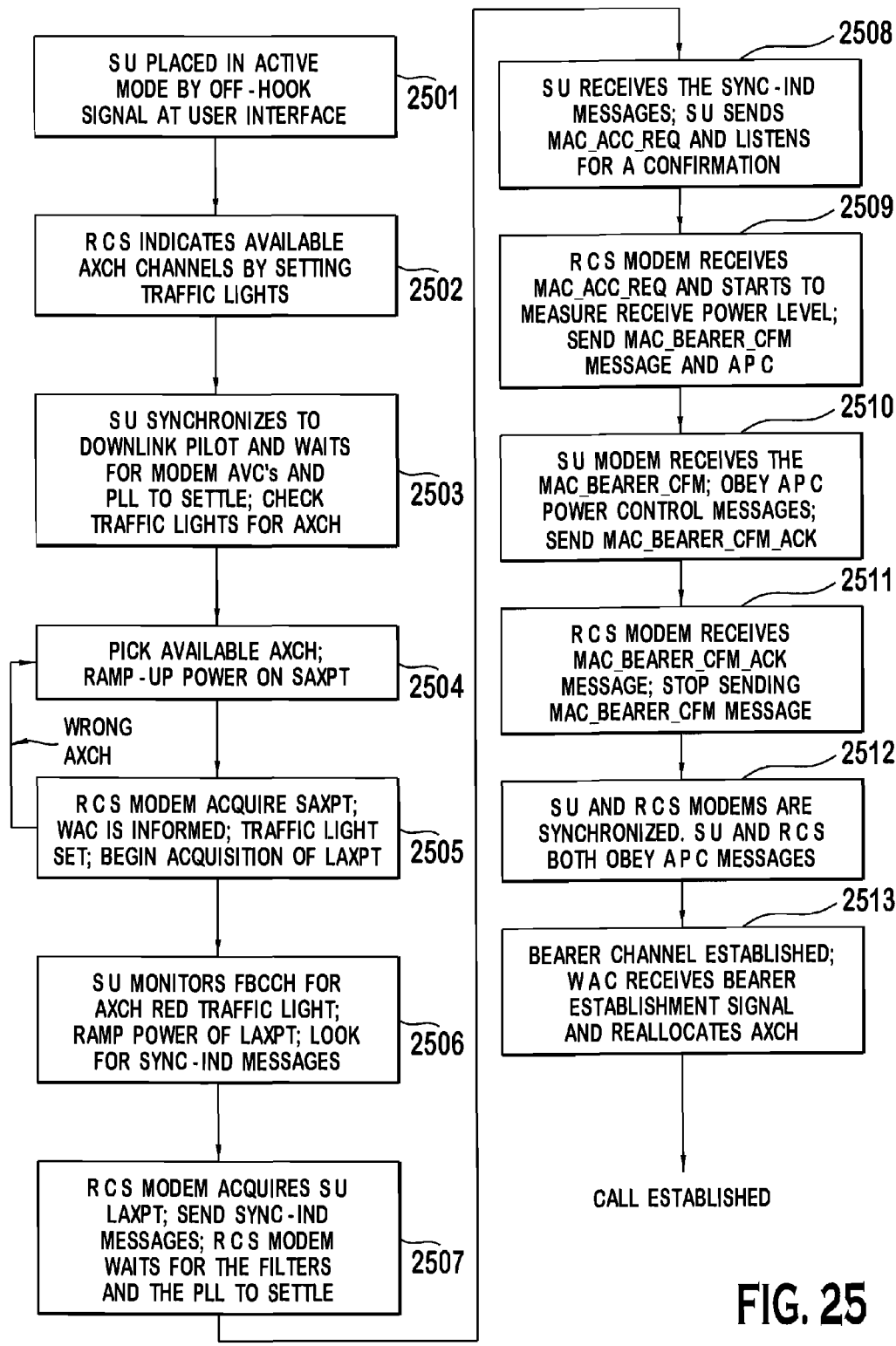
FIG. 25 is a flow-chart diagram of an exemplary call establishment algorithm for an outgoing call request used by the present invention for establishing a bearer channel between an RCS and an SU.

For the Outgoing Call Connection shown in FIG. 25, the SU is placed in active mode by the off-hook signal at the user interface at step 2501.

Next, at step 2502, the RCS indicates available AXCH channels by setting the respective traffic lights.

At step 2503, the SU synchronizes to the Downlink Pilot, waits for the SU modem Vector correlator filters and phase lock loop to settle, and the SU checks service type and traffic lights for an available AXCH.

Steps 2504 through 2513 are identical to the procedure steps 2404 through 2413 for the Incoming Call Connection procedure of FIG. 24, and so are not explained in detail.

In the previous procedures for Incoming Call Connection and Outgoing Call Connection, the power Ramping-Up process consists of the following events. The SU starts from very low transmit power and increases its power level while transmitting the short code SAXPT; once the RCS modem detects the short code it turns off the traffic light. Upon detecting the changed traffic light, the SU continues ramping-up at a slower rate this time sending the LAXPT. Once the RCS modem acquires the LAXPT and sends a message on CTCH to indicate this, the SU keeps its transmit (TX) power constant and sends the MAC-Access-Request message. This message is answered with a MAC_BEARER_CFM message on the CTCH. Once the SU receives the MAC_BEARER_CFM message it switches to the traffic channel (TRCH) which is the dial tone for POTS.

When the SU captures a specific user channel AXCH, the RCS assigns a code seed for the SU through the CTCH. The code seed is used by the spreading code generator in the SU modem to produce the assigned code for the reverse pilot of the subscriber, and the spreading codes for associated channels for traffic, call control, and signaling. The SU reverse pilot spreading code sequence is synchronized in phase to the RCS system Global Pilot spreading code sequence, and the traffic, call control, and signaling spreading codes are synchronized in phase to the SU reverse pilot spreading code sequence.

If the Subscriber unit is successful in capturing a specific user channel, the RCS establishes a terrestrial link with the remote processing unit to correspond to the specific user channel. For the DECT V5.1 standard, once the complete link from the RDU to the LE is established using the V5.1 ESTABLISHMENT message, a corresponding V5.1 ESTABLISHMENT ACK message is returned from the LE to the RDU, and the Subscriber Unit is sent a CONNECT message indicating that the transmission link is complete.

Support of Special Service Types

The system of the present invention includes a bearer channel modification feature which allows the transmission rate of the user information to be switched from a lower rate to a maximum of 64 kb/s. The Bearer Channel Modification (BCM) method is used to change a 32 kb/s ADPCM channel to a 64 kb/s PCM channel to support high speed data and fax communications through the spread-spectrum communication system of the present invention. Additional details of this technique are described in U.S. patent application entitled "CDMA COMMUNICATION SYSTEM WHICH SELECTIVELY SUPPRESSES DATA TRANSMISSIONING DURING ESTABLISHMENT OF A COMMUNICATION CHANNEL" filed on even date herewith and incorporated herein by reference.

The system of the present invention includes at least two different types of bearer modification: a first type which uses two links set-up over the RF interface and includes an asynchronous switchover in the transmit and receive directions, and a second type which uses only a single link over the RF interface and may include either a synchronous or an asynchronous switchover in the transmit and receive directions. In the following, the term "standard bearer channel" is used to refer to a bearer channel having a transmission rate normally employed (for example, 32 kb/sec or encoded channel) and the term "high rate bearer channel" is used to refer to a bearer channel which can support a higher transmission rate (for example, 64 kb/sec or decoded channel). Also, the following uses the term "terrestrial link" to indicate a transmission link between the RCS and a remote processing unit. While the term terrestrial link may commonly refer to a standard twisted pair transmission link, such as a 1.544 Mb/s T1 or 2.048 Mb/s E1, the terrestrial link contemplated for use with the exemplary embodiment of the invention is not so limited and can be of any type of transmission link, having any rate, wired or wireless.

In the first type of bearer modification, the following describes the uplink (SU to RCS) process. The standard bearer channel on the RF interface is established between the RCS and SU, and a corresponding link exists between the RCS terrestrial interface and the remote processing unit, such as an RDU. The digital transmission rate of the link between the RCS and remote processing unit normally corresponds to a data encoded rate, which may be, for example, ADPCM at 32 kb/s. The WAC controller of the RCS monitors the encoded digital data information of the link received by the Line Interface of the MUX. If the WAC controller detects the presence of a 2100 Hz tone in the digital data, the WAC first determines whether a high rate channel is available over the RF interface and, if so, instructs the SU through the assigned logical control channel to begin bearer modification. The instruction causes a high rate link to be established between the RCS modem and the SU. In addition, the WAC controller instructs the remote processing unit to establish a second link supporting the high rate link between the remote processing unit and the RCS.

Once the remote processing unit sets up the high rate link to the RCS, the RCS sends a MODIFY TRANSMIT message to the SU, which responds by transmitting the digital information on the high rate bearer channel. Consequently, for a brief period, the SU transmits digital data over both the 32 kb/s and the 64 kb/s links to the RCS at the same time.

Once the high rate bearer link is established, the SU sends a MODIFY TRANSMIT CONFIRM message to the RCS, which then sends a message to the remote processing unit to indicate the modification is complete and to switch to the high rate terrestrial link. The remote processing unit sends a message to the RCS to confirm that it switched to the high rate link, which causes the WAC controller to switch its transmission to the high rate link by removing the standard rate terrestrial link, and also causes the WAC controller to instruct the RCS modem and the SU to terminate and tear down the standard rate bearer channel (e.g. 32 kb/s link).

The downlink process for the first type of bearer modification is similar to the uplink process. The standard bearer channel on the RF interface is established between the RCS and SU, and a corresponding link exists between the RCS terrestrial interface and the remote processing unit, such as an RDU. The digital transmission rate of the link between the RCS and remote processing unit normally corresponds to a data encoded rate, which may be, for example, ADPCM at 32 kb/s. The WAC controller of the RCS monitors the encoded digital data information of the link received by the Line Interface of the MUX. If the WAC controller detects the presence of the 2100 Hz tone in the digital data, the WAC first determines whether a high rate channel is available over the RF interface and, if so, instructs the SU through the assigned logical control channel to begin bearer modification. The instruction causes a high rate bearer channel to be established between the RCS modem and the SU. In addition, the WAC controller instructs the remote processing unit to establish a second link supporting the high rate terrestrial link between the remote processing unit and the RCS.

Once the remote processing unit sets up the high rate link to the RCS, the remote processing unit sends an indication to the RCS. Consequently, for a brief period, the remote processing unit and the RCS exchange the same data over both the standard (e.g. 32 kb/s) and the high rate (e.g. 64 kb/s) terrestrial links. Then, the RCS sends a MODIFY RECEIVE message to the SU which responds to this message by beginning reception of the digital information on the high rate bearer channel.

Once the high rate bearer link is established, the SU sends a MODIFY RECEIVE CONFIRM message to the RCS, which then sends a message to the remote processing unit to indicate the modification is complete, and to tear down the standard rate terrestrial link. The remote processing unit sends a message to the RCS to confirm that it switched transmission to the high rate link, which causes the WAC controller to instruct the RCS modem and the SU to terminate and tear down the standard bearer channel.

Another embodiment of the BCM method incorporates a negotiation between the external remote processing unit, such as the RDU, and the RCS to allow for redundant channels on the terrestrial interface, while only using one bearer channel on the RF interface. The method described is a synchronous switchover from the 32 kb/s link to the 64 kb/s link over the air link which takes advantage of the fact that the spreading code sequence timing is synchronized between the RCS modem and SU. In addition, the method uses the advantage of a transcoder within the transmit or receive direction of the RCS modem to convert the digital data from the standard to the high rate while passing through the RCS.

The uplink process is described first. When the WAC controller detects the presence of the 2100 Hz tone in the digital data received from the SU, and determines that a high rate bearer channel over the RF interface is available, a transcoder in the RCS modem receives and transcodes the standard rate digital data signal from the SU into a high rate digital data signal for transmission to the remote processing unit. Then, the WAC controller instructs the remote processing unit to establish a high rate terrestrial link duplex link between the remote processing unit and the RCS and begin receiving the decoded high rate digital data signal. The remote processing unit does not receive data on both terrestrial links concurrently. Instead, once the remote processing unit begins receiving the digital data signal on the high rate link, the RCS is informed of the switch. The, the standard bearer channel on the RF interface is modified to be a high rate bearer channel by a MODIFY TRANSMIT and concurrently the transcoder is removed from the transmission path.

Thus, the RCS also informs the SU that the standard bearer channel is being torn down and to switch processing to transmit unencoded 64 kb/s data on the channel. The SU and RCS exchange control messages over the bearer control channel of the assigned channel group to identify and determine the particular subepoch of the bearer channel spreading code sequence within which the SU will begin transmitting unencoded high rate data to the RCS. Once the subepoch is identified, the switch occurs synchronously at the identified subepoch boundary. This synchronous switchover method is more economical of bandwidth in the RF interface since the system does not need to maintain the additional bearer capacity for a 64 kb/s link in order to support a switchover.

Next, the downlink process is described. The WAC controller detects the presence of the 2100 Hz tone in the digital data received from the remote processing unit, and determines that a high rate bearer channel over the RF interface is available, a transcoder in the RCS modem is assigned to a high rate link from the remote processing unit. The transcoder transcodes the high rate digital data signal to be received from the remote processing unit into a standard rate digital data signal for transmission to SU. Then, the WAC controller instructs the remote processing unit to establish a high rate terrestrial link duplex link between the remote processing unit and the RCS and begin transmitting the high rate data on the high rate link. The RCS receives digital data on both terrestrial links concurrently. Once the remote processing unit indicates to the RCS it is transmitting digital data on the high rate link, the RCS modifies the standard bearer channel on the RF interface to be a high rate bearer channel by a MODIFY RECEIVE and concurrently the transcoder is removed from the transmission path.

Thus, the RCS also informs the SU that the standard bearer channel is being torn down and to switch processing to transmit unencoded high rate digital data on the channel. The SU and RCS exchange control messages over the bearer control channel of the assigned channel group to identify and determine the particular subepoch of the bearer channel spreading code sequence within which the RCS will begin transmitting unencoded high rate data to the SU. Once the subepoch is identified, the switch occurs synchronously at the identified subepoch boundary.

A further exemplary embodiment of the present invention including this second type of bearer modification may switch both the uplink and downlink directions together and synchronously. In these embodiment, the previously described uplink and downlink transmission path processes are superimposed. The switchover process may use, however, two different versions of message sequences to accomplish the synchronous switching.

In the first version, after the RCS has detected the 2100 Hz tone, the RCS transmits on both a standard rate terrestrial link and a high rate terestrial link to the remote processing unit, and assigns a transcoder to decode the digital data signal received from the SU for transmission on the high rate terrestrial link in the uplink path. The RCS also prepares to receive a high rate terrestrial link from the remote processing unit by assigning a second transcoder to encode digital data from the remote processing unit and by creating a high rate terrestrial link in the downlink path. Then, the RCS sends a message to the remote processing unit to begin transmission in the downlink path in both the standard and high rate terrestrial links, and to switch reception from the standard rate terrestrial link to the high rate terrestrial link in the uplink path.

The remote processing unit sends a message to the RCS to confirm that the modification has been accomplished, and the RCS then activates the transcoder in the downlink path to encode the digital data signal for transmission on the RF interface to the SU on a standard rate bearer channel. Once this is accomplished, the RCS and SU negotiate a time to switch uplink and downlink paths synchronously. At the decided time, the standard rate bearer channels in the uplink and downlink paths are modified to be high rate bearer channels, and the standard rate terrestrial links are torn down.

In the second version, the SU and RCS negotiate a time to synchronously modify the standard rate bearer to a high rate bearer, and perform the modification in both the uplink and downlink paths, concurrently with the RCS message to remote processing unit to start receiving in the uplink in the high rate terrestrial link and to start transmitting on both the standard rate and high rate terrestrial links in the downlink. Once the remote processing unit gives confirmation of this message, the RCS and remote processing unit tear down the standard rate terrestrial links in both uplink and downlink paths.

As another special service type, the system of the present invention includes a method for conserving capacity over the RF interface for ISDN types of traffic. This conservation occurs while a known idle bit pattern is transmitted in the ISDN D-channel when no data information is being transmitted. The CDMA system of the present invention includes a method to prevent transmission of redundant information carried on the D-channel of ISDN networks for signals transmitted through a wireless communication link. The advantage of such method is that it reduces the amount of information transmitted and consequently the transmit power and channel capacity used by that information. The method is described as it is used in the RCS. In the first step, the controller, such as the WAC of the RCS or the SU controller of the SU, monitors the output D-channel from the subscriber line interface for a pre-determined channel idle pattern. A delay is included between the output of the line interface and the CDMA modem. Once the idle pattern is detected, the controller inhibits the transmission of the spread message channel through a message included in the control signal to the CDMA modem. The controller continues to monitor the output D-channel of the line interface until the presence of data information is detected. When data information is detected, the spread message channel is activated. Because the message channel is synchronized to the associated pilot which is not inhibited, the corresponding CDMA modem of the other end of the communication link does not have to reacquire synchronization to the message channel.

Drop Out Recovery

The RCS and SU each monitor the CDMA bearer channel signal to evaluate the quality of the CDMA bearer channel connection. Link quality is evaluated using the sequential probability ratio test (SPRT) employing adaptive quantile estimation. The SPRT process uses measurements of the received signal power; and if the SPRT process detects that the local spreading code generator has lost synchronization with the received signal spreading code or if it detects the absence or low level of a received signal, the SPRT declares loss of lock (LOL).

When the LOL condition is declared, the receiver modem of each RCS and SU begins a Z-search of the input signal with the local spreading code generator. Z-search is well known in the art of CDMA spreading code acquisition and detection and is described in *Digital Communications and Spread Spectrum Systems*, by Robert E. Ziemer and Roger L. Peterson, at pages 492-94 which is incorporated herein by reference. The Z-search algorithm of the present invention tests groups of eight spreading code phases ahead and behind the last known phase in larger and larger spreading code phase increments.

During the LOL condition detected by the RCS, the RCS continues to transmit to the SU on the Assigned Channels, and continues to transmit power control signals to the SU to maintain SU transmit power level. The method of transmitting power control signals is described below. Successful reacquisition desirably takes place within a specified period of time. If reacquisition is successful, the call connection continues, otherwise the RCS tears down the call connection by deactivating and deallocating the RCS modem assigned by the WAC, and transmits a call termination signal to a remote call processor, such as the RDU, as described previously.

When the LOL condition is detected by the SU, the SU stops transmission to the RCS on the Assigned Channels which forces the RCS into a LOL condition, and starts the reacquisition algorithm. If reacquisition is successful, the call connection continues, and if not successful, the RCS tears down the call connection by deactivating and deallocating the SU modem as described previously.

Power Control

General

The power control feature of the present invention is used to minimize the amount of transmit power used by an RCS and the SUs of the system, and the power control subfeature that updates transmit power during bearer channel connection is defined as automatic power control (APC). APC data is transferred from the RCS to an SU on the forward APC channel and from an SU to the RCS on the reverse APC channel. When there is no active data link between the two, the maintenance power control (MPC) subfeature updates the SU transmit power.

Transmit power levels of forward and reverse assigned channels and reverse global channels are controlled by the APC algorithm to maintain sufficient signal power to interference noise power ratio (SIR) on those channels, and to stabilize and minimize system output power. The present invention uses a closed loop power control mechanism in which a receiver decides that the transmitter should incrementally raise or lower its transmit power. This decision is conveyed back to the respective transmitter via the power control signal on the APC channel. The receiver makes the decision to increase or decrease the transmitter's power based on two error signals. One error signal is an indication of the difference between the measured and desired despread signal powers, and the other error signal is an indication of the average received total power.

As used in the described embodiment of the invention, the term near-end power control is used to refer to adjusting the transmitter's output power in accordance with the APC signal received on the APC channel from the other end. This means the reverse power control for the SU and forward power control for the RCS; and the term far-end APC is used to refer to forward power control for the SU and reverse power control for the RCS (adjusting the opposite end's transmit power).

In order to conserve power, the SU modem terminates transmission and powers-down while waiting for a call, defined as the sleep phase. Sleep phase is terminated by an awaken signal from the SU controller. The SU modem acquisition circuit automatically enters the reacquisition phase, and begins the process of acquiring the downlink pilot, as described previously.

Closed Loop Power Control Algorithms

The near-end power control consists of two steps: first, the initial transmit power is set; and second, the transmit power is continually adjusted according to information received from the far-end using APC.

For the SU, initial transmit power is set to a minimum value and then ramped up, for example, at a rate of 1 dB/ms until either a ramp-up timer expires (not shown) or the RCS changes the corresponding traffic light value on the FBCH to "red" indicating that the RCS has locked to the SU's short pilot SAXPT. Expiration of the timer causes the SAXPT transmission to be shut down, unless the traffic light value is set to red first, in which case the SU continues to ramp-up transmit power but at a much lower rate than before the "red" signal was detected.

For the RCS, initial transmit power is set at a fixed value, corresponding to the minimum value necessary for reliable operation as determined experimentally for the service type and the current number of system users. Global channels, such as Global Pilot or, FBCH, are always transmitted at the fixed initial power, whereas traffic channels are switched to APC.

The APC bits are transmitted as one bit up or down signals on the APC channel. In the described embodiment, the 64 kb/s APC data stream is not encoded or interleaved.

Far-end power control consists of the near-end transmitting power control information for the far-end to use in adjusting its transmit power.

The APC algorithm causes the RCS or the SU to transmit +1 if the following inequality holds, otherwise −1.

$$\alpha_1 e_1 - \alpha_2 e_2 > 0 \qquad \text{Equation 45}$$

Here, the error signal $e_1$ is calculated as $$e_1 = P_d - (1 + SNR_{REQ}) P_N \qquad \text{Equation 46}$$

where $P_d$ is the despread signal plus noise power, $P_N$ is the despread noise power, and $SNR_{REQ}$ is the desired despread signal to noise ratio for the particular service type; and $$e_2 = P_r - P_o \qquad \text{Equation 47}$$

where Pr is a measure of the received power and Po is the automatic gain control (AGC) circuit set point. The weights $\alpha_1$ and $\alpha_2$ in equation (33) are chosen for each service type and APC update rate.

Maintenance Power Control

During the sleep phase of the SU, the interference noise power of the CDMA RF channel may change. The present invention includes a maintenance power control feature (MPC) which periodically adjusts the SU's initial transmit power with respect to the interference noise power of the CDMA channel. The MPC is the process whereby the transmit power level of an SU is maintained within close proximity of the minimum level for the RCS to detect the SU's signal. The MPC process compensates for low frequency changes in the required SU transmit power.

The maintenance control feature uses two global channels: one is called the status channel (STCH) on reverse link, and the other is called the check-up channel (CUCH) on forward link. The signals transmitted on these channels carry no data and they are generated the same way the short codes used in initial power ramp-up are generated. The STCH and CUCH codes are generated from a "reserved" branch of the global code generator.

The MPC process is as follows. At random intervals, the SU sends a symbol length spreading code periodically for 3 ms on the status channel (STCH). If the RCS detects the sequence, it replies by sending a symbol length code sequence within the next 3 ms on the check-up channel (CUCH). When the SU detects the response from the RCS, it reduces its transmit power by a particular step size. If the SU does not see any response from the RCS within that 3 ms period, it increases its transmit power by the step size. Using this method, the RCS response is transmitted at a power level that is enough to maintain a 0.99 detection probability at all SU's.

The rate of change of traffic load and the number of active users is related to the total interference noise power of the CDMA channel. The update rate and step size of the maintenance power update signal for the present invention is determined by using queuing theory methods well known in the art of communication theory, such as outlined in "*Fundamentals of Digital Switching*" (Plenum—New York) edited by McDonald and incorporated herein by reference. By modeling the call origination process as an exponential random variable with mean 6.0 mins, numerical computation shows the maintenance power level of a SU should be updated once every 10 seconds or less to be able to follow the changes in interference level using 0.5 dB step size. Modeling the call origination process as a Poisson random variable with exponential interarrival times, arrival rate of $2 \times 10^{-4}$ per second per user, service rate of $1/360$ per second, and the total subscriber population is 600 in the RCS service area also yields by numerical computation that an update rate of once every 10 seconds is sufficient when 0.5 dB step size is used.

Figure 26:
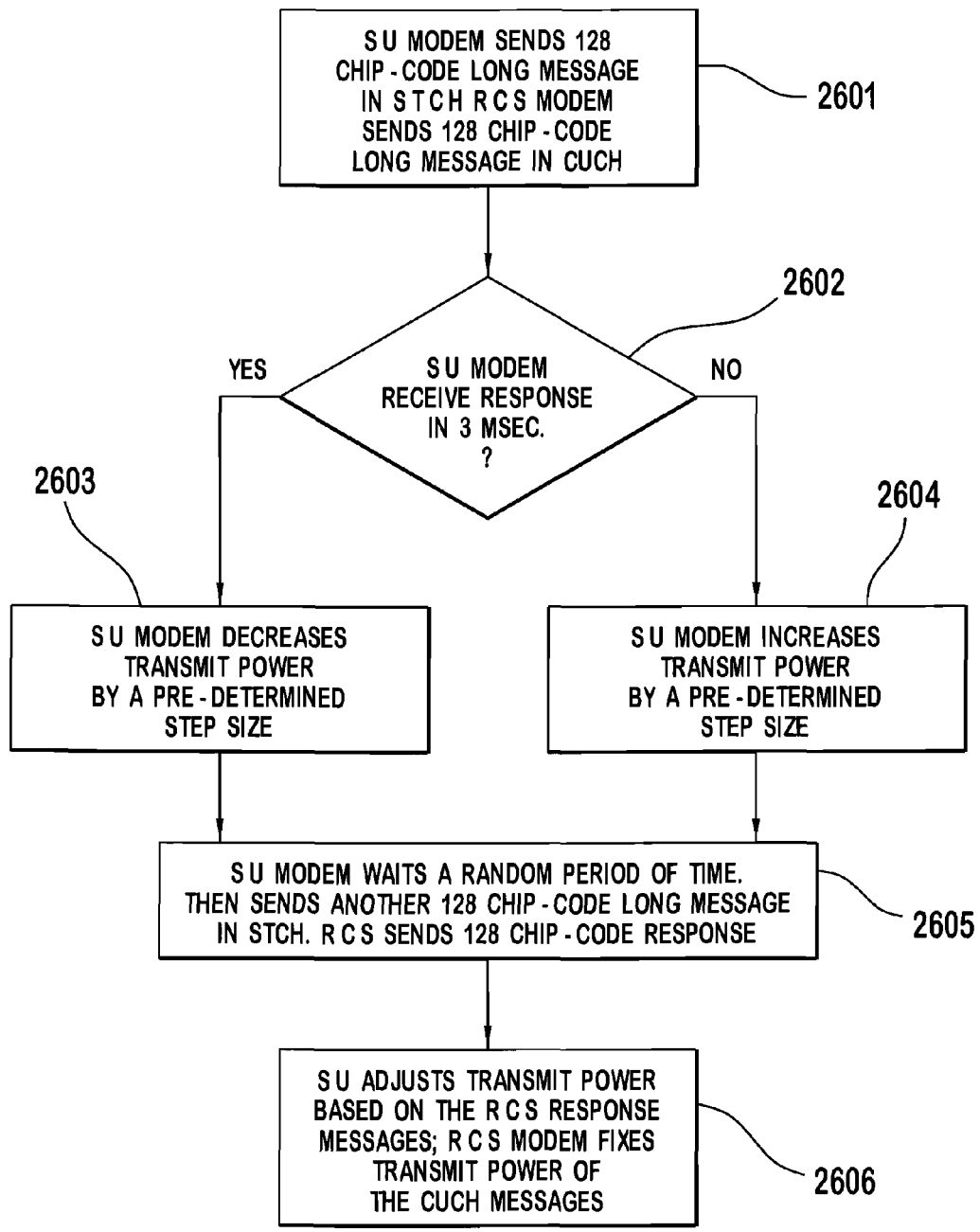
FIG. 26 is a flow-chart diagram of an exemplary maintenance power control algorithm of the present invention.

Maintenance power adjustment is performed periodically by the SU which changes from sleep phase to awake phase and performs the MPC process. Consequently, the process for the MPC feature is shown in FIG. 26 and is as follows: First, at step 2601, signals are exchanged between the SU and the RCS maintaining a transmit power level that is close to the required level for detection: the SU periodically sends a symbol length spreading code in the STCH, and the RCS periodically sends a symbol length spreading code in the CUCH as response.

Next, at step 2602, if the SU receives a response within 3 ms after the STCH message it sent, it decreases its transmit power by a particular step size at step 2603; but if the SU does not receive a response within 3 ms after the STCH message, it increases its transmit power by the same step size at step 2604.

The SU waits, at step 2605, for a period of time before sending another STCH message, this time period is determined by a random process which averages 10 seconds.

Thus, the transmit power of the STCH messages from the SU is adjusted based on the RCS response periodically, and the transmit power of the CUCH messages from the RCS is fixed.

In an alternative embodiment of the present invention, a slightly different method of maintenance power control is performed in which the base station actually calculates the power of the received message signal from a SU and transmits a message to the SU for power adjustment. This process is similar to the transmit power initialization process prior to call establishment, as described previously.

The SU awakes from the sleep phase and initially transmits a message to the base station. The initial transmit power is set to a minimum value and then ramped up, for example, at a rate of 1 dB/ms until either a ramp-up timer (not shown) expires or the RCS changes the corresponding traffic light value on the FBCH to "red" indicating that the RCS has locked to the SU's short pilot SAXPT. Expiration of the timer causes the SAXPT transmission to be shut down, unless the traffic light value is set to red first, in which case the SU continues to ramp-up transmit power but at a much lower rate than before the "red" signal was detected.

For the RCS, initial transmit power is set at a fixed value, corresponding to the minimum value necessary for reliable operation as determined experimentally for the service type and the current number of system users. Global channels, such as Global Pilot or, FBCH, are always transmitted at the fixed initial power, whereas traffic channels are switched to APC.

If the RCS detects the message sent by the SU, the RCS measures the received power and signal to noise ratio of the received signal and determines whether the signal power should be increased (unacceptable bit error rate) or decreased (excessive initial transmit power). The RCS may then communicate the required adjustment to the SU in one of two methods.

In the first method, a measured value is determined, which may be an error value and may include information of total received noise power at the base station, and this value is communicated to the SU through a message channel. For this method, the SU then adjusts its transmit power and returns to the sleep phase.

In the second method, the RCS again determines a measured value, but instead uses this value to transmit APC data on the APC channel to the SU. The APC bits are transmitted as one bit up or down signals (+1 or −1) on the APC channel to increase or decrease the SU transmit power. The SU then responds to the APC data, which is a string of +1's or a string of −1's, until the RCS measures an acceptable initial transmit power level. Then the RCS modifies the APC data to be an alternating string of +1's and −1's, which indicates the SU must keep the transmit power near a constant level, which becomes the initial transmit level. At this point, the SU may then return to the sleep phase.

Mapping of Power Control Signal to Logical Channels For APC

Power control signals are mapped to specified Logical Channels for controlling transmit power levels of forward and reverse assigned channels. Reverse global channels are also controlled by the APC algorithm to maintain sufficient signal power to interference noise power ratio (SIR) on those reverse channels, and to stabilize and minimize system output power. The present invention uses a closed loop power control method in which a receiver periodically decides to incrementally raise or lower the output power of the transmitter at the other end. The method also conveys that decision back to the respective transmitter.

TABLE 13

APC Signal Channel Assignments

| Link Channels and Signals | Call/Connection Status | Power Control Method | |
|---|---|---|---|
| | | Initial Value | Continuous |
| Reverse link AXCH AXPT | Being Established | as determined by power ramping | APC bits in forward APC channel |
| Reverse link APC, OW, TRCH, pilot signal | In-Progress | level established during call set-up | APC bits in forward APC channel |
| Forward link APC, OW, TRCH | In-Progress | fixed value | APC bits in reverse APC channel |

Forward and reverse links are independently controlled. For a call/connection in process, forward link (TRCHs APC, and OW) power is controlled by the APC bits transmitted on the reverse APC channel. During the call/connection establishment process, reverse link (AXCH) power is also controlled by the APC bits transmitted on the forward APC channel. Table 13 summarizes the specific power control methods for the controlled channels.

The required SIRs of the assigned channels TRCH, APC and OW and reverse assigned pilot signal for any particular SU are fixed in proportion to each other and these channels are subject to nearly identical fading, therefore, they are power controlled together.

Adaptive Forward Power Control

Figure 27:
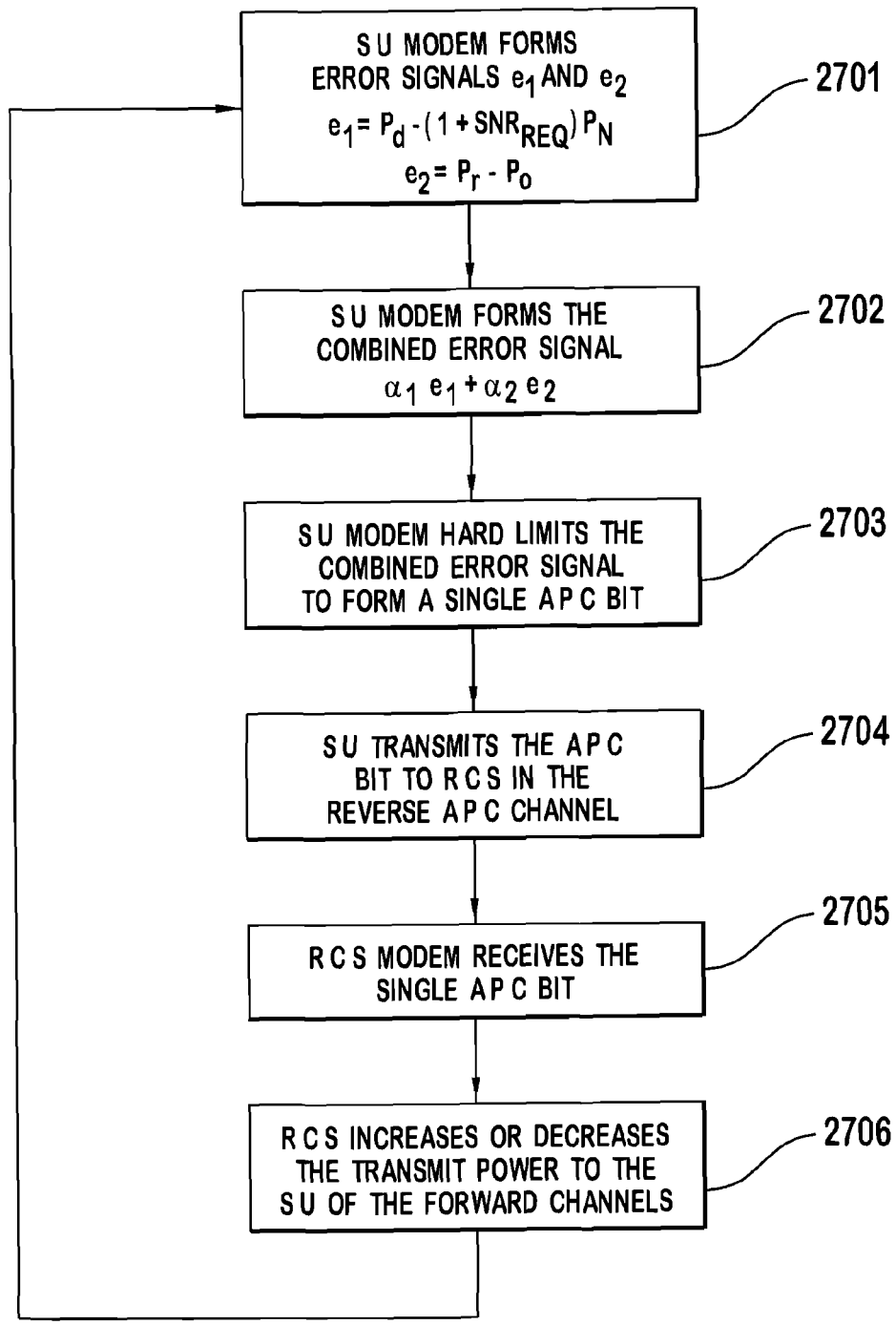
FIG. 27 is a flow-chart diagram of an exemplary automatic forward power control algorithm of the present invention.

The AFPC process attempts to maintain the minimum required SIR on the forward channels during a call/connection. The AFPC recursive process, shown in FIG. 27, consists of the steps of having an SU form the two error signals $e_1$ and $e_2$ in step 2701 where $$e_1 = P_d - (1 + SNR_{REQ})P_N \quad \text{Equation 36}$$

$$e_2 = P_r - P_o \quad \text{Equation 37}$$

and $P_d$ is the despread signal plus noise power, $P_N$ is the despread noise power, $SNR_{REQ}$ is the required signal to noise ratio for the service type, $P_r$ is a measure of the total received power, and $P_o$ is the AGC set point. Next, the SU modem forms the combined error signal $\alpha_1 e_1 + \alpha_2 e_2$ in step 2702. Here, the weights $a_1$ and $a_2$ are chosen for each service type and APC update rate. In step 2703, the SU hard limits the combined error signal and forms a single APC bit. The SU transmits the APC bit to the RCS in step 2704 and RCS modem receives the bit in step 2705. The RCS increases or decreases its transmit power to the SU in step 2706 and the algorithm repeats starting from step 2701.

For the exemplary embodiment, the inventors have determined that the value for the noise power $P_N$ may be sampled and averaged over at least one data symbol, and for greater accuracy may be sampled and averaged over several symbols. In addition, the inventor's have determined that the calculation of the error in equation 36 may have a bias making it desirable to adjust the value $P_N$ by a constant value.

Adaptive Reverse Power Control

Figure 28:
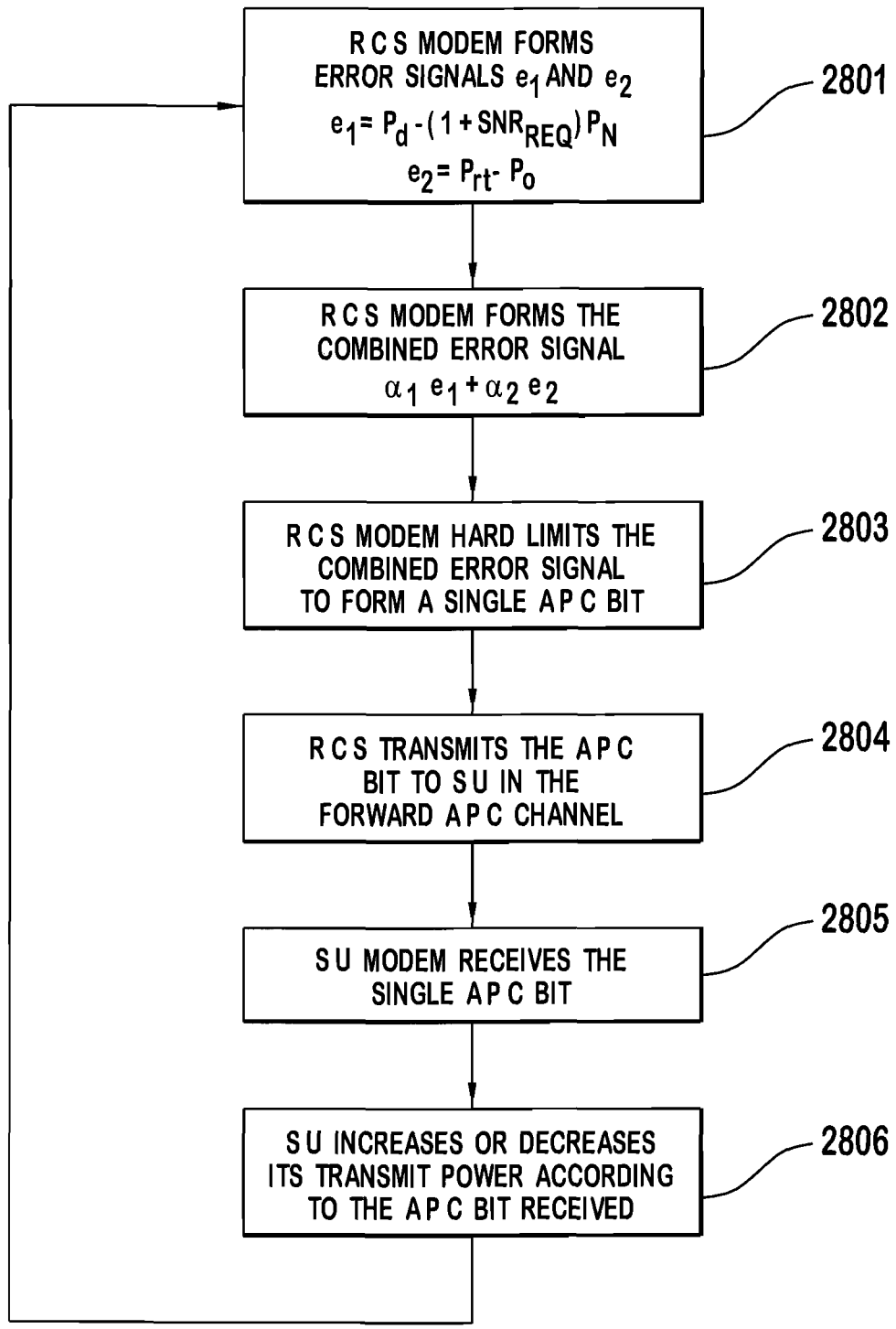
FIG. 28 is a flow-chart diagram of an exemplary automatic reverse power control algorithm of the present invention.

The ARPC process maintains the minimum desired SIR on the reverse channels to minimize the total system reverse output power, during both call/connection establishment and while the call/connection is in progress. The recursive ARPC process, shown in FIG. 28, begins at step 2801 where the RCS modem forms the two error signals $e_1$ and $e_2$ in step 2801 where $$e_1 = P_d - (1 + SNR_{REQ})P_N \quad \text{Equation 38}$$

$$e_2 = P_{rt} - P_o \quad \text{Equation 39}$$

and $P_d$ is the despread signal plus noise power, $P_N$ is the despread noise power, $SNR_{REQ}$ is the desired signal to noise ratio for the service type, $P_{rt}$ is a measure of the average total power received by the RCS, and $P_o$ is the AGC set point. The RCS modem forms the combined error signal $\alpha_1 e_1 + \alpha_2 e_2$ in step 2802 and hard limits this error signal to determine a single APC bit in step 2803. The RCS transmits the APC bit to the SU in step 2804, and the bit is received by the SU in step 2805. Finally, the SU adjusts its transmit power according to the received APC bit in step 2806, and the algorithm repeats starting from step 2801.

For the exemplary embodiment, the inventors have determined that the value for the noise power $P_N$ may be sampled and averaged over at least one data symbol, and for greater accuracy may be sampled and averaged over several symbols. In addition, the inventor's have determined that the calculation of the error in equation 38 may have a bias making it desirable to adjust the value $P_N$ by a constant value.

TABLE 14

Symbols/Thresholds Used for APC Computation

| Service or Call Type | Call/Connection Status | Symbol (and Threshold) Used for APC Decision |
|---|---|---|
| Don't care | Being Established | AXCH |
| ISDN D SU | In-Progress | one 1/64-kb/s symbol from TRCH (ISDN-D) |
| ISDN 1B + D SU | In-Progress | TRCH (ISDN-B) |
| ISDN 2B + D SU | In-Progress | TRCH (one ISDN-B) |
| POTS SU (64 KBPS PCM) | In-Progress | one 1/64-KBPS symbol from TRCH, use 64 KBPS PCM threshold |
| POTS SU (32 KBPS ADPCM) | In-Progress | one 1/64-KBPS symbol from TRCH, use 32 KBPS ADPCM threshold |
| Silent Maintenance Call (any SU) | In-Progress | OW (continuous during a maintenance call) |

SIR and Multiple Channel Types

The required SIR for channels on a link is a function of channel format (e.g. TRCH, OW), service type (e.g. ISDN B, 32 KBPS ADPCM POTS), and the number of symbols over which data bits are distributed (e.g. two 64 kb/s symbols are integrated to form a single 32 kb/s ADPCM POTS symbol). Despreader output power corresponding to the required SIR for each channel and service type is predetermined. While a call/connection is in progress, several user CDMA logical channels are concurrently active; each of these channels transfers a symbol every symbol period. The SIR of the symbol from the nominally highest SIR channel is measured, compared to a threshold and used to determine the APC step up/down decision each symbol period. Table 14 indicates the symbol (and threshold) used for the APC computation by service and call type.

APC Parameters

APC information is always conveyed as a single bit of information, and the APC Data Rate is equivalent to the APC Update Rate. The APC update rate is 64 kb/s. This rate is high enough to accommodate expected Rayleigh and Doppler fades, and allow for a relatively high (~0.2) Bit Error Rate (BER) in the Uplink and Downlink APC channels, which minimizes capacity devoted to the APC.

The power step up/down indicated by an APC bit is nominally between 0.1 and 0.01 dB. The dynamic range for power control is 70 dB on the reverse link and 12 dB on the forward link for the exemplary embodiment of the present system.

An Alternative Embodiment of Multiplexing of APC Information

The dedicated APC and OW logical channels described previously can also be multiplexed together in one logical channel. The APC information is transmitted at 64 kb/s. continuously whereas the OW information occurs in data bursts. The alternative multiplexed logical channel includes the unencoded, non-interleaved 64 kb/s. APC information on, for example, the In-phase channel and the OW information on the Quadrature channel of the QPSK signal.

Closed Loop Power Control Implementation

The closed loop power control during a call connection responds to two different variations in overall system power. First, the system responds to local behavior such as changes in power level of an SU, and second, the system responds to changes in the power level of the entire group of active users in the system.

Figure 29A:
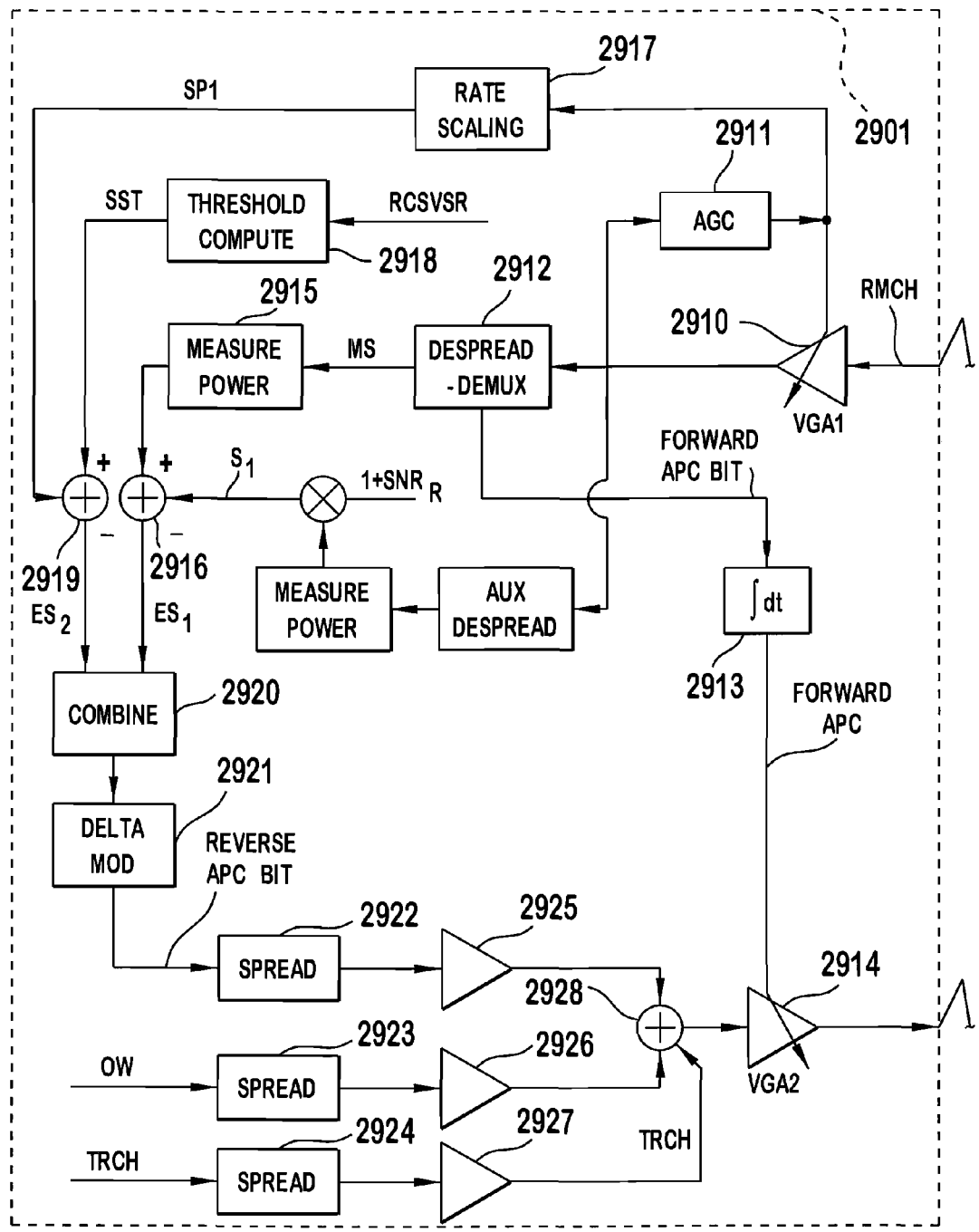
FIG. 29 is a block diagram of an exemplary closed loop power control system of the present invention when the bearer channel is established.
Figure 29B:
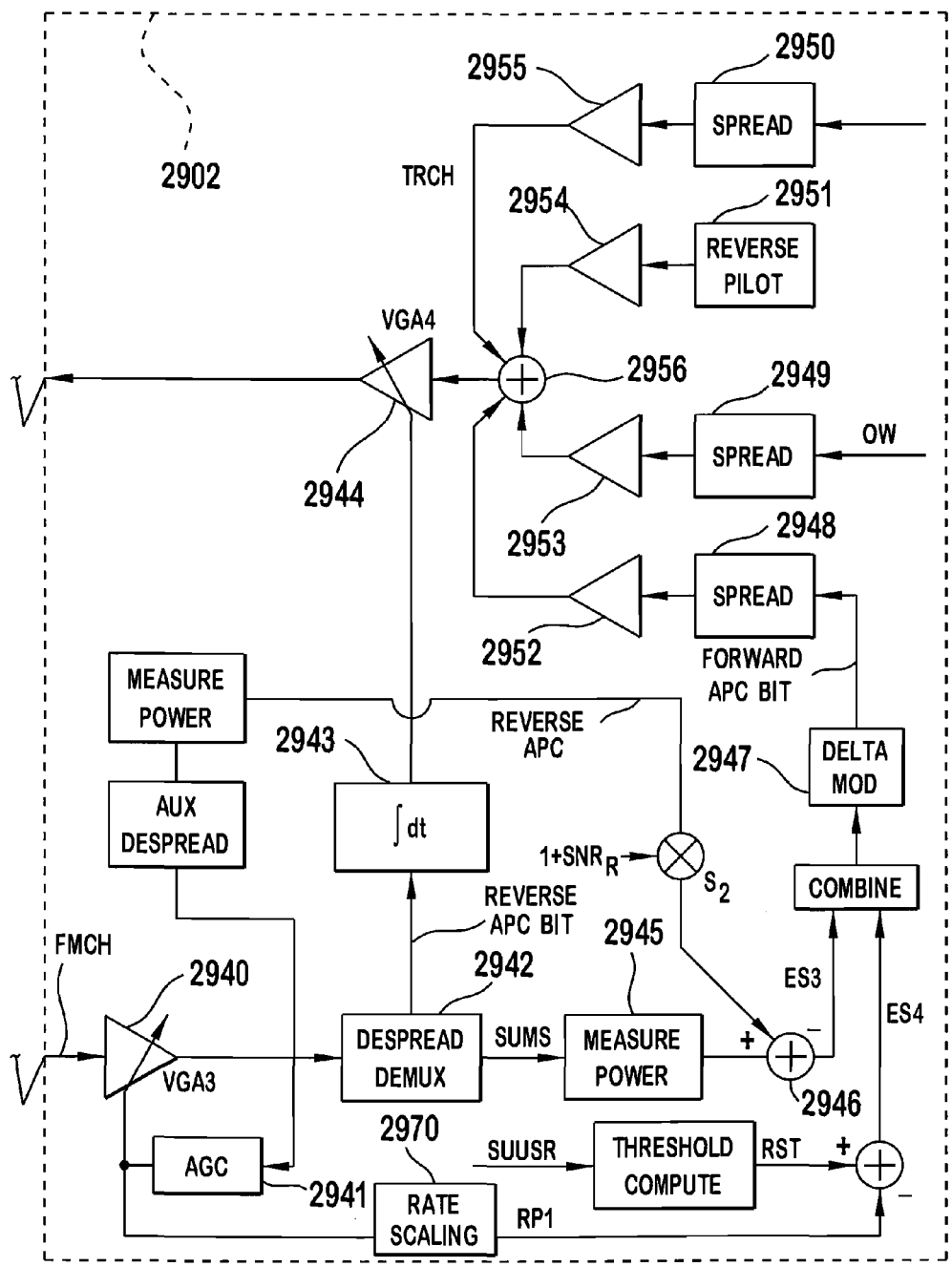

The Power Control system of the exemplary embodiment of the present invention is shown in FIG. 29. As shown, the circuitry used to adjust the transmitted power is similar for the RCS (shown as the RCS power control module 2901) and SU (shown as the SU power control module 2902). Beginning with the RCS power control module 2901, the reverse link RF channel signal is received at the RF antenna and demodulated to produce the reverse CDMA signal RMCH. The signal RMCH is applied to the variable gain amplifier (VGA1) 2910 which produces an input signal to the Automatic Gain Control (AGC) Circuit 2911. The AGC 2911 produces a variable gain amplifier control signal into the VGA1 2910. This signal maintains the level of the output signal of VGA1 2910 at a near constant value. The output signal of VGA1 is despread by the despread-demultiplexer (demux) 2912, which produces a despread user message signal MS and a forward APC bit. The forward APC bit is applied to the integrator 2913 to produce the Forward APC control signal. The Forward APC control signal controls the Forward Link VGA2 2914 and maintains the Forward Link RF channel signal at a minimum desired level for communication.

The signal power of the despread user message signal MS of the RCS power module 2901 is measured by the power measurement circuit 2915 to produce a signal power indication. The output of the VGA1 is also despread by the AUX despreader which despreads the signal by using an uncorrelated spreading code, and hence obtains a despread noise signal. The power measurement of this signal is multiplied by 1 plus the desired signal to noise ratio ($SNR_R$) to form the threshold signal S1. The difference between the despread signal power and the threshold value S1 is produced by the subtractor 2916. This difference is the error signal ES1, which is an error signal relating to the particular SU transmit power level. Similarly, the control signal for the VGA1 2910 is applied to the rate scaling circuit 2917 to reduce the rate of the control signal for VGA1 2910. The output signal of scaling circuit 2917 is a scaled system power level signal SP1. The Threshold Compute logic 2918 calculates the System Signal Threshold value SST from the RCS user channel power data signal RCSUSR. The complement of the Scaled system power level signal, SP1, and the System Signal Power Threshold value SST are applied to the adder 2919 which produces second error signal ES2. This error signal is related to the system transmit power level of all active SUs. The input Error signals ES1 and ES2 are combined in the combiner 2920 produce a combined error signal input to the delta modulator (DM1) 2921, and the output signal of the DM1 is the reverse APC bit stream signal, having bits of value +1 or −1, which for the present invention is transmitted as a 64 kb/sec signal.

The Reverse APC bit is applied to the spreading circuit 2922, and the output signal of the spreading circuit 2922 is the spread-spectrum forward APC message signal. Forward OW and Traffic signals are also provided to spreading circuits 2923, 2924, producing forward traffic message signals 1, 2, . . . N. The power level of the forward APC signal, the forward OW, and traffic message signals are adjusted by the respective amplifiers 2925, 2926 and 2927 to produce the power level adjusted forward APC, OW, and TRCH channels signals. These signals are combined by the adder 2928 and applied to the VAG2 2914, which produces forward link RF channel signal.

The forward link RF channel signal including the spread forward APC signal is received by the RF antenna of the SU, and demodulated to produce the forward CDMA signal FMCH. This signal is provided to the variable gain amplifier (VGA3) 2940. The output signal of VGA3 is applied to the Automatic Gain Control Circuit (AGC) 2941 which produces a variable gain amplifier control signal to VGA3 2940. This signal maintains the level of the output signal of VGA3 at a near constant level. The output signal of VAG3 2940 is despread by the despread demux 2942, which produces a despread user message signal SUMS and a reverse APC bit. The reverse APC bit is applied to the integrator 2943 which produces the Reverse APC control signal. This reverse APC control signal is provided to the Reverse APC VGA4 2944 to maintain the Reverse link RF channel signal at a minimum power level.

The despread user message signal SUMS is also applied to the power measurement circuit 2945 producing a power measurement signal, which is added to the complement of threshold value S2 in the adder 2946 to produce error signal ES3. The signal ES3 is an error signal relating to the RCS transmit power level for the particular SU. To obtain threshold S2, the despread noise power indication from the AUX despreader is multiplied by 1 plus the desired signal to noise ratio $SNR_R$. The AUX despreader despreads the input data using an uncorrelated spreading code, hence its output is an indication of the despread noise power.

Similarly, the control signal for the VGA3 is applied to the rate scaling circuit to reduce the rate of the control signal for VGA3 in order to produce a scaled received power level RP1 (see FIG. 29). The threshold compute circuit computes the received signal threshold RST from the SU measured power signal SUUSR. The complement of the scaled received power level RP1 and the received signal threshold RST are applied to the adder which produces error signal ES4. This error is related to the RCS transmit power to all other SUs. The input error signals ES3 and ES4 are combined in the combiner and input to the delta modulator DM2 2947. The output signal of DM2 2947 is the forward APC bit stream signal, with bits having value of value +1 or −1. In the exemplary embodiment of the present invention, this signal is transmitted as a 64 kb/sec signal.

The Forward APC bit stream signal is applied to the spreading circuit 2948, to produce the output reverse spread-spectrum APC signal. Reverse OW and Traffic signals are also input to spreading circuits 2949, 2950, producing reverse OW and traffic message signals 1, 2, ... N, and the reverse pilot is generated by the reverse pilot generator 2951. The power level of the reverse APC message signal, reverse OW message signal, reverse pilot, and the reverse traffic message signals are adjusted by amplifiers 2952, 2953, 2954, 2955 to produce the signals which are combined by the adder 2956 and input to the reverse APC VGA4 2944. It is this VGA4 2944 which produces the reverse link RF channel signal.

Figure 30A:
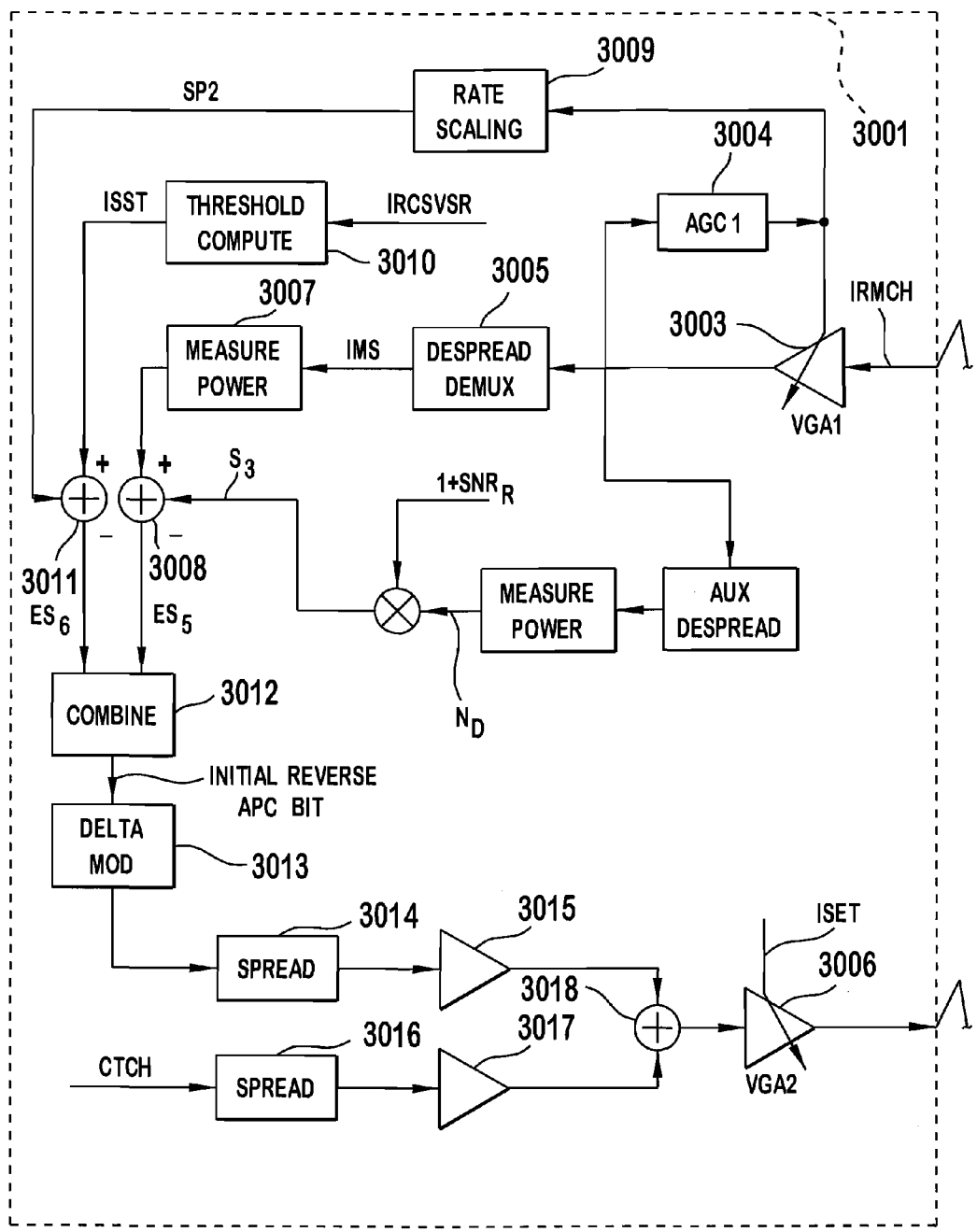
FIG. 30 is a block diagram of an exemplary closed loop power control system of the present invention during the process of establishing the bearer channel.
Figure 30B:
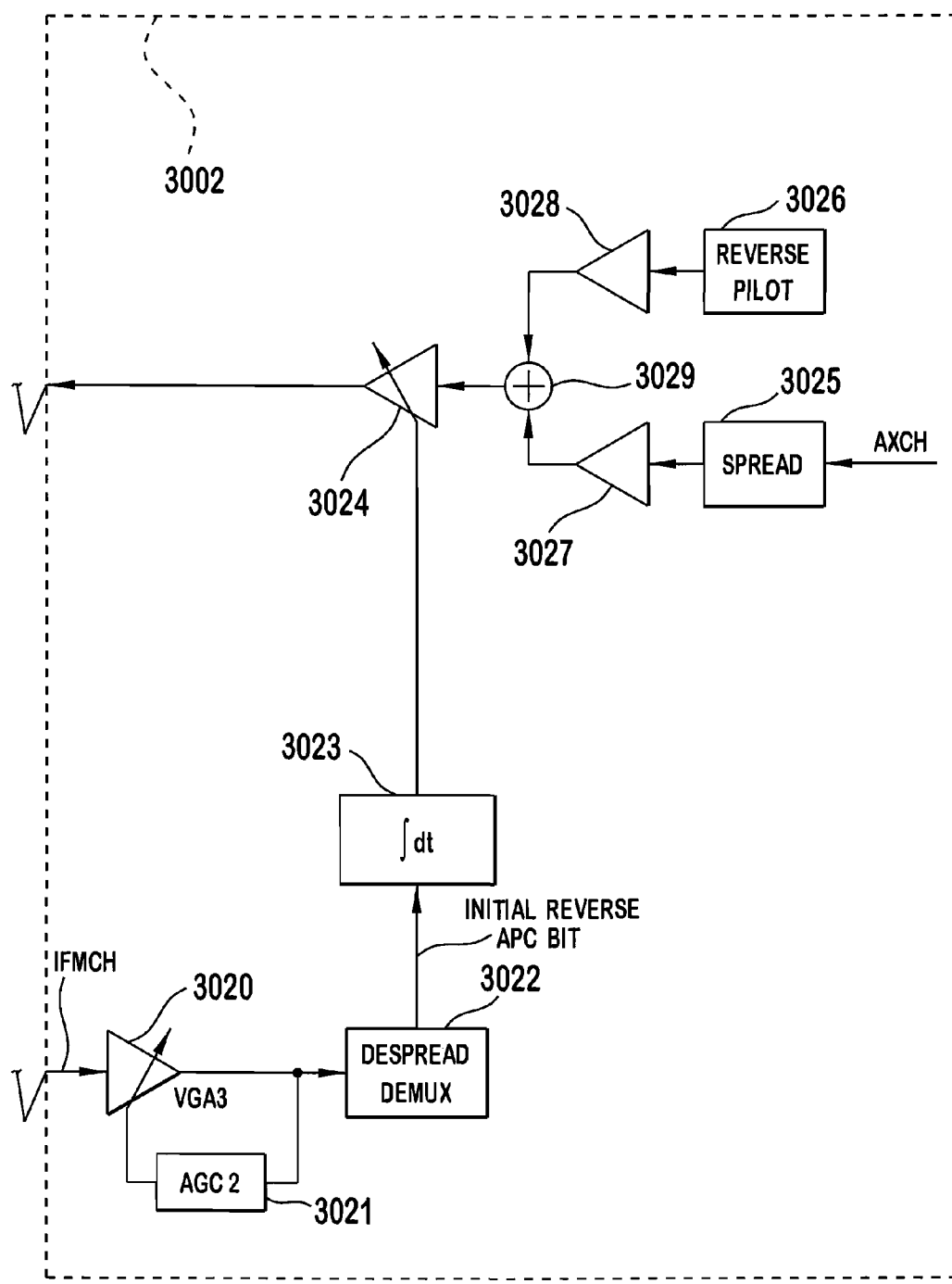

During the call connection and bearer channel establishment process, the closed loop power control of the present invention is modified, and is shown in FIG. 30. As shown, the circuits used to adjust the transmitted power are different for the RCS, shown as the Initial RCS power control module 3001; and for the SU, shown as the Initial SU power control module 3002. Beginning with the Initial RCS power control module 3001, the reverse link RF channel signal is received at the RF antenna and demodulated producing the reverse CDMA signal IRMCH which is received by the first variable gain amplifier (VGA1) 3003. The output signal of VGA1 is detected by the Automatic Gain Control Circuit (AGC1) 3004 which provides a variable gain amplifier control signal to VGA1 3003 to maintain the level of the output signal of VAG1 at a near constant value. The output signal of VGA1 is despread by the despread demultiplexer 3005, which produces a despread user message signal IMS. The Forward APC control signal, ISET, is set to a fixed value, and is applied to the Forward Link Variable Gain Amplifier (VGA2) 3006 to set the Forward Link RF channel signal at a predetermined level.

The signal power of the despread user message signal IMS of the Initial RCS power module 3001 is measured by the power measure circuit 3007, and the output power measurement is subtracted from a threshold value S3 in the subtractor 3008 to produce error signal ES5, which is an error signal relating to the transmit power level of a particular SU. The threshold S3 is calculated by multiplying the despread power measurement obtained from the AUX despreader by 1 plus the desired signal to noise ratio $SNR_R$. The AUX despreader despreads the signal using an uncorrelated spreading code, hence its output signal is an indication of despread noise power. Similarly, the VGA1 control signal is applied to the rate scaling circuit 3009 to reduce the rate of the VGA1 control signal in order to produce a scaled system power level signal SP2. The threshold computation logic 3010 determines an Initial System Signal Threshold value (ISST) computed from the user channel power data signal (IRCSUSR). The complement of the Scaled system power level signal SP2 and the ISST are provided to the adder 3011 which produces a second error signal ES6, which is an error signal relating to the system transmit power level of all active SUs. The value of ISST is the desired transmit power for a system having the particular configuration. The input Error signals ES5 and ES6 are combined in the combiner 3012 produce a combined error signal input to the delta modulator (DM3) 3013. DM3 produces the initial reverse APC bit stream signal, having bits of value +1 or −1, which in the exemplary embodiment is transmitted as a 64 kb/s signal.

The Reverse APC bit stream signal is applied to the spreading circuit 3014, to produce the initial spread-spectrum forward APC signal. The CTCH information is spread by the spreader 3016 to form the spread CTCH message signal. The spread APC and CTCH signals are scaled by the amplifiers 3015 and 3017, and combined by the combiner 3018. The combined signal is applied to VAG2 3006, which produces the forward link RF channel signal.

The forward link RF channel signal including the spread forward APC signal is received by the RF antenna of the SU and demodulated to produce the initial forward CDMA signal (IFMCH) which is applied to the variable gain amplifier (VGA3) 3020. The output signal of VGA3 is detected by the Automatic Gain Control Circuit (AGC2) 3021 which produces a variable gain amplifier control signal for the VGA3 3020. This signal maintains the output power level of the VGA3 3020 at a near constant value. The output signal of VAG3 is despread by the despread demultiplexer 3022, which produces an initial reverse APC bit that is dependent on the output level of VGA3. The reverse APC bit is processed by the integrator 3023 to produce the Reverse APC control signal. The Reverse APC control signal is provided to the Reverse APC VGA4 3024 to maintain Reverse link RF channel signal at a defined power level.

The global channel AXCH signal is spread by the spreading circuits 3025 to provide the spread AXCH channel signal. The reverse pilot generator 3026 provides a reverse pilot signal, and the signal power of AXCH and the reverse pilot signal are adjusted by the respective amplifiers 3027 and 3028. The spread AXCH channel signal and the reverse pilot signal are summed by the adder 3029 to produce reverse link CDMA signal. The reverse link CDMA signal is received by the reverse APC VGA4 3024, which produces the reverse link RF channel signal output to the RF transmitter.

System Capacity Management

The system capacity management algorithm of the present invention optimizes the maximum user capacity for an RCS area, called a cell. When the SU comes within a certain value of maximum transmit power, the SU sends an alarm message to the RCS. The RCS sets the traffic lights which control access to the system, to "red" which, as previously described, is a flag that inhibits access by the SU's. This condition remains in effect until the call to the alarming SU terminates, or until the transmit power of the alarming SU, measured at the SU, is a value less than the maximum transmit power. When multiple SUs send alarm messages, the condition remains in effect until either all calls from alarming SUs terminate, or until the transmit power of the alarming SU, measured at the SU, is less than the maximum transmit power. An alternative embodiment monitors the bit error rate measurements from the FEC decoder, and holds the RCS traffic lights at "red" until the bit error rate is less than a predetermined value.

The blocking strategy of the present invention includes a method which uses the power control information transmitted from the RCS to an SU, and the received power measurements at the RCS. The RCS measures its transmit power level, detects that a maximum value is reached, and determines when to block new users. An SU preparing to enter the system blocks itself if the SU reaches the maximum transmit power before successful completion of a bearer channel assignment.

Each additional user in the system has the effect of increasing the noise level for all other users, which decreases the signal to noise ratio (SNR) that each user experiences. The power control algorithm maintains a desired SNR for each user. Therefore, in the absence of any other limitations, addition of a new user into the system has only a transient effect and the desired SNR is regained.

The transmit power measurement at the RCS is done by measuring either the root mean square (rms) value of the baseband combined signal or by measuring the transmit power of the RF signal and feeding it back to digital control circuits. The transmit power measurement may also be made by the SUs to determine if the unit has reached its maximum transmit power. The SU transmit power level is determined by measuring the control signal of the RF amplifier, and scaling the value based on the service type, such as POTS, FAX, or ISDN.

The information that an SU has reached the maximum power is transmitted to the RCS by the SU in a message on the Assigned Channels. The RCS also determines the condition by measuring reverse APC changes because, if the RCS sends APC messages to the SU to increase SU transmit power, and the SU transmit power measured at the RCS is not increased, the SU has reached the maximum transmit power.

The RCS does not use traffic lights to block new users who have finished ramping-up using the short codes. These users are blocked by denying them the dial tone and letting them time out. The RCS sends all 1's (go down commands) on the APC Channel to make the SU lower its transmit power. The RCS also sends either no CTCH message or a message with an invalid address which would force the FSU to abandon the access procedure and start over. The SU, however, does not start the acquisition process immediately because the traffic lights are red.

When the RCS reaches its transmit power limit, it enforces blocking in the same manner as when an SU reaches its transmit power limit. The RCS turns off all the traffic lights on the FBCH, starts sending all 1 APC bits (go down commands) to those users who have completed their short code ramp-up but have not yet been given a dial tone, and either sends no CTCH message to these users or sends messages with invalid addresses to force them to abandon the access process.

The self blocking process of the SU is as follows. When the SU starts transmitting the AXCH, the APC starts its power control operation using the AXCH and the SU transmit power increases. While the transmit power is increasing under the control of the APC, it is monitored by the SU controller. If the transmit power limit is reached, the SU abandons the access procedure and starts over.

System Synchronization

Figure 10:
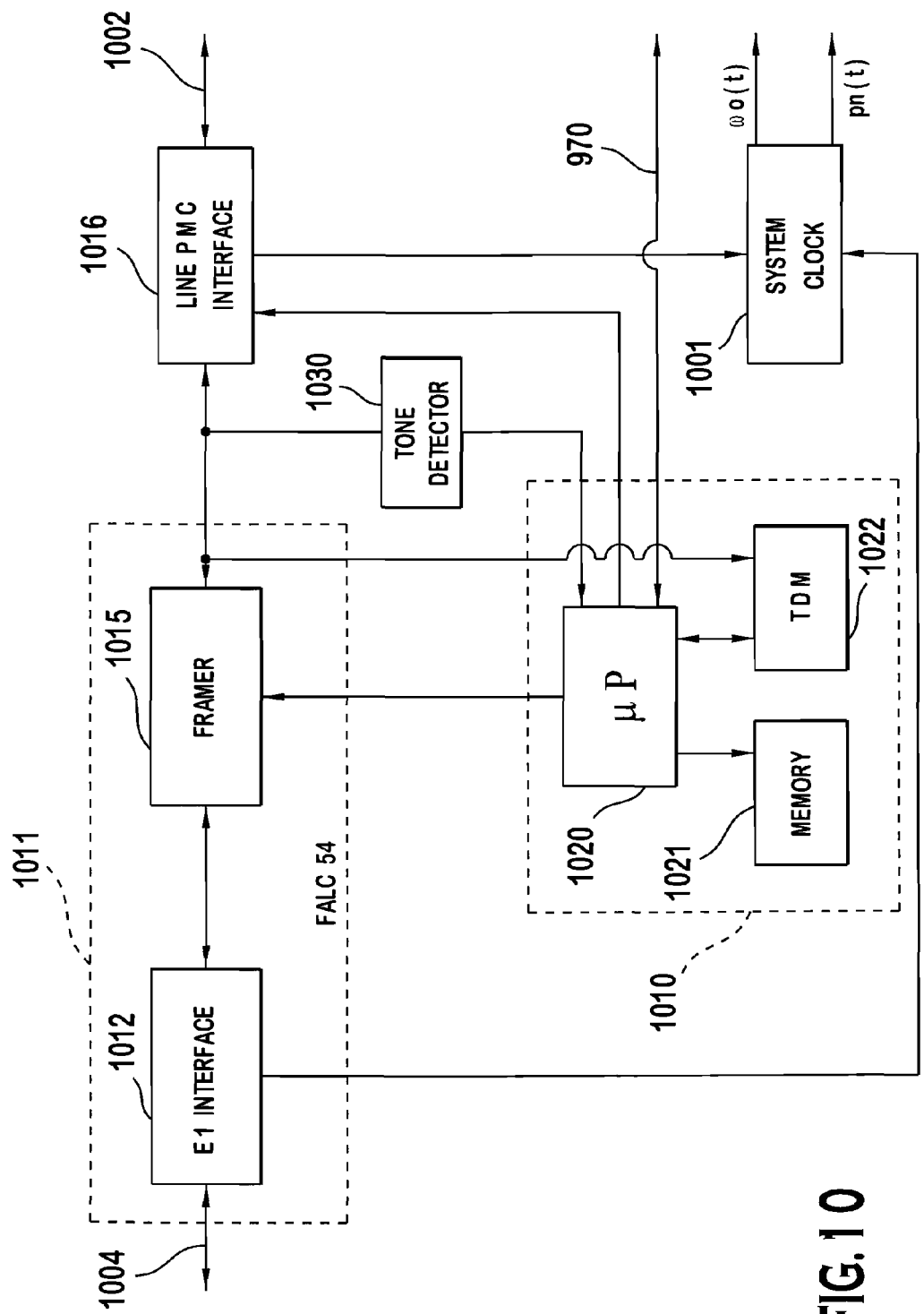
FIG. 10 is a block diagram of the elements of an exemplary multiplexer suitable for use in the RCS shown in FIG. 9.

The RCS is synchronized either to the PSTN Network Clock signal through one of the Line interfaces, as shown in FIG. 10, or to the RCS system clock oscillator, which free-runs to provide a master timing signal for the system. The Global Pilot Channel, and therefore all Logical channels within the CDMA channel, are synchronized to the system clock signal of the RCS. The Global Pilot (GLPT) is transmitted by the RCS and defines the timing at the RCS transmitter.

The SU receiver is synchronized to the GLPT, and so behaves as a slave to the Network Clock oscillator. However, the SU timing is retarded by the propagation delay. In the present embodiment of the invention, the SU modem extracts a 64 KHz and 8 KHz clock signal from the CDMA RF Receive channel, and a PLL oscillator circuit creates 2 MHz and 4 MHz clock signals. The SU transmitter and hence the LAXPT or ASPT are slaved to the timing of the SU receiver.

The RCS receiver is synchronized to the LAXPT or the ASPT transmitted by the SU, however, its timing may be retarded by the propagation delay. Hence, the timing of the RCS receiver is that of the RCS transmitter retarded by twice the propagation delay.

Furthermore, the system can be synchronized via a reference received from a Global Positioning System receiver (GPS). In a system of this type, a GPS receiver in each RCS provides a reference clock signal to all submodules of the RCS. Because each RCS receives the same time reference from the GPS, all of the system clock signals in all of the RCSs are synchronized.

The RCS Test Configuration Unit

Figure 31:
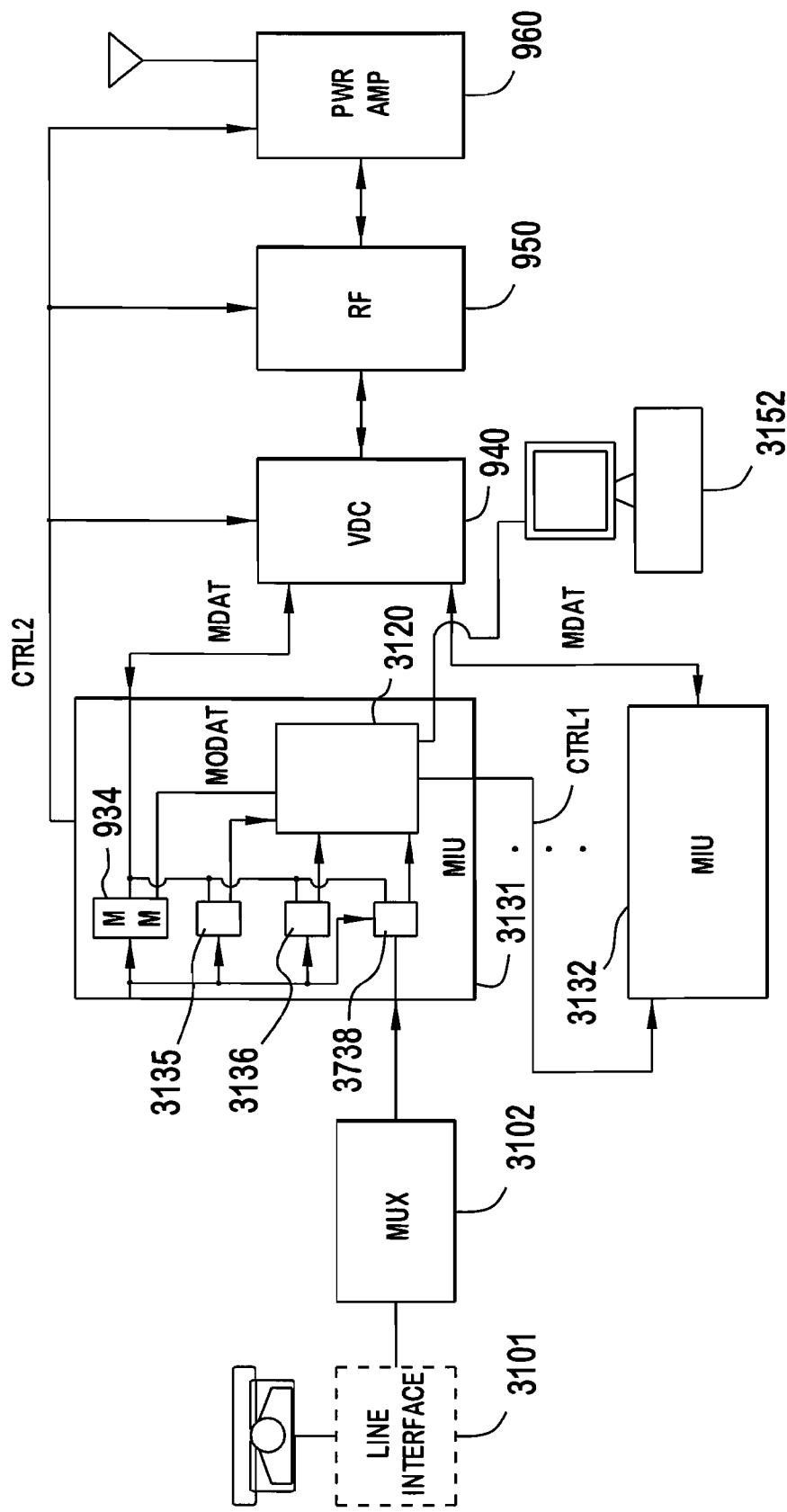
FIG. 31 is a diagram of the RCS and SU configured for test purposes.

The RCS as described previously, and shown in FIG. 9, may be configured for test purposes, as is shown in FIG. 31. Test purposes may be, for example, to initiate a communication link to an SU and measure system parameters described previously. Providing such measurements to a user may be useful for optimally setting the various programmable parameters of the RCS, which may provide an improved system performance since the RCS is generally used in a fixed location.

The test configuration may not, however, require support of a large number of users and hence, communication channels. For such a configuration, the functionality of the WAC 920 of FIG. 9 may be incorporated into the MIU 931. For such incorporation, the system control functions of the WAC may be implemented in the MIU controller 1230 shown in FIG. 12. If only one MUX 905 is present, the time slot interchange function of the TSI 1101 is simplified, and may not even be required. The TSI 1101 may also be incorporated into a specially configured MUX unit.

As shown in FIG. 31, the test configuration includes an optional telephone line interface 3101; MUX 3102; a master MIU 3131, including Master CDMA Modem 934, CDMA modems 3135, 3136, channel distribution circuit (CDC) 3738 and system controller 3120; optional additional MIUs 3132; a VDC 940; RF Transmitter/Receiver 950 and Power Amplifier 960. In addition, the test unit includes an Input and Display Device (IDD) 3152 which may be, for example, a PC having a customized user interface program. The operation of the VDC 940, RF Transmitter/Receiver 950 and Power Amplifier 960 is the same as described previously with respect to the RCS.

The optional telephone line interface 3101 may be used to provide signalling or other telephony signals, as well as providing an interface between a telephone (analog input) and the transport line having a corresponding format. Consequently, the telephone line interface 3101 can receive an analog signal, sample and quantize the signal into a digital signal, and provide the digital signal with associated telephony control signals (e.g. network signalling), as a channel in group of multiplexed channels. For convenience, the channel for transmission to an SU is termed a forward channel. Since a telephone call is bidirectional, or an SU may itself establish a communication link with the telephone, a channel for transmission from the SU to the telephone is termed a reverse channel. The reverse channel is also provided as one of a group of multiplexed reverse channels to the telephone line interface 3101, which receives telephony control signals from the reverse channel and provides a reverse analog signal to the telephone.

The MUX 3102 is configured to accept a group of multiplexed digital signals having a line format, and to separate the line format coding and telephony control signals from the channels. This information and the channels, each having a digital signal corresponding to a user's communication channel, are provided to the Master MIU 3131. The functionality of the MUX is as described previously with reference to FIG. 10.

The Master MIU 3131, including Master CDMA Modem 934, performs those functions as described previously with reference to FIG. 12 through FIG. 20. However, the MIU 2131 of the Test Configuration may contain the following modifications: 1) referring to FIG. 12, the PCM interface 1220 may include additional interface components to provide time slot interchange functionality; and 2) the System Controller 3120 of FIG. 31 may be formed from the MIU controller 1230 of FIG. 12 by the following modifications: 1) an optional increase in the capacity of memory 1242 for storage of modem data, 2) addition of an I/O interface for communication with an external device, 3) addition of a control link CTRL1 in order to communicate with and supervise optional additional MIU 3132 and MIU 3132 modems (not shown), 4) addition of a control link CTRL1 in order to communicate with and supervise operation of the VDC 940, RF Transmitter/Receiver 950 and Power Amplifier 960, and 5) support of communication channel routing by the CDC 3738.

The System Controller 3120 may receive data signals MODAT$_k$, k=1, 2, . . . N, from the Master CDMA Modem 934 and each of the CDMA Modems 3135 and 3136. Each corresponding data signal MODAL may indicate current values of system parameters, such as, for example, system noise interference levels, number of established calls, forward and reverse power control parameters, time to access a channel, time to establish a channel, and number of dropped calls. System Controller 3120 may collect and store this information in memory (not shown) and provide the information to the IDD 3152 through the I/O interface (not shown) if prompted by a user (or this may occur automatically).

The IDD 3152 is typically a remote terminal, such as a PC, which may have software programs that support a human-machine interface, in which commands are parsed and formed into a request to the System Controller 3120 for particular system parameter values. In addition, the IDD 3152 may also have software programs that receive the particular system parameter values (as, for example, a digital data signal having a predetermined data record format) and format the data into a predetermined display format. The display format can be, for example, graphs, values, history, or real time display of changing values.

Although the invention has been described in terms of multiple exemplary embodiments, it is understood by those skilled in the art that the invention may be practiced with modifications to the embodiments that are within the scope of the invention as defined by the following claims.

What is claimed is:

1. A wireless subscriber unit comprising:
   circuitry configured to store a program received by the wireless subscriber unit in a first memory and for determining whether the program was received correctly; wherein the program is received via a wireless communications link;
   circuitry configured to store the program in a second memory, in response to a determination that the program was received correctly; and
   circuitry configured to reboot the wireless subscriber unit and load the program from the second memory.

2. The wireless subscriber unit of claim 1 wherein the program is received by a modem of the subscriber unit.

3. The wireless subscriber unit of claim 2 wherein the modem is a CDMA modem.

4. The wireless subscriber unit of claim 1 wherein the program is received from an external device.

5. The wireless subscriber unit of claim 1 wherein the circuitry configured to reprogram the second memory uses the program stored in the first memory.

6. The wireless subscriber unit of claim 1 wherein the first memory is a FLASH memory.

7. The wireless subscriber unit of claim 1 wherein the controller receives current values of system parameters.

8. The wireless subscriber unit of claim 7 wherein the current values are provided by a modem.

9. The wireless subscriber unit of claim 7 wherein the current values are system noise interference levels, number of established calls, forward power control parameters, reverse power control parameters, time to access a channel, time to establish a channel or a number of dropped calls.

10. A method implemented in a wireless subscriber unit, the method comprising:
    storing a program received by the wireless subscriber unit in a first memory of the subscriber unit; wherein the program is received via a wireless communications link;
    determining whether the program was received correctly; and
    in response to a determination that the program was received correctly, storing the program in a second memory of the wireless subscriber unit and rebooting the wireless subscriber unit and loading the program from the second memory.

11. The method of claim 10 wherein the program is received by a modem of the wireless subscriber unit.

12. The method of claim 11 wherein the modem is a CDMA modem.

13. The method of claim 10 wherein the program is received from an external device.

14. The method of claim 10 comprising reprogramming the second memory using the program stored in the first memory.

15. The method of claim 10 wherein the first memory is a FLASH memory.

16. The method of claim 10 comprising receiving current values of system parameters by the wireless subscriber unit.

17. The method of claim 16 wherein the current values are provided by modem.

18. The method of claim 16 wherein the current values are system noise interference levels, number of established calls, forward power control parameters, reverse power control parameters, time to access a channel, time to establish a channel or a number of dropped calls.

* * * * *